United States Patent
Kamenomostskiy

(10) Patent No.: US 9,754,057 B2
(45) Date of Patent: Sep. 5, 2017

(54) WEIGHT OPTIMIZED THIN WALL STRUCTURES AND WEIGHT OPTIMIZATION SYSTEM TOOL

(71) Applicant: Aleksandr I. Kamenomostskiy, New York, NY (US)

(72) Inventor: Aleksandr I. Kamenomostskiy, New York, NY (US)

(*) Notice: Subject to any disclaimer, the term of this patent is extended or adjusted under 35 U.S.C. 154(b) by 975 days.

(21) Appl. No.: 13/843,045

(22) Filed: Mar. 15, 2013

(65) Prior Publication Data

US 2014/0372087 A1 Dec. 18, 2014

(51) Int. Cl.
| | |
|---|---|
| *G06F 17/50* | (2006.01) |
| *E04C 2/08* | (2006.01) |
| *E04C 2/38* | (2006.01) |
| *E04C 3/08* | (2006.01) |
| *E04C 3/30* | (2006.01) |
| *E04C 3/04* | (2006.01) |

(52) U.S. Cl.
CPC ........... *G06F 17/5018* (2013.01); *E04C 2/08* (2013.01); *E04C 2/38* (2013.01); *E04C 3/08* (2013.01); *E04C 3/30* (2013.01); *E04C 2003/043* (2013.01); *E04C 2003/046* (2013.01); *E04C 2003/0413* (2013.01); *E04C 2003/0421* (2013.01); *E04C 2003/0434* (2013.01); *E04C 2003/0452* (2013.01); *E04C 2003/0465* (2013.01); *E04C 2003/0469* (2013.01); *E04C 2003/0473* (2013.01); *E04C 2003/0482* (2013.01); *Y10T 428/2495* (2015.01)

(58) Field of Classification Search
CPC .............................................. E04C 2003/0413

USPC ............................................................ 703/1
See application file for complete search history.

(56) References Cited

U.S. PATENT DOCUMENTS

| | | | | |
|---|---|---|---|---|
| 2002/0184850 A1* | 12/2002 | Kamenomostski | ....... | E04C 2/08 52/800.1 |
| 2005/0016117 A1* | 1/2005 | Kamenomostski | ....... | E04C 2/08 52/831 |
| 2010/0031606 A1* | 2/2010 | Kamenomostski | ....... | E04C 2/08 52/846 |

OTHER PUBLICATIONS

Boeing Design Manual BDM-6080, Rev. A, May 1, 1992, pp. 1-44.
Kamenomostskiy, A.I., "Structural Mechanics and Design of Buildings", Scientific-Technical Magazine, No. 5, 1990, Building Publishing House, Moscow, U.S.S.R., 7 pp.

* cited by examiner

*Primary Examiner* — Hugh Jones
(74) *Attorney, Agent, or Firm* — Adams & Wilks

(57) ABSTRACT

A thin wall profile member (TPM) with a cross-sectional shape and dimensions constant along its length is pre-constructed for use as a load carrying, weight optimized structural element. The TPM includes at least one main strip and at least one additional strip each having longitudinal reinforcing ribs. The at least one additional strip has a width that does not exceed a width of the at least one main strip and has a thickness that equals or exceeds a thickness of the at least one main strip. The ratio of the width of the at least one additional strip to the width of the at least one main strip has a value greater than 0 and less than or equal to 1. The ratio of the thickness of the at least one additional strip to the thickness of the at least one main strip has a value that is greater than or equal to 1.

67 Claims, 61 Drawing Sheets

Feasible dimensions of U-shaped TPM

| Profile No. | $a_3 = a_4 = \dfrac{\delta_a}{\delta_b} = \dfrac{\delta_c}{\delta_b}$ | $a_2 = \dfrac{b}{a}$ | $a_1 = \dfrac{c}{b}$ | $A$ | $K_s$ | $A_1$ | $A_2$ |
|---|---|---|---|---|---|---|---|
| 1 | 1.0 | 2.1 | 0.3 | 0.4042 | 1.16 | 0.596 | 0.26 |
| 2 | 1.5 | 2.3 | 0.3 | 0.4141 | 0.54 | 0.531 | 0.346 |
| 3 | 2.0 | 2.3 | 0.3 | 0.4155 | 0.35 | 0.513 | 0.416 |

FIG. 41

Range of allowable values for the stringer panel stress factors

| Description | Material D-16T | | | Material B95 | | |
|---|---|---|---|---|---|---|
| Panel stress factor \ Stringer profile shape | 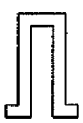 | 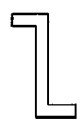 |  | 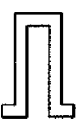 | 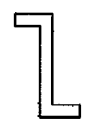 |  |
| $q_p$ [daN/cm²] | 71-128 | 65-∞ | 113-∞ | 161-287 | 147-∞ | 258-∞ |

Features of real and optional-design panels

| Panel \ Feature | Real | | Designed | |
|---|---|---|---|---|
| | I | II | I | II |
| $q_p$ [daN/cm] | 934 | 555 | 934 | 555 |
| $l_s$ [cm] | 45 | 40 | 45 | 40 |
| $B$ [cm] | 31.4 | 33.4 | 31.4 | 33.4 |
| $a_1$ [mm] | 20 | 20 | 13 | 13 |
| $\delta_{a1}$ [mm] | 2.5 | 2 | 1.8 | 1.2 |
| $a_2$ [mm] | 30 | 25 | 26 | 17 |
| $\delta_{a2}$ [mm] | 2 | 1.6 | 1 | 1 |
| $a_3$ [mm] | 20 | 20 | 13 | 13 |
| $\delta_{a3}$ [mm] | 2.5 | 1.5 | 1.8 | 1.2 |
| $\delta$ [mm] | 1.5 | 1.25 | 1 | 1 |
| $b_s$ [mm] | 70 | 58 | 32 | 30 |
| $\sigma$ [daN/cm²] | 2307 | 1719 | 2852 | 2128 |
| $F_{tot}$ [cm²] | 4.71 | 4.18 | 3.14 | 3.34 |
| $F_{tot}$ [%] | -- | -- | 33.5 | 20 |
| $F_s$ [cm²] | 8 | 6.6 | 7.14 | 5.37 |
| $\Delta F_s$ [%] | -- | -- | 12 | 18.6 |
| $F_p$ [cm²] | 12.71 | 10.78 | 10.28 | 8.71 |
| $\Delta F_p$ [%] | -- | -- | 19.1 | 19.2 |

FIG. 57

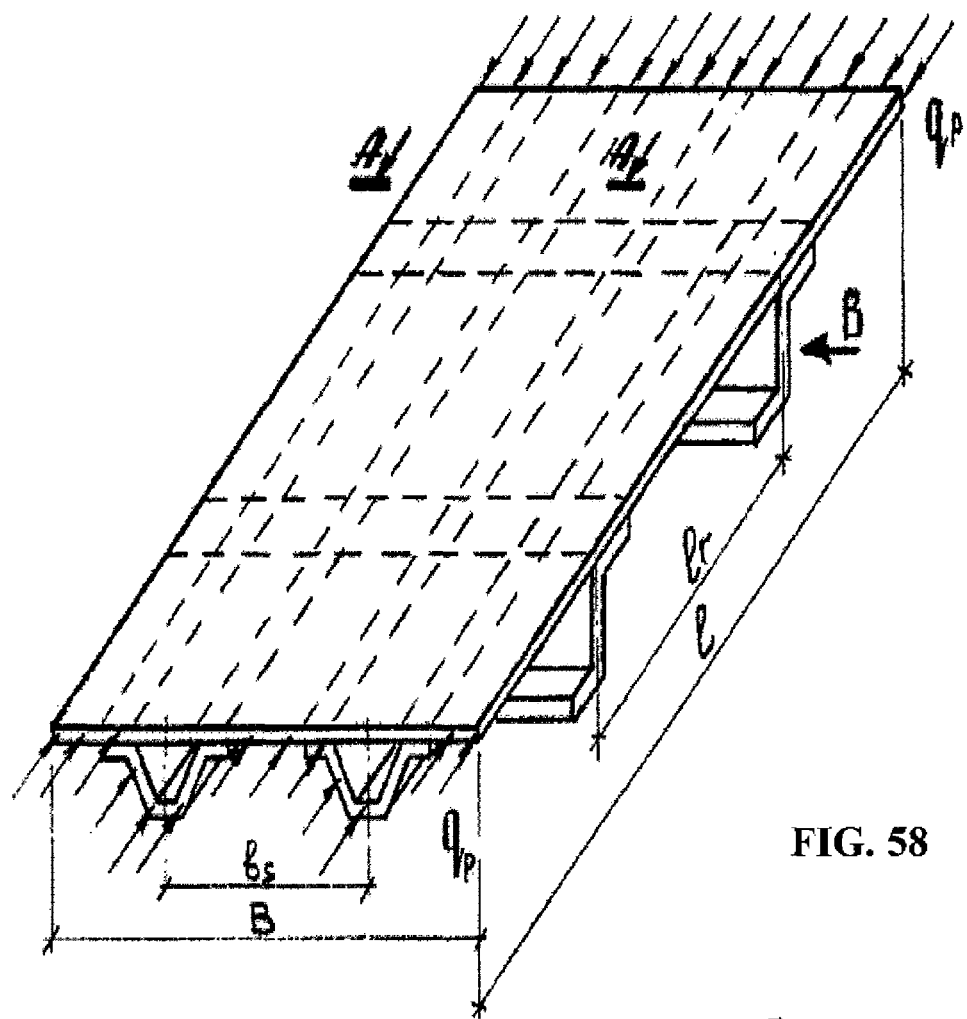
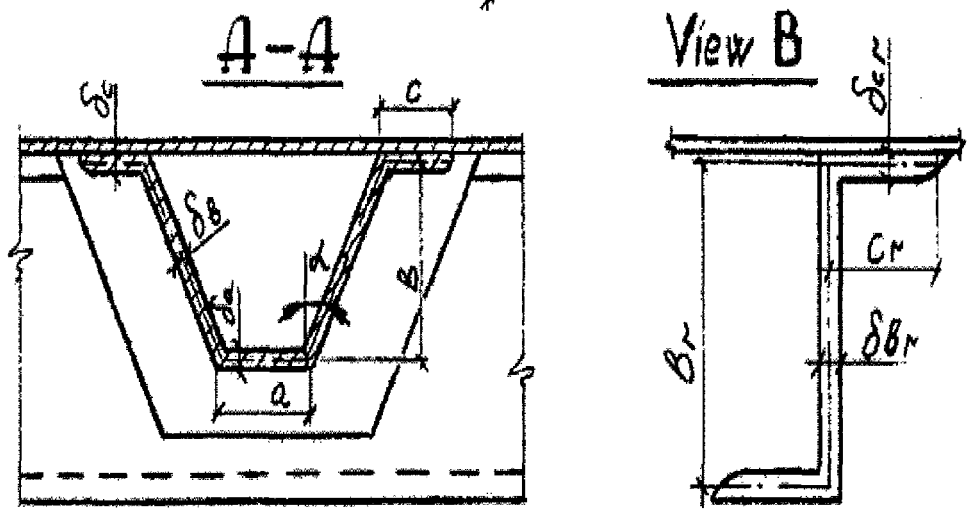
FIG. 58

Coefficients $K\sigma.w$, $K\tau.w$ in the formulae for web cell critical stresses

| $\dfrac{l}{h_w}$ \ coefficients | $K\sigma.w$ | $K\tau.w$ |
|---|---|---|
| 1 | 23 | 8.5 |
| 0.8 | 14.5 | 7 |
| 0.6 | 8 | 6 |
| 0.4 | 4.5 | 5.5 |
| 0.2 | 2 | 5 |

FIG. 75

Factor θ versus web cell overall dimensions

| $\dfrac{l}{h_w}$ | 2 | 1.5 | 1.25 | 1 |
|---|---|---|---|---|
| θ | 1.66 | 5.8 | 12.6 | 30 |

FIG. 76

Feasible coefficients for stringer shape

| Coefficients | Profile | ⊓ shape | ⌐ shape | L shape |
|---|---|---|---|---|
| $a_1$ | | 0.3 | 0.3 | 0.3 |
| $a_2$ | | 2.3 | 2.3 | 1.0 |
| $a_3$ | | 1.5 | – | – |
| $a_4$ | | 1.5 | – | – |
| $A$ | | 0.4141 | 0.515 | 0.328 |
| $A_1$ | | 0.531 | 1.38 | 1.2 |
| $A_2$ | | 0.346 | 0.33 | 0.641 |
| $A_3$ | | 7.938 | 0.383 | 0.117 |
| $K_s$ | | 0.54 | 5.8 | 0.55 |

FIG. 77

WEIGHT OPTIMIZED THIN WALL STRUCTURES AND WEIGHT OPTIMIZATION SYSTEM TOOL

CROSS-REFERENCE TO RELATED APPLICATIONS

This application is related, but does not claim benefit of priority from, continuation-in-part (CIP) of patent application Ser. No. 12/462,521, filed 5 Aug. 2009, which is a continuation of patent application Ser. No. 10/913,616, filed 6 Aug. 2004, which is a continuation of patent application Ser. No. 10/149,049, filed 4 Jun. 2002, which is the National Stage of International Application No. PCT/RU 00/00494, filed 1 Dec. 2000. It is further related, but does not claim priority from, CIP application Ser. No. 13/841,700 and CIP application Ser. No. 13/842,488, filed even date herewith, and which claim priority from one or more of the aforementioned related applications, all of which applications are commonly owned and assigned.

BACKGROUND OF THE INVENTION

Field of the Invention

The present disclosure is related to modeling and analysis tools for design and selection of weight-optimized structural members subject to load-bearing forces.

Background Information

Compressed thin wall structural members ("thin wall structures") are well suited for a variety of applications ranging from construction projects to mechanical equipment and machinery design that require low weight, high strength and high stability and flexibility.

The basic principles of thin wall structural design optimization that have important practical significance for solving the inverse problem of structural mechanics are described in F. R. Shanley's textbook, *Weight And Strength Analysis In Aircraft Design*. In this work, problems of thin wall tubular column optimization and problems of designing a plate and tubular shell affected by the bending moment are solved; the issue of optimal installation of reinforcement plates (stringers and ribs) is addressed. These examples describe approaches to solving multi-parameter optimization problems based on use of fundamental principles of plates and bars structural theories applied to simple optimization techniques. Optimization techniques are selected based on analysis of performance and stability failure modes of compressive structural members. The objective of Shanley's approach was to establish a functional connection between the allowable stress value, on the one hand, and geometric parameters and the external load, on the other.

Because such a connection is rather difficult to establish due to the multi-parameter nature of the task, the number of variables needs to be reduced by expressing certain variables using an integrating factor. An effectively selected integrating factor can be a criterion of the minimal cross-section area (minimum weight) if actual stability failure modes of the compressive shape are considered. In this case, the maximum value of the integrating factor equals the minimum value of the cross-section area. If the thin wall shape buckles only in overall stability mode, then the integrating factor, named the "shape factor" by Shanley ($K_F = i^2/F$, where i and F are the radius of gyration and bar cross section area, respectively), can serve as the minimum weight criterion. If the compressive shape is also subject to local buckling, then the "shape factor" cannot serve as the criterion of minimum weight because its increase will result in reduction of the shape's bearing capacity (due to decrease in the local buckling critical stress).

It is a great challenge, from a design standpoint, to achieve optimum weight thin wall structures, especially, when one must also account for maximum expected load-bearing capacity along several cross-sections and different materials.

Thin wall structures are traditionally formed from thin wall profile members (TPMs) generally referred to as thin wall shapes. There are many applications where thin wall structures, due to low weight, are the only design choice for engineers and designers.

In some instances, in order to enhance the load-bearing capacity of thin wall shapes, the same TPMs may be "reinforced' using reinforcing plates and/or shells (collectively referred to as "panels"). For purposes of discussion, we shall refer to reinforced TPMs as "TPM-panel combinations" or simply "TPM-panels".

Structural design optimization has been developed, in general, for such simple structural members as thick wall beams, heavy cross-section bars, trusses, arches and frames. Thin wall plates, shells and shapes (TPMs) are significantly less researched.

In the same way as designing thick structures, thin wall structures must be designed to satisfy a variety of "constructive restrictions." For example, the end design product must "fit" or "accommodate" the physical space for which it is designed. Other constructive restrictions may include, depending on the application, additional criteria such as weight, strength, stability, and flexibility constraints, as well as factors having to do with temperature (heat/cold resistance), conductivity, and other well-known material-selection criteria.

Modern design optimization relies heavily on computers which model and analyze a configuration to ensure that a particular design is suitable. Conventional tools, however, rely heavily on modeling techniques that draw mainly from thick wall structures, and which may be used for example to select an I-beam for a bridge or other extremely heavy load bearing project, where weight optimization, while important, it is not as critical as applications involving for example, aircrafts components.

Consequently, modern design of thin wall structures is focused more on single parameter-by-parameter optimization, with little emphasis on inter-dependencies of these parameters to other parameters. For example, critical stress, external compressed load, material properties, cross-section dimensions, and other criteria all impact, separately and interdependently, optimum design configuration and material selection.

Because inter-dependencies are not properly mapped out with the goal of weight optimizing a design for a given constructive restriction, the process is relatively unsophisticated.

It is desirable to be able to improve weight-optimization processes in design particularly in applications where TPMs may be employed.

SUMMARY

The present disclosure describes tools and associated computational analysis methodologies employed therein for improved TPM and TPM-panel weight-optimization and selection.

The tools draw on inter-dependence parameters relating to TPM cross-section dimensions ratio values and established constructive restrictions to calculate using appropriate algorithmic computational analysis the optimum cross-section dimensions values of a given TPM. The proposed computational analysis is used in the selection of weight-optimized TPM-panels.

A design selection serves as a blueprint for the next stage which is the actual fabrication or manufacturing of the component. For a given set of constructive restrictions, the final product is based on optimum configurations selected from a fixed set of TMPs with varied cross-section shapes; or in the case of TPM-panels, on optimum configurations selected from a fixed set of TMP-panel combinations of varied cross-section dimensions.

In a further exemplary embodiment, a proposed methodology and associated system tool are described that decrease the number of variables in optimization of a wing box, the load carrying components of which are TPM shapes and TPM-panels.

BRIEF DESCRIPTION OF THE DRAWINGS

The appended drawings illustrate exemplary configurations of the disclosure and, as such, should not be considered as limiting the scope of the disclosure that may admit to other equally effective configurations. Correspondingly, it has been contemplated that features of some configurations may be beneficially incorporated in other configurations without further recitation.

versus TPM stress factor $$\bar{P}_s = \frac{P_s}{l_{re}^2},$$

U-shaped TPM.

Figure 28:
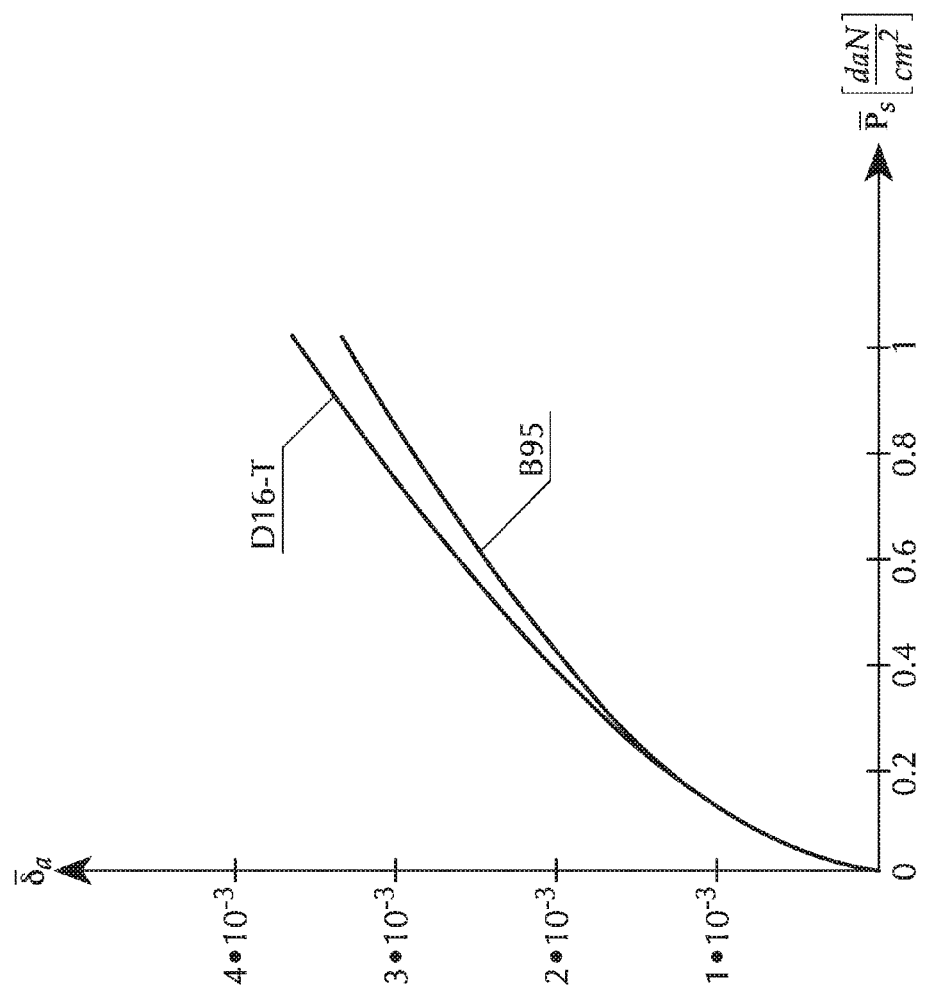

FIG. 28 is a plot showing scaled (dimensionless) characteristic dimension $$\bar{\delta}_a = \frac{\delta_a}{l_{re}}$$

versus TPM stress factor $$\bar{P}_s = \frac{P_s}{l_{re}^2},$$

U-shaped TPM.

Figure 29:
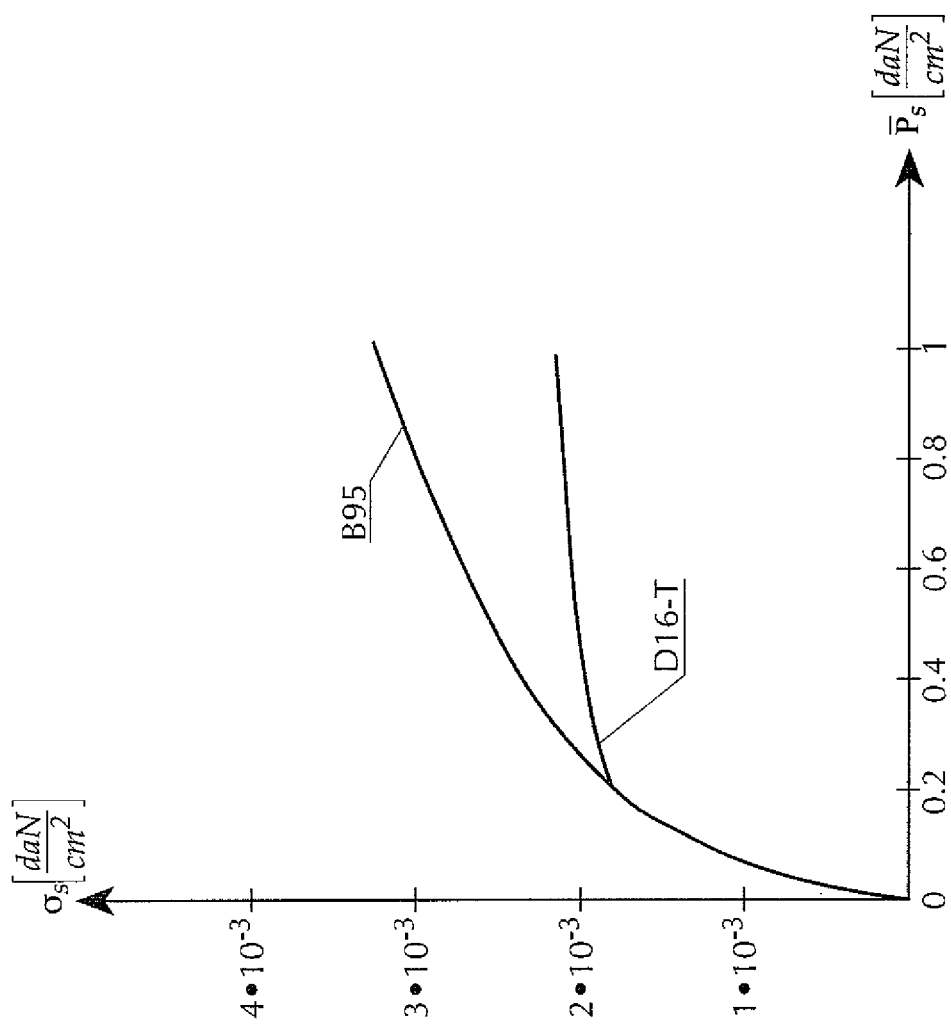

FIG. 29 is a plot showing optimum stress $\sigma_s$ versus TPM stress factor $$\bar{P}_s = \frac{P_s}{l_{re}^2},$$

U-shaped TPM.

Figure 30:
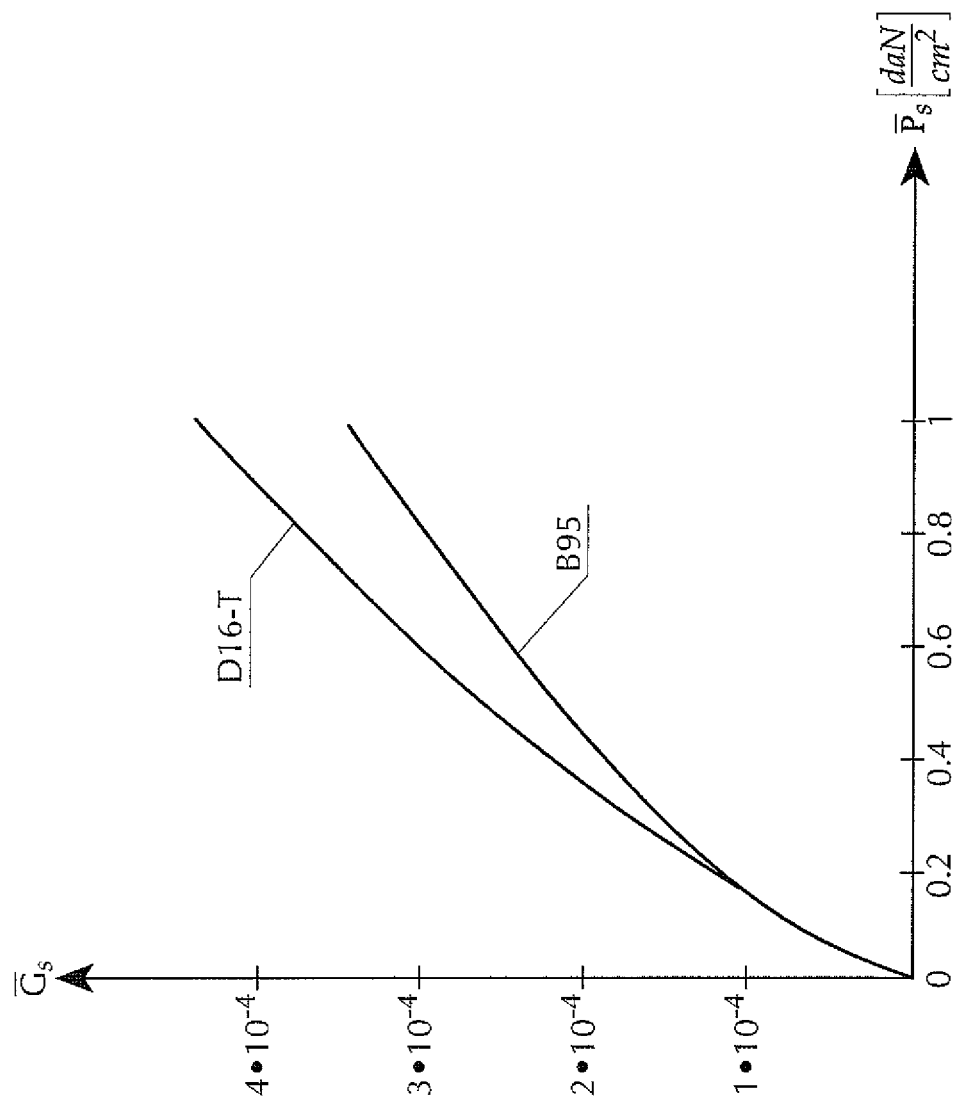

FIG. 30 is a plot showing dimensionless weight $$\bar{G}_s = \frac{G_s}{l_s \cdot l_{re}^2 \cdot \gamma}$$

versus TPM stress factor $$\bar{P}_s = \frac{P_s}{l_{re}^2},$$

U-shaped TPM.

Figure 31:
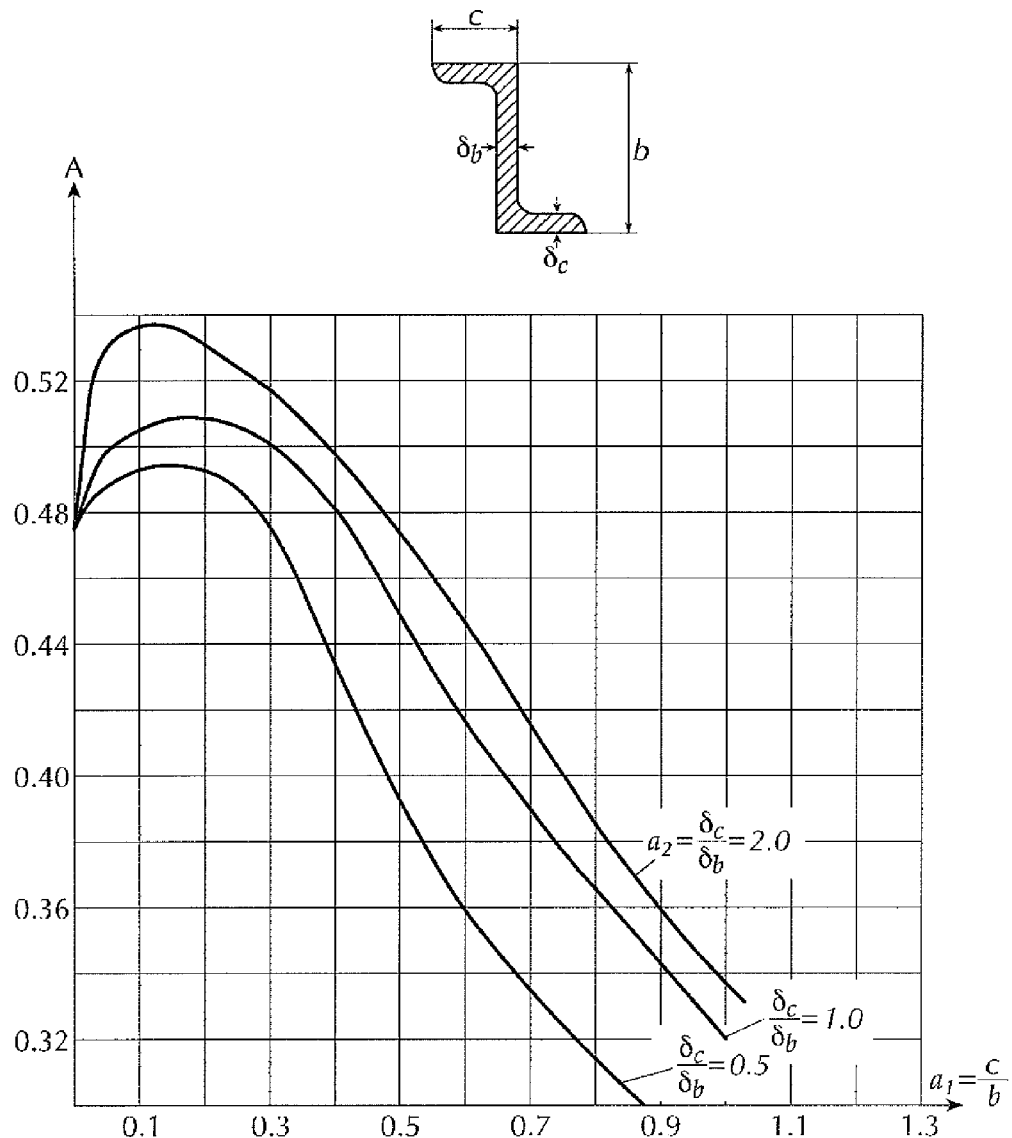

FIG. 31 is a plot showing shape efficiency factor A versus ratios of Z-shaped TPM dimensions.

Figure 32:
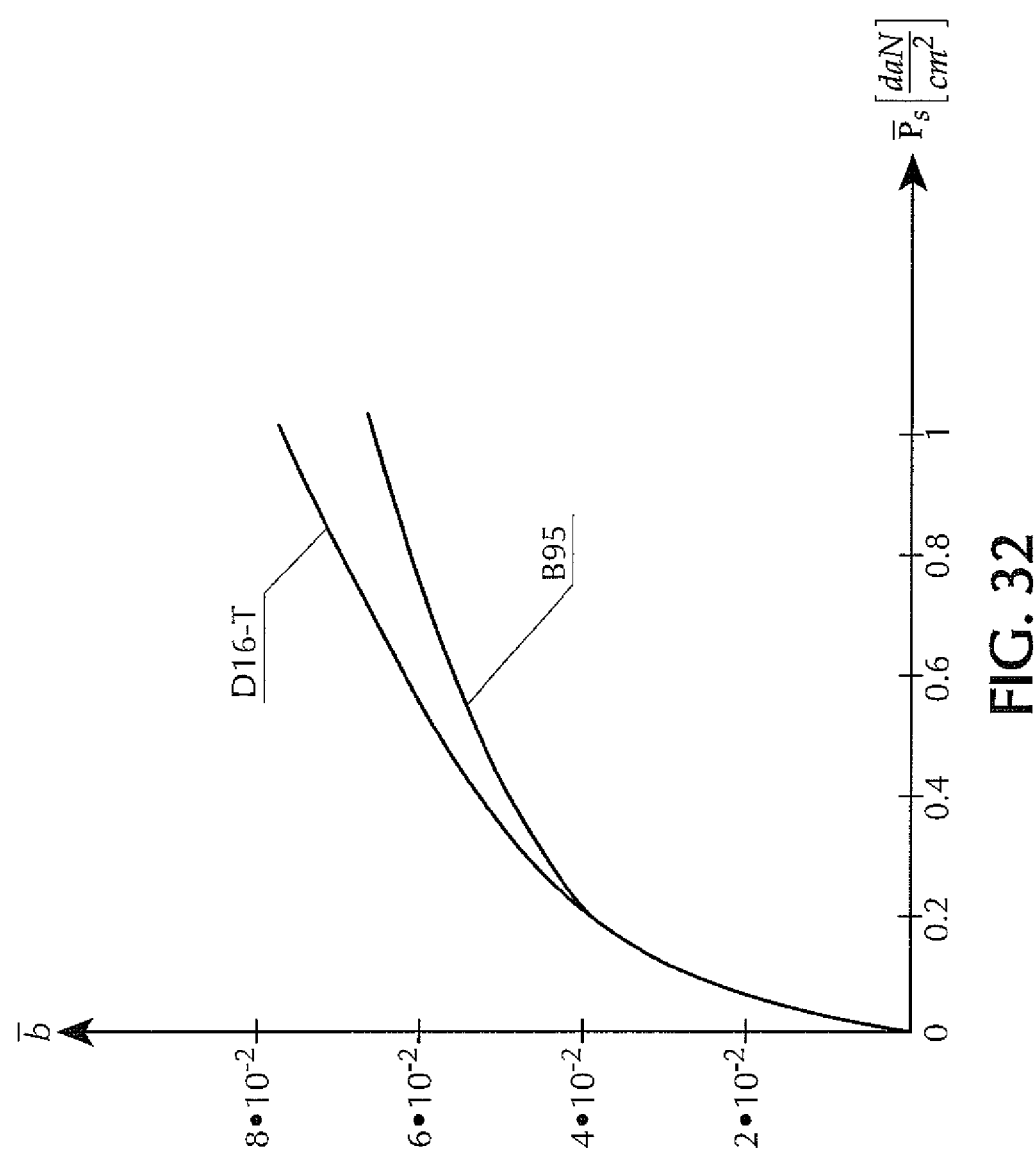

FIG. 32 is a plot showing scaled (dimensionless) characteristic dimension $$\bar{b} = \frac{b}{l_{re}}$$

versus TPM stress factor $$\bar{P}_s = \frac{P_s}{l_{re}^2},$$

Z-shaped TPM.

Figure 33:
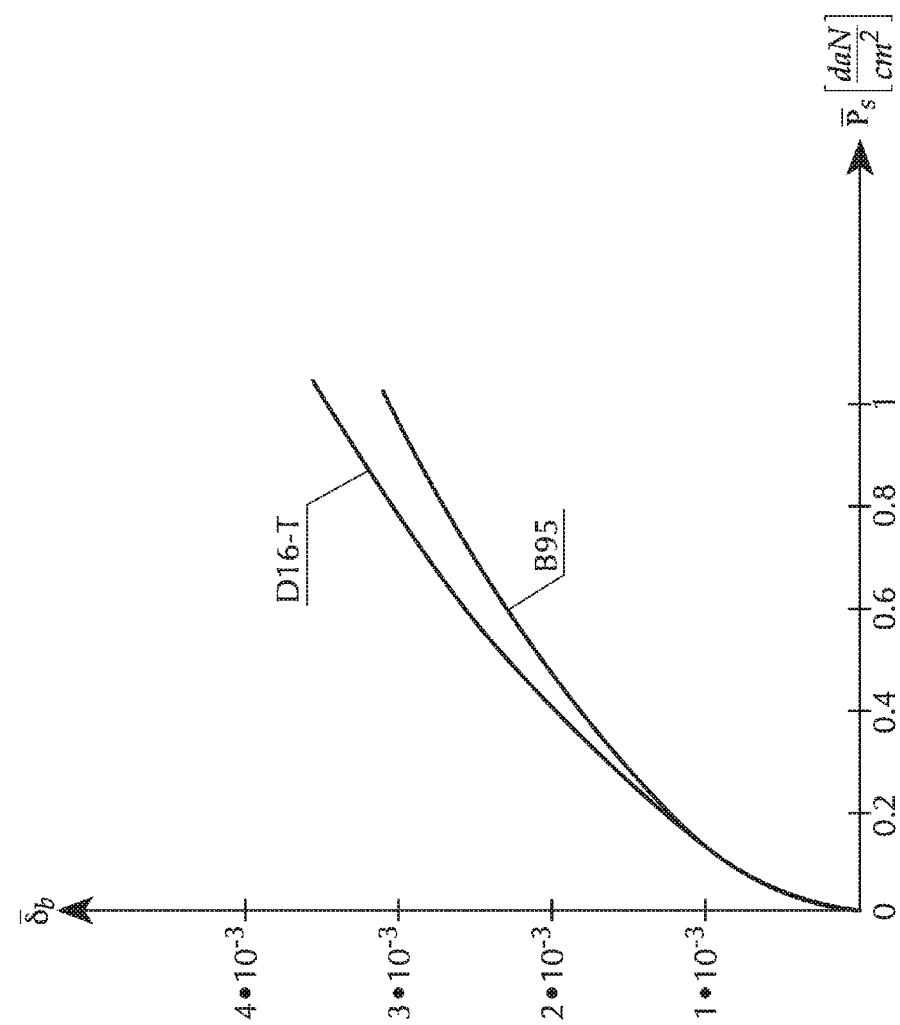

FIG. 33 is a plot showing scaled (dimensionless) characteristic dimension $$\bar{\delta}_b = \frac{\delta_b}{l_{re}}$$

versus TPM stress factor $$\bar{P}_s = \frac{P_s}{l_{re}^2},$$

Z-shaped TPM.

Figure 34:
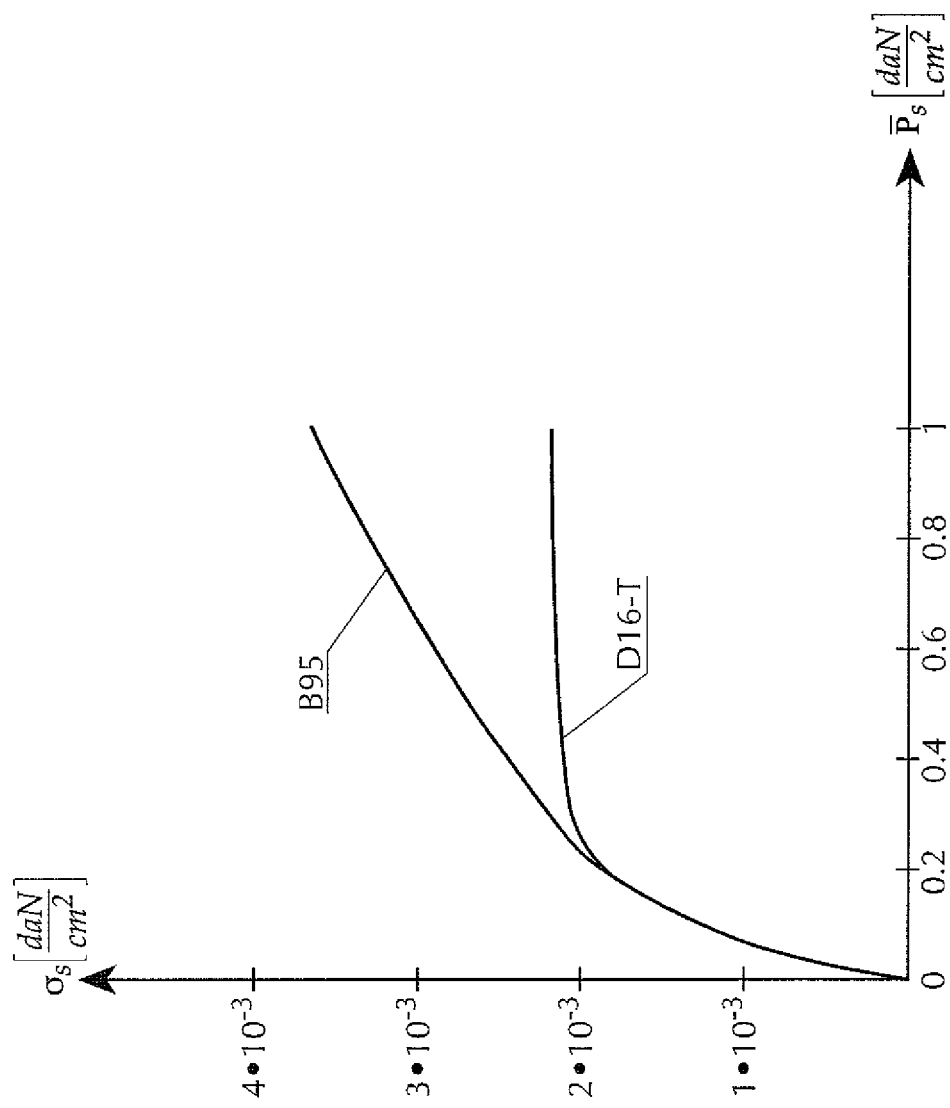

FIG. 34 is a plot showing optimum stress $\sigma_s$ versus TPM stress factor $$\bar{P}_s = \frac{P_s}{l_{re}^2},$$

Z-shaped TPM.

Figure 35:
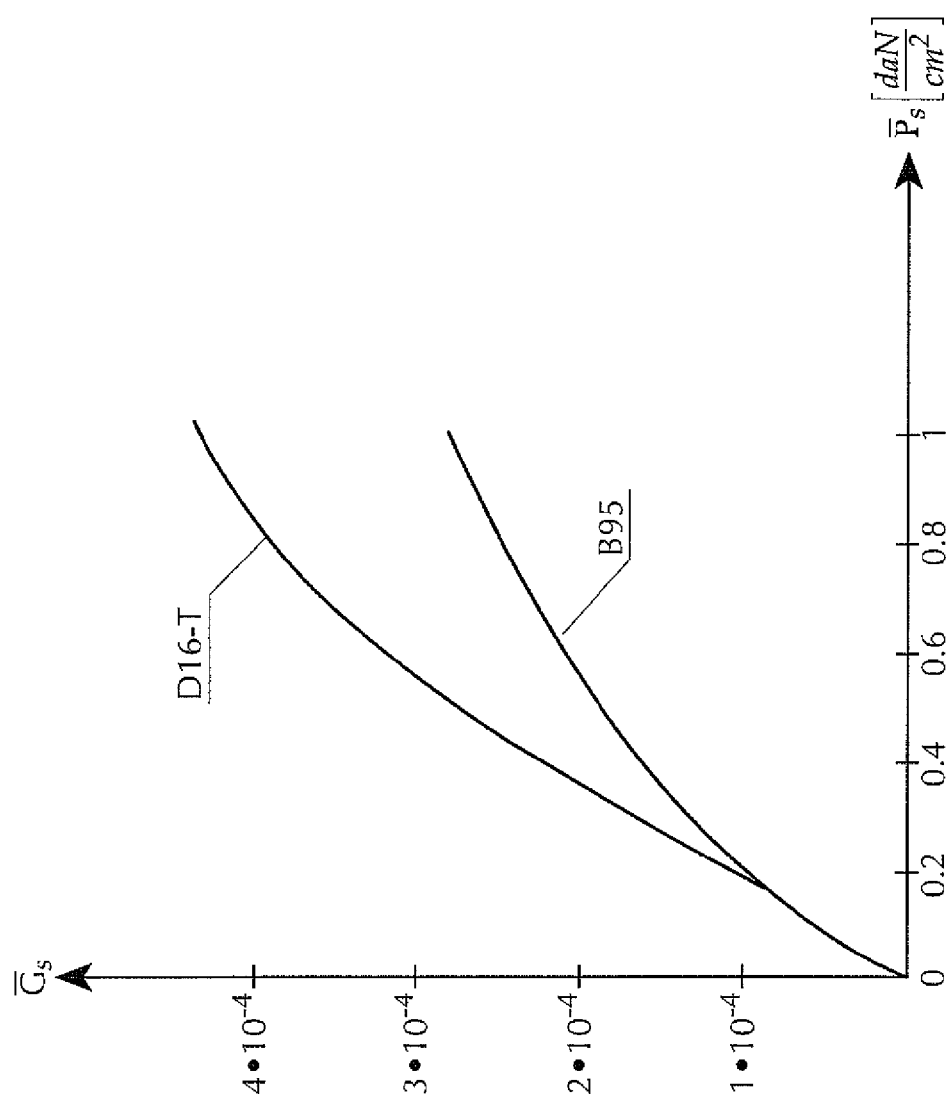

FIG. 35 is a plot showing dimensionless weight versus $$\bar{G}_s = \frac{G_s}{l_s \cdot l_{re}^2 \cdot \gamma}$$

TPM stress factor $$\bar{P}_s = \frac{P_s}{l_{re}^2},$$

Z-shaped TPM.

Figure 36:
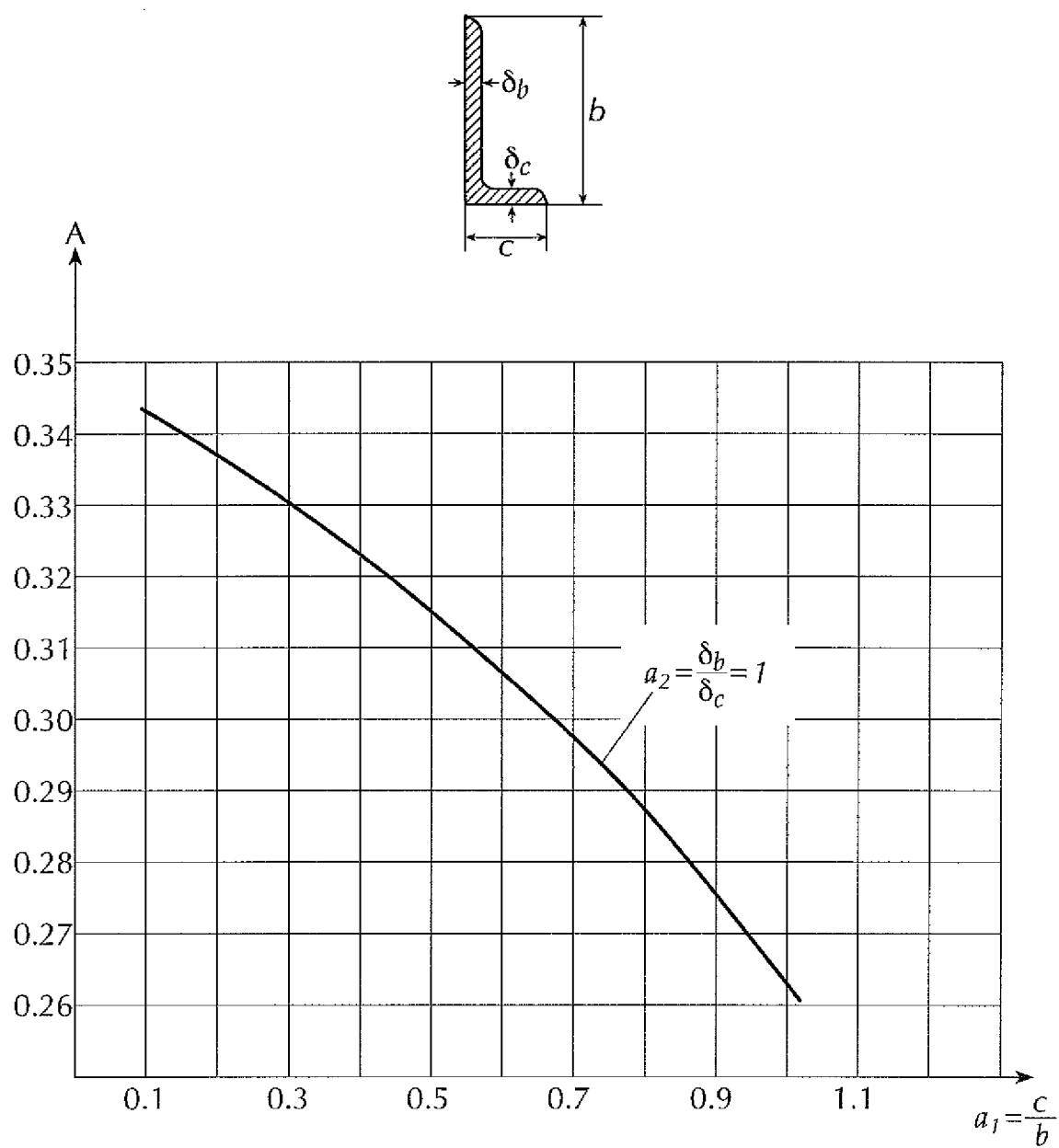

FIG. 36 is a plot showing shape efficiency factor A versus ratio of L-shaped TPM dimensions.

Figure 37:
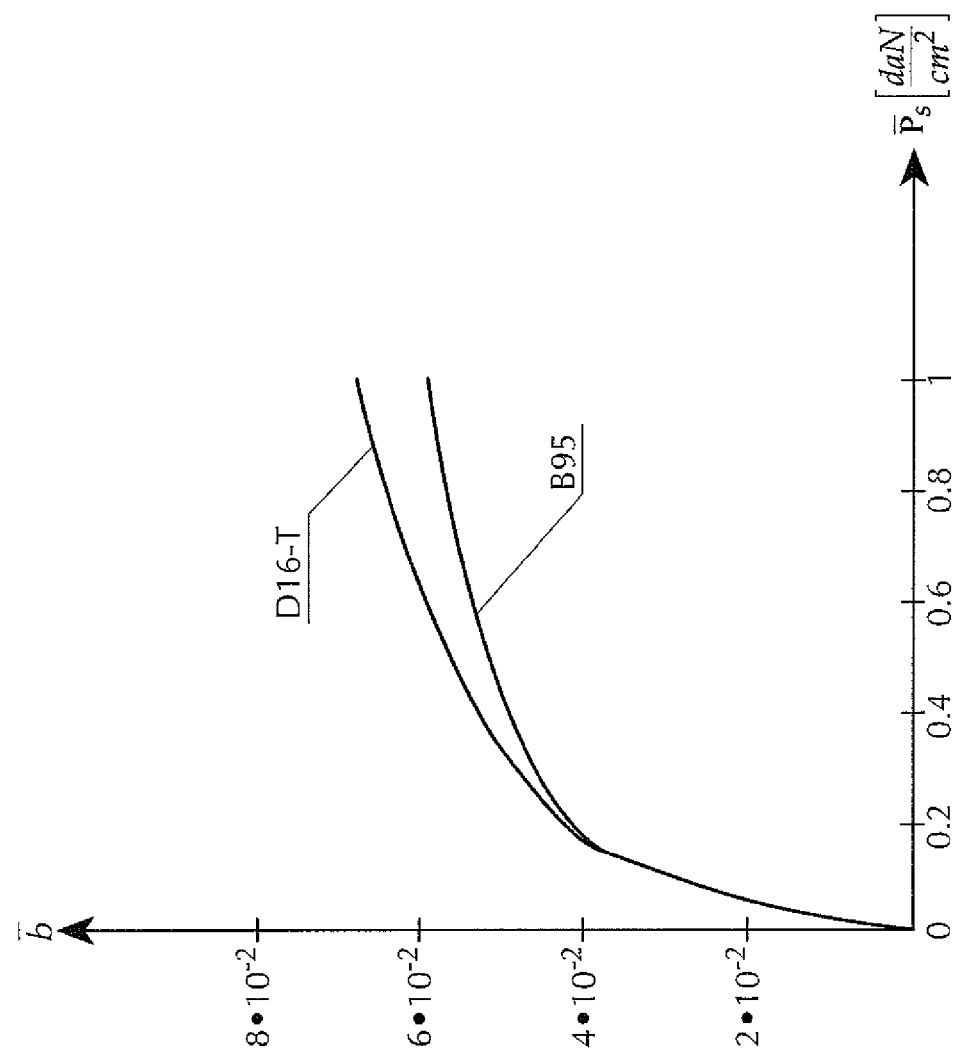

FIG. 37 is a plot showing scaled (dimensionless) characteristic dimension $$\bar{b} = \frac{b}{l_{re}}$$

versus TPM stress factor $$\bar{P}_s = \frac{P_s}{l_{re}^2},$$

L-shaped TPM.

Figure 38:
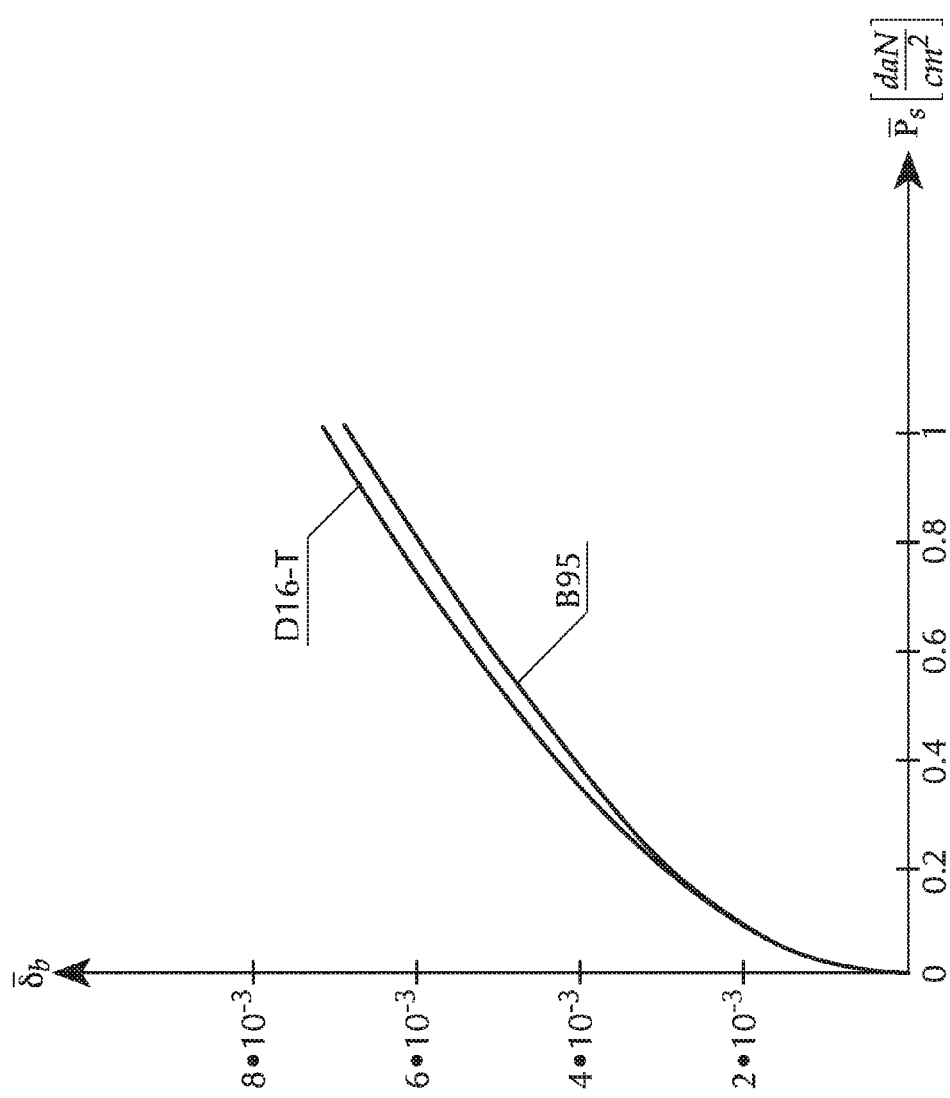

FIG. 38 is a plot showing scaled (dimensionless) characteristic dimension $$\bar{\delta}_b = \frac{\delta_b}{l_{re}}$$

versus TPM stress factor $$\bar{P}_s = \frac{P_s}{l_{re}^2},$$

L-shaped TPM.

Figure 39:
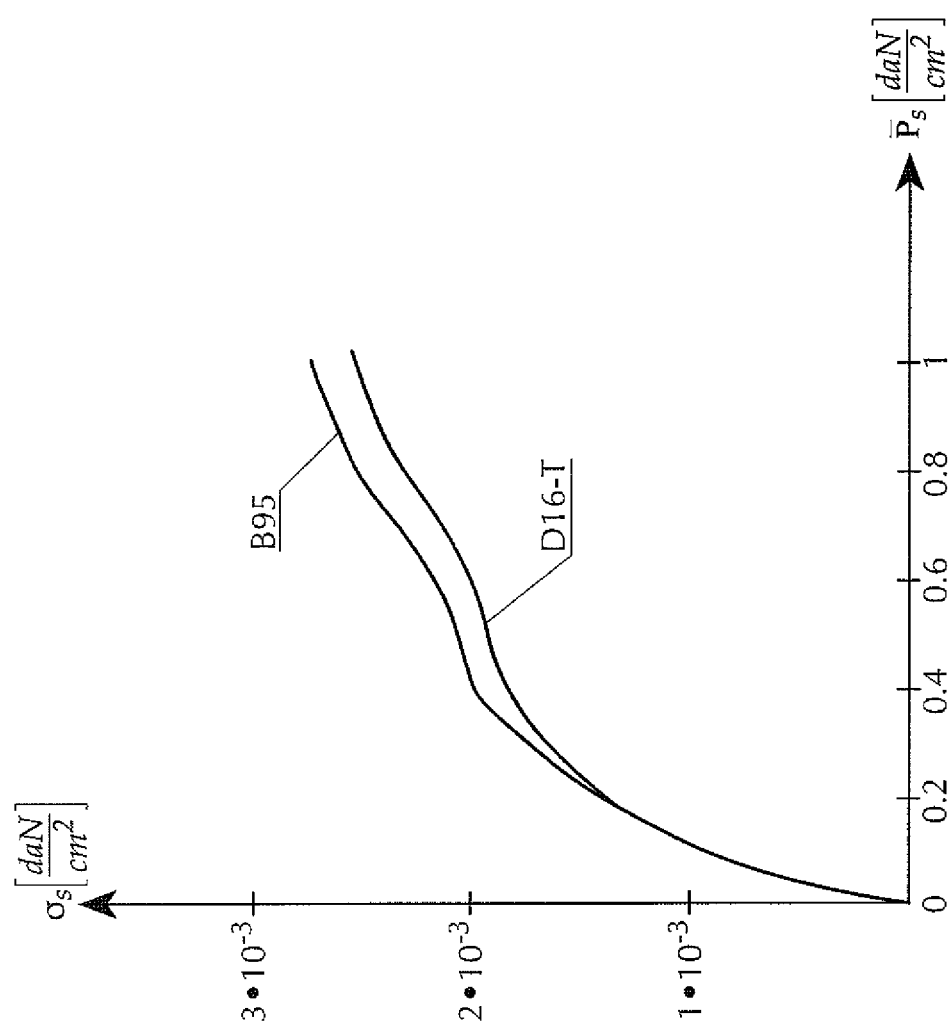

FIG. 39 is a plot showing optimum stress $\sigma_s$ versus TPM stress factor $$\bar{P}_s = \frac{P_s}{l_{re}^2},$$

L-shaped TPM.

Figure 40:
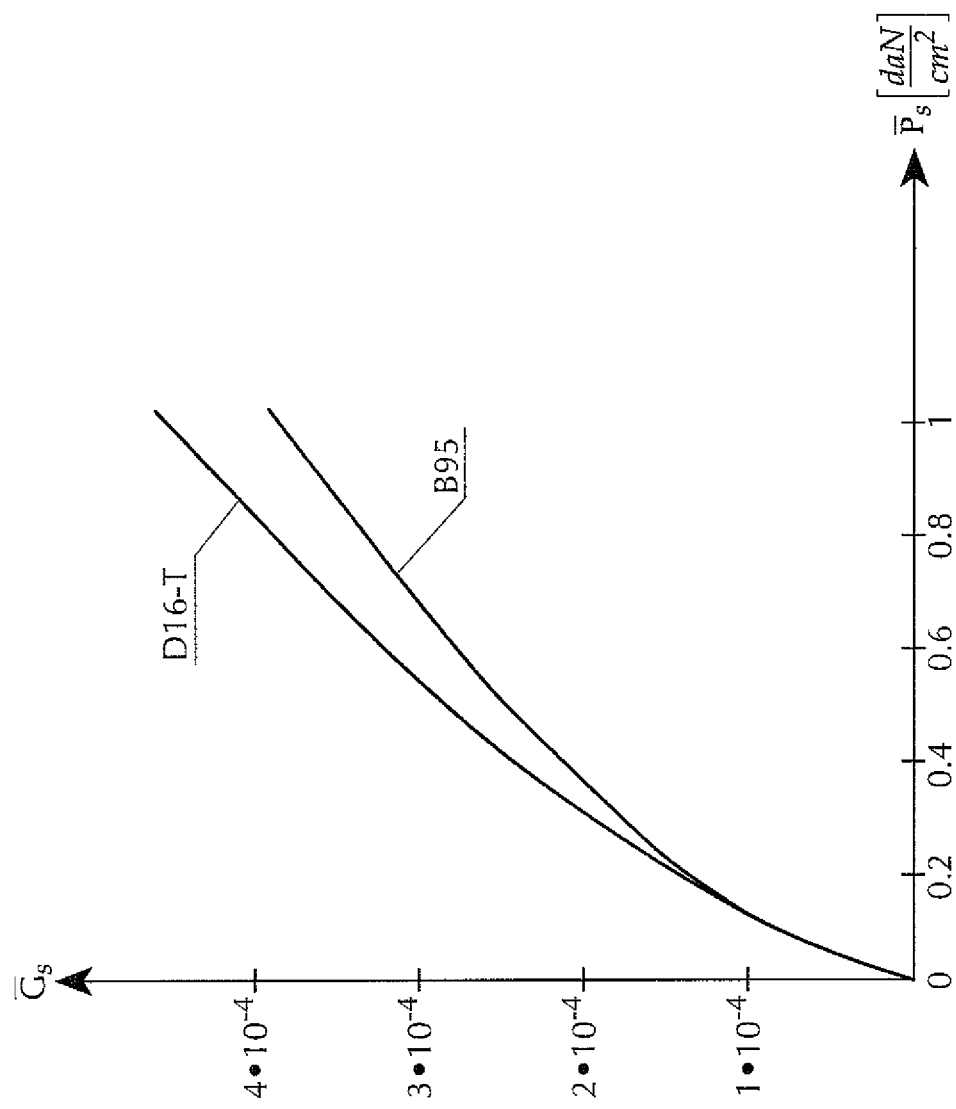

FIG. 40 is a plot showing dimensionless weight $$\bar{G}_s = \frac{G_s}{l_s \cdot l_{re}^2 \cdot \gamma}$$

versus TPM stress factor $$\bar{P}_s = \frac{P_s}{l_{re}^2},$$

L-shaped TPM.

FIG. 41 is a table showing feasible dimensions of U-shaped TPM.

Figure 42:
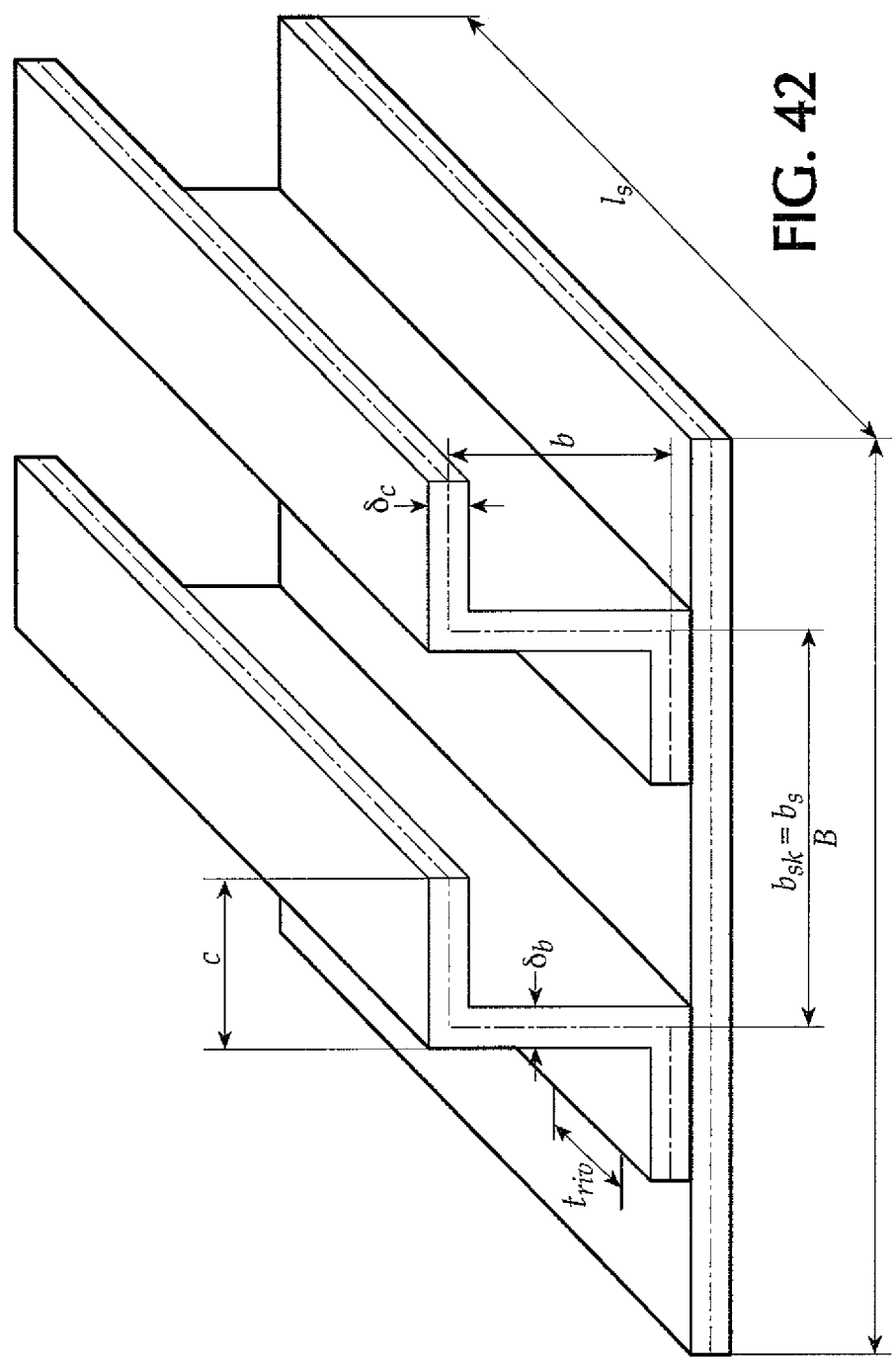

FIG. 42 shows a panel with Z-shaped TPM.

Figure 43:
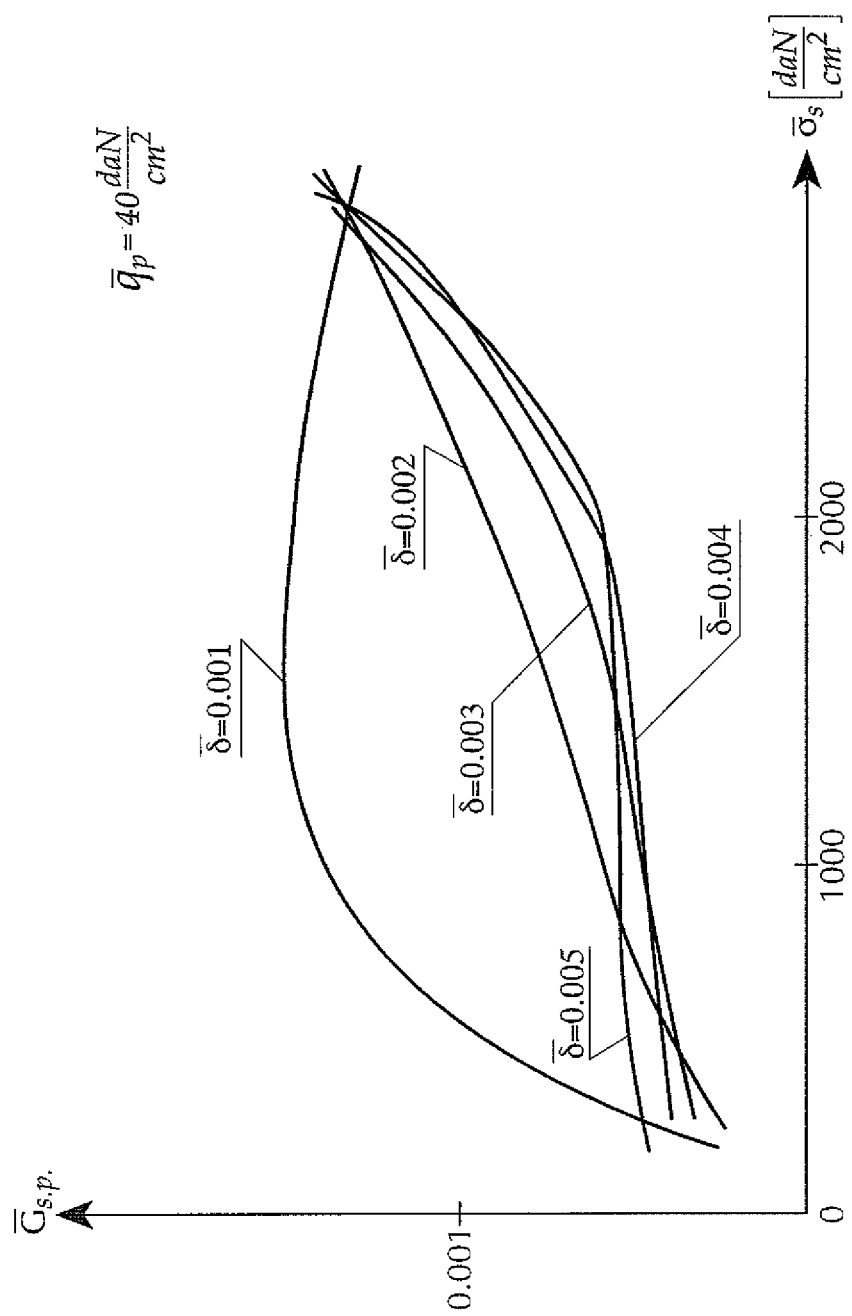

FIG. 43 is a plot showing dimensionless panel weight $$\bar{G}_s = \frac{G_s}{l_s \cdot l_{re}^2 \cdot \gamma}$$

versus TPM stress $\sigma_s$, U-shaped TPM.

Figure 44:
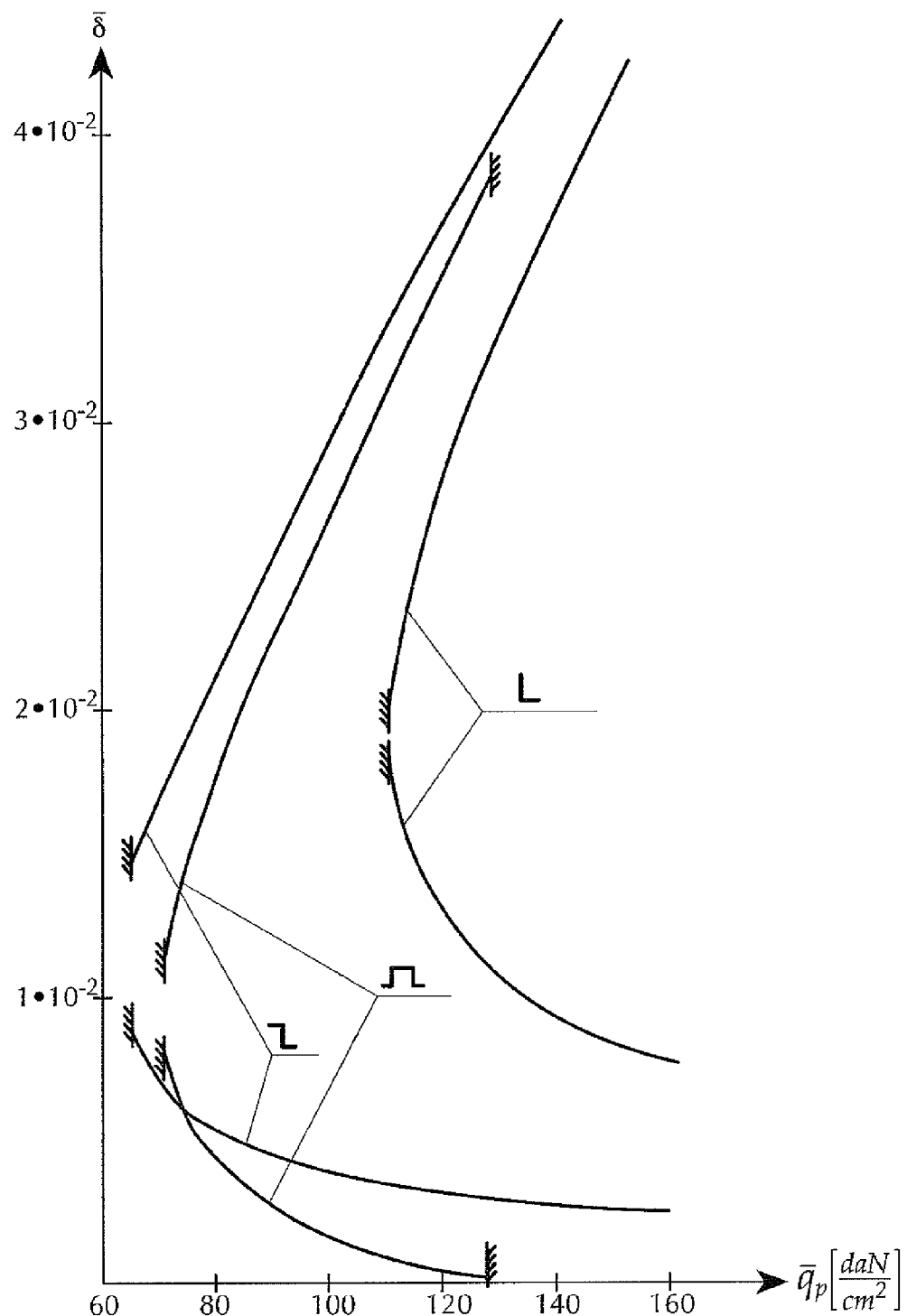

FIG. 44 is a plot showing dimensionless skin thickness $$\bar{\delta} = \frac{\delta}{l_{re}}$$

versus the panel stress factor $$\bar{q}_p = \frac{q_p}{l_{re}},$$

material D16-T (minimum weight panel).

Figure 45:
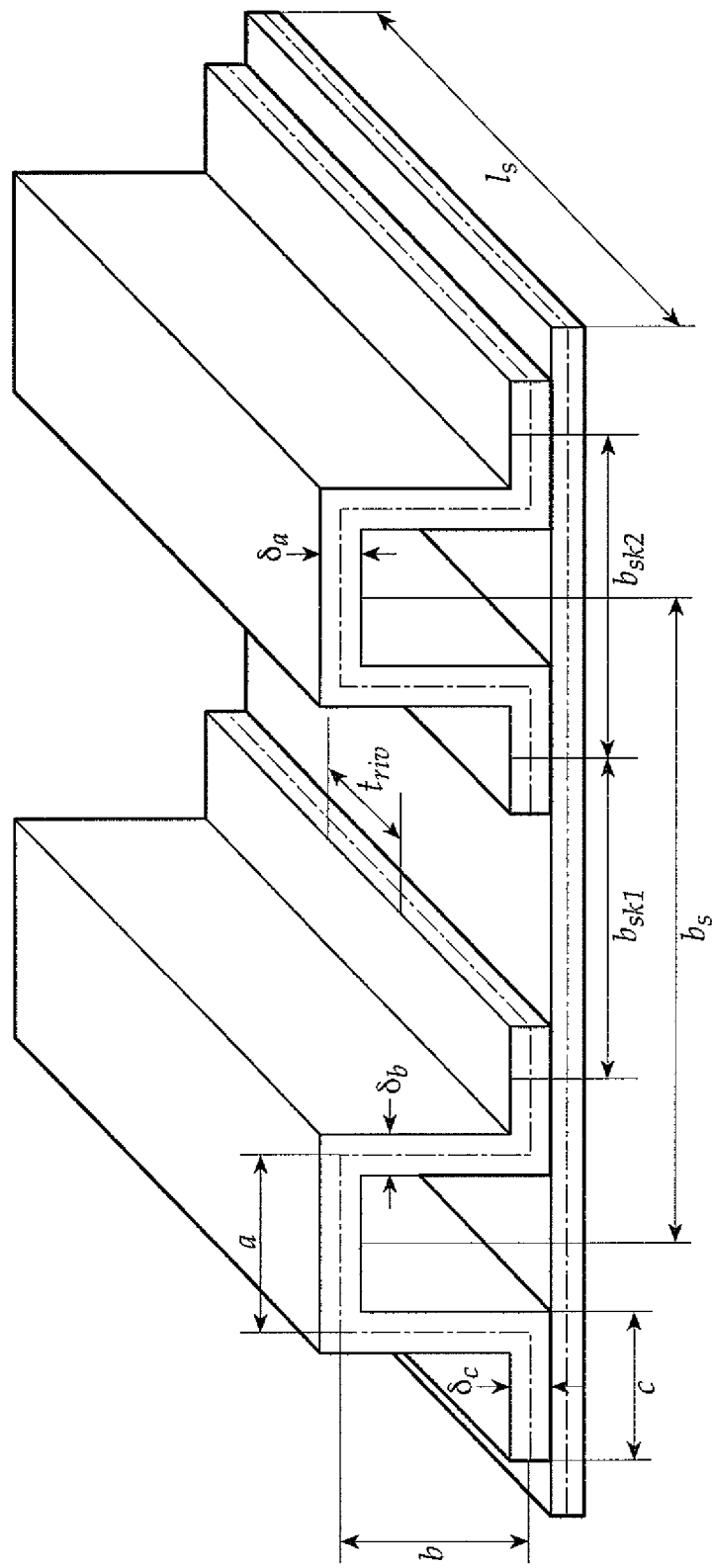

FIG. 45 is a stringer panel with U-shaped TPM.

Figure 46:
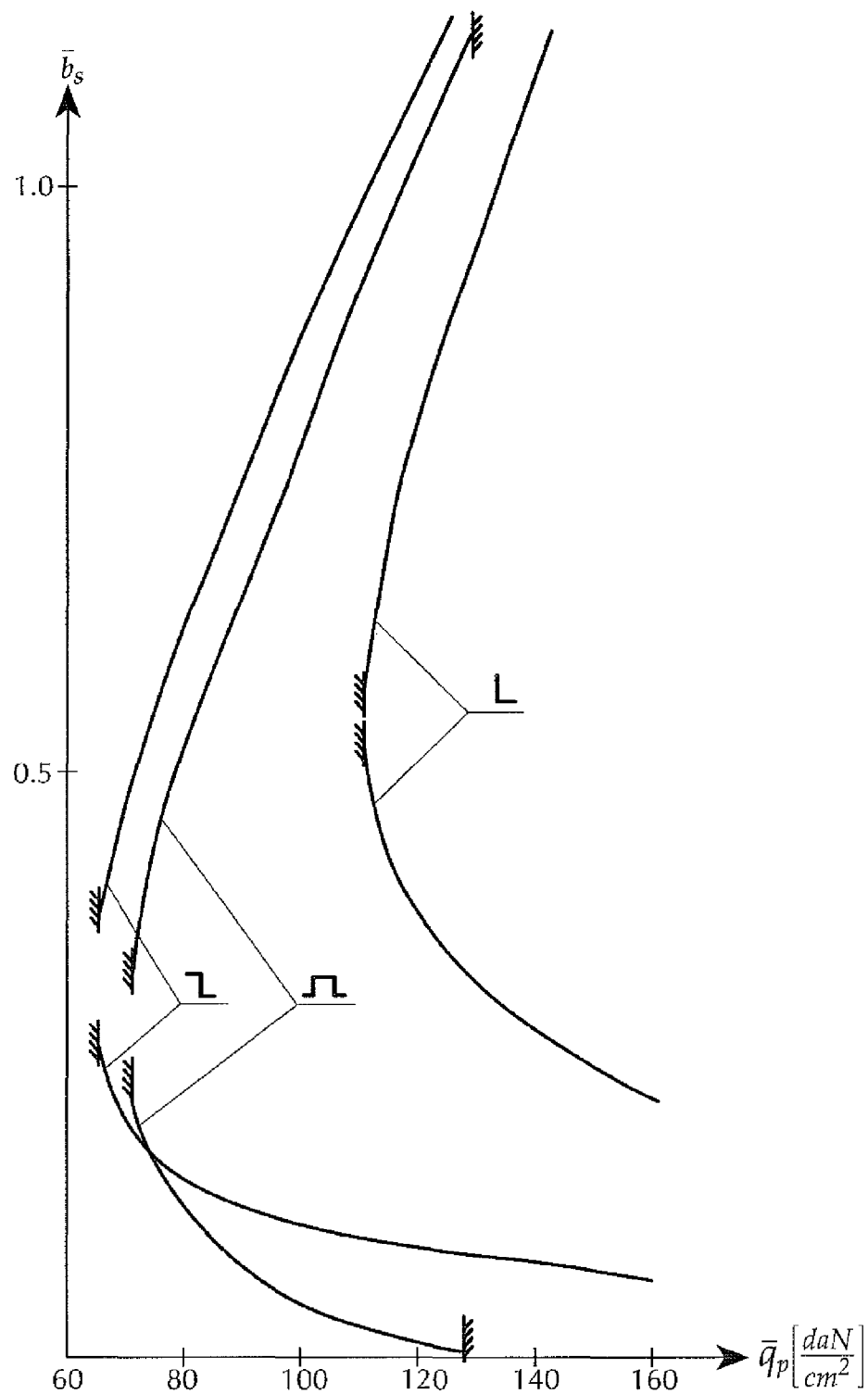

FIG. 46 is a plot showing dimensionless distance between stringers $$\bar{b}_s = \frac{b_s}{l_{re}}$$

versus the panel stress factor $$\bar{q}_p = \frac{q_p}{l_{re}},$$

material D16-T (minimum weight panel).

Figure 47:
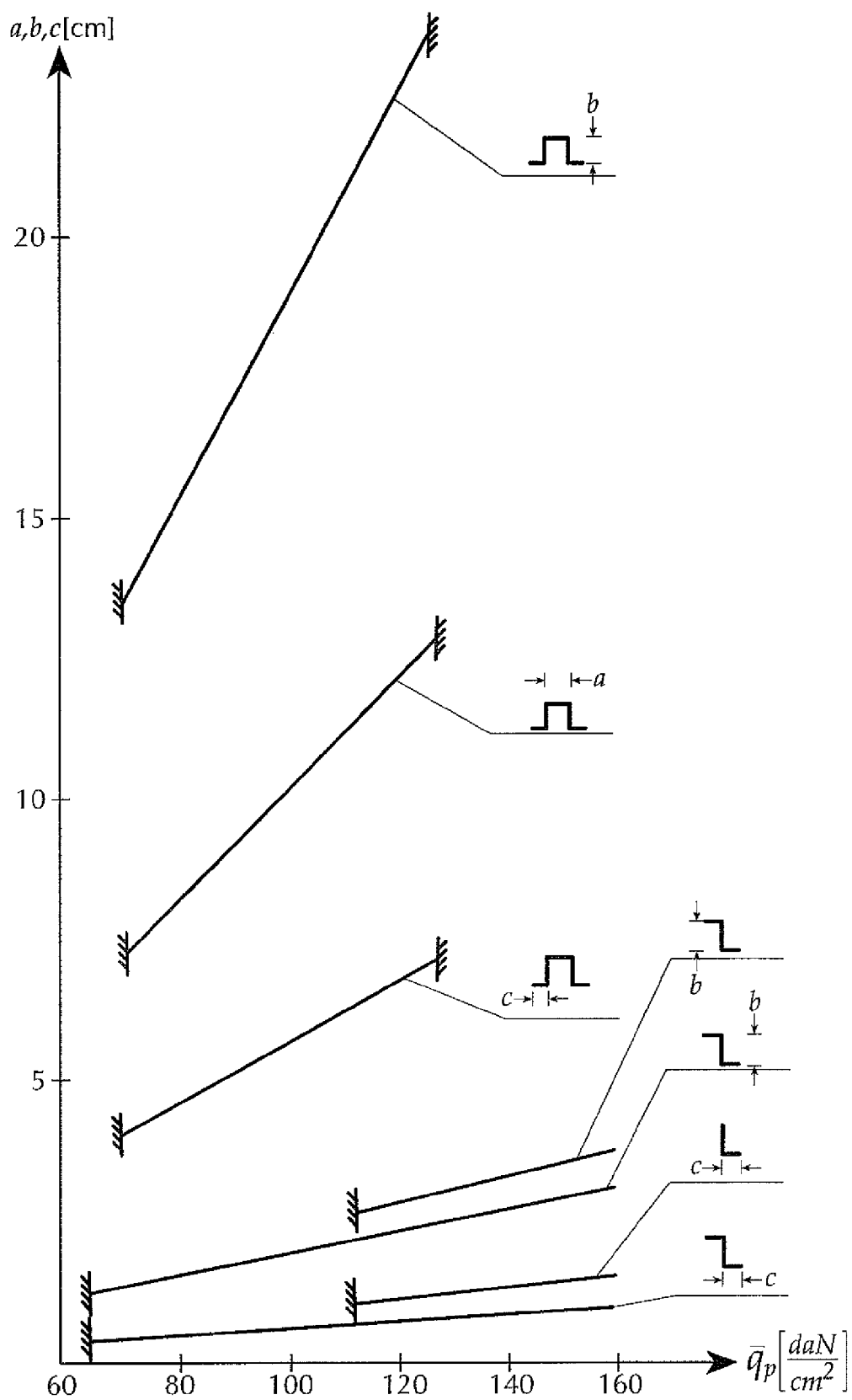

FIG. 47 is a plot showing TPM shape width a, b, c versus the panel stress factor $$\bar{q}_p = \frac{q_p}{l_{re}},$$

material D16-T (minimum weight panel).

Figure 48:
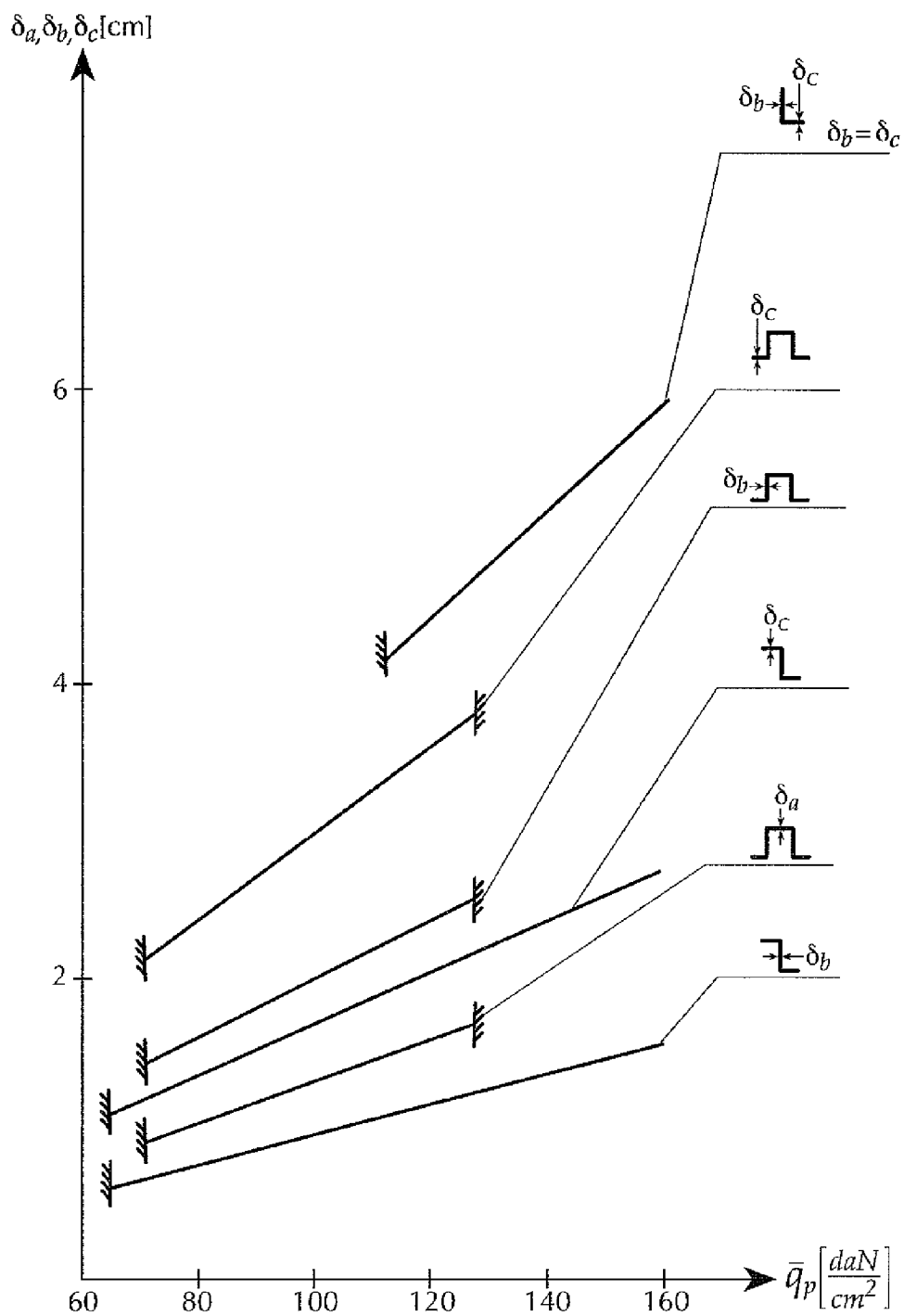

FIG. 48 is a plot showing TPM shape thickness $\delta_a$, $\delta_b$, $\delta_c$ versus the panel stress factor $$\bar{q}_p = \frac{q_p}{l_{re}},$$

material D16-T (minimum weight panel).

Figure 49:
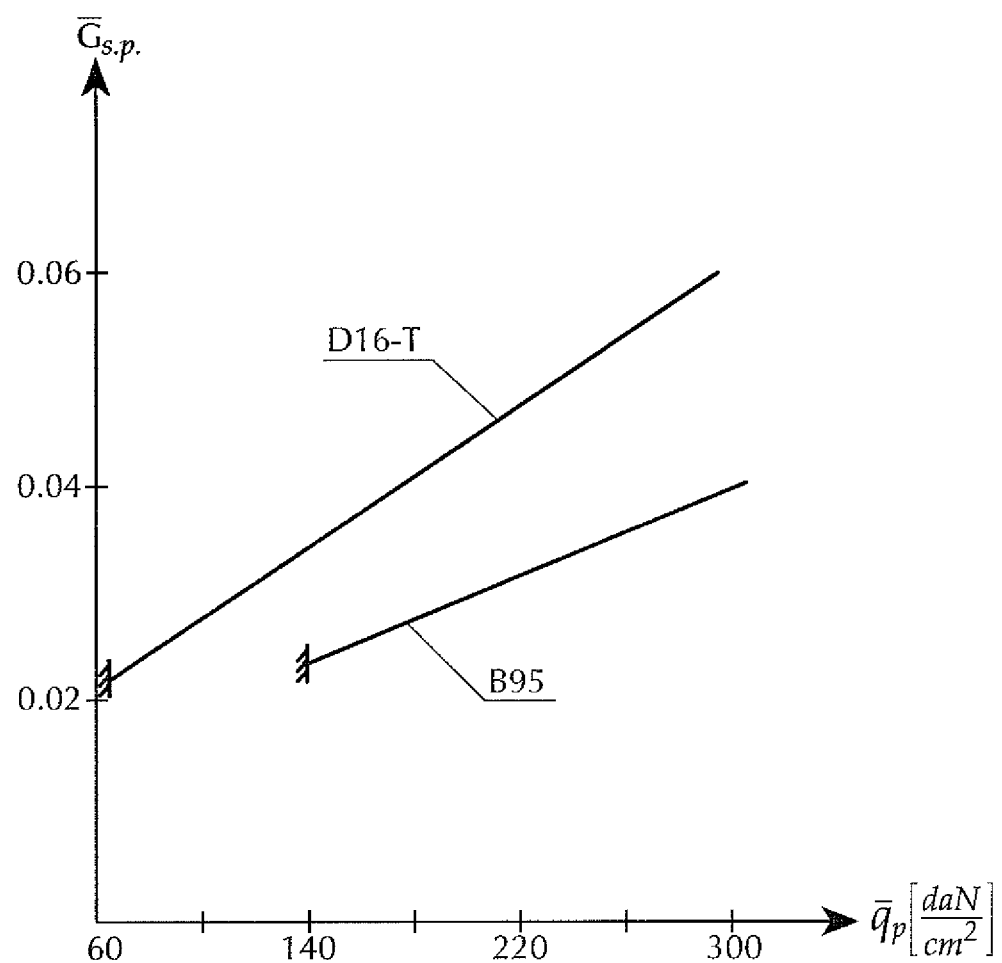

FIG. 49 is a plot showing dimensionless panel weight $$\bar{G}_s = \frac{G_s}{l_s \cdot l_{re}^2 \cdot \gamma}$$

versus the panel stress factor $$\bar{q}_p = \frac{q_p}{l_{re}},$$

materials D16-T and B95 (least feasible weight panel).

Figure 50:
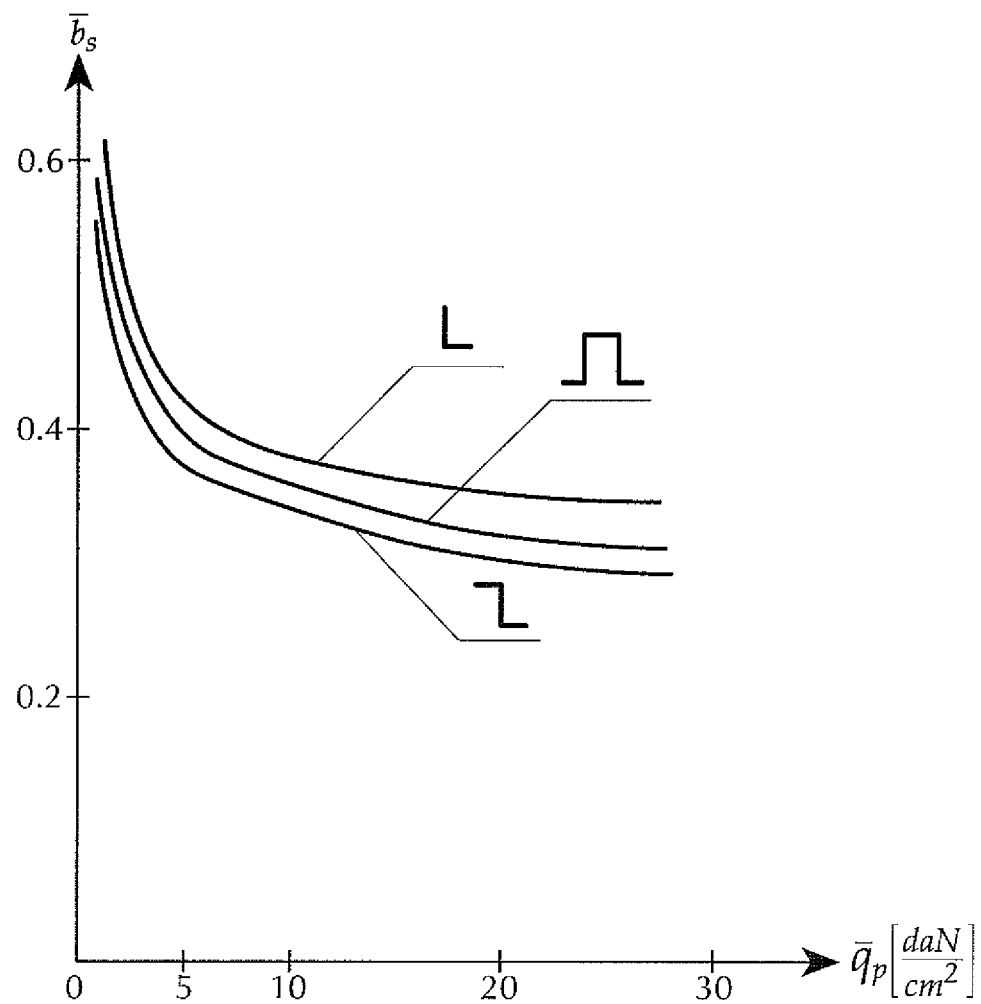

FIG. 50 is a plot showing dimensionless distance between stringers $$\bar{b}_s = \frac{b_s}{l_{re}}$$

versus the panel stress factor $$\bar{q}_p = \frac{q_p}{l_{re}},$$

material D16-T (least feasible weight panel).

Figure 51:
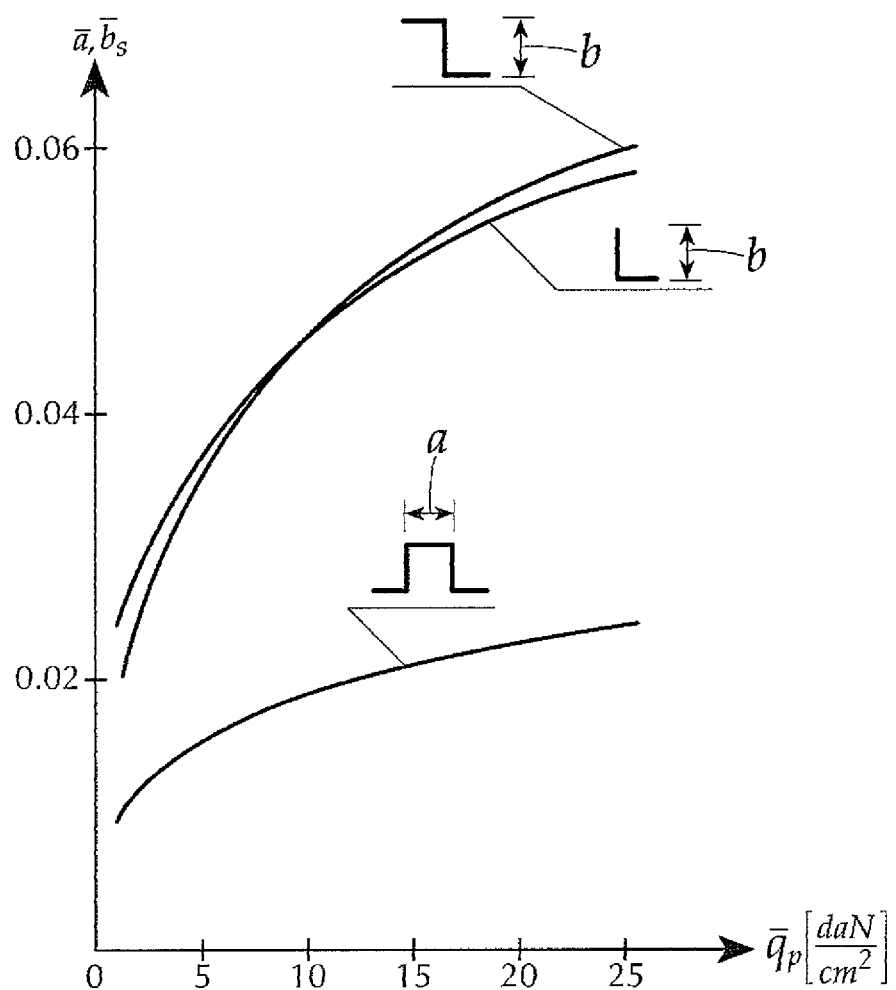

FIG. 51 is a plot showing dimensionless length of TPM shapes $$\bar{a} = \frac{a}{l_{re}}, \bar{b} = \frac{b}{l_{re}}$$

versus the panel stress factor $$\bar{q}_p = \frac{q_p}{l_{re}},$$

material D16-T (least feasible weight panel).

Figure 52:
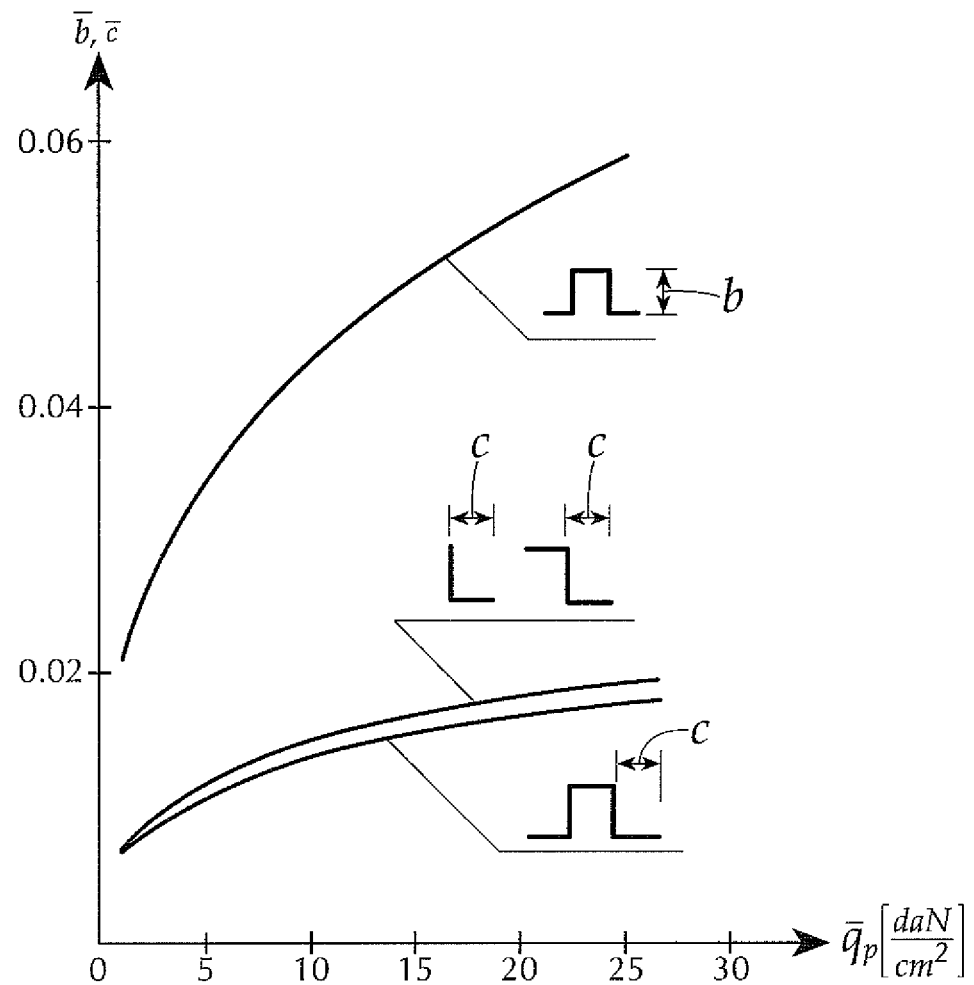

FIG. 52 is a plot showing dimensionless length of TPM shapes $$\bar{b} = \frac{b}{l_{re}}, \bar{c} = \frac{c}{l_{re}}$$

versus the panel stress factor $$\bar{q}_p = \frac{q_p}{l_{re}},$$

material D16-T (least feasible weight panel).

Figure 53:
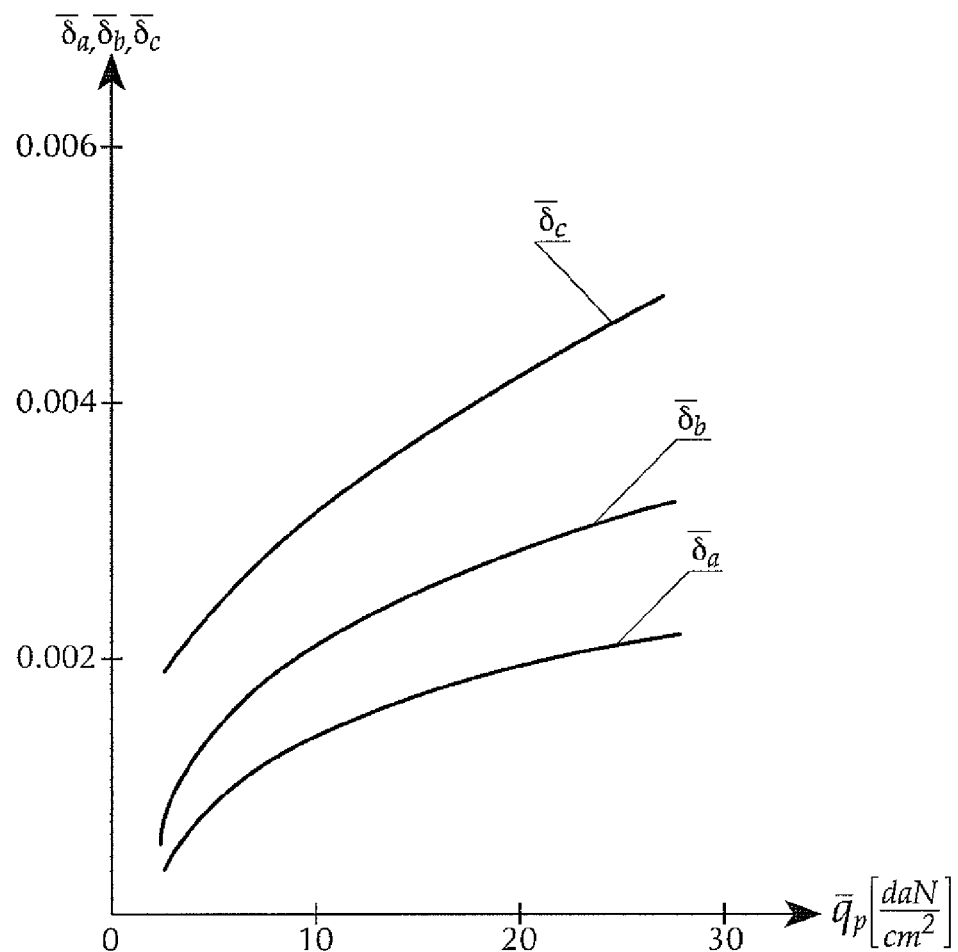

FIG. 53 is a plot showing dimensionless thickness of U-shaped TPM $$\bar{\delta}_a = \frac{\delta_a}{l_{re}}, \bar{\delta}_b = \frac{\delta_b}{l_{re}}, \bar{\delta}_c = \frac{\delta_c}{l_{re}}$$

versus panel stress factor $$\bar{q}_p = \frac{q_p}{l_{re}^2},$$

material D16-T (least feasible weight panel).

Figure 54:
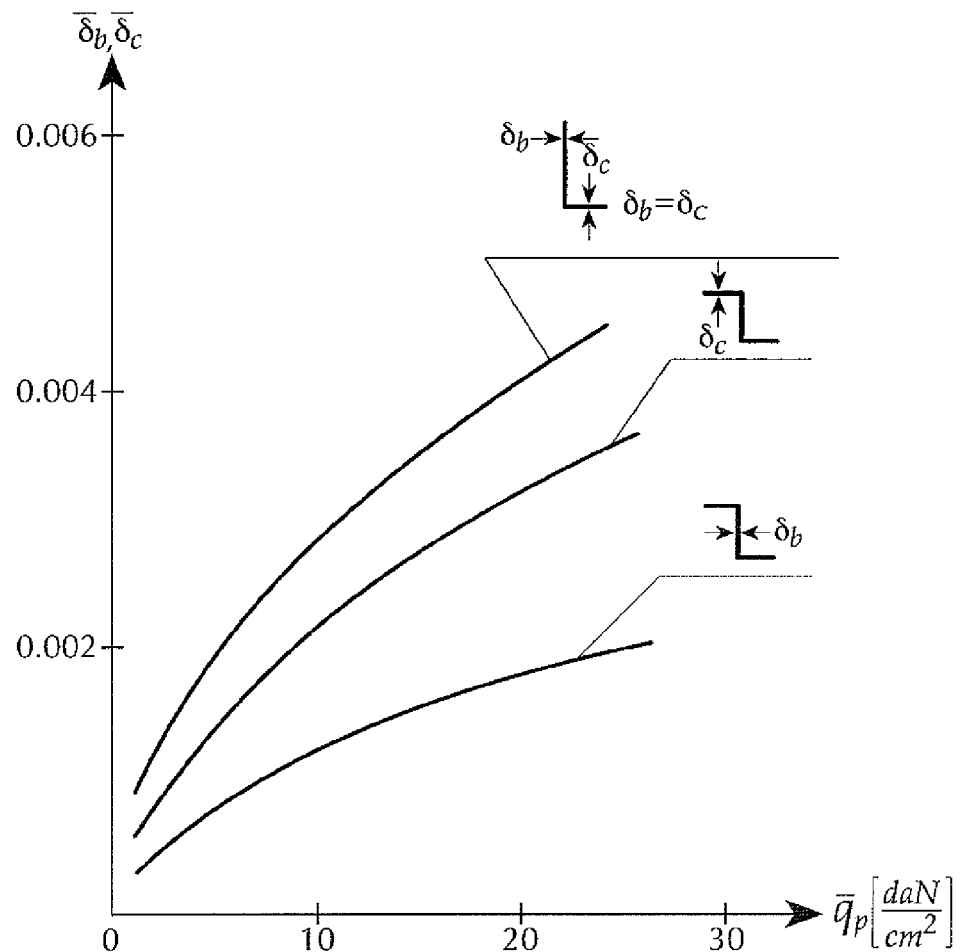

FIG. 54 is a plot showing dimensionless thickness of TPM $$\bar{\delta}_b = \frac{\delta_b}{l_{re}}, \bar{\delta}_c = \frac{\delta_c}{l_{re}}$$

versus panel stress factor $$\bar{q}_p = \frac{q_p}{l_{re}^2},$$

material D16-T (least feasible weight panel).

Figure 55:
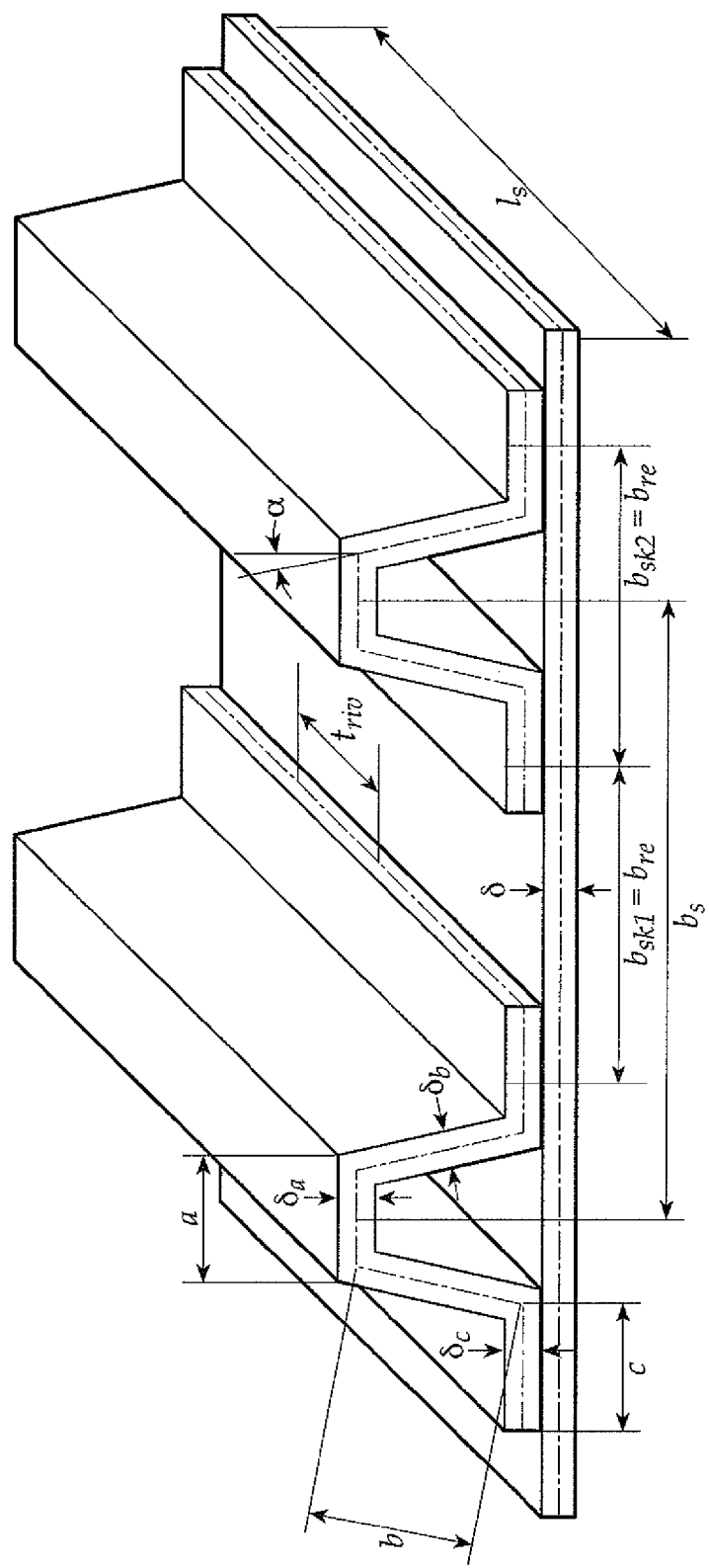

FIG. 55 is a stringer panel with U-shaped TPM possessing inclined lateral web.

Figure 56:
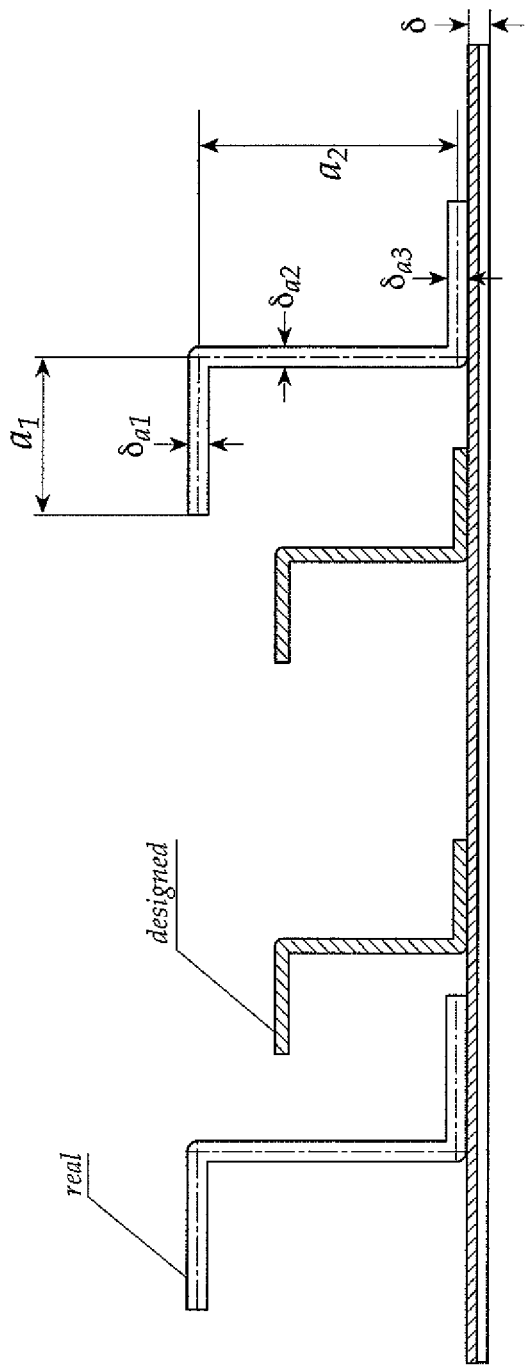

FIG. 56 shows real and optimum-design stringer panels.

FIG. 57 are tables showing (i) a range of allowable values for stringer panel stress factors, and (ii) features of real and optimum-design panels.

FIG. 58 shows a rib-reinforced stringer panel.

Figure 59:
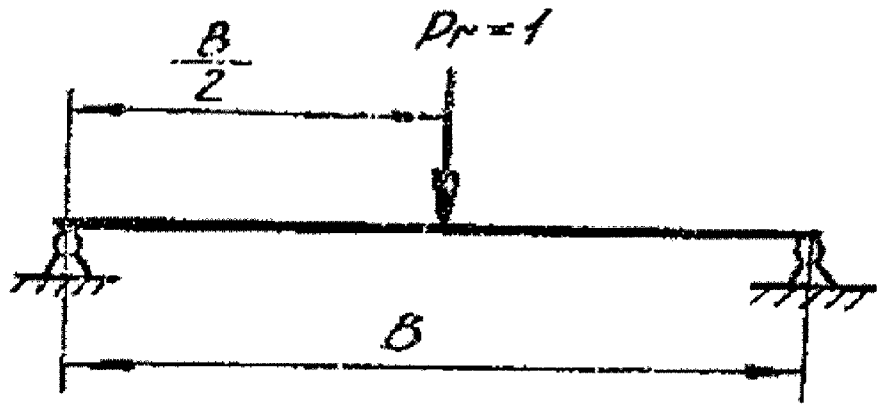

FIG. 59 shows scheme for determining of the critical rigidity of ribs.

Figure 60:
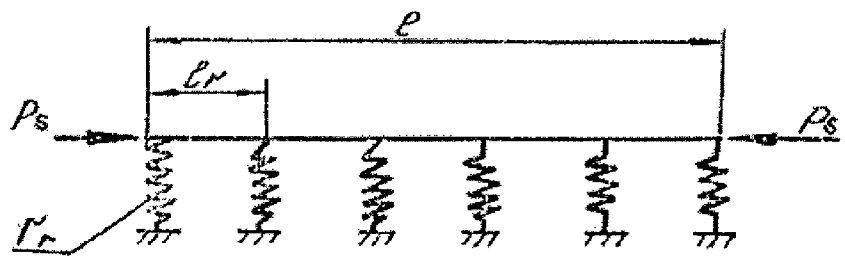

FIG. 60 shows scheme for determining of the rigidity of ribs.

Figure 61:
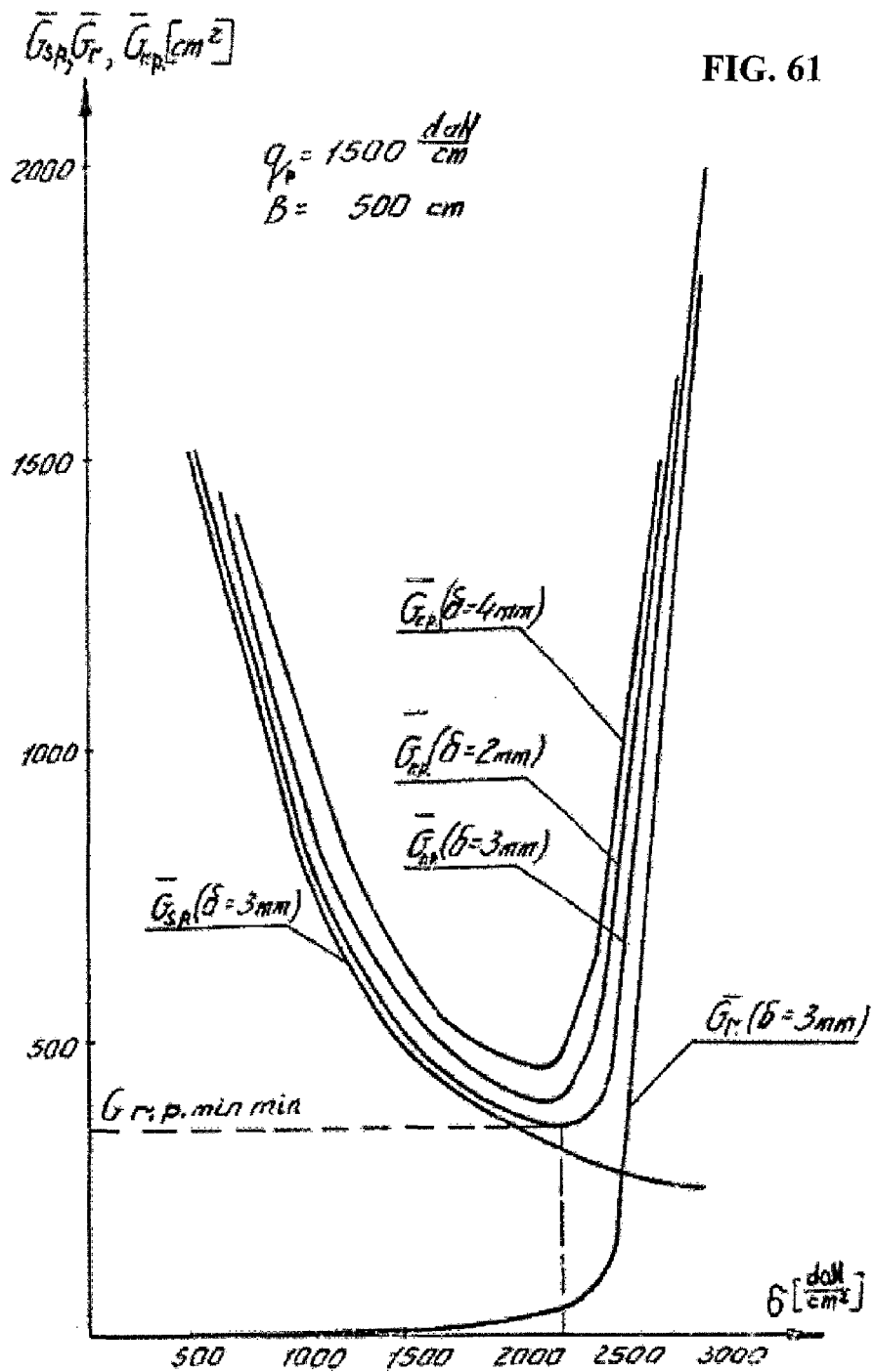

FIG. 61 is a plot of dimensionless weight of the stringer panel $$\bar{G}_{p.s} = \frac{G_{p.s}}{l \cdot \gamma},$$

ribs $$\bar{G}_r = \frac{G_r}{l \cdot \gamma}$$

and rib-reinforced stringer panel $\bar{G}_{p.r} = \bar{G}_{p.s} + \bar{G}_r$ versus panel stress σ, material D16-T.

Figure 62:
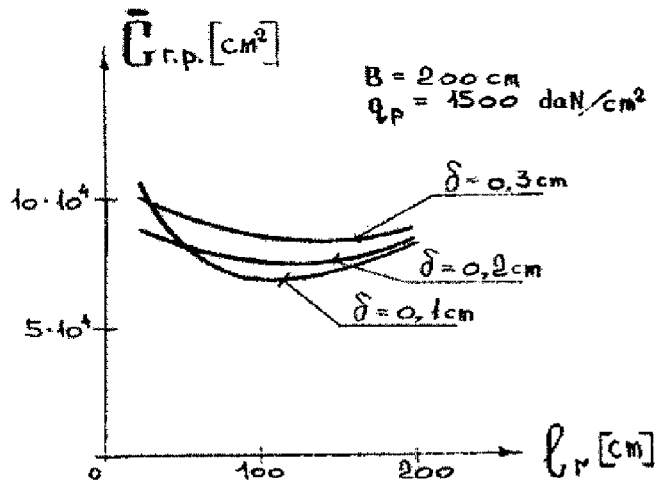

FIG. 62 is a plot of dimensionless weight of the rib-reinforced stringer panel $$\overline{G}_{p.s} = \frac{G_{p.s}}{l \cdot \gamma}$$

versus distance between ribs $l_r$, material D16-T.

Figure 63:
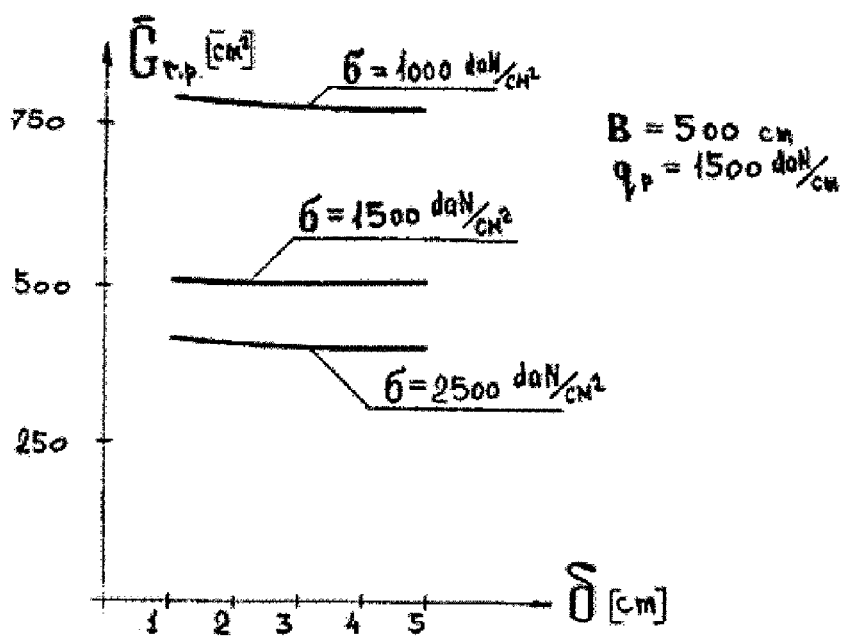

FIG. 63 is a plot of dimensionless weight of the rib-reinforced stringer panel $$\overline{G}_{p.r} = \frac{G_{p.r}}{l \cdot \gamma}$$

versus skin thickness δ, material D16-T.

Figure 64:
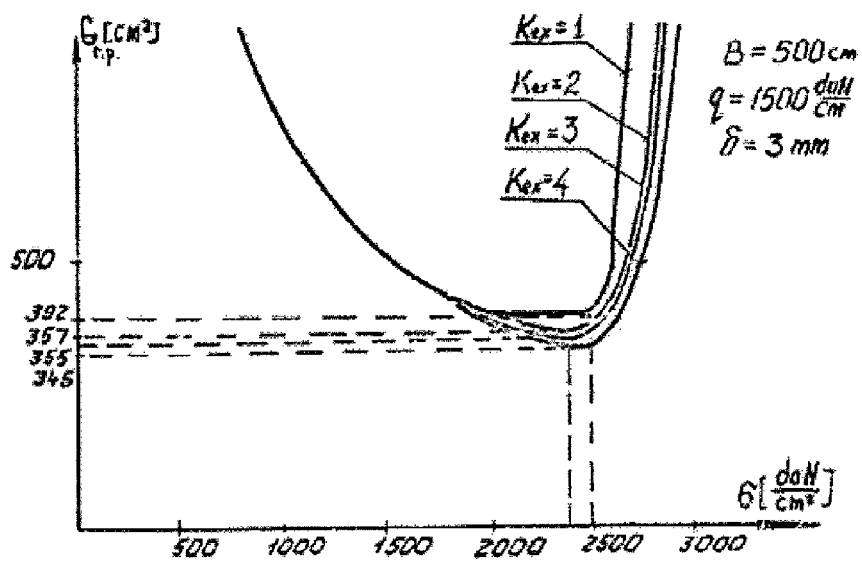

FIG. 64 is a plot of dimensionless weight $$\overline{G}_{p.r} = \frac{G_{p.r}}{l \cdot \gamma}$$

of the rib-reinforced stringer panel versus panel stress σ with varying rib rigidity factor.

Figure 65:
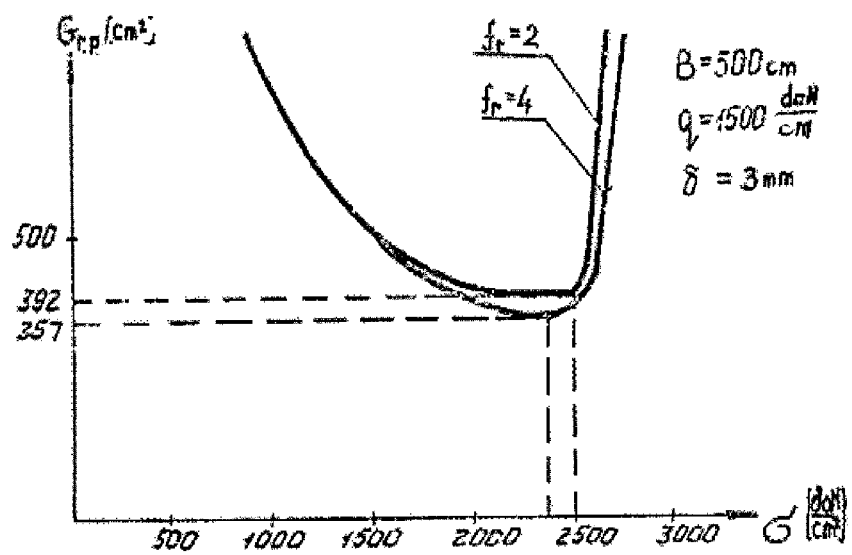

FIG. 65 is a plot of dimensionless weight $$\overline{G}_{p.r} = \frac{G_{p.r}}{l \cdot \gamma}$$

of the rib-reinforced stringer panel versus panel stress σ with varying rib shape factor $f_r$, material D16-T.

Figure 66:
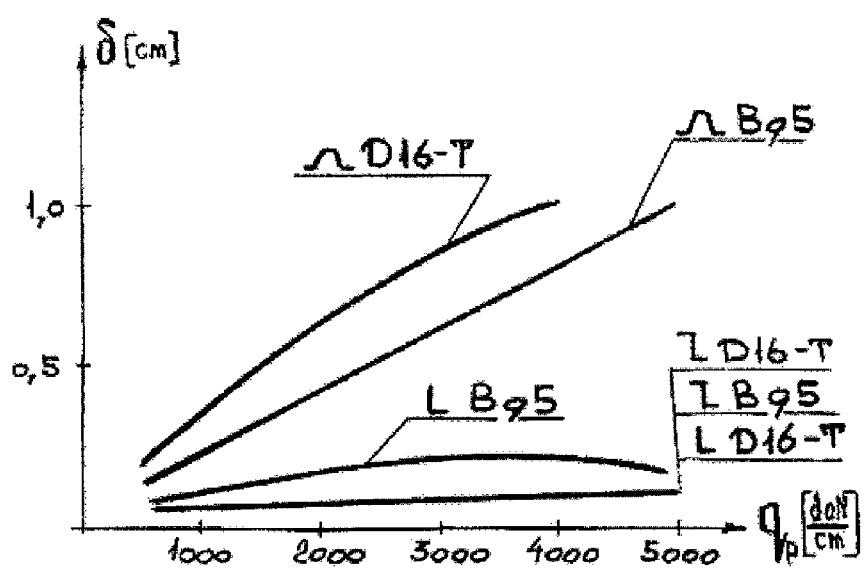

FIG. 66 plots skin thickness δ of the rib-reinforced stringer panel versus linear compressive force $q_p$.

Figure 67:
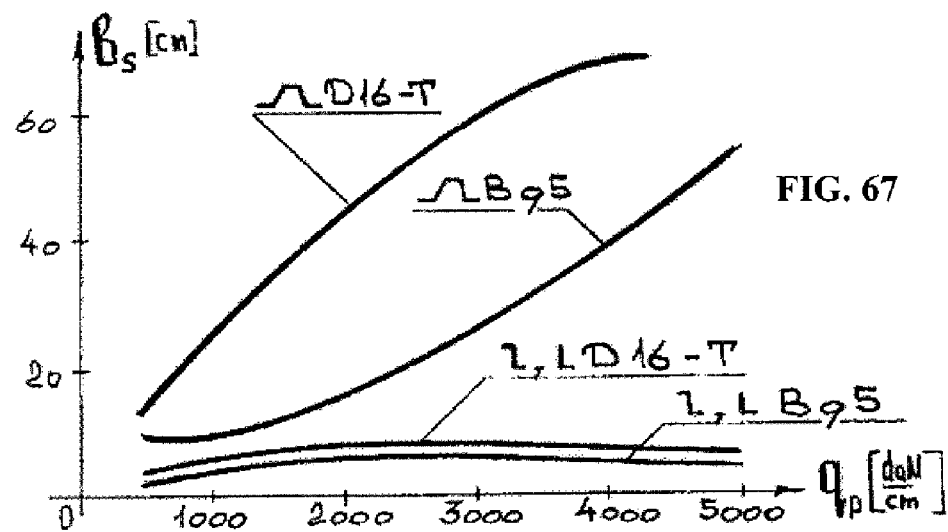

FIG. 67 plots distance between stringers $b_s$ of the rib-reinforced stringer panel versus linear compressive force $q_p$.

Figure 68:
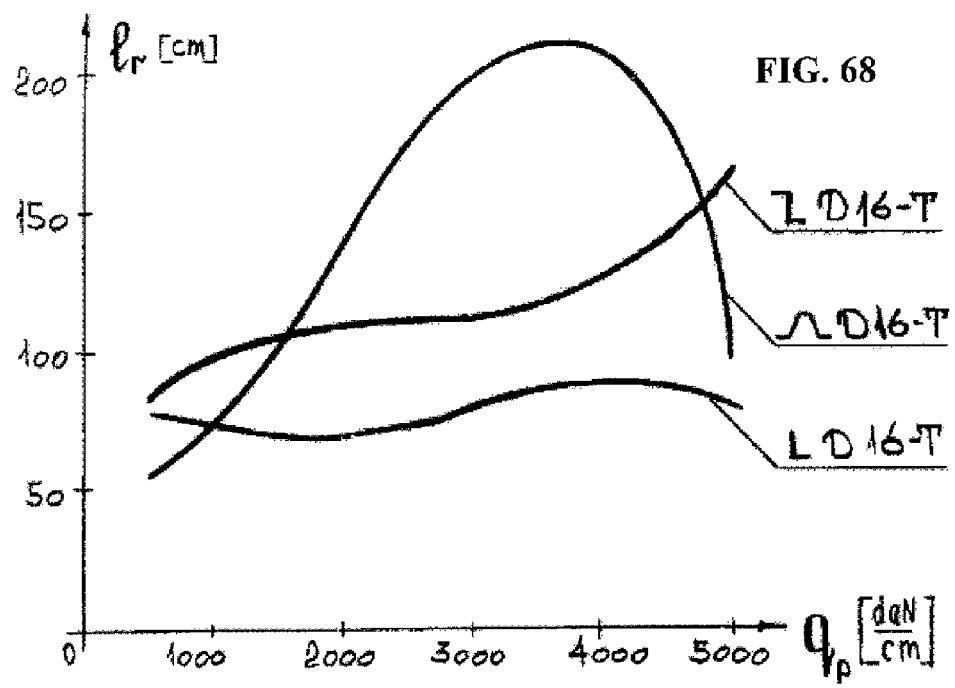

FIG. 68 plots distance between ribs $l_r$ of the rib-reinforced stringer panel versus linear compressive force $q_p$.

Figure 69:
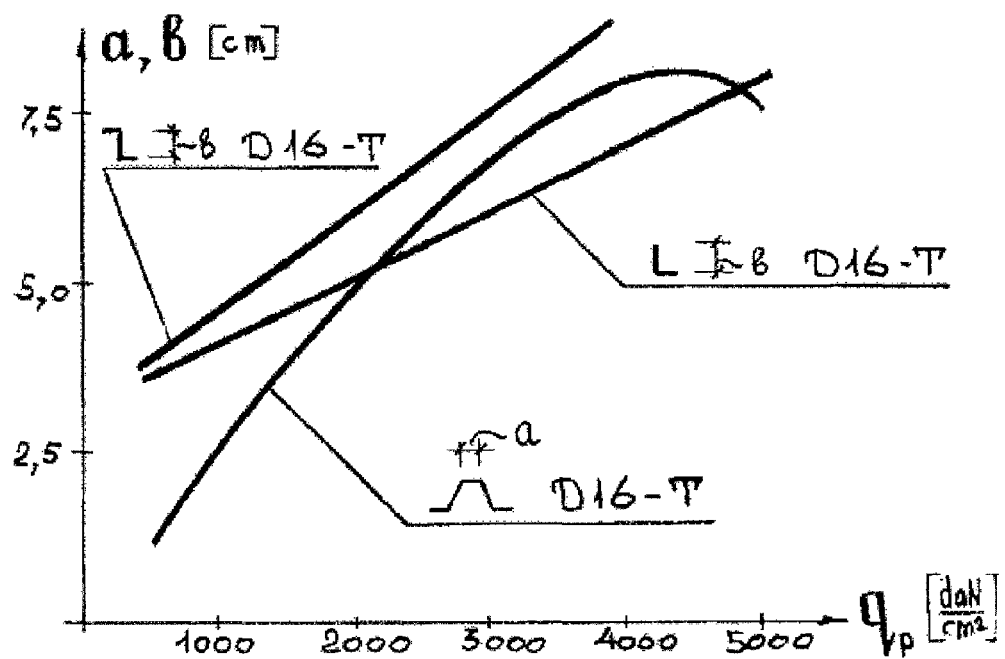

FIG. 69 plots characteristic dimensions of stringer shape a, b of the rib-reinforced stringer panel versus linear compressive force $q_p$.

Figure 70:
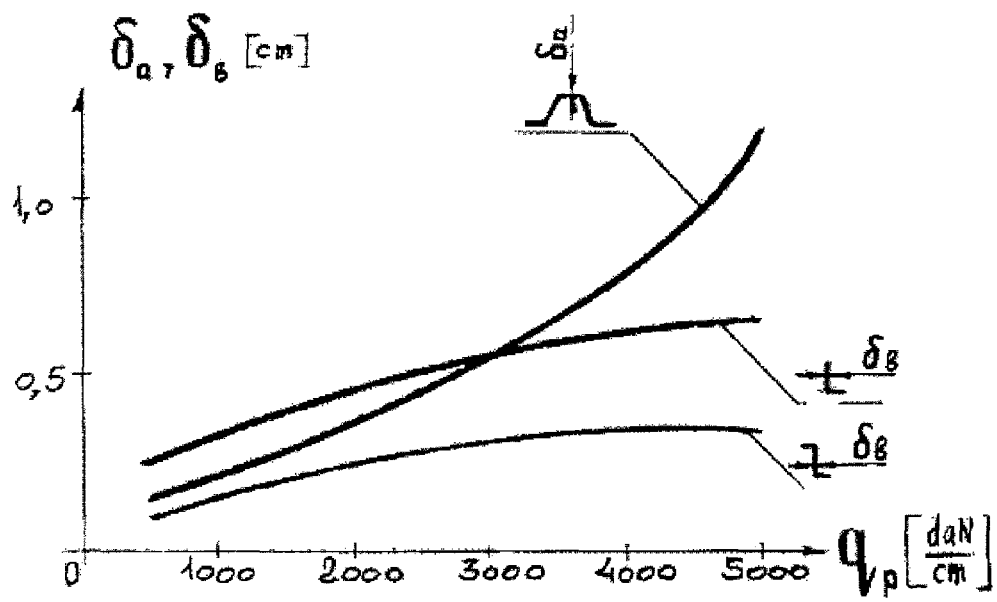

FIG. 70 plots characteristic thicknesses of stringer shape $\delta_a$, $\delta_b$ of the rib-reinforced stringer panel versus linear compressive force $q_p$.

Figure 71:
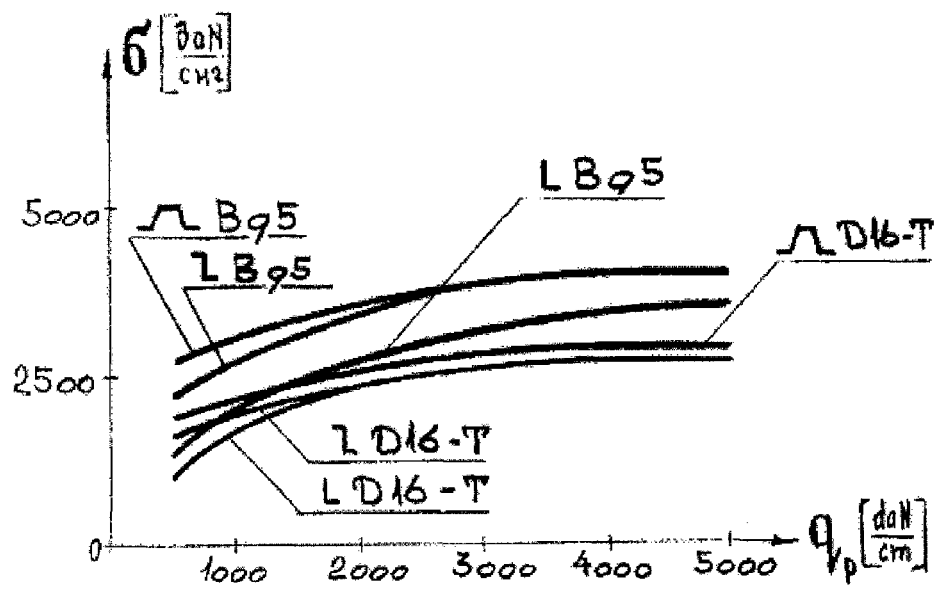

FIG. 71 plots optimal stress σ of the rib-reinforced stringer panel versus linear compressive force $q_p$.

Figure 72:
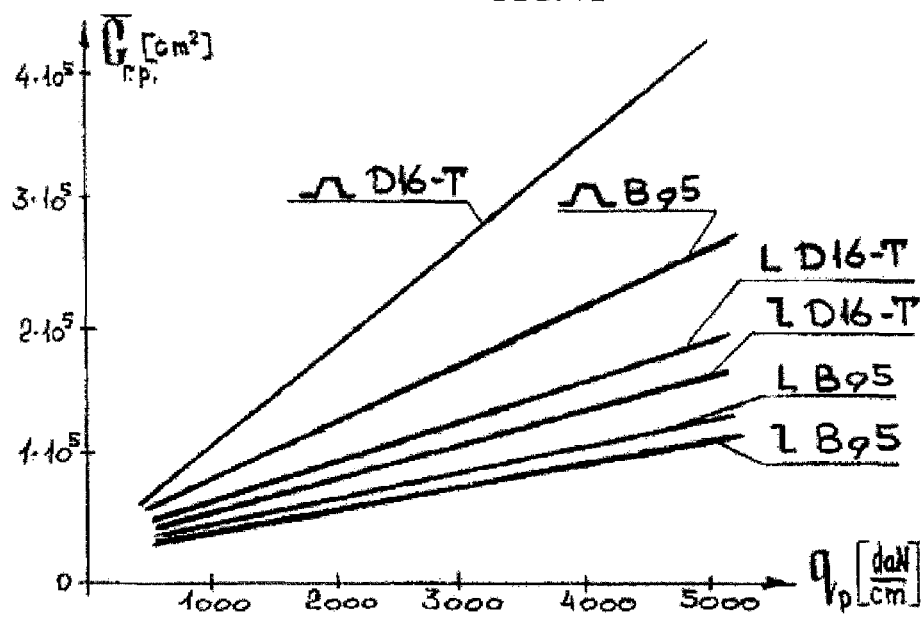

FIG. 72 plots dimensionless weight $$\overline{G}_{p.r} = \frac{G_{p.r}}{l \cdot \gamma}$$

of the rib-reinforced stringer panel versus linear compressive force $q_p$.

Figure 73:
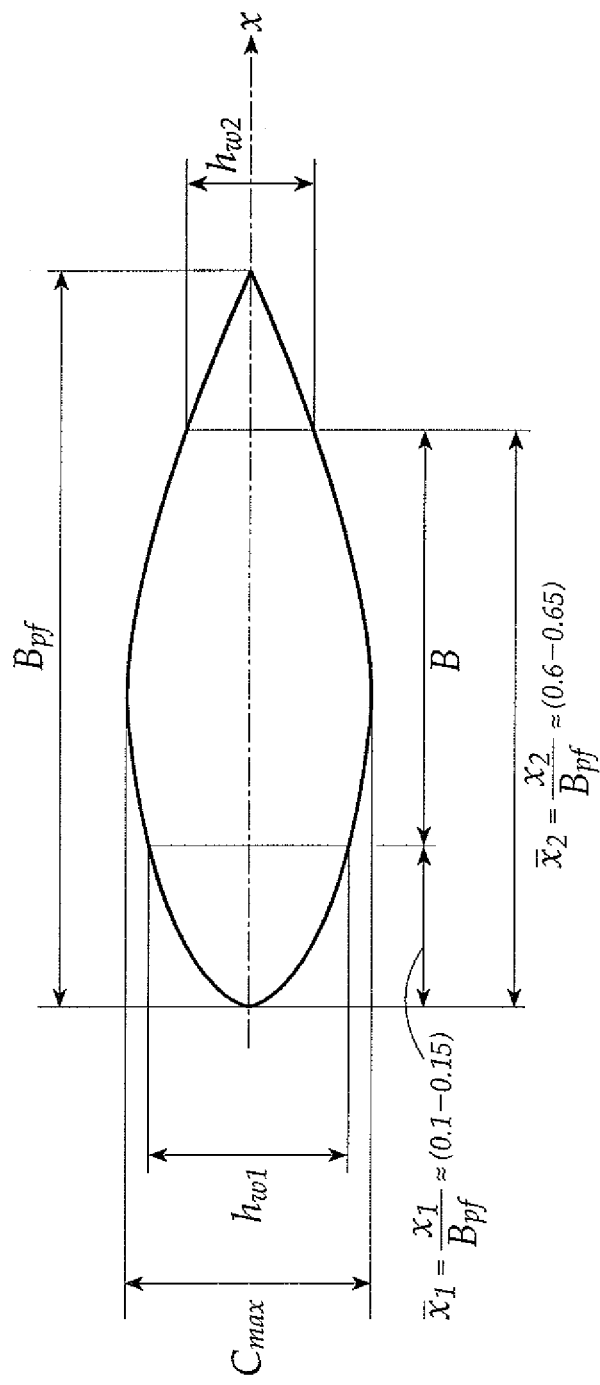

FIG. 73 plots aerodynamic profile of the wing with the specified position of the torsion box.

Figure 74:
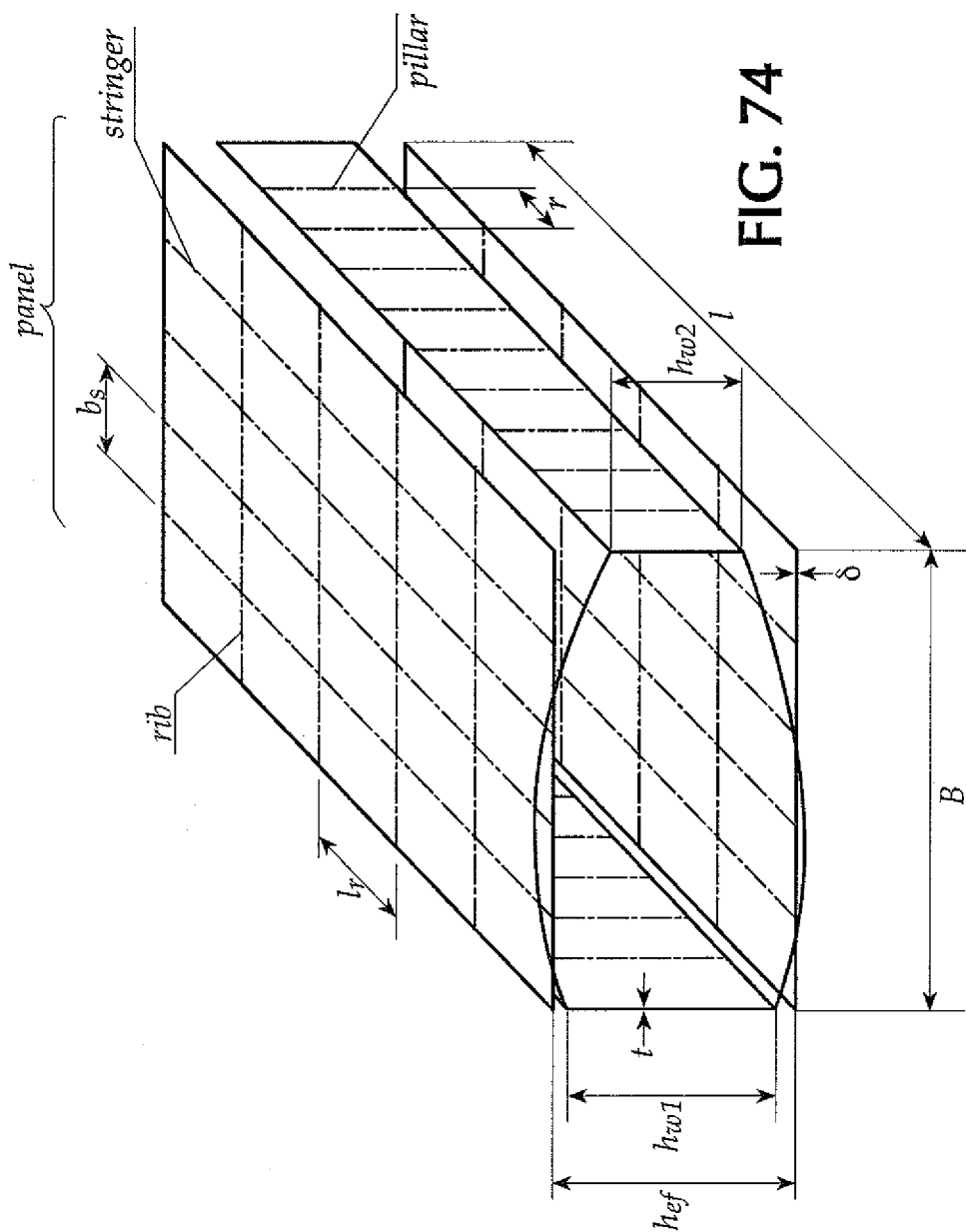

FIG. 74 shows a wing design scheme.

FIG. 75 is a table showing coefficients $K_{\sigma.w}$, $K_{\tau.w}$ in the formulae for web cell critical stresses.

FIG. 76 is a table showing factor θ versus web cell overall dimensions.

FIG. 77 is a table showing feasible coefficients for a stringer shape.

Figure 78:
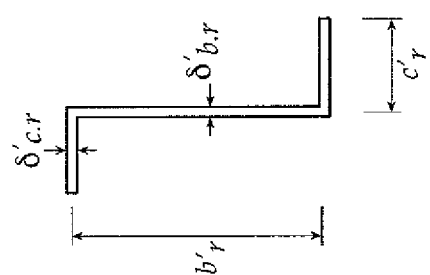

FIG. 78 is a table showing dimensions and geometrical characteristics of rib shape.

Figure 79:
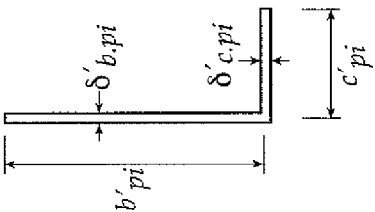

FIG. 79 is a table showing dimensions and geometrical characteristics of pillar shape.

DETAILED DESCRIPTION

The detailed description set forth below in connection with the appended drawings is intended as a description of exemplary embodiments of the present invention and is not intended to represent the only embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in schematic form with no additional detail in order to avoid obscuring the novelty of the exemplary embodiments presented herein.

The word "exemplary" is used herein to mean "serving as an example, instance, or illustration." Any embodiment described herein as "exemplary" is not necessarily to be construed as preferred or advantageous over other embodiments.

The subject matter of the present inventions may best be understood by reference to the following descriptions taken in connection with the accompanying drawings.

The present disclosure describes improved TMP and TMP-panel design optimization techniques. The techniques utilize advanced mathematical modeling techniques to perform practical multi-parameter associations.

The term "constructive restrictions" is used herein to refer to TPM dimensionality necessary to achieve desired structural, material and fabrication requirements and specifications.

Structural requirements for load-carrying TPMs and TPM-panel combinations are set to ensure stability and stiffness under compressive load. An excessive compression load could, for example, lead to buckling, an unstable condition affecting the TPM but also potentially the surrounding environment.

Material requirements for load-carrying TPMs and TPM-panel combinations are set to ensure minimum weight objectives at maximum expected load-bearing capacity.

Fabrication requirements for load-carrying TPMs and TPM-panel combinations are typically associated with manufacture or design specific parameters relating to sizing, cost, proper fit, etc. An example set of fabrication type requirements may be requirements that call for minimum thickness of TPM to allow mass production, providing a panel sheet thickness which conforms to standard thickness values, and ensuring that any design allows for any flanges incorporated thereon, for example, to allow the mounting of rivets.

For purposes of the present disclosure, a constructive restriction is any variable which plays any role whatsoever in the ability to achieve the best possible weight optimization limited only by the available of TPM and/or TPM-panel configurations available for selection by a designer as part of the design process.

Glossary of Terms to be Used

| | |
|---|---|
| Bow | Longitudinal curvatures of rod, bar, shapes and tube. |
| Buckle | A distortion of the surface of the material. |
| Elasticity | The ability of a material or body to return to its original shape and dimensions after being deformed by stress. |
| Profile/Shape | A product that is long in relation to its cross-sectional dimensions (not a wire, a rod, or a bar), formerly termed a "shape". |
| Proportionality limit stress | The maximum stress which a metal still obeys Hooke's Law. |
| Structural shape | A section of any design accepted as standard by the structural industry; such shape include I-beam, wide flange of H-beam, channels, angles, tees and zees. |
| Ultimate stress | The maximum stress (tensile, compressive, or shear) that a material can withstand. |
| Yield stress | The stress at which a material exhibits a specified permanent set. For aluminum allow and steel is 0.2% of gauge length; for aluminum allow the yield stresses in tension and compression are approximately equal. |
| Thin wall structures | Three dimensions of these structures are expressed by three values of different magnitude (shapes, tubes, wires, rods, bars), or two out of three dimensions of such structures are expressed by values of the same magnitude, and the third one, related to thickness, represents a smaller value with respect to those two (thin plate, shells, thick planks) The basic ultimate condition of thin wall structures is buckling under compressive load. |

Nomenclature

Structural Property Notation

M—bending moment in calculated wing section, [daN·cm]
$M_{ts}$ or $M_{tor}$—torsion moment in calculated wing section, [daN·cm]
Q—lateral or transversal force in calculated wing section, [daN]
q—uniform or linear compressive force, [daN/cm]
P—concentrated compressive force, [daN]
l—distance between calculated wing sections, [cm]
B—width of box beam in calculated wing section, [cm]
$c_{max}$—maximum thickness of wing aerodynamic profile, [cm]
$h_{ef}$—effective height of wing box, [cm]
$h_w$—height of wing box section vertical wall, [cm]
δ—thickness of shape-stiffened plate, [cm]
t—thickness of vertical wall of wing box section, [cm]
$b_s$—longitudinal installation shape spacing (stringer spacing), [cm]
$b_{re}$—reduced width of shape-stiffened plate, [cm]
$l_s$—shape length, [cm]
$l_{re}$—shape effective length, $l_{re}=l_s/\sqrt{c_s}$, [cm]
$l_r$—lateral installation shape spacing (rib spacing), [cm]
r—pillar spacing (pillars supporting vertical walls), [cm]
a, $\delta_a$, b, $\delta_b$, c, $\delta_c$—shape cross-section dimensions, [cm]
F—shape cross-section area, [cm²]
J—shape moment of inertia, [cm⁴]
$i_s$—shape radius of gyration, $i_s=\sqrt{(J/F)}$, [cm]
W—wing box moment of resistance [cm³]
Ω—wing box area, [cm²]
σ, τ—normal and shear stress, [daN/cm²]
$\overline{P}_c$—shape load intensity or stress factor, $\overline{P}_c=P/l_{re}^2$, [daN/cm²]
$\overline{q}_p$—panel load intensity or stress factor, $\overline{q}_p=P/(B/l_{re})=q/l_{re}$, [daN/cm²]

Material Property Notation $\sigma_{pr}, \tau_{pr}$—compression and shear proportionality limit stress, [daN/cm²]
$\sigma_{0.2}, \tau_{0.2}$—compression and shear yield (0.2% offset) stress, [daN/cm²]
$\sigma_b, \tau_b$—tensile and shear ultimate stress, [daN/cm²]
$\sigma_0, \tau_0$—compression and shear limiting stress, [daN/cm²]
E—compression normal modulus (Young's modulus), [daN/cm²]
$G_{s.p.}$ or $G_{p.s}$—stringer panel weight, [kg]
$G_{p.r.}$ or $G_{r.p}$—rib stringer panel weight, [kg]
$G_w$—pillar wall weight, [kg]
G—wing box beam weight, [kg]
γ—density of material, [kg/cm³]

Non Dimensional Factors f—shape factor
$\eta_\sigma, \eta_\tau$—compression and shear plasticity or elastic ductility factors
B—rib strength factor
$K_e$—bending stiffness rib factor
A, Σ—shape efficiency factor
$K_\sigma, K_\tau$—compression and shear crippling cell factors
Θ—pillar moment of inertia factor
Ψ—shape dimensions variation factor
$c_s$—stringer end fixity factor Sub- and Superscripts ts—torsion
cr—critical
l—local
tot—total (overall)
r—rib
sk—skin (plate)
p—panel
s—stringer
pi—pillar
w—wall
ef—effective
re—reduced
pr—proportional
s.p. or p.s.—stringer panel
r.p. or p.r.—ribbed panel
ex—experimental
op—optimum
n—normative (feasible)
rq—required
riv—rivet
av—average
tr—transversal
d—design Introduction A structural design optimization methodology and tool is herein described. The technology pertains to thin wall structures in respect of minimum weight criterion. Technology emphasis is the weight optimization of structural metal thin wall load bearing shapes of various configurations and panels. Intended uses include applications spanning the field from aerospace, construction, transportation and other industries.

The technology aims in part to take advantage of the widespread commercial availability of extruded (rolled) thin wall structures which come in a wide variety of standards and sizes, with H, L, Z, I, C, T, and U-shaped configurations being widely deployed for this reason. Aluminum alloy and steel structures are particularly plentiful and common design choices by designers across industries with load bearing design needs.

The aim of structural design optimization is to be able to achieve reliable thin wall structures which are at the same time light in weight and lower cost if possible.

A software tool capable of addressing the inefficiencies and lack of precision in prevailing structural optimization processes would be quickly embraced by structural engineers, designers and developers.

The presently proposed solution solves inverse task of structural mechanics for TPMs and TPM-panels: given load, material, pattern of axes, overall size (length, width), and constructive restrictions on the structure, cross-section dimensions are found corresponding to the optimum weight structure.

In a real world environment, a structural design optimization is considered solved when demonstrating changes of weight value in a wide range of structural parameters for different types of structures and materials. For instance, it is not sufficient only to find out that the optimum height or thickness of the shape corresponds to their optimum values. Because the calculated optimum values may not be implemented due to structural, material, or fabricated restrictions, it is equally important to demonstrate how optimum weight values will change for others shapes, in view of these restrictions. The designer should not only select the best suited material, but he should also know how the structure's weight will change in case a different material is used. Because the basic ultimate condition of thin wall structures is buckling under compressive load, these data cannot be obtained by direct comparison of mechanical properties specifications of materials, because the weight of buckling thin wall structure depends on the compressive load value when the material's mechanical properties are changed.

Modern structural optimization design concepts rely heavily on mathematical modeling, using as principles, functional analysis theory, theory of random functions, and the theory of operations.

Many structural optimization concepts however suffer from an "academic" approach to addressing the problem. Traditional approaches rely on single-discipline optimization, at best coupling low accurate modeling of other relevant disciplines during the detailed design phase without consideration of all design variables and restrictions. Omission or poor formulation of even one restriction leads to undesirable effects and dismissal of the result as irrelevant.

It would be very much desirable to be able to make generalization that on the one hand make it possible to single out optimization methods that combine certain main conditions from perspective of strength, overall and local buckling, stiffness, according to the industry standards, while at the same time, leave room for structural, material, and/or fabricated restrictions in arriving at optimum design configurations and parameters.

Because the final output of a designer's work is a structural blueprint, design methodologies should allow being able to determine optimum suitable configurations based in large extent on profile of cross-sections and cross-sectional dimensions of structures.

Because of high labor intensity of computations, getting accurate results of simultaneous optimization even of three- or four-parameter problems is practically possible only by utilization of significant computer resources and time. Several search methods for the optimum are known of multi-parameter problem solving using a computer: classical analysis method (variation calculation); deterministic approach scanning, mathematical programming (gradient based methods); probabilistic (random) search. The variation calculation method requires solving an equations system with partial derivatives for variable parameters. The disadvantages of this method are: cumbersome equations and—more importantly—this method do not allow any discontinuities or functions' extreme points and their derivatives. The latter does not allow using this method for optimization of some parameters. In the deterministic approach, the gradient method is a two-step one: first, partial derivatives for variable parameters are calculated. Then, the system shifts in the direction opposite to the gradient one (the scalar function gradient vector is co-directional with this function's largest increase). The gradient method is well suited to solving linear problems. The majority of practical parameter optimization problems are nonlinear ones. In this case, the method is time consuming.

Structural design optimization has been developed in general for such simple structural members as thick wall beams, weighted cross-section bars, trusses, arches, and frames. Thin wall plates, shells, and shapes are significantly less researched. Only those inverse tasks of structural mechanics that have the simplest mathematical models are explored in the thin wall structural design optimization.

Traditional approaches for determining optimum geometrical parameters is to use cross-section area as variable parameters rather than cross-section dimensions (perhaps allowing reduction of number of variables.) Local stability is ensured by restricting the cross-sectional dimensions based on the results of the separate local stability problem solved with the consideration of design issues in mind.

The constructive restrictions are taken into consideration when cross-section dimension values are calculated based on the results of the area optimization problem by using the iterative search technique. However, iterative search does not allow one to determine how close the selected set of cross-section dimensions is to the optimum one, neither does it ensure correspondence to the minimum cross-sectional area. Therefore, such problem formulation is less accurate than when cross-section dimensions are assumed as variables during the optimization process.

For example, Boeing Design Manual (BDM-6080) on optimizing round tube columns of different aluminum alloys at combined buckling and crippling modes does not adapt the disclosed approach to the more complex structures BDM optimizes.

In one scenario, BDM notes "a Z section has no common relationship such as D/t" and enforces "some geometric constraints to dictate its optimum dimensions," declaring that "In the physical behavior of the Z section, however, this is difficult to achieve." In BDM, local stability (crippling) is ensured by restricting the cross-sectional dimensions ratios based on the results of the separate local stability problem solved with cross-section area as a variable.

The presently proposed approach, described in greater detail below, has shown great promise in design optimization of practical multi-parameter thin wall structures using only mathematical analysis and modeling.

An important distinction in the proposed approach is in its reducing the dimensionality of a problem (by decreasing the number of simultaneously variable parameters) by employing a general scheme and incorporating common design approaches. This is achieved in principle by an initial process of:

1) transition from simple calculated schemes to more complex ones based on the analysis of work and different stability failure modes in a structure; 2) introduction of integrating factors—design indexes; 3) introduction constructive restrictions; and 4) use of the equal stability principle.

After this initial process is completed, a scanning methodology is employed (e.g., direct enumeration methodology) and a small number of resulting variables used. The proposed process was found to make it possible to scale down the optimization process of a wing box, for example, from 20 to 4 variable geometric parameters. This is described and explained further below.

The proposed solution does require a high level of familiarity and advanced knowhow of load and material science. During aircraft design, the present methodology may be utilized during the advanced detailed design stage.

A better practice would be to identify optimum weight structure shape designs and configurations at the earliest possible stage in design—which in the case of aircraft, is the preliminary and concept design phase. This also leaves room for being able to make more informed decisions on matters of design and, of course, to reduce wasteful efforts.

Using the extensive data from practical application of the technology to different shapes, materials, and constructive restrictions and analysis of plots of the new geometric index, ranges of cross-section dimension ratio values critical for optimum weight have been established. For each TPM shape, inside the ranges, the values of the shape efficiency factor have insignificant deviation from its theoretical maximal values and thus insignificant deviation from its theoretical minimum weight values. Therefore, constructive restrictions to actual cross-section dimensions need be factored into the ratio values inside the ranges to achieve optimum weight.

Outside the ranges, the weight of the shapes increases significantly. The ranges are the same for all loads, materials, shapes, and constructive restrictions and serve as an essential criterion of quality and efficiency of the developed design.

By further reducing the parameters of the optimization task, the ranges can be used early in design to assure a minimum weight structure that will perform with integrity under any load and using any material. The ranges enable decreased labor intensity and simplify computation standardization as well as development of standard optimum design programs and design manuals.

Model and Analysis Tool—High Level Description

The present invention employs a software-based, model and analysis tool that performs computational analysis on designer-selected TPMs to help in the selection of the appropriate TPM with minimum weight and size for a particular application.

The analysis uses criteria that have never been used before to select a TPM of optimum weight, and in fact, for this reason, it is believed that conventional techniques do not provide an opportunity for a designer to be able to use computationally-determined solutions to ensure that a particular TPM or TPM-panel is weight-optimized for a given application or use.

The proposed approach employs a process whereby the number of simultaneously relevant variables under consideration are decreased using a number of design approaches. One such design approach involves a process whereby, starting with an initial structure, a modeling and simulation process is initiated which applies work and stability failure analysis, starting with initial simple calculation methodologies and transitioning to higher level of calculation complexity. In parallel or subsequent thereto, (i) integrated factors-design indexes, (ii) equal stability principle, and (iii) constructive restriction parameters are all introduced.

The design output serves as a blueprint for the next stage which is the actual fabrication or manufacturing of the component. For a given set of constructive restrictions, the final product is based on optimum configurations selected from a fixed set of TMPs with varied cross-sectional shapes; or in the case of TPM-panels, on optimum configurations selected from a fixed set of TMP-panel combinations of varied cross-sectional dimensions.

The present disclosure uses mathematical modeling to weight-optimize design process without using conventional iterative process analysis and modeling.

Where TPMs have been deployed with selected cross-section dimensions, at no time has the effect of "spacing" of cross section material been taken into consideration in determining optimum weight. As a result, at a higher moment of inertia, while higher overall stability is achieved, local stability is reduced.

TPM-panel combination arrangements are also known, but as has already been explained, design tools all rely on iterative modeling techniques which suffer the drawbacks already described.

The present disclosure describes new and novel techniques for selecting optimum design TPMs and TPM-panel combinations that meet constructive restrictions that are optimized for weight.

The proposed approach is a system of optimization including a problem formulation strategy that is based on applying the inverse task of structural mechanics. The system minimizes the number of parameters varied simultaneously, thereby reducing time to design as well as cost of design while a weight optimized solution is achieved.

The proposed system tool is a promising solution for practical multi-parameter thin wall structure optimization problems completely captured mathematically. The system serves to reduce the dimensionality of the problem (decrease the number of simultaneously varied parameters), thereby achieving savings in time and cost of design, by using common design approaches such as:

1) transition from simple calculation schemes to more complex ones based on the analysis of work and different stability failure modes in a structure; 2) introduction of integrating factors—design indexes; 3) introduction of constructive restrictions; and 4) use of the equal stability principle.

A method of scanning (direct enumeration method) a small number of resulting variables is employed. This method of scanning is the single global optimum search method (direct enumeration method). It does not require any special type of functions connecting the sought parameters with the assessment criterion (optimum weight).

For example, use of this system has made it possible to scale down the optimization problem of the wing box from 20 to 4 variable geometric parameters.

In an exemplary embodiment described further below, the number of variables in optimization of a wing box are decreased. In the case of the wing box, the load carrying components are TPM shapes and TPM-panels. TPM-panels are reinforced with stringers or stringers and ribs, and vertical walls manufactured out of sheets reinforced with pillars. Following the system tool outlined above, moving from simple calculation schemes to more complicated ones based on analysis of different stability failure modes in the wing box structure enables division of wing design into the following structural members: stringer, stringer panel, rib-reinforced stringer panel, pillar-reinforced wall panel.

Each of the above structural members constitutes a certain stage in solution of the general problem of optimization of the wing box. The dimensionality of the problem is reduced at each stage.

At the first stage, six variable cross section dimensions of the stringer profile are expressed as a function of the only force compressing the stringer and it does not appear as a variable. In the second stage of the optimization problem, eight variable parameters, taking into account the results of the first stage, are expressed through two variable parameters, the normal stress and the sheet thickness. In the third stage, thirteen variable parameters, taking into account the results of the second stage, are expressed through the same two variable parameters, the normal stress and the sheet thickness. In the fourth stage, seven variable parameters (independent of the previous parameters) are expressed through two variable parameters, the maximum thickness of the aerodynamic wing profile and the wall thickness. As the end result, the problem of optimization of the thin wall members of the load carrying wing box, comprising twenty variable cross-section dimensions parameters, is reduced to four variable parameters, namely the maximum thickness of the aerodynamic wing profile, sheet thickness, wall thickness, and normal stress. Each of the considered structural members in wing box design optimization is capable of being independently employed in practice in optimum design of thin wall structures.

FIGS. 1-8 show a set of distinct TPM configurations associated with a number of different variants defined later below.

Likewise, FIGS. 10-15 show various TMP-panel combinations and in some cases from differing perspectives.

Each TPM is defined by at least a main strip (b) and one or more additional strips which form web- and flange-type strips. A web (or web strip) is characterized by two common longitudinal reinforcing ribs, while a flange (or flange strip) is characterized by one common longitudinal reinforcing rib and one free longitudinal reinforcing rib.

Figure 1:
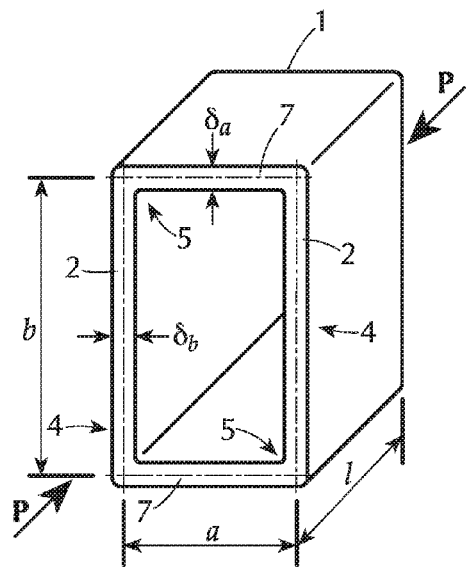
FIGS. 1-8 depict TPMs of various configurations, each characterized by a main strip and having a dimensional component (width b), in accordance with an exemplary embodiment.

Referring back to the figures, FIG. 1 shows a TPM (variant TPM I) having a closed rectangular shape, two main web strips and two additional web strips in accordance with an exemplary embodiment of the invention.

Figure 2:
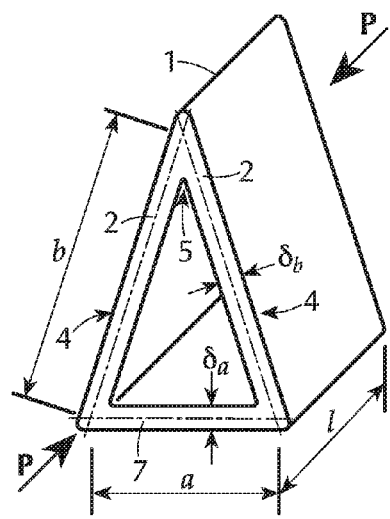

FIG. 2 shows a TPM (also variant TPM I) with closed triangular shape, two main web strips and one further web strip.

Figure 3:
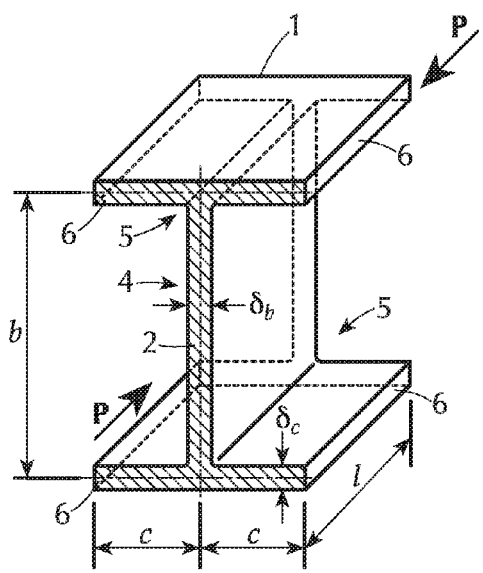

FIG. 3 shows an I-shaped TPM (variant TPM II) which has one main web strip and four flanges.

Figure 4:
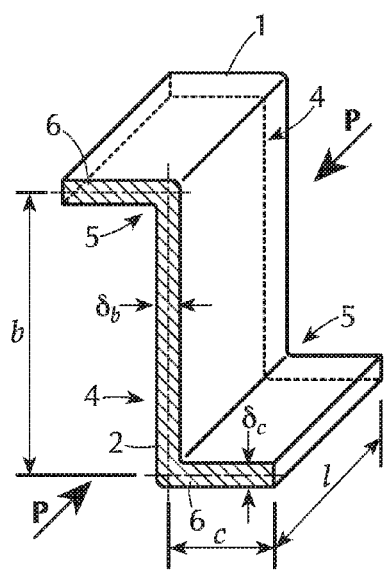

FIG. 4 shows a Z-shaped TPM (also variant TPM II) which has one main web strip and two flanges.

Figure 5:
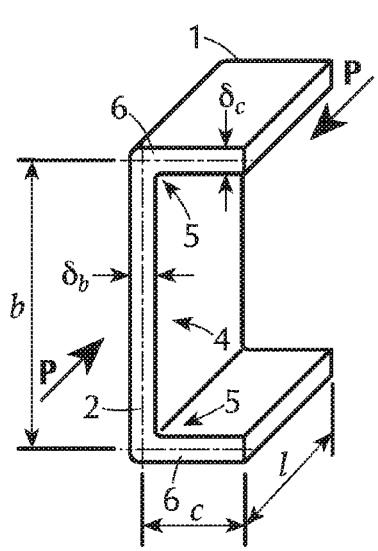

FIG. 5 shows a C-shaped TPM (variant TPM II) with one main web strip and two flanges.

Figure 6:
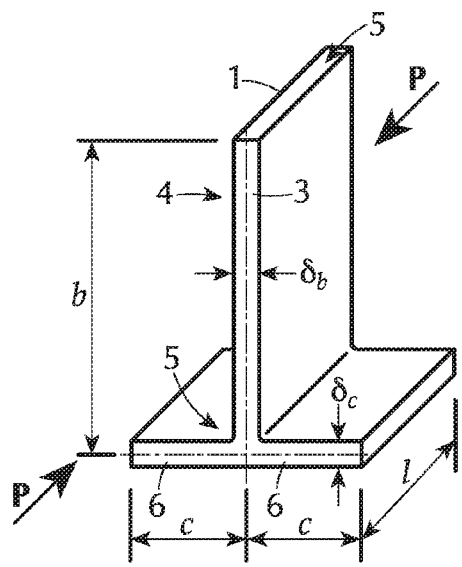

FIG. 6 shows a T-shaped TPM (variant TPM II) with one main flange and two further flanges.

Figure 7:
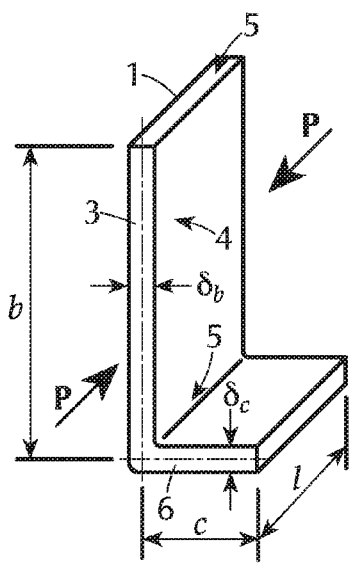

FIG. 7 shows an L-shaped TPM (variant TPM II) with one main flange and one further flange.

Figure 8:
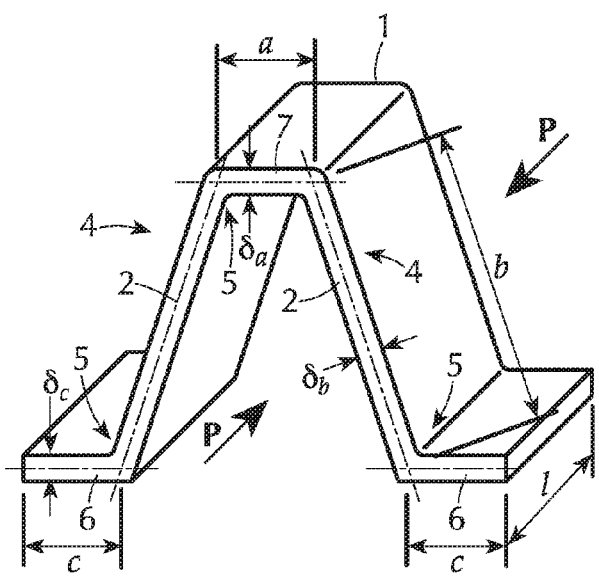

FIG. 8 shows a U-shaped TPM (variant TPM Ill) with two main inclined web strips, one web strip and two flanges.

Figure 9:
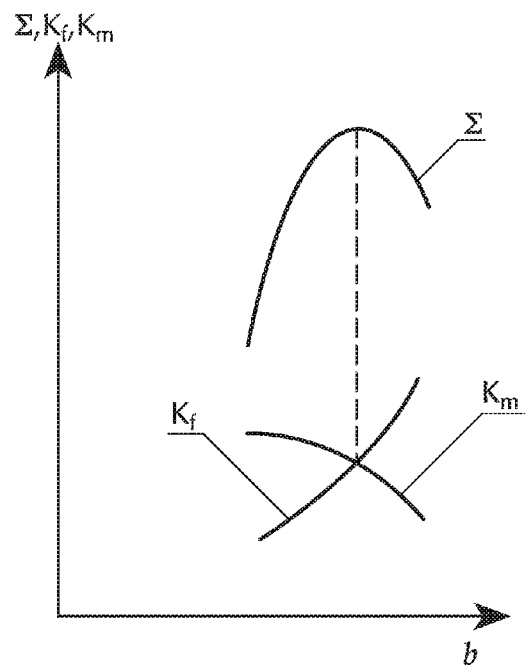
FIG. 9 diagrammatically maps shape efficiency factor value Σ as a function of width b.

FIG. 9 diagrammatically maps shape efficiency factor $\Sigma$ as a function of width b, which shall be discussed in greater detail below.

Figure 10:
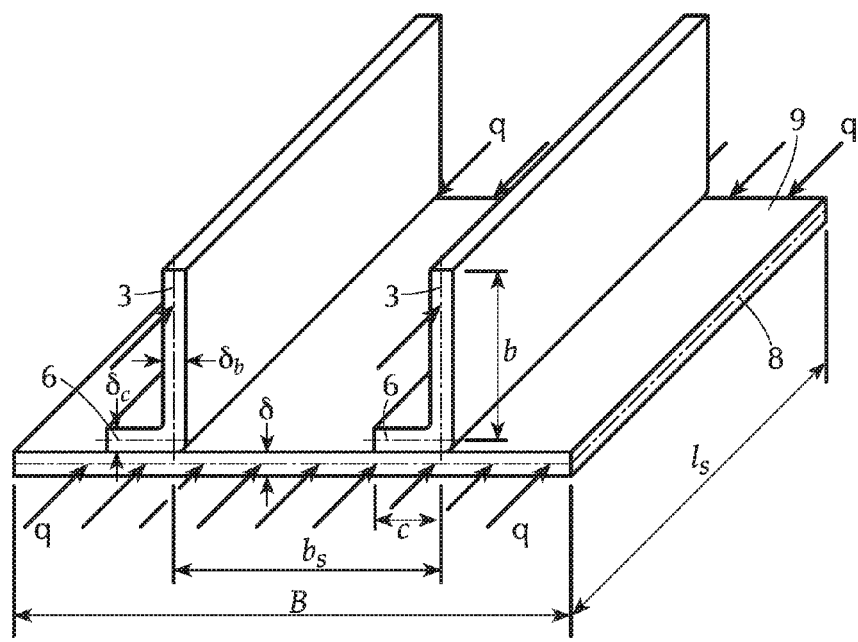
FIG. 10 is a cross-section perspective of a TMP-panel combination in accordance with a further embodiment of the present invention.

FIG. 10 is TPM-panel combination formed by joining an L-shaped TPM to a sheet in open cross-section configuration.

Figure 11:
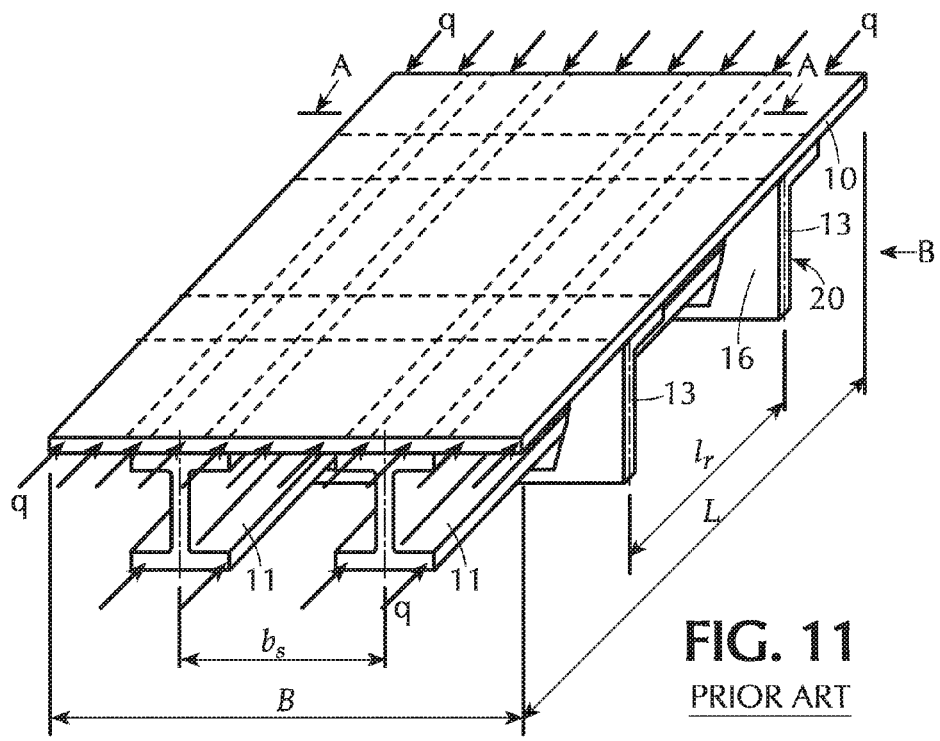
FIG. 11 is an inverted perspective of the configuration in FIG. 10 showing the I- and L-shaped TPMs positioning on the panel which function to simultaneously reinforce the panel in the longitudinal and transverse directions, respectively.

FIG. 11 is an inverted perspective of the configuration in FIG. 10 showing more clearly the I- and L-shaped TPMs positioning on the panel which function to simultaneously reinforce the panel in the longitudinal and transverse directions, respectively.

Figure 12:
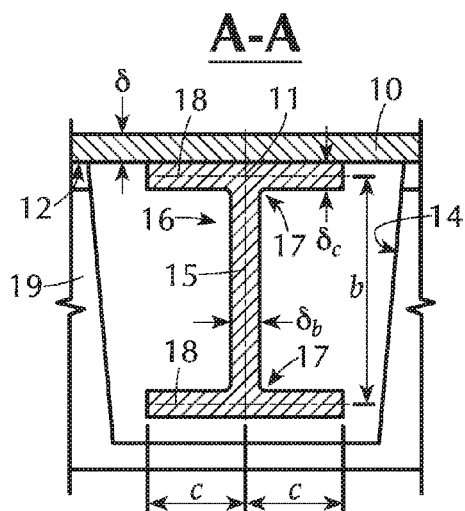
FIG. 12 is a sectional view of FIG. 11 taken along line "A-A".

FIG. 12 is a sectional view of FIG. 11 taken along line "A-A".

Figure 13:
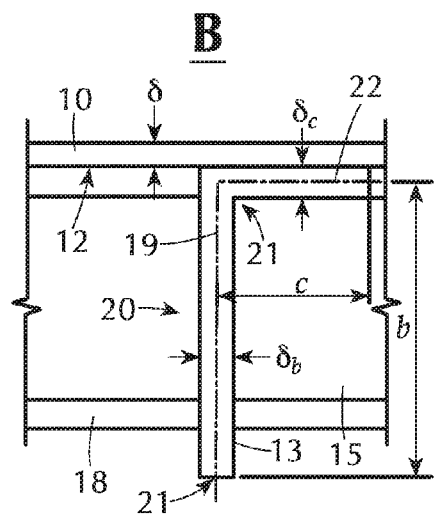
FIG. 13 is a further sectional view as seen in the direction of arrow "B" in FIG. 11.

FIG. 13 is a further sectional view as seen in the direction of arrow "B" in FIG. 11.

Figure 14:
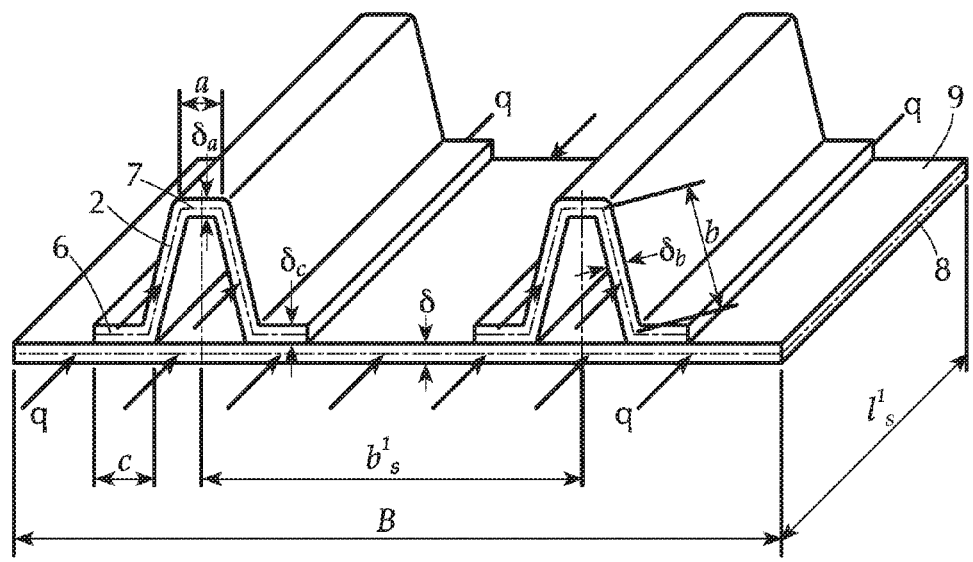
FIG. 14 is a cross-sectional perspective of a further TPM-panel configuration defined by a U-shaped TPM in accordance with a further embodiment.
Figure 15:
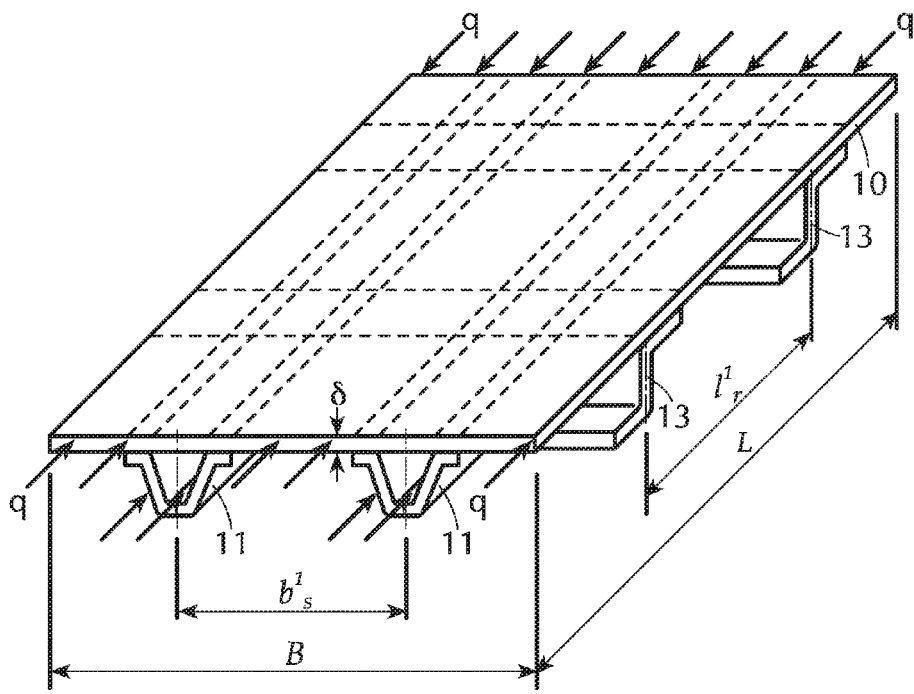
FIG. 15 is a further cross-sectional perspective of a TPM-panel configuration substantially as shown in FIG. 14 but including, in addition to the U-shaped TPM, a further Z-shaped TPM to cooperatively reinforce the panel in both longitudinal and transverse directions, respectively.

FIG. 14 is a cross-sectional perspective of a further TPM-panel configuration defined by a U-shaped TPM in accordance with a further embodiment;

FIG. 15 is a further cross-sectional perspective of a TPM-panel configuration substantially as shown in FIG. 14 but including, in addition to the U-shaped TPM, a further Z-shaped TPM to cooperatively reinforce the panel in both longitudinal and transverse directions, respectively.

The proposed TPM shape according to the variant I (hereinafter, TPM I) is characterized in that the ratio of the width of the additional strip with common reinforcing ribs to the width of the main strip satisfies the range:

$$a/b=0.3 \text{ to } 0.7 \quad (1),$$

and the ratio of the thickness of additional strip with common reinforcing ribs to the thickness of the main strip satisfies the range:

$$\delta_a/\delta_b=1.0 \text{ to } 3.0 \quad (2),$$

where: a is the width of the additional strip with common reinforcing ribs;

b is the width of the main strip;

$\delta_a$ is the thickness of the additional strip with common reinforcing ribs; and $\delta_b$ is the thickness of the main strip.

As provided, the stiffness of the main strip does not exceed the stiffness of the additional strip, specifically, $\delta_a/a \geq \delta_b/b$.

The proposed TPM according to the variant II (hereinafter, TPM II) is characterized in that the ratio of the width of the additional strip with the free reinforcing rib and the common reinforcing rib to the width of the main strip satisfies the range:

$$c/b=0.05 \text{ to } 0.3 \quad (3),$$

and the ratio of the thickness of the additional strip with the free reinforcing rib and the common reinforcing rib to the thickness of the main strip satisfies the range:

$$\delta_c/\delta_b=1.0 \text{ to } 3.0 \quad (4),$$

where: b is the width of the main strip;

c is the width of the additional strip with the free reinforcing rib and the common reinforcing rib;

$\delta_b$ is the thickness of the main strip; and $\delta_c$ is the thickness of the additional strip with the free reinforcing rib and the common reinforcing rib.

As provided, the stiffness of the main strip does not exceed the stiffness of the additional strip, specifically, $\delta_c/c \geq \delta_b/b$.

The proposed TPM according to the variant III (hereinafter, TPM III) is characterized in that the ratio of the width of the additional strip with common reinforcing ribs to the width of the main strip satisfies the range:

$$a/b=0.3 \text{ to } 0.7 \quad (1),$$

and the ratio of the thickness of the additional strip with common reinforcing ribs to the thickness of the main strip satisfies the range:

$$\delta_a/\delta_b=1.0 \text{ to } 3.0: \quad (2),$$

with this, the ratio of width of the additional strip with the free reinforcing rib and the common reinforcing rib to the width of the main strip satisfies the range:

$$c/b=0.05 \text{ to } 0.3 \quad (3),$$

and the ratio of the thickness of the additional strip with the free reinforcing rib and the common reinforcing rib to thickness of the main strip satisfies the range:

$$\delta_c/\delta_b=1.0 \text{ to } 3.0 \quad (4),$$

where: a is the width of the additional strip with common reinforcing ribs;

b is the width of the main strip;

c is the width of the additional strip with the free reinforcing rib and the common reinforcing rib;

$\delta_a$ is the thickness of the additional strip with common reinforcing ribs;

$\delta_b$ is the thickness of the main strip;

$\delta_c$ is the thickness of the additional strip with the free reinforcing rib and the common reinforcing rib;

with this, the stiffness of the main strip does not exceed the stiffness of the additional strip; specifically, $\delta_a/a \geq \delta_b/b$ and $\delta_c/c \geq \delta_b/b$.

Besides, in this variant of the TPM, the stiffness of the additional strip with common reinforcing ribs does not exceed the stiffness of the additional strip with the free reinforcing rib and the common reinforcing rib; specifically, $\delta_a/a \geq \delta_b/b$ and $\delta_c/c \geq \delta_b/b$, which follows from expressions (1), (2), (3) and (4).

The second type of subject of the group of inventions is two variants of TPM-panel configurations, IV and V (hereinafter, TPM-panel IV and TPM-panel V, or simply panel IV and panel V), based on all said variants of TPM, I, II and III.

The technological result of the panel according to the variant IV is achieved by that the panel comprises a sheet and a number of TPMs, having relations between the shape dimensions complying with the expressions in equations (1)-(4) above, which are installed across its width longitudinally with even pitch; with this, the main strip(s) and additional strip(s) are forming with the sheet an open cross-section configuration, wherein the thickness of the sheet of the panel according to the invention satisfies the following expression:

$$\delta = (0.0006 \text{ to } 0.0035)l \qquad (5),$$

and the pitch of the longitudinal installation satisfies the expression:

$$b_c = (20 \text{ to } 65)\delta \qquad (6),$$

where: $\delta$ is the thickness of the sheet of the panel;

l is the length of the thin wall profile member forming with the sheet the open cross-section configuration; and $b_c$ is the pitch of the longitudinal installation of thin wall profile members forming with the sheet the open cross-section configuration.

The stiffness of the main strip does not exceed the stiffness of the additional strip, and the stiffness of the additional strip with common reinforcing ribs does not exceed the stiffness of the additional strip with the free reinforcing rib and the common reinforcing rib; specifically, $\delta_b/b \leq \delta_a/a \leq \delta_c/c$.

Besides, the panel IV can be additionally equipped with the TPM installed transversally and having the above relations of the shape dimensions (1)-(4). With this, it is expedient to install these TPM with the pitch of transversal installation $$l_n = (10 \text{ to } 60)b_c \qquad (7),$$

where: $l_n$ is the pitch of transversal installation of thin wall profile member for the case of longitudinally installed thin wall profile member forming with the sheet the open cross-section configuration;

$b_c$ is the pitch of the longitudinal installation of thin wall profile members forming with the sheet the open cross-section configuration.

The technological result of panel V is achieved by that the panel comprises a sheet and a number of TPMs, having relations between the shape dimensions complying with the expressions in equations (1)-(4), which are installed across its width longitudinally with even pitch; with this, the main strip(s) and additional strip(s) are joined with the sheet to form a closed cross-section configuration, wherein the thickness of the sheet of the panel according to the invention satisfies the following expression:

$$\delta = (0.0006 \text{ to } 0.0035)l \qquad (5)$$

and the pitch of the longitudinal installation satisfies the expression:

$$b^1_c = (40 \text{ to } 130)\delta \qquad (8),$$

where: $\delta$ is the thickness of the sheet of the panel;

l is the length of the thin wall profile members forming with the sheet the closed cross-section configuration; and $b^1_c$ is the pitch of longitudinal installation of thin wall profile members forming with the sheet the closed cross-section configuration.

The stiffness of the main strip does not exceed the stiffness of the additional strip, and the stiffness of the additional strip with common reinforcing ribs does not exceed the stiffness of the additional strip with the free reinforcing rib and the common reinforcing rib, specifically, $\delta_b/b \leq \delta_a/a \leq \delta_c/c$.

Besides, the panel according to the variant V can be additionally equipped with the TPM installed transversally and having the above relations of the shape dimensions (1) to (4). With this, it is expedient to install these TPM with the pitch of transversal installation $$l^1_n = (1.5 \text{ to } 10)b^1_c \qquad (9),$$

where:

$l^1_n$ is the pitch of transversal installation of thin wall profile members for the case of longitudinally installed thin wall profile member farming with the sheet the closed cross-section configuration; and $b^1_c$ is the pitch of the longitudinal installation of thin wall profile members forming with the sheet the closed cross-section configuration.

Thus, to achieve an optimum weight TPM for a given set of constructive restrictions the process to be followed involves first providing a TPM having a cross-section that includes at least one of (1) at least two main strips and at least one additional strip having ends connecting with respective ends of two of the at least two main strips and selecting dimensions such that each main strip has a thickness $\delta_b$ and a width b and the additional strip has a thickness $\delta_a$ and a width a so that $\delta_b/b$ is not larger than $\delta_a/a$, and (2) at least one main strip and at least one additional strip having one end connecting with an end of the main strip and selecting dimensions such that the main strip has a thickness $\delta_b$ and a width b and the additional strip has a thickness $\delta_c$ and a width c and so that $\delta_b/b$ is not larger than $\delta_c/c$.

The next step involves selecting set of cross-section dimensions ratios values within established ranges values. A set of constructive restrictions is established that map to actual cross-section dimensions.

Then, based on the set of ratios values and constructive restrictions, a respective set shape efficiency factors values $\Sigma_1, \Sigma_2 \ldots \Sigma_n$, are determined wherein each of the shape efficiency factor values is defined by:

$\Sigma = K_f \cdot K_m$, where $K_f = (i^2/F)^{2/5}$ is an overall stability factor, $K_m = K^{1/5}/(b/\delta_b)^{2/5}$ is a local stability factor, b, $\delta_b$ are the width and the thickness of the main strip, respectively, i, F are the radius of gyration and the cross-section area, respectively, and K is the coefficient in the known formula for local stability stress.

In a subsequent step, a maximum of the shape efficiency factor value $\Sigma_{max}$ is determined from within the respective set of determined shape efficiency factors values $\Sigma_1, \Sigma_2 \ldots \Sigma_n$.

Then based on this determination of the shape efficiency factor maximum value $\Sigma_{max}$, a next step is to ascertain TPM ratio values.

From this, a TPM pattern having cross-section dimensions and ratio values which result in a maximum shape efficiency factor value $\Sigma_{max}$ is identified. Implicitly, this same pattern also ensures the reliable operation and weight-optimized result of a TPM for the given set of desired, predefined constructive restrictions.

The proposed approach calculates maximum shape efficiency factor values for different shape TPMs. Once this is done, an overall maximum shape efficiency factor value $\Sigma_{0max}$ is identified as well as its associated shape. This shape determines among all TPM shapes the best TPM configuration to employ.

As previously explained, a TPM could be combined with two or more strips. In such cases, if buckling were to occur, it is most likely to occur first in the strips of the TPM. We can refer to this as "local failure mode" and is characterized by warp along one or more cross-sections in addition to any stresses produced linearly in relation to the position of common longitudinal ribs of the strips.

This local failure mode may result in overall buckling failure mode and collapse of the entire TPM subject to compression forces. This in turn could lead or contribute to overall TPM-panel combination failure, which could result in severe system or device failure.

Optimization, therefore, as contemplated herein involves applying the techniques proposed to determine possible failure condition along a number of cross-sections of the TPM-panel combination.

The presently proposed approach therefore is a design optimization technique that algorithmically looks at alternative TPM and TPM-panel combinations, and on the basis of predefined constructive restrictions (structural, material and fabricated requirements) identifies a combination of variables from which cross-section dimensions are determined. By making incremental changes to cross-section dimensions, and for a given pattern, determining possible failure conditions, it is possible to arrive at a best result. This result it has been determined is a much more efficient and cost effective way to select a best pattern than has been done using conventional (usually iterative) techniques.

This next section will now set out to describe application of the suggested techniques to arrive at somewhat more complicated patterns involving longitudinal and transversal reinforcing TPM-panel combinations IV and V, respectively. Here again the goal is to minimize panel weight with respect to a given set of constructive restrictions.

TPM-panel combinations IV and V are "wide column" structures, whereas TPMs I-III are all simple or "narrow column" structures, for purposes of discussion. Wide and narrow is used here to describe stability related attributes in overall and local terms. A configuration cross-section is "wide", for instance, when there is both TPM and panel simultaneously being subjected, at that cross-section, to various load-bearing stresses. In case of "narrow" design, only the TPM cross-section is considered to bear load stress.

"Local" is meant to refer to a "localized failure condition", i.e., a condition that is limited to the TPM (or TPM-panel combination) only. When the failure condition expands beyond the TPM (or TPM-panel) then there is said to be an "overall failure condition".

In the case of a TPM-panel combination, the sheet (which serves as the panel) provides substantial additional stability to the combination, which is one reason why it is provided. When referring to local stability, the benefit in stability of the sheet is not accounted for. However, in calculating overall stability, then the contribution in stability by the sheet is accounted for through appropriate calculations discussed below. This is achieved by treating wide cross-sections the same as narrow cross-sections when performing calculations. The aim is to arrive at a shape efficiency factor that is relevant.

Referring again to the variant TPM configurations shown in FIGS. 1 to 8, cross-section dimensions selection of each TMP will next be described by application of a set of ratios rules.

As should be appreciated, a TPM is configured to structurally be impacted when a compressive load P is applied. The following TPM configurations have been shown: closed rectangle (FIG. 1), closed triangle (FIG. 2), I-shaped (FIG. 3), Z-shaped (FIG. 4), C-shaped (FIG. 5), T-shaped (FIG. 6), L-shaped (FIG. 7), and U-shaped (FIG. 8).

A TPM may comprise one or more main web strips 2 (as shown in FIGS. 1-5 and 8); or one or more main flanges 3 (as shown in FIG. 6 and FIG. 7). Each TPM may further include one or more main strip(s) 4 characterized by two common longitudinal reinforcing ribs or one free longitudinal reinforcing rib and one common longitudinal reinforcing rib 5, respectively, as shown in FIGS. 10-15. Additional flange(s) 6 (shown in FIGS. 3 to 8) and web strip 7 (shown in FIGS. 1, 2 and 8) may be included and which are defined by (i) a width which is less than that of main strip 4 and (ii) a thickness not less than that of main strip 4.

Further rules that should be followed are set forth below.

For example, the stiffness of main strip 4 should not exceed that of the additional strip (flanges 6, web strips 7): specifically, $\delta_a/a \geq \delta_b/b$ and $\delta_c/c \geq \delta_b/b$. The stiffness of the additional strip with two common longitudinal reinforcing ribs, web 7 (FIG. 8), should not exceed the stiffness of the additional strip with one free longitudinal reinforcing rib and one common longitudinal reinforcing rib, flange 6 (FIG. 8): specifically, $\delta_a/a \leq \delta_c/c$.

The additional flange 6 or the additional web 7 can be located with respect to main strip 4 either at a 90° angle as in FIG. 1, 3 to 7, or at a different angle as in FIGS. 2 and 8.

Width and thickness of main webs 2, flanges 3 and additional webs 7, flanges 6 in the cross-sections of TPM (FIGS. 1 to 8) should satisfy expressions (1), (3), (10):

$$a/b = 0.3 \text{ to } 0.7 \qquad (1),$$

$$c/b = 0.05 \text{ to } 0.3 \qquad (3),$$

$$\delta_a/\delta_b = \delta_c/\delta_b = 1.0 \text{ to } 3.0 \qquad (10),$$

where: a, b, c, $\delta_a$, $\delta_b$, and $\delta_c$ are, respectively, width and thickness of the additional web, the main web or flange and the additional flange.

For example, width a of additional web 7 has its length measured along a cross-section medial line (the line equidistant from longitudinal edge lines of cross-section) of the web 7 between the respective lines of main webs 2 adjacent to the web 7 (FIGS. 1, 2 and 8).

Width b of main web 2 or flange 3 has its length measured along the medial line of the cross-section of main web 2 or flange 3 between the respective lines of adjacent strips (FIGS. 1 to 8).

Width c of additional flange 6 has its length measured along the medial line of the cross-section of flange 6 from the medial line of main web 2 or flange 3 to the free longitudinal reinforcing rib of additional flange 6 (FIGS. 3 to 8).

Thickness $\delta_a$, $\delta_b$, and $\delta_c$ corresponding to dimensions a, b, c is defined as the distance measured between the edges of cross-sections of webs and flanges.

The above expressions (1), (3), (10) should be applied where variant TPM I, II or III are employed with following shapes: I-shape with one main web 2 and four additional flanges 6 (FIG. 3); Z-shape (FIG. 4) with two additional flanges 6 located both sides from the main web 2; or C-shape with additional flanges 6 located the same side of the main web 2 (FIG. 5); or U-shape with main webs 2, additional web 7 and additional flanges 6 (FIG. 8); or T (FIG. 6) and L (FIG. 7)—with the main flange 3 and additional flange(s) 6; or closed rectangular (FIG. 1) and triangular (FIG. 2); as well as shapes with other arrangement and quantity of main and additional webs and flanges.

The ratio range values of widths and ratios of thicknesses of main webs 2 and flanges 3, additional flanges 6 and webs 7 are obtained using the generalizing parameter with various shapes of TPM. Reference was made to this earlier when referring to a "shape efficiency factor $\Sigma$, where $\Sigma = K_f K_m$, where:

$K_f = (i^2/F)^{2/5}$ is an overall stability factor, $K_m = K^{1/5}/(b/\delta_b)^{2/5}$ is a local stability factor, b, $\delta_b$ are the width and the thickness of the main web 2 or flange 3, respectively;

i, F are the radius of gyration and the area of shape of any TPM shown in FIGS. 1 to 8, respectively; and K is the coefficient in the known formula for local stability critical stress, depending on ratios (1), (3), (10) of TPM shape dimensions.

TPMs may be compared in terms of weight as well. The greater the maximum value of factor $\Sigma$ for a particular shape, the less its TPM weight.

At the same time, within the specified ranges, maintaining the values of the above ratios, variation of shape absolute (actual) dimensions is possible which enables to provide for constructive restrictions not entailing a considerable increase of the weight of TPM. Beyond these ranges, the weight of TPM increases significantly.

The graphic illustration of the shape efficiency factor $\Sigma$ versus the width b of the main strip is shown in FIG. 9. As can be seen from this plot, the factor $\Sigma$ possesses, for each shape, a maximum value. For each TPM shape, a corresponding shape efficiency factor maximum value exits that falls inside a range of ratio values.

FIG. 9 therefore illustrates the significance of a shape efficiency factor. The wider a structural shape cross-sectional material is "distributed" (i.e., placed at the farthest distance from the neutral axis), the bigger the value of the overall stability factor $K_f$ and its overall stability.

At the same time, the local stability factor $K_m$ that characterizes local stability decreases. As a result, when functions of overall and local stability have equal values, the function of the shape efficiency factor has its maximum value (this being different for different TPM cross-section shapes). Furthermore, this maximum value ensures the minimum TPM shape cross-section area (and hence the minimum weight).

Different cross-section shapes can also be compared by their associated weight values. The bigger the maximal value of the shape efficiency factor $\Sigma$ of a particular shape, the smaller its associated TPM shape weight value.

At the same time, it is possible to maintain, within specified ranges, the values of the above ratios through a variation of shape actual (absolute) cross-section dimensions. This has the benefit of, for a given set of constructive restrictions, being able to select actual cross-section dimensions without compromising considerably TPM weight. Inside the ranges, for each TPM shape, the values of the shape efficiency factor have insignificant deviation from its theoretical maximal values and thus insignificant deviation from its theoretical minimum weight values. Outside the ranges, the shape efficiency factor values decrease significantly, so the weight of the TPM increases significantly.

Having identified that a range of values for shape efficiency factor exists, it is not only possibly to select a best design TPM for a given application, it is now also possible to create many new TPMs which likewise are defined by a shape efficiency factor that varies only slightly within a desired range and with respect to weight, and much more significantly outside the range.

To minimize weight during design development, the idea is to use a programming tool that algorithmically reduces the design choice down to a best TPM selection based on predefined, or otherwise known, cross-section dimension ratio values falling with a desired range.

As a design is tweaked to meet other design constraints, the tool will recognize when certain cross-section dimension ratios appear to have fallen outside a desired range of values and prompt the designer to select a different TPM, or change the material of the TPM. In the latter instance, a stronger material will necessarily change the shape efficiency factor for a TPM of a given shape.

The above-described principles are equally relevant when designing TPM-panel combinations.

FIG. 10 shows a TPM-panel combination of variant IV. This variant is based on the L-shaped variant TPM II described above and shown in FIG. 7. In a fully-deployed state, a TPM-panel will be subjected primarily to a compressive load q directed along a length l that's distributed across a width B of the TPM-panel. The TPM-panel includes sheet 8 and a variant type TPM II attached to one of the sides 9 of this sheet 8 across its width and installed longitudinally with even pitch. Multiple TPMs (variant II) are shown. Each TPM is integrably coupled to sheet 8 in an open cross-section configuration. Each TPM II is an L-shape type TPM and consists of main flange 3 and one additional flange 6.

Width b and c of main flanges 3 and of additional flanges 6 and the thickness of these, $\delta_b$ and $\delta_c$, respectively, satisfy the expressions:

$$c/b = 0.05 \text{ to } 0.3 \qquad (3),$$

$$\delta_c/\delta_b = 1.0 \text{ to } 3.0 \qquad (4).$$

The other dimensions of TPM-panel (variant IV) cross-section in FIG. 10 satisfy the following expressions:

$$\delta = (0.0006 \text{ to } 0.0035)l \qquad (5),$$

$$b_c = (20 \text{ to } 65)\delta \qquad (6),$$

where: $\delta$ is the thickness of sheet 8;

$b_c$ is the pitch of the longitudinal installation of the TMPs resting on sheet 8 in the open cross-section configuration shown and described; and l is the length of TPM II.

As provided, the stiffness of the main strip does not exceed the stiffness of the additional strip, specifically, $\delta_c/c \geq \delta_b/b$.

FIG. 14 shows a TPM-panel (variant V) which is based on a TPM of variant III of U-shape (as in FIG. 8). Here, the TMP is formed with sheet 8 in closed cross-section configuration. Each TPM III is characterized by main webs 2, additional web 7 and additional flanges 6.

The values of width a, b, c of additional webs 7, main webs 2, and additional flanges 6 and values of thickness corresponding to these dimensions, $\delta_a$, $\delta_b$, $\delta_c$ of the shape of TPM III of the TPM-panel V satisfy the following expressions:

$$a/b = 0.3 \text{ to } 0.7 \tag{1},$$

$$c/b = 0.05 \text{ to } 0.3 \tag{3},$$

$$\delta_a/\delta_b = \delta_c/\delta_b = 1.0 \text{ to } 3.0 \tag{10}.$$

The other dimensions of the panel V cross-section (FIG. 14) satisfy the following expressions:

$$\delta = (0.0006 \text{ to } 0.0035)l \tag{5},$$

$$b^1{}_c = (40 \text{ to } 130)\delta \tag{8},$$

where:

$\delta$ is the thickness of the sheet 8;

$b^1{}_c$ is the pitch of the longitudinal installation of thin wall profile members forming with the sheet 8 the closed cross-section configuration; and l is the length of TPM III.

The stiffness of the main strip should not exceed the stiffness of the additional strip, and the stiffness of the additional strip with common reinforcing ribs should not exceed the stiffness of the additional strip with the free reinforcing rib and the common reinforcing rib, specifically, $\delta_b/b \leq \delta_a/a \leq \delta_c/c$.

To reinforce TPM-panels IV and V in longitudinal direction, additional TPMs of variant I, II and III are shown embodied. One skilled in the art would appreciate that this is done only for discussion purposes, and that other TMP shapes, including for example, Z-, T-, C-, rectangular, or triangular shapes.

The TPM-panels IV and V, shown in FIGS. 10 and 14 function as follows.

The distributed compressive load q is reacted by both TPM I, II, III and the sheet of TPM-panel 8. The load-bearing capacity of the TPM-panels IV, V is provided for by virtue of selection of optimum dimensions of cross-section of the panel: dimensions of shapes of TPM are selected basing on the expressions of equations (1), (3), (4) and (10); the thickness of sheet 8 and the pitch of TPM longitudinal installation that have been selected based on rules satisfying the expressions in equations (5), (6) and (8), respectively.

FIGS. 11-13 and 15 show panels IV, V with TPM II, III installed both longitudinally and transversally.

FIGS. 11 to 13 show panel IV based on longitudinally installed I-shaped TPM II and transversally installed L-shaped TPM II.

In its course of operation, a TPM-panel IV will reacts primarily to any compressive load q directed along length L of any longitudinally installed TPM (see pos. 11 in FIGS. 11 and 12). These same TPMs are attached to one of the sides 12 of sheet 10 across its width and formed integrally with sheet 10 in open cross-section configuration.

TPM 13 are installed transversally with even pitch across the length of the same side 12 of sheet 10 and are embodied with cut-outs 14 in which the longitudinally installed TPM 11 are located (FIGS. 11-13). TPM 11 possesses the main web 15 embodied as the main strip 16; at each of its reinforcing ribs 17, an additional flange 18 is formed with the width less than that of the strip 16 and with thickness not less than that of the strip 16 (FIG. 12).

The width b and c of main webs 15 and additional flanges 18, and thickness corresponding to these dimensions, $\delta_b$, $\delta_c$, respectively, of the shape of longitudinally installed TPM 11 satisfy the expressions:

$$c/b = 0.05 \text{ to } 0.3 \tag{3},$$

$$\theta_c/\theta_b = 1.0 \text{ to } 3.0 \tag{4},$$

With this, the stiffness of the main strip does not exceed the stiffness of the additional strip, specifically, $\delta_c/c \geq \delta_b/b$.

Each transversally installed TPM 13 is embodied as an L-shape and possesses a main flange 19 embodied as a main strip 20 across the width of which, at one of its longitudinal reinforcing ribs 21, an additional flange 22 is formed (FIG. 13).

Relations of shape dimensions of TPM 13 should also satisfy the expressions (3) and (4).

The other dimensions of the cross-section of TPM-panel IV should satisfy the expressions:

$$\delta = (0.0006 \text{ to } 0.0035)L/n_n \tag{5},$$

$$b_c = (20 \text{ to } 65)\delta \tag{6},$$

where:

L is the length of the panel;

$n_n$ is the number of transversally installed TPM 13;

$\delta$ is the thickness of the sheet 10;

$b_c$ is the pitch of the longitudinal installation of TPM 11 forming with the sheet 10 the open cross-section configuration. In the panel IV with longitudinally installed TPM 11 of I-shape forming with the sheet 10 the open cross-section configuration, the pitch $l_n$ of the transversal installation of L-shaped TPM 13 (shown in FIG. 11), satisfies the expression:

$$l_n = (10 \text{ to } 60)b_c \tag{7}.$$

FIG. 15 shows the TPM-panel V based on the longitudinally and transversally installed members 11 and 13, respectively. The longitudinally installed TPM 11 is embodied as a U-shape and formed with sheet 10 in closed cross-section configuration. The transversally installed member 13 is of a Z-shape.

The width a, b, c of additional webs, main webs, and additional flanges and thickness corresponding to these dimensions $\delta_a$, $\delta_b$, $\delta_c$ of the longitudinally and transversally installed TPM 11, 13 of the TPM-panel V shown in FIG. 15 satisfy the following expressions:

$$a/b = 0.3 \text{ to } 0.7 \tag{1},$$

$$c/b = 0.05 \text{ to } 0.3 \tag{3}$$

$$\delta_a/\delta_b = \delta_c/\delta_b = 1.0 \text{ to } 3.0 \tag{10}.$$

The stiffness of the main strip should not exceed the stiffness of the additional strip, and the stiffness of the additional strip with common reinforcing ribs should not exceed the stiffness of the additional strip with the free reinforcing rib and the common reinforcing, specifically, $\delta_b/b \leq \delta_a/a \leq \delta_c/c$.

The other cross-section dimensions of the panel V (FIG. 15) should satisfy the expressions:

$$\delta = (0.0006 \text{ to } 0.0035)L/n^1{}_n \tag{5},$$

$$b^1{}_c = (40 \text{ to } 130)\delta \tag{8},$$

where: $\delta$ is the thickness of sheet 10;

$b^1{}_c$ is the pitch of installation of U-shaped TPM 11 formed with sheet 10 in closed cross-section configuration;

L is the length of the panel; and $n^1_n$ is the number of transversally installed TPMs 13.

The pitch $1^1_n$ of transversal installation of TPM 13 of TPM-panel V provided in the longitudinal installation of TPM 11 and formed with sheet 10 in closed cross-section configuration, should further satisfy the expression:

$$l^1_n = (1.5 \text{ to } 10) b^1_c \quad (9).$$

The width B of TPM-panels IV, V shown in FIGS. 10, 11, 14 and 15 is determined from the following expressions:

$$B = n_c \cdot b_c = n^1_c \cdot b^1_c \quad (11),$$

where $n_c$, $n^1_c$ are the numbers of longitudinally installed TPM of TPM-panels IV, V forming with the sheet the open and closed cross-section configuration, respectively.

The length L of TPM-panels IV, V shown in FIGS. 11 and 15 may be determined from the following expressions:

$$L = n_n \cdot l_n = n^1_n \cdot l^1_n \quad (12),$$

where $n_n$ and $n^1_n$ are the number of transversally installed TPMs for those longitudinal TPMs formed with the sheet in open and closed cross-section configurations, respectively.

For transversal and longitudinal reinforcing of TPM-panels IV and V, TPM of other shapes can also be employed.

In the course of operation of panels IV and V under the compressive load q, the load-bearing capacity of the panel is provided for by virtue of selection of the optimum dimensions of cross-sections of longitudinally and transversally installed TPM, thickness of the sheet, pitches of longitudinal and transversal installation corresponding to the minimum weight of the panel.

The presented examples and drawings illustrated herein are provided only by way of example. The shapes and configurations were selected due to their wide use in applications where thin wall profile structures are desirable. The illustrations are not meant to in any way limit the scope and spirit of application of the variants of the present invention. While a number of different variants of TMP-panel combinations have been shown and described, this too is not meant to be equally limited in any way.

It should further be stated that while TPM-panels are not as commonly used as simple TPM configurations, the mathematical relations expressed by (1), (3) and (10) are equally relevant to TPM-panels as they are to TMP-only configurations.

Thus, to achieve an optimum weight TPM for a given set of constructive restrictions the process to be followed involves first providing a TPM having a cross-section that includes at least one of (1) at least two main strips and at least one additional strip having ends connecting with respective ends of two of the at least two main strips and selecting dimensions such that each main strip has a thickness $\delta_b$ and a width b and the additional strip has a thickness $\delta_a$ and a width a so that $\delta_b/b$ is not larger than $\delta_a/a$, and (2) at least one main strip and at least one additional strip having one end connecting with an end of the main strip and selecting dimensions such that the main strip has a thickness $\delta_b$ and a width b and the additional strip has a thickness $\delta_c$ and a width c and so that $\delta_b/b$ is not larger than $\delta_c/c$.

The next step involves selecting set of cross-section dimensions ratios values within established ranges values. A set of constructive restrictions is established that map to actual cross-section dimensions.

Then, based on the set of ratios values and constructive restrictions, a respective set shape efficiency factors values $\Sigma_1, \Sigma_2 \ldots \Sigma_n$, are determined wherein each of the shape efficiency factor values is defined by:

$\Sigma = K_f \cdot K_m$, where
$K_f = (i^2/F)^{2/5}$ is an overall stability factor,
$K_m = K^{1/5}/(b/\delta_b)^{2/5}$ is a local stability factor,
b, $\delta_b$ are the width and the thickness of the main strip, respectively,
i, F are the radius of gyration and the cross-section area, respectively, and
K is the coefficient in the known formula for local stability stress.

In a subsequent step, a maximum of the shape efficiency factor value $\Sigma_{max}$ is determined from within the respective set of determined shape efficiency factors values $\Sigma_1, \Sigma_2 \ldots \Sigma n$.

Then based on this determination of the shape efficiency factor maximum value $\Sigma_{max}$, a next step is to ascertain TPM ratio values.

From this, a TPM pattern having cross-section dimensions and ratio values which result in a maximum shape efficiency factor value $\Sigma_{max}$ is identified. Implicitly, this same pattern also ensures the reliable operation and weight-optimized result of a TPM for the given set of desired, predefined constructive restrictions.

The proposed approach calculates maximum shape efficiency factor values for different shape TPMs. Once this is done, an overall maximum shape efficiency factor value $\Sigma_{0max}$ is identified as well as its associated shape. This shape determines among all TPM shapes the best TPM configuration to employ.

TPM Computational Analysis—High Level Operational Flow

Figure 16:
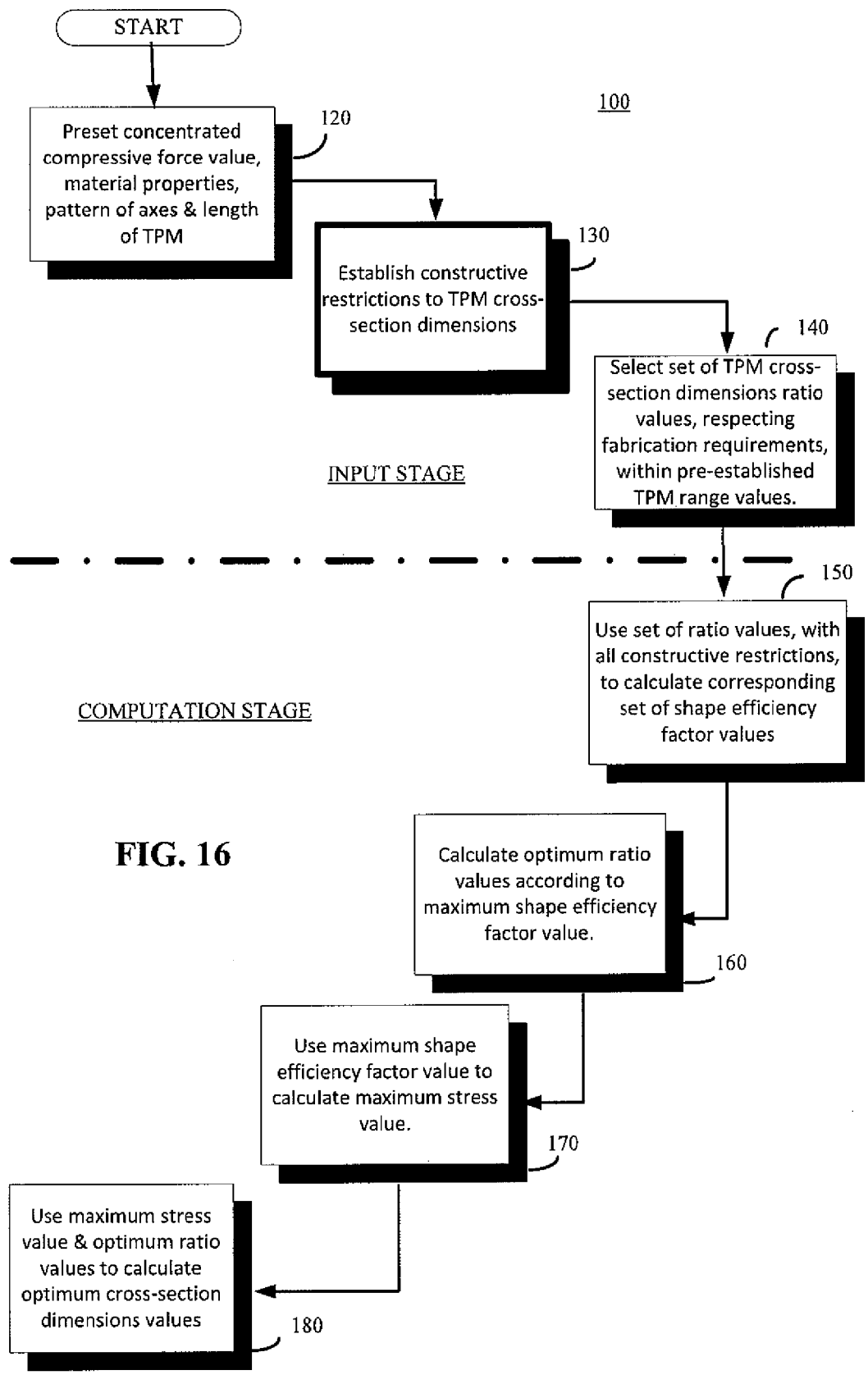
FIG. 16 is a flow diagram describing the operational flow of a model and analysis TPM design tool configured for selecting an optimum weight TPM in accordance with an exemplary embodiment.

FIG. 16 is a high-level flow diagram 100 describing the operation flow of a model and analysis TPM design tool configured for selecting an optimum weight TPM in accordance with an exemplary embodiment.

The proposed process of designing TPMs is facilitated by a model and analysis design tool. The tool performs computational analysis on relevant input variables. In this regard, we will functionally delineate process functions into an input stage and a computation stage.

The input stage, as the name implies, involves the designer inputting into the tool relevant design parameters (step 120). The relevant design parameters may include preset parameters such as concentrated compressive force value, material properties (compression yield stress value, compression proportionality limit value, tensile ultimate stress value, compression limiting stress value, compression normal modulus value), pattern of axes, length of the TPM under analysis, and other relevant parameters.

The tool uses the received parameters to establish weight minimization parameters which include consideration of constructive restrictions (including fabricated restrictions) to TPM cross-section dimensions (step 130). Finally, the designer is asked to select from set of TPM cross-section dimension ratio values, respecting fabrication requirements of previous step, within pre-established TPM range values (step 140).

Having received all relevant input date, the tool must process the set of ratio values, respecting constructive restrictions, to obtain corresponding set of shape efficiency factor values (step 150).

The processing in the previous step results in identification of optimum ratio values according to maximum shape efficiency factor value (step 160).

The tool then calculates a maximum stress value using the maximum shape efficiency factor value to obtain maximum stress value (step 170). At step 180, the tool calculates optimum cross-section dimension values using maximum stress value and optimum ratio values.

TPM-Panel Computational Analysis—High Level Operational Flow

Figure 17:
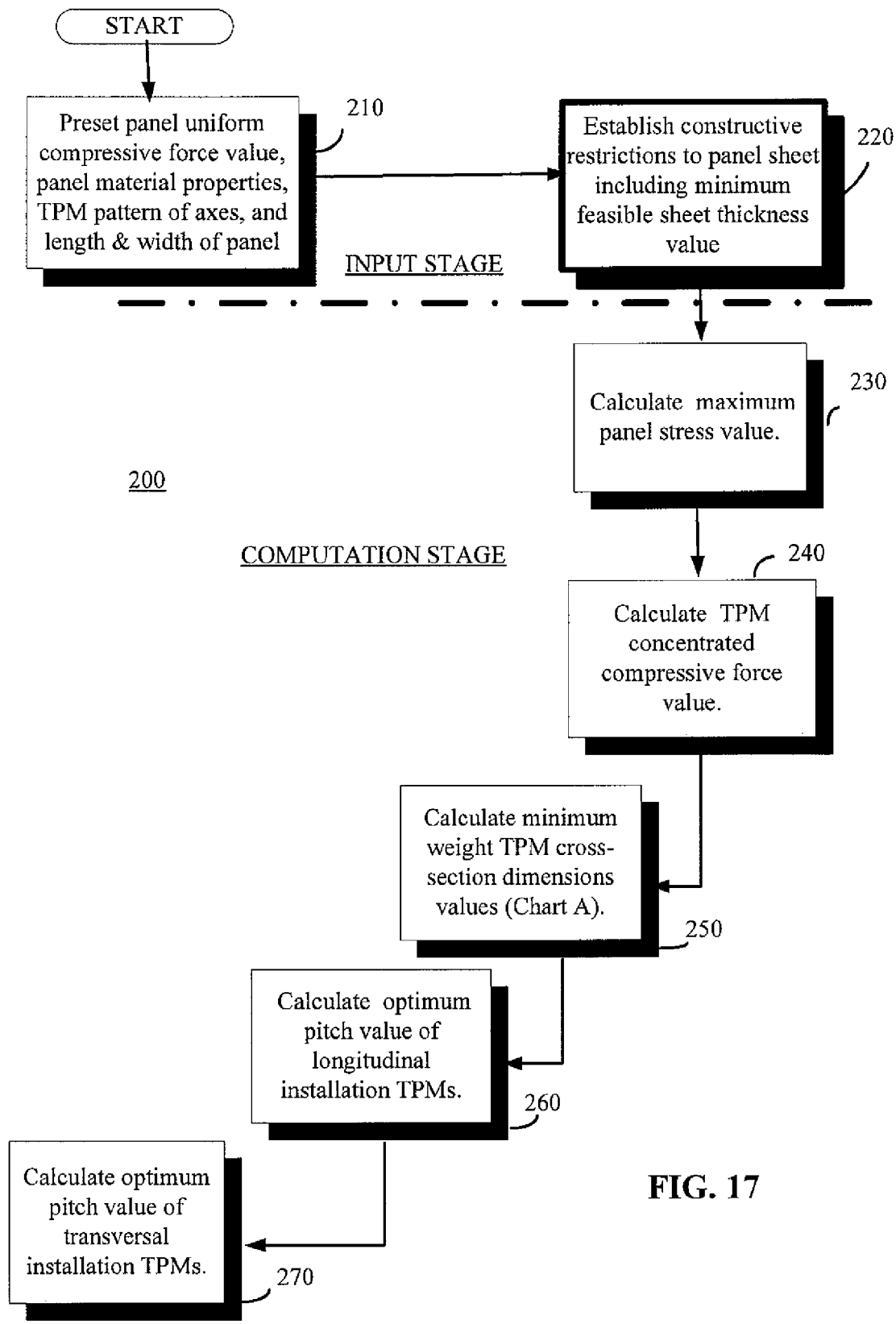
FIG. 17 is a flow diagram describing the operational flow of a model and analysis TPM design tool configured for selecting an optimum weight TPM-panel in accordance with a further exemplary embodiment.

FIG. 17 is a high-level flow diagram 200 describing the operation flow of a model and analysis TPM design tool configured for selecting an optimum weight TPM-panel in accordance with a further exemplary embodiment.

Referring to FIG. 17, a first step in design optimization of TPM-panel combinations involves receiving preset panel uniform compressive force value; panel material properties (TPM and sheet)—compression yield stress value, compression proportionality limit value, tensile ultimate stress value, compression limiting stress value, compression normal modulus value; pattern of axes (TPM shape); and panel length and width (step 210). Any constructive (including fabricated) restrictions to TPM-panel including minimum feasible sheet thickness value are established and entered into the tool to be used in its calculations (step 220). Steps 210 and 220 are part of the input stage functions performed by the tool.

Once the information has been collected the tool is ready to begin processing this information. This is performed by a calculations stage.

The first calculation is to generate a maximum panel stress value (step 230), followed by generating TPM concentrated compressive force value (step 240). This then is followed by generating minimum weight cross-section dimensions values using the methodology described in operational flow diagram 100 (step 250). The tool then calculates and generates an optimum pitch value of longitudinally installed TPMs (step 260). In the final step 270, the optimum pitch value of transversal installation TPMS is obtained.

The solution of the panel optimization problem is based on the existing methods of direct calculations of its strength, as well as on the results obtained in solution of the problem of the optimum compressed TPM.

The panel is considered as a "wide column" losing stability simultaneously in overall and local modes. It is assumed in the practice of TPM-reinforced panels that the link of TPM with skin is pivotal. In this assumption, in the local stability calculations, the mutual effect of TPM and skin is not accounted for, while in the overall stability calculations the effect of the skin is accounted for through the effective bending rigidity of the TPM. In the calculation scheme selected, the shape efficiency factor for a "wide column" shall be assumed the same as for the "simple (narrow) column".

For the example, the panel with Z-shape TPM (forming with the sheet an open configuration) shall be considered. For the panel with the U-shaped TPM (forming with the sheet a closed configuration), the final results are presented. The results of calculations are presented for panels with U-shaped, Z-shaped and L-shaped TPM.

To summarize, the computer-implemented methodology in accordance with an exemplary embodiment, involves the sequence of steps of:
(i) identifying constructive restrictions associated with the panel sheet;
(ii) calculating a maximum panel stress value on the basis of the constructive restrictions;
(iii) calculating a TPM concentrated force value;
(iv) calculating for any TPM that is to be longitudinally disposed on the panel sheet, and for a first corresponding set of constructive restrictions, a first set of optimum cross-section dimensional ratio values;
(v) calculating for any TPM that is to be transversally disposed on the panel sheet, and for a second corresponding set of constructive restrictions, a second set of optimum cross-section dimensional values;
(vi) calculating a first optimum pitch value to pitch position the TPMs to be longitudinally disposed on the panel sheet; and
(vii) calculating a second optimum pitch value to pitch position the TPMs to be longitudinally disposed on the panel sheet.

As explained, the constructive restrictions associated with the panel sheet include a minimum feasible sheet thickness value, as well as at least one of a preset panel uniform compressive force value, panel material properties, TPM pattern of axes, and a length and width of panel.

Furthermore, the calculating of at least one of the first and second sets of optimum cross-section dimensional values of a corresponding TPM involves identifying a set of TPM cross-section dimensional ratio values, and calculating from a set of inter-dependent parameters, including the set of TPM cross-section dimensional ratio values, the optimum cross-section dimensional ratio values of the TPM.

The set of inter-dependent parameters includes the corresponding one of the set of first and second constructive restrictions. Each of the first and second sets of constructive restrictions is determined from at least one of a preset concentrated compressive force value, material properties, pattern of axes, and a length of the associated TPM.

Furthermore, the calculating of the optimum cross-section dimensions ratio values of the TPM, involves:
(i) calculating a corresponding set of shape efficiency factor values for the set of TPM cross-section dimensions ratio values, using the corresponding one of the first and second sets of constructive restrictions;
(ii) calculating a maximum shape efficiency factor value; and
(iii) calculating optimum ratio values and a maximum stress value on the basis of the maximum shape efficiency factor value.

A further example of generating an optimum TPM design given a set of constructive restrictions utilizing the more common Z and I shapes, is now presented.

A Z shape is shown in FIG. 4 while an I shape is shown in FIG. 5. Consider these same TPMs with four variable shape dimensions b, $\delta_b$, c, and $\delta_c$. We first introduce relevant ratios:
(i) the ratio of the width of the additional strip with the free rib and the common rib to the width of the main strip: $a_1 = c/b$, and
(ii) the ratio of the thickness of the additional strip with the free rib and the common rib to the thickness of the main strip: $a_2 = \delta_c/\delta_b$.

We then express the shape efficiency factor as a function of the two ratios $a_1$, $a_2$ and coefficient $K = K(a_1, a_2)$.

The theoretical maximum value of Z shape efficiency factor $\Sigma_{max} = 0.538$ is obtained at the optimum ratio values at $a_1^{op} = 0.15$ and at $a_2^{op} = 2$, then the factor $K^{op} = 6.0$.

The theoretical maximum value of I shape efficiency factor $\Sigma_{max} = 0.556$ is obtained at the optimum ratio values at $a_1^{op} = 0.05$ and at $a_2^{op} = 2.5$, then the factor $K^{op} = 6.2$.

Feasible ratios for Z shape taking into account constructive restrictions are presented below.

For Z shape, (at $\Sigma_{max} = 0.538$) an optimum value of $a_1^{op} = 0.15$. The length of flange c at this optimum value is not sufficient to be able to successfully mount a rivet (c<2 cm). If the optimum thickness ratio value is increased to $a_2^{op} = 2$, thickness $\delta_b$ may prove too thin (less than 1 mm). This makes it difficult to manufacture such a profile in mass-scale production. The most suitable for production is a constant thickness shape with $a_2^{op}=1$, but at some loads and material the value flange thickness $\delta_c$ may be less than the value of the thickness panel skin, and hence not recommended.

Given a different set of constructive restrictions, whereby $a_1=0.05$-$0.3$ and $a_2=1.0$-$3.0$, then in this scenario, a Z-shaped TPM may very well be a best option.

Going back to the previous example, it was explained that for a rivet to fit, an $a_1^{op}=0.3$ is desirable. With this, the maximum value $\Sigma=0.515$, at $a_2^{op}=2$, therefore $\Sigma=0.515$ will be less $\Sigma_{max}=0.538$ and weight of this variant Z shape will be more than for Z shape at theoretical value $\Sigma_{max}=0.538$ over 4.3% only. In the second example, again for a rivet could fit, we will assume that $a_1^{op}=0.3$, and that the most suitable for production is a constant thickness profile. Now assuming $a_2^{op}=1$, the resultant shape efficiency factor is only $\Sigma=0.50$. So, by changing slightly the design configurations the designer has to choose from, it is possible to address the problem of being able to provide clearance and thickness for the mounting of a rivet, at an additional marginal weight "cost" or "penalty" which is only 5.3% above a non-suitable for riveting configuration, but otherwise lighter in weight.

Beyond specifying ranges, the value of shape efficiency factor could decrease significantly. For example assuming values of ($a_1^{op}>0.3$ and $a_2^{op}<1.0$), which would allow fitting of a rivet, and assuming next that $a_1^{op}=0.4$ and that thickness $\delta_b$ can't prove too thin, it is assumed that $a_2^{op}=0.5$, corresponding value $\Sigma=0.425$, therefore weight of this variant profile will be more over 21.4% (comparing variant with theoretical value $\Sigma_{max}=0.538$).

Taking this a step further, with $a_1^{op}>0.3$ and $a_2^{op}>3.0$), again so a rivet could fit, and assuming that $a_1^{op}=0.4$ and that the value flange thickness $\delta_c$ should be more than the value of the thickness panel skin, and if we assume $a_2^{op}=3.5$, we arrive at a resultant $\Sigma=0.367$. At this $\Sigma$, a substantial weight increase of over 31.8 percent is realized.

Feasible ratios values and corresponding shape efficiency factor values for a Z-shaped TPM as a function of a given set of constructive restrictions is presented in Table 1 below.

TABLE 1

($\Sigma_{max}=0.538$)

| | $a_1^{op}$ | $a_2^{op}$ | $\Sigma$ | % |
|---|---|---|---|---|
| 1. | 0.30 | 2.0 | 0.515 | 4.30 |
| 2. | 0.30 | 1.0 | 0.500 | 5.30 |
| 3. | 0.31 | 0.7 | 0.490 | 8.90 |
| 4. | 0.31 | 3.3 | 0.480 | 10.8 |
| 5. | 0.40 | 0.5 | 0.425 | 21.4 |
| 6. | 0.40 | 3.5 | 0.367 | 31.8 |

Table 2 has similar calculations as those in Table 1 but this time for an I-shaped TPM.

TABLE 2

($\Sigma_{max}=0.556$)

| | $a_1^{op}$ | $a_2^{op}$ | $\Sigma$ | % |
|---|---|---|---|---|
| 1. | 0.15 | 2.0 | 0.538 | 6.30 |
| 2. | 0.20 | 1.0 | 0.513 | 7.73 |
| 3. | 0.31 | 0.7 | 0.471 | 14.9 |
| 4. | 0.31 | 3.3 | 0.412 | 25.9 |
| 5. | 0.40 | 0.5 | 0.415 | 25.4 |
| 6. | 0.40 | 3.3 | 0.379 | 31.8 |

As can be seen from the above tables, it is established that the proposed algorithmic process, coupled with suitable computing means and user selectable interfaces, it is possible to arrive at feasible ratio values that satisfy known constructive restrictions with optimum weight configuration.

Referring again back to Table 2, it is shown that the critical shape efficiency factor and corresponding ratio values play a critical role in arriving at a TPM design that is weight optimized (as in items 1, 2 in Tables 1 and 2), near weight optimized (items 3, 4 in Table 1 only), and non-weight optimized (items 5, 6 in Table 1 and items 3-6 in Table 2).

It can be seen that the shape efficiency factor values of $\Sigma_5$ and of $\Sigma_6$ based on the ratios in Variants 5 and 6, respectively, and which are significantly outside the ranges for the Z shape and the I shape TPMs, are significantly less than the theoretical maximum value $\Sigma_{max}$ for each shape.

It can be further seen from the shape efficiency factor values of $\Sigma_1$, $\Sigma_2$ based on the ratios values in Variants 1, 2, respectively, and which are within the ranges for the Z shape and the I shape TPMs, that the shape efficiency factor values are not significantly less than the theoretical maximum value $\Sigma_{max}$ for a given shape.

It is to be understood that a TPM is implicitly associated with a shape efficiency factor with theoretical maximum values. For various TPM shapes, these theoretical maximum values fall inside specified ranges. Inside the ranges, for each TPM shape, the values of the shape efficiency factor have insignificant deviation from its theoretical maximum values and thus insignificant deviation from its theoretical minimum weight values. Outside the ranges, the shape efficiency factor values decrease significantly, as a consequence of which so does the overall weight in design. In all other regards, techniques for setting the ratios themselves to feasible and workable dimensions and which comply with a given set of constructive restrictions is known and beyond the scope of this invention.

In accordance with a further embodiment of the invention, various shapes of TPM can be compared in weight: the greater the maximum value of the shape efficiency factor $\Sigma$ for a particular shape, the less is the TPM weight. For selecting the most efficient TPM shape with minimum weight, for each TPM of a given shape a plurality of maximum shape efficiency factors values $\Sigma_{max}1, \Sigma_{max}2 \ldots \Sigma_{max}N$ are determined, an overall maximum shape efficiency factor value $\Sigma_{0max}$ is determined and the TPM of the shape having the overall maximum shape efficiency factor value $\Sigma_{0max}$ is produced by known methods.

The proposed method of producing minimum weight transversal and longitudinal reinforcing panels IV and V with respect to constructive restrictions comprising the steps similar to method of producing a minimum weight TPM and including expressions (1) (9).

1. TPM Analysis 1.1 Detailed Computational Analysis—TPM Selection Analysis Scheme For explanation purposes, an analysis scheme for a representative thin wall profile member has been selected that is very close to the existing efficient calculation method. For a TPM, such a method is the theory of stability of compressed strips forming the TPM (with regard to their operation within supercritical range in respect of stability). The selected analysis scheme predetermines the character and sequence of destruction of a compressed TPM.

A TPM is considered as a solid-walled structural member consisting of plate (strips). Therefore it is possible that prior to the loss of the stability of the TPM as a whole (overall stability loss), the strips forming the TPM would have suffered (local) buckling (which is characterized by warp of the cross-section, linearity and position of common longitudinal ribs of the strips being maintained). This may result in destruction of the entire compressed TPM.

Geometrical irregularities (initial eccentricity of load application and bends) reduce critical stresses and, consequently, reduce the load-carrying capacity of the TPM. Calculations errors (of loads, stresses, deformations) and adopted assumptions of the selected analysis scheme are refined later in compliance with the Design Standards.

Optimization Model

What follows is a more detailed discussion of the operational flow described in FIG. 16.

As already explained, the drawback common to all known calculation methods of optimization is lack of a unified practical calculation method for multiple-parameter problems. In the thin wall systems optimum design theory, only those inverse problems of building mechanics have been examined that are the simplest in their mathematical description with only few simultaneously varied parameters.

To reduce the number of simultaneously varied parameters, the proposed model uses the following design approaches: 1) proceeding from simple design schemes to more complicated ones basing on analysis of various forms of stability loss of the structure; 2) introduction of generalizing coefficients (shape efficiency factor et al.); 3) employment of equal stability principle; 4) introduction of constructive restrictions.

The suggested model using these design approaches enable analytical representation of the dimensions of cross-section (shape dimensions) of compressed TPM having the minimum weight.

The compressed TPM is considered as a "simple column" possessing high torsional rigidity. As a rule, in the TPM-based structures their high torsional rigidity is provided for. There are two kinds of stability loss—local and overall ones. Used to solve the problem is equating design and critical stresses for both kinds of stability loss. Initially, applying the conditions of G. Cohen's theorem, it is proved that the equations used ensure the minimum weight of a compressed TPM.

To equate the two kinds of stability loss as a criterion of the minimum weight, the following conditions formulated in the Cohen's theorem are sufficient:

The effective thickness function $\tau_{ef}(x_i)$ shall be independent on one of the cross-section dimensions $x_i$, for example, $x_k$; $x_i$ are independent dimensions determining the cross-section, where $i=1, 2 \ldots n$.

Therefore, $$\frac{\partial \bar{\tau}_{ef}}{\partial \bar{x}_k} = 0$$

where $\bar{\tau}_{ef} = t_{ef}/\bar{q}$, and $\bar{t}_{ef} = t_{ef}/l_{re}$, $\bar{q} = q/l_{re}$, $t_{ef}$ being the effective thickness (area divided by unit length of cross-section). Stresses $\sigma_{cr.\,l}(x_i)$ and $Y_{cr.\,tot}(x_i)$ shall be monotony decreasing with $x_k$.

Therefore, $$\frac{\partial \sigma_{cr.l}(x_i)}{\partial x_k} \neq 0; \quad \frac{\partial \sigma_{cr.tot}(x_i)}{\partial x_k} \neq 0.$$

Let us check applicability of Cohen's equation for a compressed TPM. For this, thickness function $\tau_{ef}(x_i)$ and critical stress functions $\sigma_{cr.\,l}(x_i)$, $\sigma_{cr.\,tot}(x_i)$ should be expressed in terms of TPM shape dimensions $x_i$.

Let us introduce TPM dimensionless parameters $a_1$, $a_2 \ldots a_n$ as ratios of TPM shape dimensions to characteristic dimensions. Characteristic dimensions a, $\delta_a$ shall be defined as the dimensions of the main strip appearing in the formula of local stability critical stress.

Figure 18:
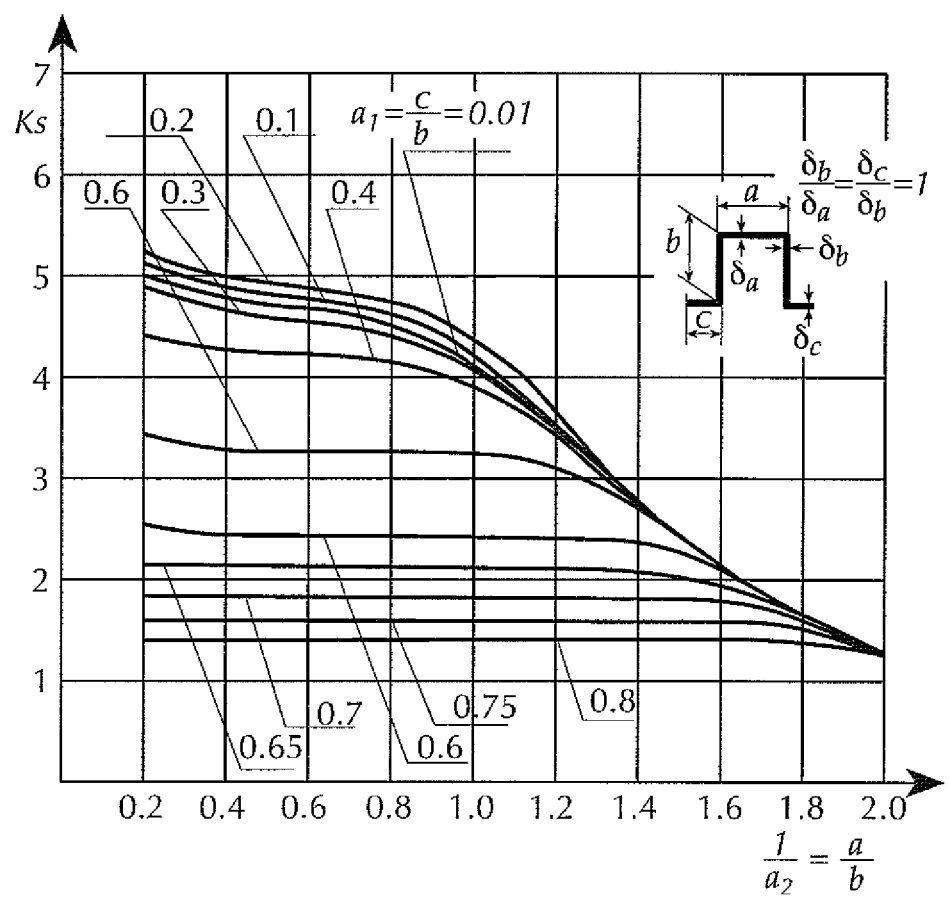
FIG. 18 is a plot showing factor Ks versus ratios of U-shaped TPM dimensions.

FIG. 18 is a plot showing factor Ks versus ratios of U-shaped TPM dimensions.

Figure 19:
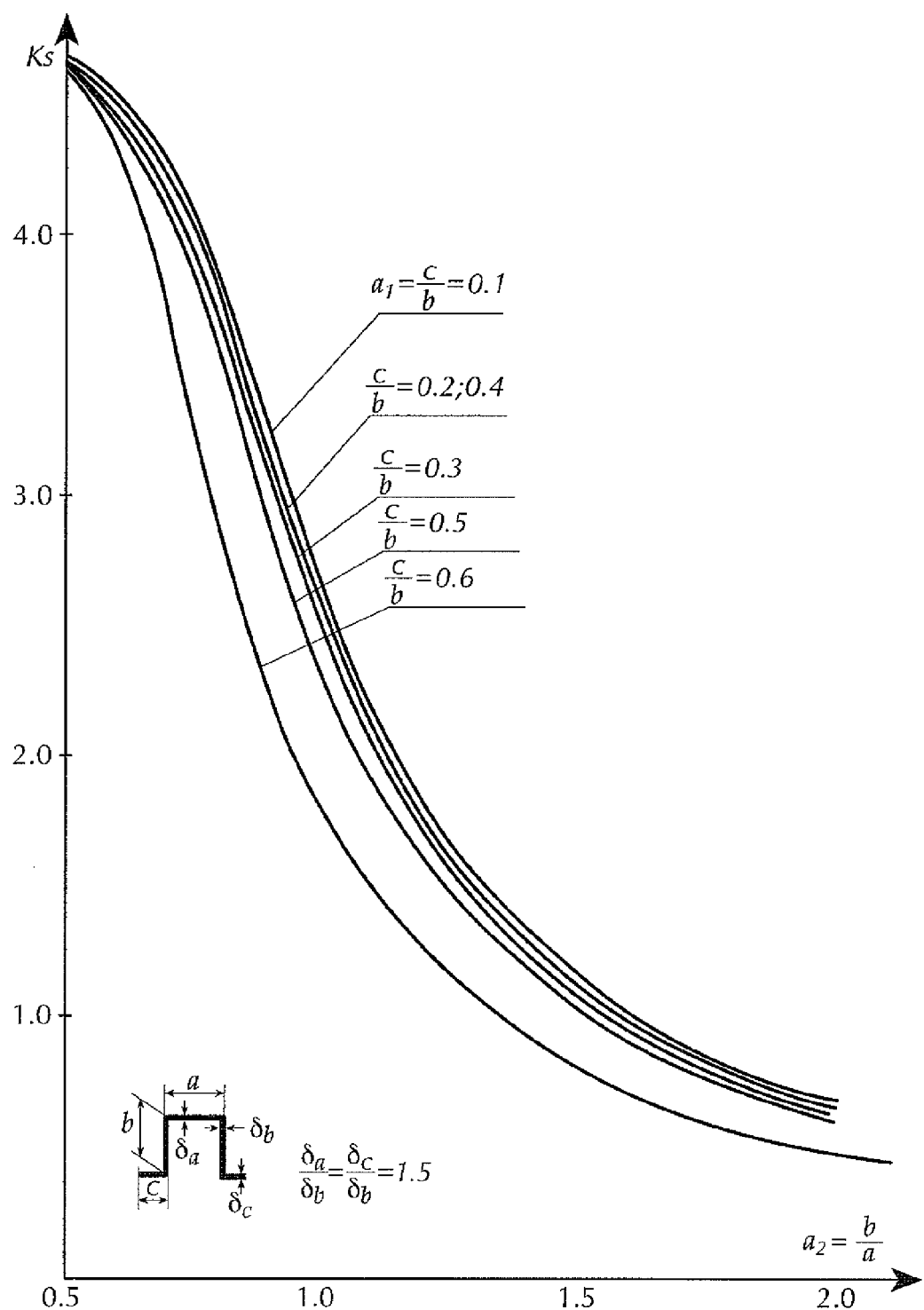
FIG. 19 is a another plot showing factor Ks versus ratios of U-shaped TPM dimensions.

FIG. 19 is another plot showing factor Ks versus ratios of U-shaped TPM dimensions.

Figure 20:
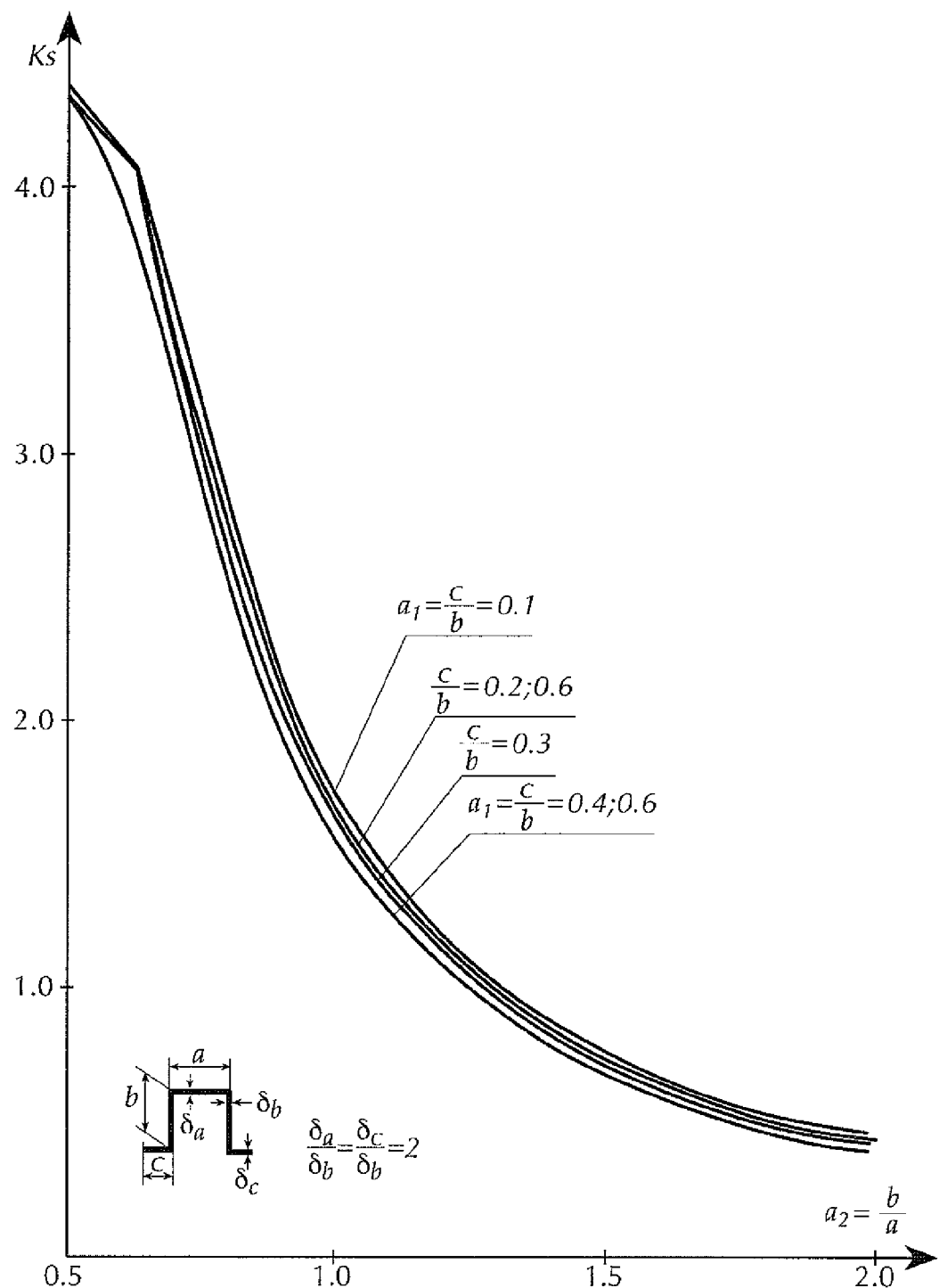
FIG. 20 is a yet another plot showing factor Ks versus ratios of U-shaped TPM dimensions.

FIG. 20 is yet another plot showing factor Ks versus ratios of U-shaped TPM dimensions.

Figure 21:
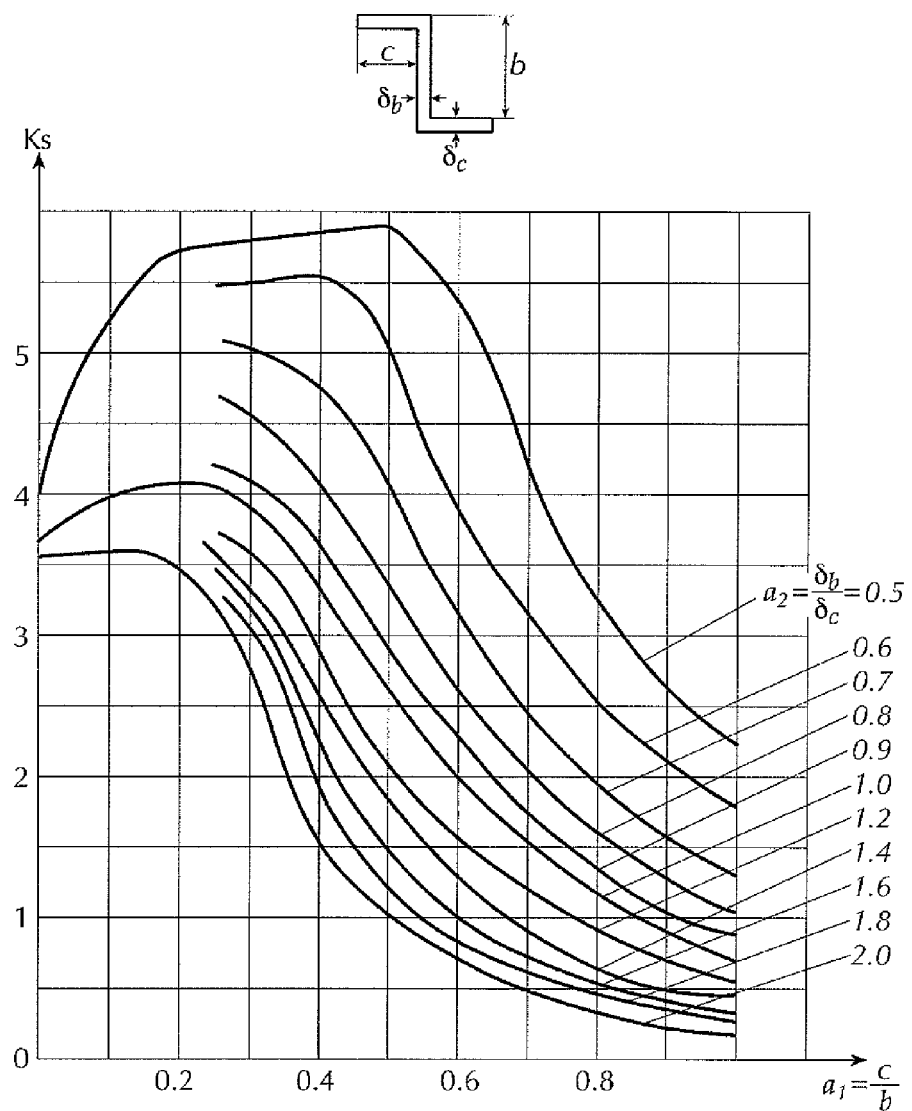
FIG. 21 is a plot showing factor Ks versus ratios of Z-shaped TPM dimensions.

FIG. 21 is a plot showing factor Ks versus ratios of Z-shaped TPM dimensions.

Figure 22:
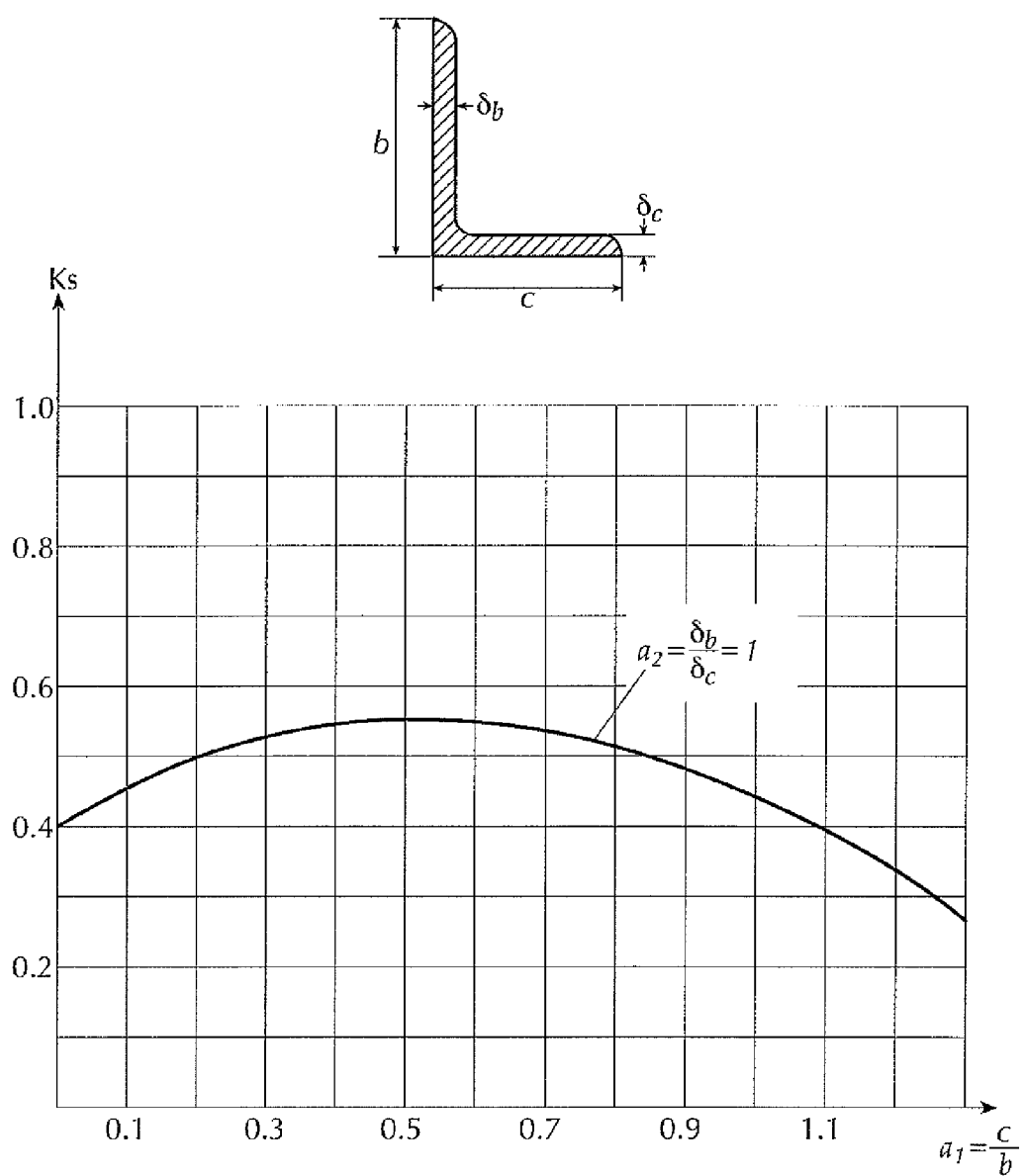
FIG. 22 is a plot showing factor Ks versus ratios of L-shaped TPM dimensions.

FIG. 22 is a plot showing factor Ks versus ratios of L-shaped TPM dimensions.

Figure 23:
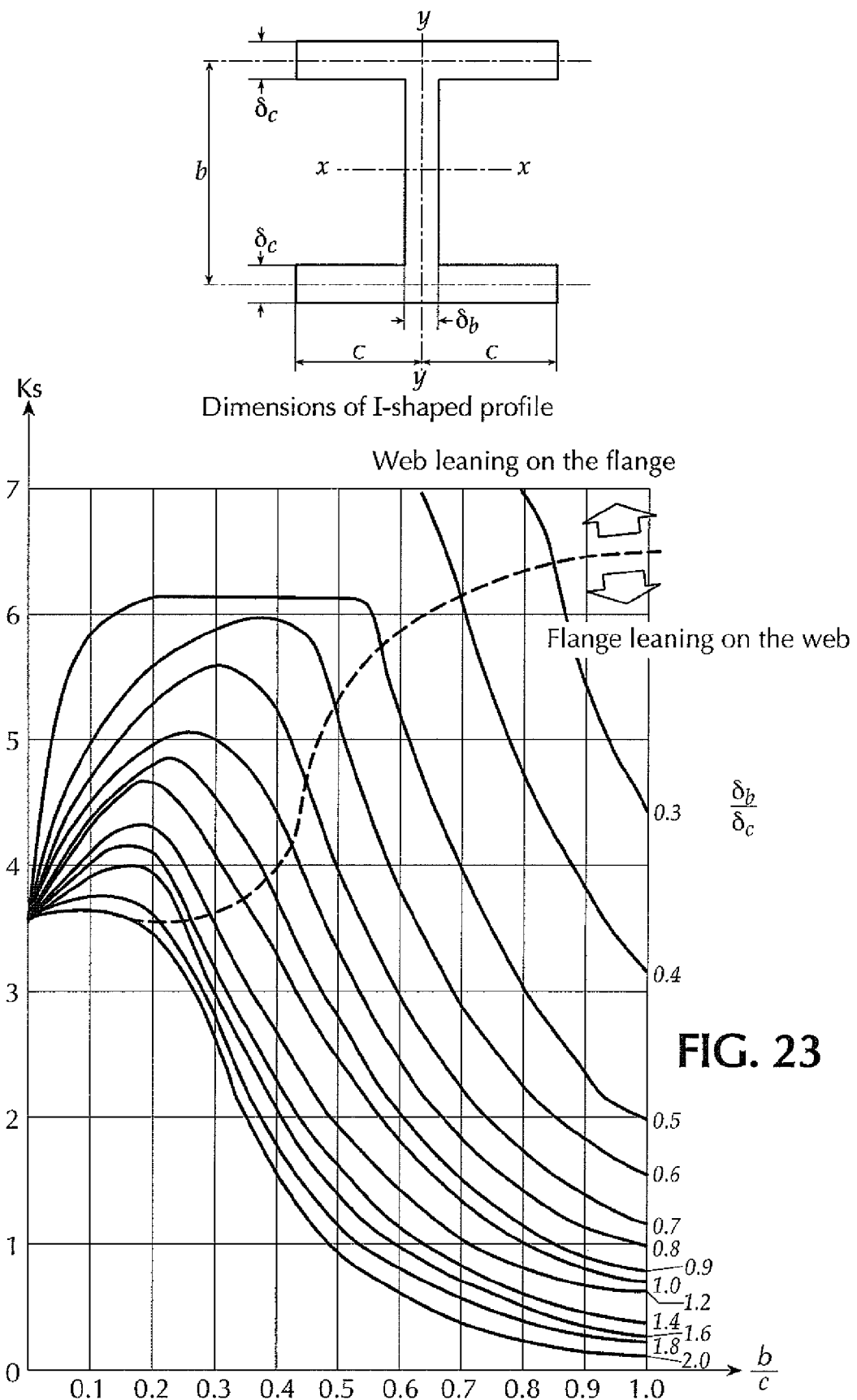
FIG. 23 is a plot showing factor Ks versus ratios of I-shaped TPM dimensions.

FIG. 23 is a plot showing factor Ks versus ratios of I-shaped TPM.

Let us express geometric characteristics of the profile in the dimensionless form through characteristic dimensions and dimensionless parameters:

$$\bar{F}_s = \bar{a} \cdot \bar{\delta}_a \cdot f_1(a_1, a_2 \ldots, a_n), \tag{1.1.1}$$

$$\bar{J}_s = \bar{a}^3 \cdot \bar{\delta}_a \cdot f_2(a_1, a_2 \ldots, a_n), \tag{1.1.2}$$

$$\bar{i}_s^2 = \bar{a}^2 \cdot f_3(a_1, a_2 \ldots, a_n), \tag{1.1.3}$$

where $$\bar{F}_s = \frac{F_s}{l_{re}^2}; \bar{J}_s = \frac{J_s}{l_{re}^4}; \bar{i} = \frac{i_s}{l_{re}}; \bar{a} = \frac{a}{l_{re}}; \bar{\delta}_a = \frac{\delta_a}{l_{re}},$$

$f_1(a_1, a_2, \ldots a_n)$, $f_2(a_1, a_2, \ldots a_n)$, $f_3(a_1, a_2, \ldots a_n)$ are functions of dimensionless parameters of the TPM shape.

Then: the effective thickness $$\bar{t}_{ef} = \frac{\bar{F}_s}{\bar{a}} = \bar{\delta}_a \cdot f_1(a_1, a_2 \ldots, a_n), \tag{1.1.4}$$

the effective thickness function:

$$\bar{\tau}_{ef} = \frac{\bar{\delta}_a \cdot f_1(a_1, a_2, \ldots, a_n)}{\bar{q}_c}, \tag{1.1.5}$$

the local stability critical stress $$\sigma_{cr.l} = \frac{K_s \cdot E}{(\bar{a}/\bar{\delta}_a)^2} \cdot \sqrt{\eta_\delta}, \tag{1.1.6}$$

K is the local stability factor of TPM shape:
$K_s = K_s(a_1, a_2, \ldots, a_n)$, FIGS. 18-23:
the overall stability critical stress $$\sigma_{cr.tot} = \frac{\pi^2 \cdot E}{\lambda_s^2} \cdot \eta_\sigma = \pi^2 \cdot E \cdot \bar{a}^2 \cdot f_3(a_1, a_2, \ldots, a_n) \cdot \eta_\sigma, \tag{1.1.7}$$

where $\lambda_s$, is TPM flexibility, $\lambda_s = l_{re}/i$

Assuming $x_k = a$ and writing the partial derivatives as $$\frac{\partial \overline{\tau}_{ef}}{\partial \overline{a}}, \frac{\partial \sigma_{cr.l}}{\partial \overline{a}} \text{ and } \frac{\partial \sigma_{cr.tot}}{\partial \overline{a}},$$

we see the Cohen's theorem conditions 1 and 2 are fulfilled. Therefore, equality of the critical stresses of local and overall stability for the TPM ensures its minimum weight.

1.2 Accounting for Material Properties at Elasticity Area (Derivation of Analytical Dependence for Elastic Ductility Factor)

To derive analytical formula for the elastic ductility (plasticity) factor for aluminum alloys, the following linear law of variation of stress $\sigma$ with flexibility $\lambda_s$ is assumed:

$$\sigma = \sigma_0 - \frac{\sigma_0 - \sigma_{pr}}{\lambda_s^*} \cdot \lambda_s, \quad (1.2.1)$$

where $\lambda_s^*$ is the limiting flexibility of TPM, $$\lambda_s^* = \pi \cdot \sqrt{\frac{E}{\sigma_{pr}}}.$$

On the other hand, TPM stress can be expressed in terms of flexibility by equation (1.1.7). Excluding flexibility $\lambda_s$ from equations (1.1.7) and (1.2.1), we obtain the ductility factor as follows:

$$\eta_\sigma = \frac{\sigma}{\sigma_{pr}} \cdot \left(\frac{\sigma_0 - \sigma}{\sigma_0 - \sigma_{pr}}\right)^2. \quad (1.2.2)$$

It follows from (1.2.2) that the ductility factor $\eta_\sigma$ depends on stress $\sigma$. To determine $\eta_\sigma$ usually the successive approximation method is used, which complicates the solution making the design process rather time consuming. To avoid usage of this method, let us present critical stress (1.1.6) and (1.1.7) in the following way:

$$\sigma_{cr.l} = \sigma_{cr.l(\eta_\sigma=1)} \cdot \sqrt{\eta_{\sigma.l}} \quad (1.2.3),$$

$$\sigma_{cr.tot} = \sigma_{cr.tot(\eta_\sigma=1)} \cdot \eta_{\sigma.tot} \quad (1.2.4),$$

where:
$\sigma_{cr.l(\eta_\sigma=1)}$ is local stability critical stress (1.1.6) determined at ductility factor equal to 1;
$\sigma_{cr.tot(\eta_\sigma=1)}$ is overall stability critical stress (1.1.7) determined at ductility factor equal to 1.

Solving (1.2.2) together with (1.2.3) and (1.2.4), respectively, and taking into account equations $\sigma_{cr.l} = \sigma_{cr.tot} = \sigma$, we obtain:

$$\eta_{\sigma.l} = \left\{\left[\frac{\sqrt{\sigma_{pr} \cdot (\sigma_0 - \sigma_{pr})^2 + 4 \cdot \sigma_{cr.l(\eta_\sigma=1)}^2 \cdot \sigma_0} - }{\sigma_{pr}^{1/2} \cdot (\sigma_0 - \sigma_{pr})}\right]}{4 \cdot \sigma_{cr.l(\eta_\sigma=1)}^3}\right\}, \quad (1.2.5)$$

$$\eta_{\sigma.tot} = \frac{\sigma_0}{\sigma_{cr.tot(\eta_\sigma=1)}} - \frac{\sigma_0 - \sigma_{pr}}{\sigma_{cr.tot(\eta_\sigma=1)}} \cdot \left(\frac{\sigma_{pr}}{\sigma_{cr.tot(\eta_\sigma=1)}}\right)^{\frac{1}{2}}. \quad (1.2.6)$$

The sequence of determination of local and total critical stresses for TPM is as follows. First, the critical stress is determined at ductility factor value equaling 1 (one) $\sigma_{cr.l(\eta_\sigma=1)}, \sigma_{cr.tot(\eta_\sigma=1)}$. If the obtained values of critical stress are less than $\sigma_{pr}$, the calculation is considered completed; if the value is greater, then using equations (1.2.5) and (1.2.6) the elastic ductility factor is determined. After that, using equations (1.2.3) and (1.2.4) the sought-for value of critical stress is determined.

The similar sequence can be used to determine the analytical dependence for elastic ductility factors of other materials. For example, for steel alloys these dependencies take on the form:

$$\eta_{\sigma.l} = \frac{\sigma_{0,2} \cdot \sigma_{cr.l(\eta_\sigma=1)} - (\sigma_{0,2} - \sigma_{pr}) \cdot \sigma_{pr}}{\sigma_{cr.l(\eta_\sigma=1)}^2}, \quad (1.2.7)$$

$$\eta_{\sigma.tot} = \frac{\sigma_{0,2} \cdot \sigma_{cr.tot(\eta_\sigma=1)}}{(\sigma_{0,2} - \sigma_{pr}) \cdot \sigma_{pr} + \sigma_{cr.tot(\eta_\sigma=1)}^2}. \quad (1.2.8)$$

1.3. Procedure For Designing Optimum Compressive TPM

We shall, in the present example, use equations for critical and design values of stress in order to determine the optimum characteristic dimensions $\overline{a}, \overline{\delta}_a$, $$\sigma_c = \sigma_{cr.l} = \sigma_{cr.tot} \quad (1.3.1),$$

where the design stress $$\sigma_s = \frac{\overline{P}_s}{\overline{F}_s} = \frac{\overline{P}_s}{\overline{a} \cdot \overline{\delta}_a \cdot f_1(a_1, a_2, \dots a_n)}, \quad (1.3.2)$$

$$\overline{P}_s = \frac{P_s}{l_{re}^2}$$

is the TPM stress factor.

Substituting (1.1.6), (1.1.7) and (1.3.2) into equations (1.3.1) and solving them in respect to $\overline{a}, \overline{\delta}_a$, we obtain:

$$\overline{a} = \left(\frac{\overline{P}_s}{\pi \cdot \sigma_s}\right)^{1/3} \cdot \frac{A_1}{\eta_\sigma^{1/12}}, \quad (1.3.3)$$

$$\overline{\delta}_a = \left(\frac{\overline{P}_s^2 \cdot \pi}{\sigma_s^2}\right)^{1/3} \cdot \eta_\sigma^{1/12} \cdot A_2, \quad (1.3.4),$$

$A_1, A_2$ are functions of dimensionless parameters.

The functions of dimensionless parameters expressed through geometric characteristics of the shape and characteristic dimensions have the following general form:

$$A_1 = \left(\frac{K_s \cdot \overline{a}^4 \cdot \overline{\delta}_a^2}{\overline{F}_s \cdot J_s}\right)^{1/6}, \quad (1.3.5)$$

$$A_2 = \left(\frac{\overline{a}^2 \cdot \overline{\delta}_a^4 \cdot J_s}{K_s \cdot \overline{F}_s^5}\right)^{1/6}. \quad (1.3.6)$$

Substituting equations (1.3.3) and (1.3.4) into (1.1.6) and taking into account (1.3.2), we obtain the value of optimum stress $$\sigma_s = (E^3 \cdot \pi^4 \cdot \overline{P}_s^2)^{1/5} \cdot \sqrt{\eta_\sigma} \cdot A \qquad (1.3.7)$$

A is the shape efficiency factor, which is the function of dimensionless parameters $a_1, a_2 \ldots, a_n$.

Here, the ductility factor $\eta_\sigma$ is obtained from the formula (1.2.5) by replacing $\sigma_{cr.l.(\eta_o=1)}$ with $\sigma_{s(\eta_o=1)}$.

Expressing A through geometrical characteristics of TPM and characteristic dimensions, we obtain:

$$A = \left[ \left( \frac{\overline{J}_s}{\overline{F}_s} \right)^2 \cdot \frac{K_s}{(\overline{a}/\overline{\delta}_a)^2} \right]^{1/5}. \qquad (1.3.8)$$

The dimensionless weight of TPM can be expressed as:

$$\overline{G}_s = \frac{\overline{P}_s}{\sigma_s}, \qquad (1.3.9)$$

where $$\overline{G}_s = \frac{G_s}{l_{re}^2 \cdot l_s \cdot \gamma}.$$

As one can see from (1.3.9), the minimum weight is obtained at the maximum stress in TPM. It follows from (1.3.7) that the only way to increase $\sigma_s$ is to increase the shape efficiency factor A.

Let us consider the physical meaning of the shape efficiency factor. The ratio $$f_s = \frac{J_s}{F_s^2}$$

is called the TPM "shape factor". The more is the material "spaced" (that is, the higher is its distance from the neutral axis), the higher is its shape factor $f_s$. On the other hand, however, the value $$\frac{K_s}{(a/\delta_a)^2}$$

characterizing the TPM local stability is thereby reduced. As a result, the shape efficiency factor possesses a maximum.

Specifying a series of values $a_1, a_2, \ldots, a_n$, it is possible to determine the maximum value $A_{max}$ and optimum (in weight) values of dimensionless parameters $a_1^{op}, a_2^{op} \ldots, a_n^{op}$ corresponding to it. Substituting the maximum values of the shape efficiency factor $A_{max}$ into equation (1.3.7), we obtain the maximum stress, and using (1.3.9), the minimum weight.

Then, substituting the optimum values of dimensionless parameters $a_1^{op}, a_2^{op} \ldots, a_n^{op}$ and values $K_s^{op} = K_s^{op}(a_1^{op}, a_2^{op} \ldots a_n^{op})$ corresponding to these into equations (1.3.3) and (1.3.4), we can find the optimum characteristic dimensions $a^{op}, \delta_a^{op}$. The other of TPM shape dimensions are essentially functions of characteristic dimensions $a^{op}, \delta_a^{op}$ and dimensionless parameters $a_1^{op}, a_2^{op} \ldots, a_n^{op}$.

Slight deviations of A with respect to $A_{max}$ (i.e. small deviations of weight with respect to $G_{min}$) could entail considerable difference in TPM shape absolute dimensions. This important conclusion can be employed to meet constructive requirements as to the dimensions of the shape provided maximum material saving.

1.4 Determination of Optimum Parameters of Compressed TPM of the Most Common Shapes In this section, we describe determination of parameters of U-, Z-, L-shape TPMs for two aluminum alloys, D16-T and B-95 (Table 1.1 in FIG. 41), and some parameters I-shaped TPM for steel.

FIG. 41 is a table showing feasible dimensions of U-shaped TPM.

The results are presented in the form of plots of optimum parameters versus stress factor, which enables to easily find the optimum actual cross-section dimensions and minimum weight of TPM.

Figure 24:
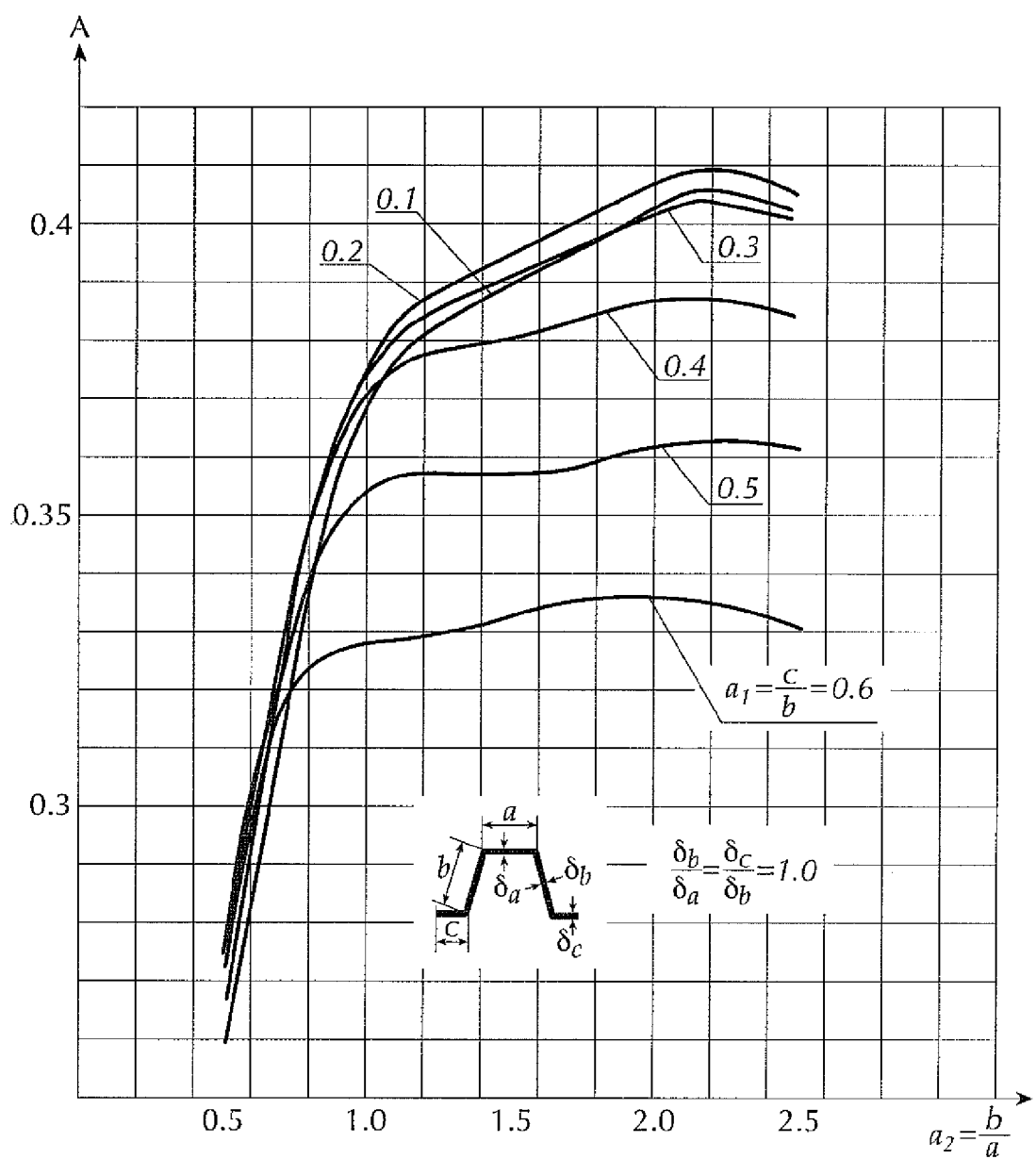
FIG. 24 is a plot of shape efficiency factor A versus ratios of U-shaped TPM dimensions.

FIG. 24 is a plot showing shape efficiency factor A versus ratios of U-shaped TPM dimensions.

Figure 25:
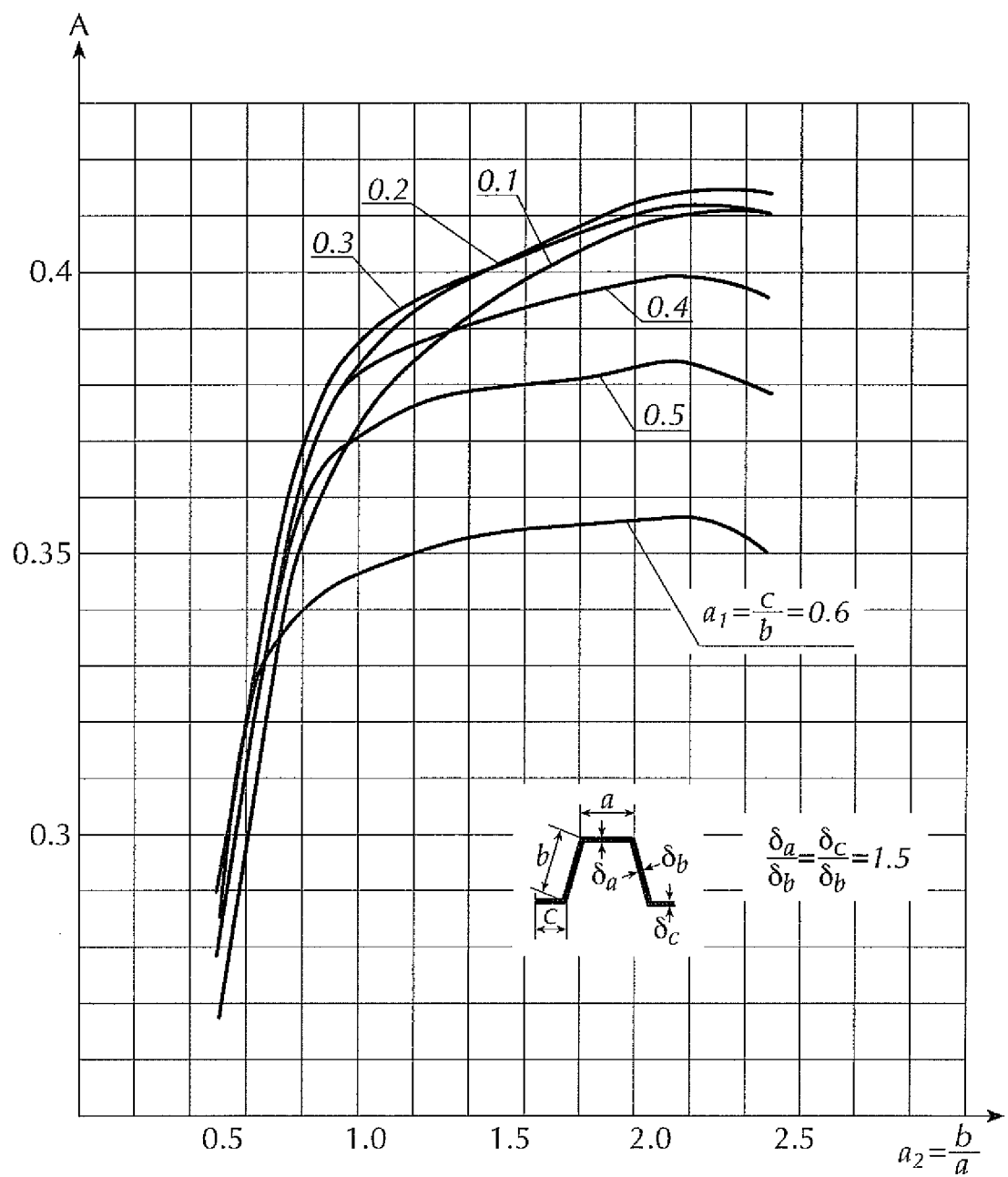
FIG. 25 is another plot showing shape efficiency factor A versus ratios of U-shaped TPM dimensions.

FIG. 25 is plot showing shape efficiency factor A versus ratios of U-shaped TPM dimensions.

Figure 26:
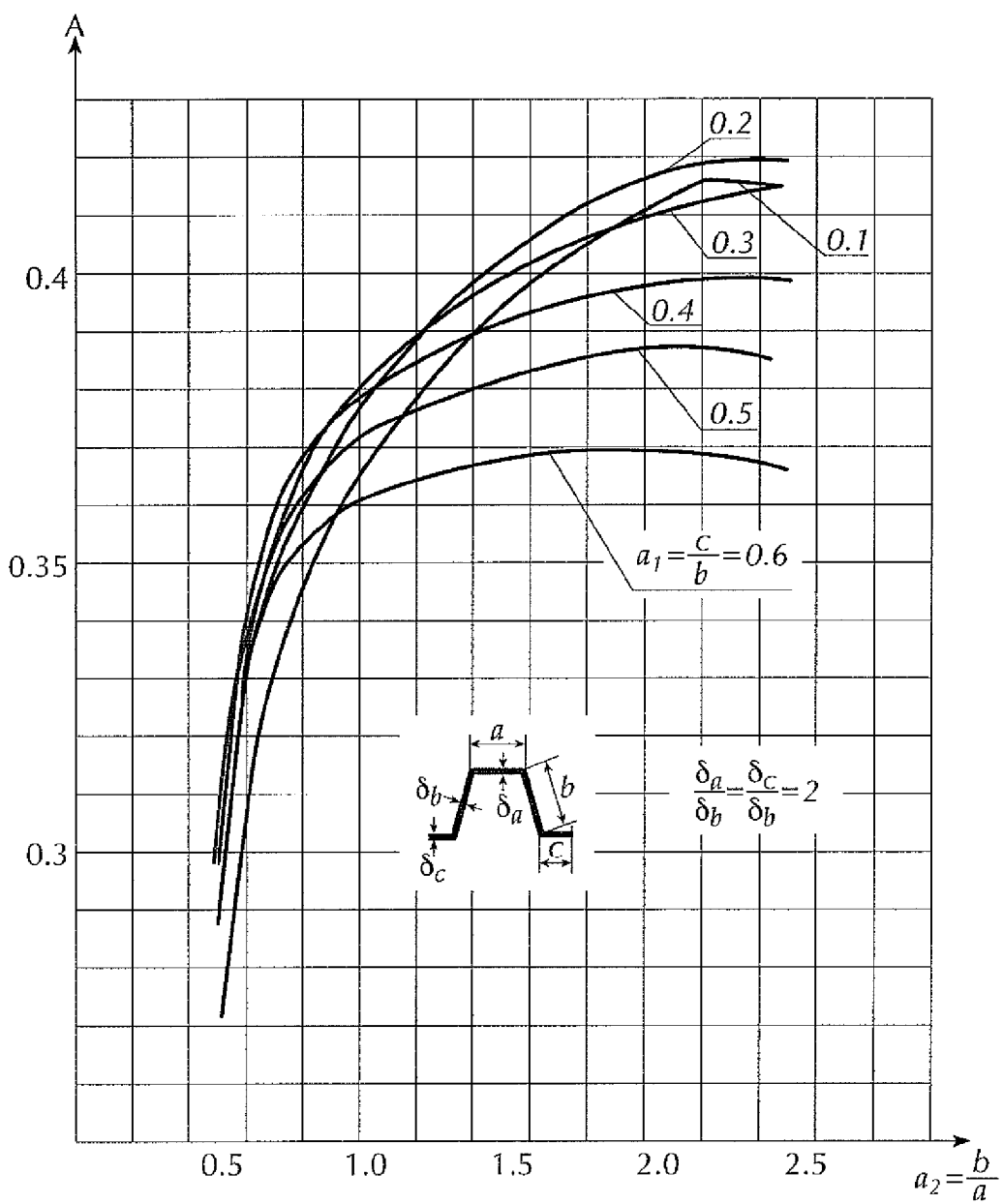
FIG. 26 is yet another plot showing shape efficiency factor A versus ratios of U-shaped TPM dimensions.

FIG. 26 is yet plot showing shape efficiency factor A versus ratios of U-shaped TPM dimensions.

Figure 27:
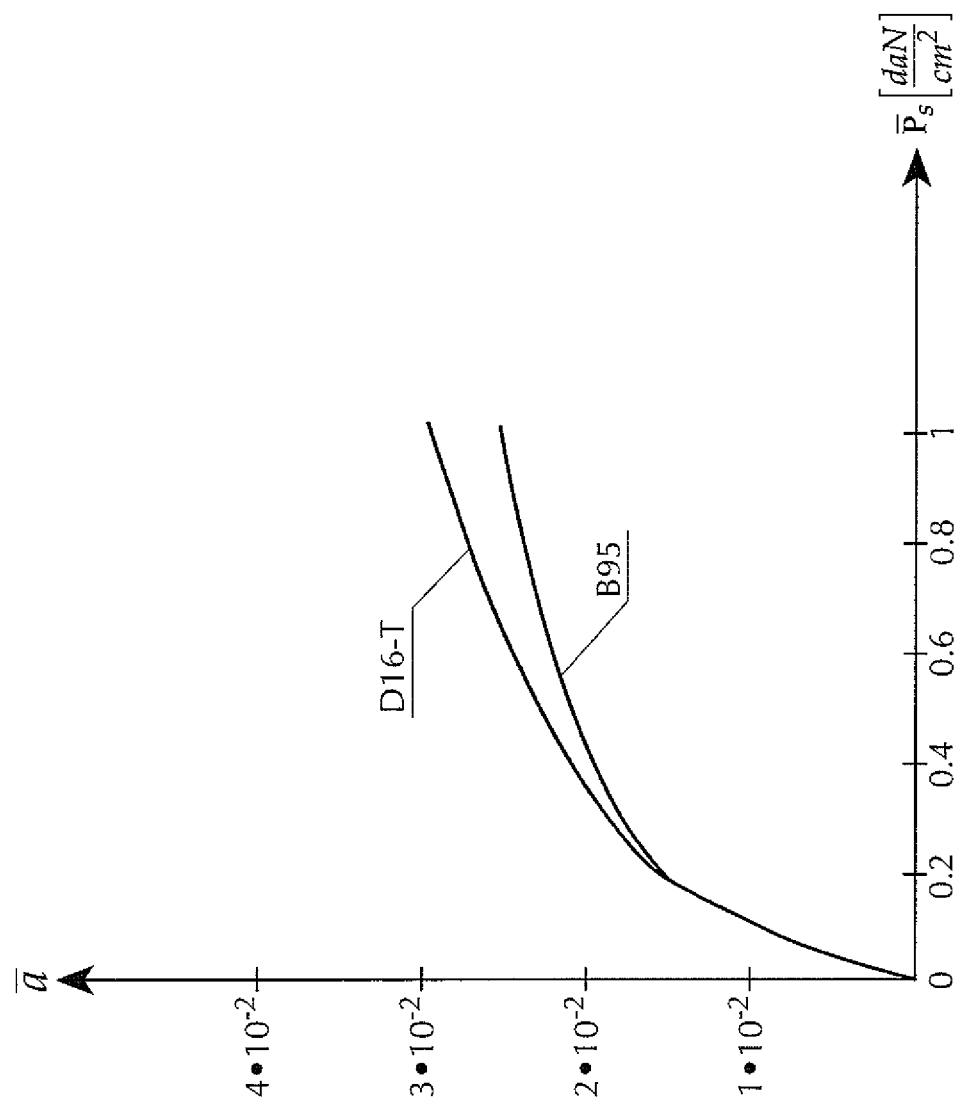
FIG. 27 is a plot showing scaled (dimensionless) characteristic dimension $$\bar{a} = \frac{a}{l_{re}}$$

FIG. 27 is a plot showing scaled (dimensionless) characteristic dimension $$\overline{a} = \frac{a}{l_{re}}$$

versus TPM stress factor $$\overline{P}_s = \frac{P_s}{l_{re}^2},$$

U-shaped TPM.

FIG. 28 is a plot showing scaled (dimensionless) characteristic dimension $$\overline{\delta}_a = \frac{\delta_a}{l_{re}}$$

versus TPM stress factor $$\overline{P}_s = \frac{P_s}{l_{re}^2},$$

U-shaped TPM.

FIG. 29 is a plot showing optimum stress $\sigma_s$ versus TPM stress factor $$\overline{P}_s = \frac{P_s}{l_{re}^2},$$

U-shaped TPM.

FIG. 30 is a plot showing dimensionless weight $$\overline{G}_s = \frac{G_s}{l_s \cdot l_{re}^2 \cdot \gamma}$$

versus TPM stress factor $$\overline{P}_s = \frac{P_s}{l_{re}^2},$$

U-shaped TPM.

To meet the constructive requirements provided small variations of shape efficiency factor A (and hence, of TPM weight) as compared with its maximum value $A_{max}$, the TPM shape dimensions could be varied.

Feasible dimensions for U-shaped TPM taking into account certain constructive requirements are presented in Table 1.1 (FIG. 41).

For TPM stress factors used in aviation $\overline{P}_s$=(0.2-1) daN/ cm², at an optimum value of $$a_1^{op} = \frac{c}{b} = 0.2,$$

the length of a flange c can be insufficient to mount a rivet (c<2 cm), so a feasible value of $a_1^{op}$=0.3 is selected. Provided optimum relationship between thickness values $$a_3^{op} = \frac{1}{a_4^{op}} = \frac{\delta_c}{\delta_b} = \frac{\delta_a}{\delta_b} = 2,$$

thickness $\delta_b$ can prove too low value (less than 1 mm), which makes it difficult to manufacture such a profile in mass-scale production. The most suitable for production is a constant thickness profile with $$a_3 = \frac{1}{a_4^{op}} = \frac{\delta_c}{\delta_b} = \frac{\delta_a}{\delta_b} = 1,$$

(profile No. 1, Table 1.1), but at some stress factors value the flange thickness value $\delta_c$ may be less of the skin thickness value, which is not recommended. Therefore, profile No. 2 is selected as the most feasible one.

At low values of the TPM stress factor, the thickness of the U-shaped TPM webs can to be very low value and technologically not feasible. If this is the case, Z-shaped and L-shaped profiles with the configuration open with the skin sheet should be selected.

Let us consider Z-shaped TPM with four variable dimensions b, $\delta_b$, c, $\delta_c$.

FIG. 31 is a plot showing shape efficiency factor A versus ratios of Z-shaped TPM dimensions.

The plot of shape efficiency factor A for various values of $a_1$, $a_2$ are presented in FIG. 31.

Respecting constructive reasons, for example, so that a rivet could fit, it is assumed that $a_1^{op}$=0.3. With this, the maximum value $A_{max}$=0.515; $a_2^{op}$=2. Then the factor $K_s^{op}$=5.8 (FIG. 31).

The calculation results are presented in plots shown in FIGS. 32 to 35.

FIG. 32 is a plot showing scaled (dimensionless) characteristic dimension $$\overline{b} = \frac{b}{l_{re}}$$

versus TPM stress factor $$\overline{P}_s = \frac{P_s}{l_{re}^2},$$

Z-shaped TPM.

FIG. 33 is a plot showing scaled (dimensionless) characteristic dimension $$\overline{\delta}_b = \frac{\delta_b}{l_{re}}$$

versus TPM stress factor $$\overline{P}_s = \frac{P_s}{l_{re}^2},$$

Z-shaped TPM.

FIG. 34 is a plot showing optimum stress $\sigma_s$ versus TPM stress factor $$\overline{P}_s = \frac{P_s}{l_{re}^2},$$

Z-shaped TPM.

FIG. 35 is a plot showing dimensionless weight $$\overline{G}_s = \frac{G_s}{l_s \cdot l_{re}^2 \cdot \gamma}$$

versus TPM stress factor $$\overline{P}_s = \frac{P_s}{l_{re}^2},$$

Z-shaped TPM.

FIG. 36 is a plot showing shape efficiency factor A versus ratio of L-shaped TPM dimensions.

The plot for the shape efficiency factor for L-shaped TPM is presented in FIG. 36. Basing on design reasons, namely, rivets mounting conditions, it is assumed that: $a_1^{op}$=0.3. With this, the maximum value $A_{max}$=0.328; $a_2^{op}$=1. Then the factor $K_s^{op}$=0.55 (FIG. 22).

Further, calculated are the factors $A_1^{op}$=1.2; $A_2^{op}$=0.641. Using equations (1.3.7), (1.3.3), (1.3.4) and (1.3.9), we can determine the optimum stress, characteristic dimensions and minimum weight.

FIG. 37 is a plot showing scaled (dimensionless) characteristic dimension $$\overline{b} = \frac{b}{l_{re}}$$

versus TPM stress factor $$\overline{P}_s = \frac{P_s}{l_{re}^2},$$

L-shaped TPM.

FIG. 38 is a plot showing scaled (dimensionless) characteristic dimension $$\overline{\delta}_b = \frac{\delta_b}{l_{re}}$$

versus TPM stress factor $$\overline{P}_s = \frac{P_s}{l_{re}^2},$$

L-shaped TPM.

FIG. 39 is a plot showing optimum stress $\sigma_s$ versus TPM stress factor $$\overline{P}_s = \frac{P_s}{l_{re}^2},$$

L-shaped TPM.

FIG. 40 is a plot showing dimensionless weight $$\overline{G}_s = \frac{G_s}{l_s \cdot l_{re}^2 \cdot \gamma}$$

versus TPM stress factor $$\overline{P}_s = \frac{P_s}{l_{re}^2},$$

L-shaped TPM.

The similar procedure is used to determine the optimum parameters of TPM of I shape.

The values of the factor $K_s$ are presented in FIG. 23.

2. TPM-Panel Analysis

Detailed Computational Analysis: TPM-PANEL Selection 2.1 Analyses Scheme—Stringer Panel with Buckling Skin For explanation purposes, an analysis scheme for a representative stringer panel with buckling skin is presented.

Panel design comes down to finding of six dimension of its cross-section b, $\delta_b$, c, $\delta_c$, $b_s$, $\delta$ given the linear compressive force $q_p$, overall dimensions B, l and panel material.

FIG. 42 shows a panel with Z-shaped TPM.

Selection of the panel cross-section dimensions allows for infinite number of solution variants. Out of these, the one is selected meeting the minimum weight panel condition.

TPM shape dimensions b, $\delta_b$, $\delta_c$, are determined according to equations (1.3.3), (1.3.4), given the force $P_s$ per one stringer. The unknown variables in this case would be pitch of TPM installation $b_s$, skin thickness $\delta$ and force $P_s$ per one stringer.

The panel weight $G_{s.p}$ is determined by the sum of weight of TPM (stringers) $G_s$, and the weight of the skin $G_{sk}$ according to the equation:

$$G_{s.p.} = G_s + G_{sk} = \left(\frac{P_s}{\sigma_s \cdot b_s} + \delta\right) \cdot l_s \cdot B \cdot \gamma. \quad (2.1.1)$$

Let us express the panel weight (2.1.1) in the dimensionless form:

$$\overline{G}_{s.p.} = \frac{\overline{P}_s}{\sigma_s \cdot \overline{b}_s} + \overline{\delta} \quad (2.1.2),$$

where $\overline{G}_{s.p.} = \frac{G_{s.p.}}{l_s \cdot l_{re} \cdot B \cdot \gamma}$, $\overline{\delta} = \frac{\delta}{l_{re}}$, $\overline{b}_s = \frac{b_s}{l_{re}}$.

The force per one stringer is related to the panel parameters by the expression:

$$P_s = q_p \cdot b_s - \delta \cdot b_s \cdot \sigma_{av} \quad (2.1.3),$$

$\sigma_{av}$ being the average stress in the skin between TPM.

Rewriting (2.1.3) in the dimensionless form, we obtain the TPM stress factor as:

$$\overline{P}_s = \overline{b}_s \cdot (\overline{q}_p - \overline{\delta} \cdot \sigma_{av}) \quad 2.1.4),$$

$\overline{q}_p$ is the panel stress factor:

$$\overline{q}_p = \frac{q_p}{l_{re}}$$

The value $\sigma^{av}$ is determined according to the formula:

$$\sigma_{av} = \sqrt{\sigma_s \cdot \sigma_{cr.sk}}, \quad (2.1.5)$$

where $$\sigma_{cr.sk} = \frac{K_p \cdot E}{(\overline{b}_s / \overline{\delta})^2}, \quad (2.1.6)$$

Here, the factor $K_p = 3.6$ for pivoted leaning of the skin.

Let us eliminate from the expression (2.1.4) the average skin stress $\sigma_{av}$. For this purpose, substitute (2.1.5) into (2.1.4), taking into consideration (2.1.6); we get $$\overline{P}_s = \overline{q}_p \cdot \overline{b}_s - \overline{\delta}^2 \cdot \sqrt{K_p \cdot E \cdot \sigma_s} \quad (2.1.7).$$

The stress in the compressed isolated TPM $\sigma_s$ is related to the stress factor $\overline{P}_s$ by the expression (1.3.7). Equation (1.3.7) enables to consider as a sought-for parameter the stringer stress $\sigma_s$ rather than the stress factor $\overline{P}_s$.

Substituting (2.1.7) into (1.3.7), we get the constraint equation for the three sought-for parameters $\sigma_s$, $\overline{b}_s$, $\overline{\delta}$:

$$\sigma_s = [E^3 \cdot \pi^4 \cdot (\overline{q}_p \cdot \overline{b}_s - \overline{\delta}^2 \cdot \sqrt{K_p \cdot E \cdot \sigma_s})^2]^{1/5} \cdot \sqrt{\eta_\sigma} \cdot A \quad (2.1.8).$$

The obtained equation can be rewritten in the form (1.2.3):

$$\sigma_s = \sigma_{s(\eta_\sigma=1)} \cdot \sqrt{\eta_\sigma},$$

then the ductility factor $\eta_\sigma$ can be obtained from the equation (1.2.5), replacing therein $\eta_{\sigma.l}$ with $\eta_\sigma$ and $\sigma_{cr.l(\eta_\sigma=1)}$ with $\sigma_{s(\eta_\sigma=1)}$.

Equation (2.1.8) cannot be solved with respect to $\sigma_s$. Given the values $\overline{b}_s$ and $\overline{\delta}$ from (2.1.8), one can numerically determine the value of $\sigma_s$ and then calculate $\overline{P}_s$ through (1.3.7). Substituting values of $\sigma_s$, and $\overline{P}_s$ into (2.1.1), we obtain the panel weight.

Numerical solution of (2.1.8) with respect to $\sigma_s$ is rather complicated and does not enable to obtain an analytical expression for the weight. The analytical expression for the panel weight as a function of two parameters $\sigma_s$ and $\overline{\delta}$ could be obtained as follows.

Solving (2.1.8) with respect to $\overline{b}_s$, we get:

$$\overline{b}_s = \frac{1}{\overline{q}_p} \cdot \left[ \sqrt{\left(\frac{\sigma_s}{\sqrt{\eta_\sigma} \cdot A}\right)^5 \cdot \frac{1}{E^3 \cdot \pi^4}} + \overline{\delta}^2 \cdot \sqrt{K_p \cdot E \cdot \sigma_s} \right]. \quad (2.1.9)$$

From (1.3.7) we get the TPM stress factor:

$$\overline{P}_s = \sqrt{\left(\frac{\sigma_s}{\sqrt{\eta_\sigma} \cdot A}\right)^5 \cdot \frac{1}{E^3 \cdot \pi^4}}. \quad (2.1.10)$$

Substituting (2.1.9) and (2.1.1.0) into (2.1.2), we get the analytical expression for the dimensionless panel weight as a function of $\sigma_s$, and $\overline{\delta}$ in the following form:

$$\overline{G}_{s.p.} = \frac{\overline{q}_p \cdot \sigma_s}{(\pi \cdot E)^2 \cdot \overline{\delta}^2 \cdot K_p^{\frac{1}{2}} \cdot \left(\sqrt{\eta_\sigma} \cdot A\right)^{5/2} + \sigma_s^2} + \overline{\delta}. \quad (2.1.11)$$

The ductility factor $\eta_\sigma$ in (2.1.11) for $\sigma_s > \sigma_{pr}$ is determined from the equation (1.2.5) replacing therein $\sigma_{cr.l(\eta_\sigma=1)}$ with $\sigma_{s(\eta_\sigma=1)}$.

FIG. 43 is a graph showing dimensionless panel weight $$\overline{G}_s = \frac{G_s}{l_s \cdot l_{re}^2 \cdot \gamma}$$

versus TPM stress $\sigma_s$, U-shaped TPM.

Some of the results of calculations according to (2.1.11) are presented in FIG. 43.

The TPM shape efficiency factor used, A is that for the Z-shaped profile, A=0.515. The value of the shape efficiency factor varies insignificantly with changing of the TPM shape and does not affect considerably the results of calculations according to (2.1.11).

As these calculations demonstrate, with the dimensionless skin thickness values typical for aircraft industry, $\overline{\delta}$=0.001-0.005, the minimum panel weight is obtained for the minimum TPM stress $\sigma_s$.

Proceeding from the stress to the design panel cross-section dimensions, we see that with reducing $\sigma_s$, the distance between TPMs (pitch of stringer longitudinal installation) (2.1.9) is also reduced, and the dimensions of the TPM shape are also reduced, due to reduction of the TPM shape factor (2.1.10). Therefore, to reduce the panel weight one should seek to increase the number of TPMs (reduction of the pitch of stringer longitudinal installation) and reduce the TPM shape cross-section dimensions.

The lower limit value for the pitch of longitudinal installation of TPM is determined by the value of the critical skin stress $\sigma_{cr.sk}$ (2.1.6). The critical stress in the skin cannot exceed the critical stress in the TPM. Therefore, the optimum panel weight is achieved provided equality of critical stresses of skin and TPM, that is, ruling out skin buckling.

The lower limit value for reducing TPM shape dimensions is determined by the minimum TPM shape moment of inertia, providing for the wavelength (in stability loss) in the panel width equal to or less than the distance between the rivet joint of TPM fastening to the skin. Reduction of TPM shape dimensions is evidently restricted also by the constructive restrictions to TPM.

2.2 Design Procedure for Stringer Panel Of Theoretical Minimum Weight

It has been proved in 2.1 that the stringer panel reaches the minimum in weight provided equality of critical stress for skin and stringer, viz. if:

$$\sigma_{cr.sk} = \sigma_s = \sigma \quad (2.2.1).$$

Taking (2.2.1) into account, the dimensionless width of the skin between the rivet joints of TPM fastening (for the open-configuration TPM equal to its dimensionless pitch of longitudinal installation) shall be written as (2.1.6):

$$\overline{b}_{sk} = \overline{b}_s = \overline{\delta} \cdot \sqrt{\frac{K_p \cdot E}{\sigma}}. \quad (2.2.2)$$

The dimensions of the panel cross-section have been shown in 2.1 to be functions of three parameters $\sigma_s$, $\overline{b}_s$ and $\overline{\delta}$. Let us determine these parameters using the derived equations (2.2.1) and (2.2.2).

The TPM stress factor (2.1.4) taking into account (2.2.1) shall be written as:

$$\overline{P}_s = \overline{b}_s \cdot (\overline{q}_p - \overline{\delta} \cdot \sigma) \quad (2.2.3).$$

Taking into consideration (2.2.3), the expression for the panel weight takes on the form:

$$\overline{G}_{s.p.} = \frac{\overline{q}_p}{\sigma}. \quad (2.2.4)$$

Expression (2.2.4) implies that for a panel with the non-buckling skin, the minimum weight is reached at the maximum panel stress.

For the maximum stress, the yield stress for the panel material is adopted:

$$\sigma = \sigma_{0.2} \quad (2.2.5).$$

Henceforth, one of the sought-for parameters, the panel stress $\sigma$, has been determined.

Given the panel stress $\sigma$, one can determine the TPM shape dimensions. To this end, we shall find the TPM stress factor (2.1.10) taking into account (2.2.5) and (2.2.1):

$$\overline{P}_s = \sqrt{\left(\frac{\sigma_{0.2}}{\sqrt{\eta_\sigma} \cdot A}\right)^5 \cdot \frac{1}{E^3 \cdot \pi^4}}. \quad (2.2.6)$$

It follows from (2.2.6) that given the material and the shape efficiency factor A, the TPM stress factor $\overline{P}_s$, is a constant.

The optimum characteristic dimensions of the shape, taking into account (2.2.6), shall be determined from equations (1.3.3) and (1.3.4). The characteristic dimensions of the TPM shape are constant values, while absolute dimensions depend linearly from the panel length (1.1.1)-(1.1.3).

The second sought-for parameter, the dimensionless pitch of longitudinal installation $\bar{b}_s$, can be determined from the equation (2.2.2), should the third sought-for parameter be found, namely, the dimensionless skin thickness $\bar{\delta}$. Expressions (2.2.1) and (2.2.5) enable finding the dimensionless skin thickness.

Substituting (2.2.2) into the constraint equation (2.1.8) and taking into consideration (2.2.5), we get:

$$\left(\frac{\sigma_{0,2}}{\sqrt{\eta_\sigma} \cdot A}\right)^{5/2} \cdot \frac{1}{E^{3/2} \cdot \pi^2} = \bar{\delta} \cdot \left(\frac{K_p \cdot E}{\sigma_{0,2}}\right)^{1/2} \cdot (\bar{q}_p - \bar{\delta} \cdot \sigma_{0,2}). \quad (2.2.7)$$

Solution of (2.2.7) with respect to $\bar{\delta}$ leads to the square equation of the kind:

$$\lambda \cdot \bar{\delta}^2 - \beta \cdot \bar{\delta} + \gamma = 0 \quad (2.2.8)$$

where: $\lambda = (K_p \cdot E \cdot \sigma_{0,2})^{1/2}$, $$\beta = \bar{q}_p \cdot \left(\frac{K_p \cdot E}{\sigma_{0,2}}\right)^{1/2}, \gamma = \left(\frac{\sigma_{0,2}}{\sqrt{\eta_\sigma} \cdot A}\right)^{5/2} \cdot \frac{1}{E^{3/2} \cdot \pi^2}.$$

Solution of (2.2.8) is $$\bar{\delta}_{1,2} = \frac{\beta}{2 \cdot \lambda} \pm \left(\frac{\beta}{4 \cdot \lambda^2} - \frac{\gamma}{\lambda}\right)^{1/2}. \quad (2.2.9)$$

Substituting into (2.2.9) the values of $\lambda$, $\beta$, $\gamma$, we get:

$$\bar{\delta}_{1,2} = \frac{\bar{q}_p}{2 \cdot \sigma_{0,2}} \pm \sqrt{\frac{\bar{q}_p^2}{4 \cdot \sigma_{0,2}^2} - \left(\frac{\sigma_{0,2}}{E \cdot \pi}\right)^2 \cdot \frac{1}{\left(A \cdot \sqrt{\eta_\sigma}\right)^{5/2} \cdot K_p^{1/2}}}. \quad (2.2.10)$$

It follows from (2.2.10) that for the same load there exist two values of the dimensionless skin thickness corresponding to the panel minimum weight.

FIG. 45 is a stringer panel with U-shaped TPM.

For the U-shaped (forming with the sheet a closed configuration) TPM, the dimensionless pitch of longitudinal installation of TPM is determined from the following equation:

$$\bar{b}_s = \bar{b}_{re} + \bar{a} + \bar{c} = \bar{\delta} \cdot \left(\frac{K_p \cdot E}{\sigma}\right)^{1/2} + \bar{a} + \bar{c}. \quad (2.2.11)$$

Then the constraint equation (2.1.8) for the closed profile shall take on the form:

$$\left(\frac{\sigma}{\sqrt{\eta_\sigma} \cdot A}\right)^{5/2} \cdot \frac{1}{E^{3/2} \cdot \pi^2} = \left[\bar{\delta} \cdot \left(\frac{K_p \cdot E}{\sigma}\right)^{1/2} + \bar{a} + \bar{c}\right] \cdot (\bar{q}_p - \bar{\delta} \cdot \sigma). \quad (2.2.12)$$

The formula to determine the dimensionless thickness of the skin for TPM forming with the sheet a closed configuration shall take on the form:

$$\bar{\delta}_{1,2} = \frac{\bar{q}_p}{2 \cdot \sigma_{0,2}} - \frac{\bar{a} + \bar{c}}{2} \cdot \left(\frac{\sigma_{0,2}}{K_p \cdot E}\right)^{1/2} \pm \quad (2.2.13)$$

$$\pm \sqrt{\left[\frac{\bar{q}_p}{2 \cdot \sigma_{0,2}} - \frac{\bar{a} + \bar{c}}{2} \cdot \left(\frac{\sigma_{0,2}}{K_p \cdot E}\right)^{1/2}\right]^2 - \frac{1}{\sqrt{E^2 \cdot \pi^2 \cdot \left(\sqrt{\eta_\sigma} \cdot A\right)^{5/2} \cdot K_p^{1/2}}} + \frac{\bar{q}_p \cdot (\bar{a} + \bar{c})}{(K_p \cdot E \cdot \sigma_{0,2})^{1/2}}}.$$

The analysis of the radicands in (2.2.10) and (2.2.13) gives the range of admissible values of the panel stress for which optimum values for the skin thickness can be obtained.

FIG. 57 are tables showing (i) a range of allowable values for stringer panel stress factors, and (ii) features of real and optimum-design panels.

It follows from the Table 2.1 shown in FIG. 57 that for TPM forming with the sheet a closed configuration the range of admissible values for the panel stress factors is narrower than that for the open profiles. Actually, the feasible range for the panel stress factors shall be even less, as the optimum dimensionless values for the skin thickness obtained from equations (2.2.10) and (2.2.13) could prove so small that their manufacturing would be impractical.

The panel stress factors pertinent to the most part of aircraft designs constitute $q_p = (20-60)$ daN/cm². It follows from Table 2.1 that feasible stress factor for a minimum weight panel exceeds the above values. In the following section it will be shown how to find the optimum panel parameters for any feasible stress factor values.

2.3 Design Procedure for Stringer Panel of Feasible Minimum Weight

If a stringer panel shall be designed for any feasible linear compressive loads $q_p$, or if dimensions of the panel cross-section do not meet the constructive restrictions, then the optimum stress shall be considered the stress $\sigma_n$, which would be less than the yield stress, that is, $\sigma'' < \sigma_{0,2}$. In this case the panel would possess the least feasible weight rather than theoretical minimum weight (i.e. the minimum weight accounting for said restrictions). The value of the stress $\sigma_n$ should be as close to $\sigma_{0,2}$ as possible (2.2.4), with this, the TPM stress factor $\bar{P}_s$ would approach its maximum value (2.2.6). This maximum value of the TPM stress factor $\bar{P}_s$ provided panel stress factor $\bar{q}_p$ being constant and panel stress $\sigma$ being at its maximum is only possible with the minimum dimensionless skin sheet thickness $\bar{\delta} = \bar{\delta}_{min}$ (2.2.3).

Let us determine the stress for the least feasible weight panel. To this end, in the equation (2.2.7) the equations $\sigma_{0,2} = \sigma_n$ and $\bar{\delta} = \bar{\delta}_{min}$ shall be accounted for; for the TPM forming with the sheet an open configuration we get:

$$\left(\frac{\sigma_n}{\sqrt{\eta_\sigma} \cdot A}\right)^{5/2} \cdot \frac{1}{E^{3/2} \cdot \pi^2} = \bar{\delta}_{min} \cdot \left(\frac{K_p \cdot E}{\sigma_n}\right)^{1/2} \cdot (\bar{q}_p - \bar{\delta}_{min} \cdot \sigma_n), \quad (2.3.1)$$

$\sigma_n$ being the maximum feasible panel stress provided minimum skin thickness $\delta_{min}$.

Solving (2.3.1) with respect to $\sigma_n$, we get the cubic equation of the type $$\sigma_n^3 + 3 \cdot U \cdot \sigma_n + 2 \cdot V = 0 \quad (2.3.2)$$

-continued where $$U = \frac{1}{3} \cdot \left(\sqrt{\eta_\sigma} \cdot A\right)^{5/2} \cdot K_p^{1/2} \cdot (E \cdot \pi)^2 \cdot \bar{\delta}_{min}^2,$$

$$V = -\frac{1}{2} \cdot \left(\sqrt{\eta_\sigma} \cdot A\right)^{5/2} \cdot K_p^{1/2} \cdot (E \cdot \pi)^2 \cdot \bar{\delta}_{min} \cdot \bar{q}_p.$$

The discriminant of (2.3.2) is determined from the equation:

$$D = V^2 + U^3 \quad (2.3.3).$$

The discriminant (2.3.3) is positive; therefore equation (2.3.2) shall have the single real root determined from Cardan formula:

$$\sigma_n = \beta + \gamma \quad (2.3.4),$$

where $\beta = (\sqrt{V^2+U^3} - V)^{1/3}$, $\gamma = (-\sqrt{V^2+U^3} - V)^{1/3}$.

The ductility factor appearing in the equation for the stress (2.3.4) shall be determined from equation (1.2.2), replacing therein $\sigma$ with $\sigma_n$; we get $$\eta_\sigma = \frac{\sigma_n}{\sigma_{pr}} \cdot \left(\frac{\sigma_0 - \sigma_n}{\sigma_0 - \sigma_{pr}}\right)^2. \quad (2.3.5)$$

One can deduce from (2.3.5) that the ductility factor $\eta_\sigma$ appearing in the formula for the sought-for stress $\sigma_n$ (2.3.4), in its turn, is dependent from the stress $\sigma_n$. Therefore, $\sigma_n$ and $\eta_\sigma$ are sought for by the successive approximation method in the following way.

In the first approximation, we assume $\eta_{\sigma I} = 1$, and through the equation (2.3.4) we determine the first approximation of the TPM stress $\sigma_{n I}$. If $\sigma_{n I} < \sigma_{pr}$, then given $\sigma^{nI}$, from (2.3.5) we get the second approximation for the ductility factor $\eta_{\sigma 2}$, and so on. The calculation is terminated provided successive approximations for stress $\sigma_n$ (or $\eta_\sigma$) would differ by a preset value.

For the TPM forming with the sheet a closed configuration, the expression (2.2.12) takes on the form:

$$\left(\frac{\sigma_n}{\sqrt{\eta_\sigma} \cdot A}\right)^{5/2} \cdot \frac{1}{E^{3/2} \cdot \pi^2} = 2 \cdot \bar{\delta}_{min} \cdot \left(\frac{K_p \cdot E}{\sigma_n}\right)^{1/2} \cdot (\bar{q}_p - \bar{\delta}_{min} \cdot \sigma_n), \quad (2.3.6)$$

it is assumed here that $$\bar{b}_s = 2 \cdot \bar{b}_{re} \quad (2.3.7).$$

The values of coefficients U and V of the cubic equation (2.3.2) for the U-shaped TPM will be twice higher. The maximum feasible panel stress for the minimum skin thickness $\bar{\delta}_{min}$ shall be determined, similarly to that of the open profiles, from equation (2.3.4). The equation (2.3.4) enables finding the panel stress given the minimum dimensionless skin thickness, hence, determining all the other parameters of the panel cross-section.

The minimum dimensionless skin thickness is determined from the expression $$\bar{\delta}_{min} = \frac{\delta_{min}}{l_{re}}.$$

Here, $l_{re} = l_s$ (for the factor accounting for stringer leaning on rib c=1), while the skin thickness is assumed $\delta_{min} = (0.8-1)$ mm. For smaller skin thickness the countersunk-headed rivets are not employed, as they do not ensure adequate skin fastening strength. Cup-headed rivets are not employed due to aerodynamic restrictions.

2.4 Calculation of Optimum Parameters for a Stringer Panel

Considered here are algorithms for design of stringer panel of optimum weight. Some of the calculation results are presented as plots of optimum parameters versus the panel stress factor. The plots are presented for U-shaped, Z-shaped and L-shaped profiles.

Algorithm of Design for the Theoretical Minimum Weight Stringer Panel

1. An array of panel stress factor values $\bar{q}_p$ is preset.
2. The ductility factor is calculated through equation (1.2.2) replacing therein $\sigma$ with $\sigma_{0.2}$.
3. TPM stress factor is calculated through equation (2.2.6).
4. Optimum characteristic scaled (dimensionless) shape dimensions for TPM are calculated through equations (1.3.3) and (1.3.4) (with $\sigma_s = \sigma_{0.2}$). The absolute shape dimensions are obtained multiplying the scaled dimension values by $l_{re}$ (1.1.3).
5. From equations (2.2.10) and (2.2.13), the optimum dimensionless skin thickness is calculated.
6. From equations (2.2.2) and (2.2.11), the optimum dimensionless pitch of stringer installation is calculated (with $\sigma = \sigma_{0.2}$).
7. From equation (2.2.4), the optimum dimensionless minimum weight of the stringer panel is calculated (with $\sigma = \sigma_{0.2}$).

FIG. 44 is a graph showing dimensionless skin thickness $$\bar{\delta} = \frac{\delta}{l_{re}}$$

versus the panel stress factor $$\bar{q}_p = \frac{q_p}{l_{re}},$$

material D16-T (minimum weight panel).

FIG. 46 is a graph showing dimensionless distance between stringers $$\bar{b}_s = \frac{b_s}{l_{re}}$$

versus the panel stress factor $$\bar{q}_p = \frac{q_p}{l_{re}},$$

material D16-T (minimum weight panel).

The plots of optimum value of the skin thickness $\bar{\delta}$ and pitch of stringer installation $\bar{b}_s$ are presented in FIGS. 44 and 46. Out of the two values of the optimum dimensionless skin thickness $\bar{\delta}$ and pitch of stringer installation $\bar{b}_s$ given a particular value of the panel stress factor, those values of $\bar{\delta}$ and $\bar{b}_s$ are selected that meet the constructive requirements the best.

FIG. 47 is a plot showing TPM shape width a, b, c versus the panel stress factor $$\overline{q}_p = \frac{q_p}{l_{re}},$$

material D16-T (minimum weight panel).

FIG. 48 is a plot showing TPM shape thickness $\delta_a$, $\delta_b$, $\delta_c$, versus the panel stress factor $$\overline{q}_p = \frac{q_p}{l_{re}},$$

material D16-T (minimum weight panel).

The plots of optimum absolute dimensions of profiles a, b, c, $\delta_a$, $\delta_b$, $\delta_c$ are presented in FIGS. 47, 48.

FIG. 49 is a plot showing dimensionless panel weight $$\overline{G}_s = \frac{G_s}{l_s \cdot l_{re}^2 \cdot \gamma}$$

versus the panel stress factor $$\overline{q}_p = \frac{q_p}{l_{re}},$$

materials D16-T and B95 (least feasible weight panel).

The plot of the dimensionless minimum weight of the stringer panel $\overline{G}_{s,p}$, with TPM of any shape is presented in FIG. 49.

Algorithm of Design for the Minimum Feasible Weight Stringer Panel

1. An array of panel stress factor values $q_p$ is preset.
2. The minimum dimensionless skin thickness is calculated:

$$\overline{\delta}_{min} = \delta_{min}/l_{re}$$

Assumed for the calculation are: $l_{re}$=1 m, $\delta_{min}$=1 mm, minimum dimensionless skin thickness $\overline{\delta}_{min}$=0.001.

3. From equation (2.3.4), stress $\sigma_n$ is determined (if $\sigma_n > \sigma_{pr}$, then $\sigma_n$ is determined through the consecutive approximations method through formula (2.3.5)).
4. From equation (2.1.10) the stress factor $\overline{P}s$ for TPM is calculated (here, $\sigma_s = \sigma_n$).
5. From equations (1.3.3) and (1.3.4), the optimum characteristic scaled TPM shape dimensions are calculated (here, $\sigma_s = \sigma_n$).
06. The optimum dimensionless distance (pitch) between stringers is calculated through equations (2.2.2) and (2.2.11) (here, $\sigma = \sigma_n$).
7. The least panel weight is calculated from equation (2.2.4) (here, $\sigma = \sigma_n$). Some of the calculation results are presented in plots, FIGS. 50 to 54.

FIG. 50 is a plot showing dimensionless distance between stringers $$\overline{b}_s = \frac{b_s}{l_{re}}$$

versus the panel stress factor $$\overline{q}_p = \frac{q_p}{l_{re}},$$

material D16-T (minimum feasible weight panel).

FIG. 51 is a plot showing dimensionless length of TPM shapes $$\overline{a} = \frac{a}{l_{re}},$$

$$\overline{b} = \frac{b}{l_{re}}$$

versus the panel stress factor $$\overline{q}_p = \frac{q_p}{l_{re}},$$

material D16-T (minimum feasible weight panel).

FIG. 52 is a plot showing dimensionless length of TPM shapes $$\overline{b} = \frac{b}{l_{re}},$$

$$\overline{c} = \frac{c}{l_{re}}$$

versus the panel stress factor $$\overline{q}_p = \frac{q_p}{l_{re}},$$

material D16-T (minimum feasible weight panel).

FIG. 53 is a plot showing dimensionless thickness of U-shaped TPM $$\overline{\delta}_a = \frac{\delta_a}{l_{re}},$$

$$\overline{\delta}_b = \frac{\delta_b}{l_{re}},$$

$$\overline{\delta}_c = \frac{\delta_c}{l_{re}}$$

versus panel stress factor $$\overline{q}_p = \frac{q_p}{l_{re}^2},$$

material D16-T (minimum feasible weight panel).

FIG. 54 is a plot showing dimensionless thickness of TPM $$\overline{\delta}_b = \frac{\delta_b}{l_{re}},$$

$$\overline{\delta}_c = \frac{\delta_c}{l_{re}}$$

versus panel stress factor $$\overline{q}_p = \frac{q_p}{\overline{P}_{re}^2},$$

material D16-T (minimum feasible weight panel).

2.5 Determining Optimum Inclination Angle of U-Shaped TPM Lateral Web and Optimum Pitch of Rivets for TPM Fastening to Skin FIG. 55 is a stringer panel with U-shaped TPM possessing inclined lateral web.

For the best utilization of the skin within the U-shaped TPM, the lateral webs of the latter are inclined to reach the equality of $b_{sk2}=b_{re}$.

The optimum inclination angle of the lateral web is:

$$\alpha = \arcsin\frac{\overline{b}_{sk} - \overline{a} - \overline{c}}{2}, \quad (2.5.1)$$

where $\overline{b}_{sk}$ is determined from equation (2.2.2).

For the minimum weight panel, $\sigma_s=\sigma_{0.2}$; for the minimum feasible weight panel, $\sigma_s=\sigma_n$. Due to design restrictions, the angle $\alpha$ should be $0 \leq \alpha \leq 60°$.

With this, the pitch of stringer installation is determined from the equation $$\overline{b}_s = \overline{b}_{sk} + \overline{c} + \overline{a} + 2 \cdot \overline{b} \cdot \sin \alpha \quad (2.5.2),$$

where $b_{sk}$ is determined from (2.2.2).

In (2.5.2), the dimensions of the profile $\overline{a}$, $\overline{b}$, $\overline{c}$ are dependent on the TPM stress factor $\overline{P}_s$, which, in its turn, is dependent on $\overline{b}_s$ (2.2.3). Therefore, the distance between stringers (pitch of stringer installation) is sought for through consecutive approximation approach. In the first approximation it is assumed that $\overline{b}_s = 2 \cdot b_{re}$.

For the panels of minimum and least feasible weight, the optimum pitch $t_{riv}$ shall be selected for TPM fastening to the skin.

The pitch $t_{riv}$ is determined basing on equality of the overall stability critical stress for the skin between the rivets $\sigma_{cr.riv}$ and the stringer critical stress $\sigma_s$, that is $$\sigma_{cr.riv} = \sigma_s, \quad (2.5.3)$$

where $$\sigma_{cr.riv} = \frac{c \cdot \pi^2 \cdot E}{(\bar{t}_{riv}/\bar{i}_{sk})^2} \cdot \eta_\sigma, \quad (2.5.4)$$

$\bar{i}_{sk} = \delta/\sqrt{12}$ is the skin radius of gyration.

Solving (2.5.3) accounting for (2.5.4) with respect to $\bar{t}_{riv}$, we get $$\bar{t}_{riv} = \bar{i}_{sk} \cdot \pi \cdot \sqrt{\frac{c \cdot E \cdot \eta_\sigma}{\sigma_s}} \quad (2.5.5)$$

$$= \frac{\delta}{2} \cdot \pi \cdot \left(\frac{c \cdot E \cdot \eta_\sigma}{3 \cdot \sigma_s}\right)^{1/2}.$$

The equation (2.5.5) holds for both theoretical minimum and minimum feasible weight panels. For the theoretical minimum weight panel, $\sigma_s=\sigma_{0.2}$, while for the minimum feasible weight panel $\sigma_s=\sigma_n$; for both panels, the ductility factor $\eta_o$ is calculated through equation (1.2.2).

Should the pitch of rivets exceed the optimum one (2.5.5), the average stress value in the panel skin (2.1.5) would decrease. Then the cross-section dimensions, hence the panel weight value, would increase.

The absolute dimensions of the TPM shape could prove not meet the constructive restrictions; in this case, the dimensionless TPM parameters $a_1=c/b$; $a_2=b/a$; $a_3=\delta_c/\delta_b$; $a_4=\delta_b/\delta_a$ shall be altered in compliance with the method stipulated in section 1. With this, the panel weight increases, though by the minimum feasible value.

2.6 Comparative Analysis of Weight Savings for Stringer Panels

Presented is investigation of possible weight savings for compressed stringer panels of a real torsion wing box, said panels designed by the iterative method. Benchmark data from these panels is utilized to determine weight savings from method outlined in 2.3. With this purpose, compressed stringer panels designed by the iterative method are compared with calculated optimum weight compressed stringer panels using the method outlined in 2.3.

The benchmark data were obtained for panels of torsion box wings of the airliner TU-154. For the purpose of comparative analysis, two panels considerably differing in compressive loads are regarded. The panels were designed for the compressive load $q_p$ constituting, respectively, 934 daN/cm and 555 daN/cm. The overall dimensions of panels are: length $l_s=45$ and 40 cm, respectively; widths B are 31.4 cm and 33.4 cm.

The longitudinal set (stringers) of these panels is manufactured out of the standard Z-shaped profiles: Pr 105-9 and Pr 105-1. The profiles were fastened to the skin with rivets. The profiles in the amount of five and six pieces were evenly distributed across the panel width with the pitch $b_s=70$ mm and 58 mm, respectively.

Basing on the above benchmark data, optimum weight panels were designed in compliance with the technology outlined in 2.3.

FIG. 56 shows real and optimum design stringer panels.

For the purpose of visualization, portions of cross-sections of the real and optimum design panels are represented superimposed in FIG. 56.

Dimensions of profiles, skin thickness values, pitches of stringer installation, stresses and cross-section areas for real and optimum design panels are summarized in the Table 2.2 (FIG. 57).

Design of optimum weight panels using method in 2.3 decreased panel weights by 19.1% and 19.2%, respectively.

3.0 Design of Optimum Weight Rib-Reinforced Stringer Panel

For explanation purposes, analysis scheme for selection of optimum parameters of rib-reinforced stringer panel, (TPM installed longitudinally and transversally) and calculations of these parameters are presented.

It has been noted in that "the exact solution of this kind of problems is excessively intricate, and the effect of ribs is rather insignificant". In the present section, we have managed to reduce this multi-parameter problem to two variable parameters only, namely, the stress in the panel and the thickness of the skin, and to demonstrate the predominant role of ribs onto formation of the panel weight optimum.

The problems in sections 3 and 4 are solved in absolute values, whereas in sections 1 and 2 it is carried out in the dimensionless form. As the transition from dimensionless values to absolute ones is rather straightforward, references to section 1 and 2 equations are given in sections 3 and 4 without additional explanations.

FIG. 58 shows a rib-reinforced stringer panel.

FIG. 59 shows scheme for determining of the critical rigidity of ribs.

FIG. 60 shows scheme for determining of the rigidity of ribs.

FIG. 61 is a plot of dimensionless weight of the stringer panel $$\overline{G}_{p.s} = \frac{G_{p.s}}{l \cdot \gamma},$$

ribs $$\overline{G}_r = \frac{G_r}{l \cdot \gamma}$$

and rib-reinforced stringer panel $\overline{G}_{p.r} = \overline{G}_{p.s} + \overline{G}_r$ versus panel stress σ, material D16-T.

FIG. 62 is a plot of dimensionless weight of the rib-reinforced stringer panel $$\overline{G}_{p.s} = \frac{G_{p.s}}{l \cdot \gamma}$$

versus distance between ribs $l_r$, material D16-T.

FIG. 63 is a plot of dimensionless weight of the rib-reinforced stringer panel $$\overline{G}_{p.r} = \frac{G_{p.r}}{l \cdot \gamma}$$

versus, skin thickness δ, material D16-T.

FIG. 64 is a plot of dimensionless weight $$\overline{G}_{p.r} = \frac{G_{p.r}}{l \cdot \gamma}$$

of the rib-reinforced stringer panel versus panel stress σ with varying rib rigidity factor.

FIG. 65 is a plot of dimensionless weight $$\overline{G}_{p.r} = \frac{G_{p.r}}{l \cdot \gamma}$$

of the rib-reinforced stringer panel versus panel stress σ with varying rib shape factor $f_r$, material D16-T.

FIG. 66 is a plot of skin thickness δ of the rib-reinforced stringer panel versus linear compressive force $q_p$.

FIG. 67 is a plot of distance between stringers $b_s$, of the rib-reinforced stringer panel versus linear compressive force $q_p$.

FIG. 68 is a plot of distance between ribs $l_r$ of the rib-reinforced stringer panel versus linear compressive force $q_p$.

FIG. 69 is a plot of characteristic dimensions of stringer shape a, b of the rib-reinforced stringer panel versus linear compressive force $q_p$.

FIG. 70 is a plot of characteristic thicknesses of stringer shape $\delta_a$, $\delta_b$ of the rib-reinforced stringer panel versus linear compressive force $q_p$.

FIG. 71 is a plot of optimal stress σ of the rib-reinforced stringer panel versus linear compressive force $q_p$.

FIG. 72 is a plot of dimensionless weight $$\overline{G}_{p.r} = \frac{G_{p.r}}{l \cdot \gamma}$$

of the rib-reinforced stringer panel versus linear compressive force $q_p$.

Design Procedure for a Rib-Reinforced Stringer Panel

The discussed method is subdivided into the following stages: formulation of the problem, selection of the force pattern, determining of the required moment of inertia for a rib and derivation of the analytical expression for the rib-reinforced stringer panel.

The procedure is applicable for rib-reinforced stringer panel with frame- and beam-type ribs. We consider the panel with U-shaped stringers having six variable dimensions, viz. a, $\delta_a$, b, $\delta_b$, c, $\delta_c$ and with frame-type Z-shaped ribs having four variable parameters: $b_r$, $\delta_{b.r}$, $c_r$, $\delta_{c.r}$.

Depending on the shape of TPM (stringer or rib), the number of their variable dimensions can be different. Solution of this problem, as it will be shown below, does not depend on the number of dimensions of the stringer or rib shape.

Formulation of the Problem

The problem in designing of the rib-reinforced stringer panel is formulated as follows: cross-section dimensions of the panel are determined, that is, stringer shape dimensions, rib shape dimensions, pitch of stringer installation $b_s$, pitch of ribs installation $l_r$, skin thickness δ basing on the overall panel minimum weight condition (FIG. 58). With this, the benchmark parameters are considered panel overall dimensions B and l, linear compressive load $q_p$ and the panel material.

It is known from the stringer panel calculations that given the values of stress σ, skin thickness δ and panel length (equal to the pitch of rib installation $l_s=l_r$), one can derive the optimal dimensions of the panel longitudinal set cross-section. Rib shape dimensions (transversal set) are determined by its bending rigidity $E \cdot J_r$, that is, given the material E, by the rib shape moment of inertia $J_r$. The method for determining of the shape dimension given its moment of inertia is presented in section 3.2.

Therefore, designing of a rib-reinforced stringer panel is reduced to determining of the panel stress σ, skin thickness δ, rib moment of inertia $J_r$ and the pitch of rib installation $l_r$. It will be shown later that the parameters $J_r$ and $l_r$ could be expressed through parameters σ and δ. So, in the final analysis, designing of the rib-reinforced stringer panel is reduced to finding the two variable parameters, panel stress σ and skin thickness δ.

Selection of the Scheme of Calculations

The rib-reinforced stringer panel is a complex spatial structure. The following calculation scheme is adopted for optimization of the parameters of the former: the stringers are considered to be isolated rods on elastic supports. The elastic supports are considered to be the ribs (FIG. 59). The ribs are regarded as double-support hinged beams leaning on longerons. The skin participates in the panel operation across the reduced width along with stringers and ribs. The worst operating conditions will be experienced by the stringer located across the panel width in the middle of the latter, as it would have the least rigidity of elastic supports (for this stringer, the ribs have the maximum deflection). Assuming that destruction of a single stringer entails destruction of the panel as a whole, we assume the basic stringer to be the one located across the panel width in its middle.

Due to determining of the actual rigidity of the rib through calculations being too complicated, we use the adjustment factor, which is to be obtained from the results of testing of the existing wing structures. We will show below that the adjustment factor only slightly affects the optimal panel weight.

3.1 Determining of the Required Panel Moment of Inertia

Provided relatively high rigidity of elastically moving supports $r_r$ (FIG. 60), loss of stability of the stringer occurs as if the support were absolutely rigid. The least support rigidity enabling this type of stability loss is called the critical rigidity.

The critical rigidity of supports is determined through the following expression:

$$r_r = \frac{m \cdot P_s}{\beta \cdot l} = \frac{P_s}{\beta \cdot l_r}. \quad (3.1.1)$$

Here, $\beta$ is the coefficient depending of the number of spans m. With the number of spans m exceeding 10, the coefficient $\beta$ would be the constant equal to 0.255; with number of spans being less, this coefficient grows. We assume $\beta$=0.255, providing for the strength margin.

We further assume the ribs rigidity to be equal to the critical support rigidity $r_r$.

Therefore, the loss of the overall stringer stability could be considered at the length $l_r$ (FIG. 60) according to Euler formula:

$$P_s = \frac{c \cdot \pi^2 \cdot E \cdot J_s}{l_r^2} \cdot \eta_\sigma. \quad (3.1.2)$$

Ductility factor $\eta_\sigma$ in (3.1.2) for $\sigma_s > \sigma_{pr}$ is derived through formula (1.2.6) replacing therein $\sigma_{cr.tot(\eta_o=1)}$ with $\sigma_{s(\eta_o=1)}$.

Substituting (3.1.2) into (3.1.1), we obtain the critical rigidity of the rib as:

$$r_r = \frac{c \cdot \pi^2 \cdot E \cdot J_s}{\beta \cdot l_r^3} \cdot \eta_\sigma. \quad (3.1.3)$$

The sought-for required rib moment of inertia $J_{r.rq}$ is determined from the condition of equality of rib critical rigidity and rigidity of the rib considered as double-support beam.

The rigidity of the rib considered as double-support beam loaded with the unit force $P_r$ is expressed by the following equation (FIG. 60):

$$r_r = K_{ex} \cdot \frac{48 \cdot E \cdot J_{r.rq}}{B^3}, \quad (3.1.4)$$

$K_{ex}$ is the experimental factor accounting for the actual rigidity of the rib within the wing; $K_{ex} \geq 1$.

Equating the critical rigidity (3.1.3) and rib rigidity (3.1.4), we obtain the required rib moment of inertia providing for the critical rigidity of the support:

$$J_{r.rq} = \frac{c \cdot \pi^2 \cdot B^3 \cdot J_s}{48 \cdot K_{ex} \cdot \beta \cdot l_r^3} \cdot \eta_\sigma. \quad (3.1.5)$$

In (3.1.5), the pitch of rib installation $l_r$ is not determined. Let us determine it through variable parameters $\sigma$ and $\delta$.

Solving (1.3.7) with respect to $l_s$, $l_r$, we get:

$$l_r = \left[ \frac{\pi^4 \cdot E^3 \cdot c^2 \cdot P_s^2 \cdot (\sqrt{\eta_\sigma} \cdot A)^5}{\sigma_s^5} \right]^{1/4}. \quad (3.1.6)$$

Here, the force per one stringer $P_s$ is determined through (2.2.3); the pitch of stringer installation $b_s$ in (2.2.3) is determined through equations (2.2.2) or (2.5.2).

The stringer moment of inertia $J_s$ in (3.1.5) is determined from equations (1.3.3), (1.3.4) and (2.2.3).

Determining the Panel Weight

The panel weight is equal to the total of the weight of the longitudinal (stringers with skin) and transversal (ribs) sets.

$$G_{r.p.} = \frac{q_p \cdot B}{\sigma} \cdot l \cdot \gamma + \frac{l}{l_r} \cdot F_r \cdot B \cdot \gamma = B \cdot l \cdot \gamma \cdot \left( \frac{q_p}{\sigma} + \frac{F_r}{l_r} \right). \quad (3.1.7)$$

Let us express the panel weight through the two variable parameters $\sigma$ and $\delta$. For this, it is sufficient to express through these parameters the ratio $$\frac{F_r}{l_r}.$$

The rib area is determined according to the formula $$F_r = \left( \frac{J_r}{f_r} \right)^{\frac{1}{2}}, \quad (3.1.8)$$

$f_r$ is the rib shape factor.

The higher is the shape factor $f_r$, the less is the weight of the rib.

Usually, the shape factor is determined after the rib strength calculations. Therefore, it would be better to determine it basing on the analysis of the existing structures. It will be shown in the following section how does the shape factor $f_r$ influence the optimal panel weight.

Substituting the expression for the rib moment of inertia (3.1.5) into (3.1.8), we obtain the area of the rib shape as a function of the stringer moment of inertia $J_s$ and pitch of rib installation $l_r$:

$$F_r = \left[ \frac{c \cdot \pi^2 \cdot B^3 \cdot J_s \cdot \eta_\sigma}{48 \cdot K_{ex} \cdot \beta \cdot f_r \cdot l_r^3} \right]^{\frac{1}{2}}. \quad (3.1.9)$$

The stringer shape moment of inertia (1.4.3) can be written, taking into account (1.3.3) and (1.3.4), as:

$$J_s = \alpha \cdot \left( \frac{P_s^5 \cdot l_r^2}{\sigma^5 \cdot \eta_\sigma^{1/2}} \right)^3, \qquad (3.1.10)$$

where the factor $$\alpha = \frac{A_1^3 \cdot A_2 \cdot A_4}{\pi^{2/3} \cdot c^{1/3}},$$

$A_1$, $A_2$, $A_4$ being the known values.

Substituting (3.1.10) into (3.1.9), we get the rib shape area as:

$$F_r = \varphi \cdot \alpha^{1/2} \cdot \frac{P_s^{5/6} \cdot B^{3/2} \cdot \eta_\sigma^{1/3}}{\sigma^{5/6} \cdot l_r^{7/6}}, \qquad (3.1.11)$$

where the factor $$\varphi = \sqrt{\frac{c \cdot \pi^2}{48 \cdot K_{ex} \cdot \beta \cdot f_r}}.$$

Solving (3.1.11) with respect to the ratio $$\frac{F_r}{l_r}$$

and taking into account (3.1.6), we get:

$$\frac{F_r}{l_r} = \frac{\alpha^{1/2} \cdot \varphi}{\psi} \cdot \frac{B^{3/2} \cdot \sigma^{15/8} \cdot \eta_\sigma^{1/16}}{P_s^{1/4} \cdot E^{13/8}}, \qquad (3.1.12)$$

where the factor $\psi = c^{13/12} \cdot \pi^{13/6} \cdot A^{65/24}$.

Substituting into (3.1.12) the expression for the force per one stringer (2.2.3), taking into account (2.2.2) and (2.3.7), we finally obtain:

$$\frac{F_r}{l_r} = \lambda \cdot \frac{B^{3/2} \cdot \sigma^2}{\left[ \delta \cdot (q_P - \delta \cdot \sigma) \cdot E^7 \cdot \eta_\sigma^{1/4} \right]^{1/4}}, \qquad (3.1.13)$$

where $\lambda$ is the constant defined by the expression $$\lambda = \left( \frac{A_1^3 \cdot A_2 \cdot A_4}{48 \cdot 1{,}9^{1/2} \cdot c^{3/2} \cdot A^{65/12} \cdot K_{ex} \cdot \pi^3 \cdot \beta \cdot f_r \cdot K_{re}} \right)^{\frac{1}{2}}.$$

Here: $K_{re}=1$ for TPM shape forming with the skin sheet an open cross-section configuration, $K_{re}=2$ for TPM shape forming with the skin sheet a close cross-section configuration.

Substituting (3.1.13) into (3.1.7), we obtain the analytical expression for the panel weight as a function of the two variable parameters $\sigma$ and $\delta$:

$$G_{r,p} = \gamma \cdot l \cdot \left\{ \frac{q_P \cdot B}{\sigma} + \lambda \cdot \frac{B^{5/2} \cdot \sigma^2}{\left[ \delta \cdot (q_P - \delta \cdot \sigma) \cdot \eta_\sigma^{1/4} \cdot E^7 \right]^{1/4}} \right\}. \qquad (3.1.14)$$

In the resulting expression for the weight (3.1.14), the first bracketed value determines the dimensionless weight of stringers with skin $G_{p.s}$ (the weight of the longitudinal set), the second one determines the weight of ribs $G_r$ (the weight of transversal set). It follows from the formula (3.1.14) that with increasing panel stress $\sigma$, the weight of the longitudinal set $G_{p.s}$ diminishes, whereas the weight of the transversal set $G_r$ increases. It follows therefrom that the panel weight $G_{p.r}$ has the optimum with respect to the stress $\sigma$. It also follows from consideration of the denominator of the second expression in the formula (3.1.14) that the panel weight has an optimum with respect to the skin thickness $\delta$ as well. The pitch of rib installation (3.1.6) is a function of the two variable parameters $\sigma$ and $\delta$, therefore, the panel weight has an optimum in respect of the pitch of rib installation, quod erat demonstrandum (that which was to be demonstrated).

Combinations of the variable parameters $\sigma$ and $\delta$ corresponding to the minimum weight calculated through the formula (3.1.14) are the optimal parameters sought for. To determine these, the scanning method has been employed enabling finding the weight global minimum. The algorithm for determining the optimal parameters of the rib-reinforced stringer panel given the analytical expression for the weight value is given in section 3.3.

Determined in the algorithm are the geometric characteristics of stringer and rib shape staking into account their joint operation with the skin and the optimal value of the side webs inclination angle for the U-shaped stringer (2.5.1). The formulae for geometrical characteristics for stringer and rib with the reduced skin are presented in the algorithm 3.3.

3.2 Procedure for Determining the TPM Shape Dimensions Given its Known Geometrical Characteristics Let us demonstrate how the rib shape dimensions can be found given its moment of inertia $J_{r.rq.}$ (3.1.5).

Assume that in determination of the rib shape factor $f_r$ (3.1.8), the shape is selected with the dimensions $b_r'$, $\delta_{b.r}'$, $c_r'$, $\delta_{c.r}'$ and with the local stability critical stress $\sigma_{cr.l}'$.

Then the factor of rib shape dimensions change $\psi_r$ shall be determined from the expression $$\psi_r = \left( \frac{J_{r.rq}}{J_r'} \right)^{1/4}, \qquad (3.2.1)$$

where: $J_{r.rq}$ is the required optimal value of the rib moment of inertia;
$J_r'$ is the moment of inertia for the selected rib shape with dimensions $b_r'$, $\delta_{b.r}'$, $c_r'$, $\delta_{c.r}'$ The sought-for optimal dimensions of the rib shape are determined from the following expressions:

$$b_r = \psi_r \cdot b_r', \quad c_r = \psi_r \cdot c_r',$$

$$\delta_b = \psi_r \cdot \delta_b', \quad \delta_{c.r} = \psi_r \cdot \delta_{c.r}' \qquad (3.2.2).$$

The rib shape dimensions found from the condition of its critical rigidity shall be increased after the rib strength calculations. To determine rib shape dimensions from the strength condition, let us use the above approach. Provided employing this approach, the local stability critical stress $\sigma_{cr.l}'$ and the shape factor $f_r$ adopted in the stability calculations do not change.

The moment of resistance of the rib shape is determined from the strength condition:

$$W = \frac{M_r}{\sigma_{cr.l}'}. \qquad (3.2.3)$$

Here, $M_r$ is the maximum bending torque in the rib cross-section;

$\sigma_{cr.l}'$ is the critical local stability stress for the rib shape with dimensions $b_r'$, $\delta_{b.r}'$, $c_r'$, $\delta_{c.r}'$.

Then the factor of rib shape change found from the strength condition shall be determined from the formula:

$$\psi_r = \left(\frac{W_r}{W_r'}\right)^{1/3}, \qquad (3.2.4)$$

$W_r'$ is the moment of resistance of the selected rib shape with dimensions $b_r'$, $\delta_{b.r}'$, $c_r'$, $\delta_{c.r}'$.

The rib shape dimensions are determined from expressions (3.2.2).

If apart from the bending torque $M_r$ the rib is loaded also by an axial force $P_{ax}$ (for example, a frame rib), then the shape change factor can be determined from the expression:

$$\pm \frac{M_r}{\psi^3 \cdot W_r'} + \frac{P_{ax}}{\psi^2 \cdot F_r'} \leq \sigma_{cr.l}', \qquad (3.2.5)$$

$W_r'$ and $F_r'$ being, respectively, moment of resistance and area of the rib shape with dimensions $b_r'$, $\delta_{b.r}'$, $c_r'$, $\delta_{c.r}'$.

3.3 Calculations of Optimal Parameters for Rib-Reinforced Stringer Panel

Presented in this section is the algorithm to obtain the optimal parameters. Some computation results are presented in the form of diagrams required for analysis of the results obtained, as well as plots of optimal parameters for the rib-reinforced stringer panel versus the linear compressive force.

Algorithm
(1) The benchmark data are set:
 the linear force compressing the panel $q_p$;
 mechanical characteristics of the panel material;
 panel width B;
 panel length l;
 stringer shape factors $a_1$, $a_2$, $a_3$, $a_4$, $A_1$, $A_2$, $A_3$, $A_4$,
 benchmark dimensions, geometrical characteristics and local stress critical stability of the rib $b'$, $\delta_{b.r}'$, $c'$, $\delta_{c.r}'$, $F_r'$, $W_r'$, $J_r'$, $f_r$, $\sigma_{cr.l}'$;
 the coefficient in the rib rigidity expression $K_{ex}$;
 the factor accounting for the condition of the stringer leaning on the rib c;
 the factor depending on the number of spans $\beta$;
 the factor depending on openness or closeness of the configuration formed by the TPM with the sheet, $K_{re}$.
(2) The cycles are specified in the following variable parameters:
 (a) skin thickness $\delta$; the series of values in compliance with the existing standards is adopted, for example, $\delta=1$; 1.2; 1.5; 2; 2.5; 3; 3.5; 4; 4.5; 5 [mm];

(b) panel stress $\sigma$; the range of variation is adopted $$\sigma = (500 - \sigma_{0.2}) \, [daN/cm^2]$$

(3) The ductility factor is calculated $\eta_\sigma = 1$ provided $\sigma \leq \sigma_{pr}$;

$$\eta_\sigma = \frac{\sigma}{\sigma_{pr}} \cdot \left(\frac{\sigma_0 - \sigma}{\sigma_0 - \sigma_{pr}}\right)^2$$

provided $\sigma > \sigma_{pr}$.

The algorithm for panel parameters optimization follows for the known analytical value for the panel weight (3.1.14).

The following coefficient is calculated:

$$\lambda = \frac{A_1^3 \cdot A_2 \cdot A}{48 \cdot 1.9^{1/2} \cdot c^{3/2} \cdot A^{65/12} \cdot K_\ni \cdot \pi^3 \cdot \beta \cdot f_r \cdot K_{re}}.$$

The minimum panel weight $G_{p.r}$ is determined through selection of optimal combinations of the variable parameters $\sigma$ and $\delta$:

$$G_{r.p} = \left\{\frac{q_p \cdot B}{\sigma} + \lambda \cdot \frac{B^{5/2} \cdot \sigma^2}{\left[\delta \cdot (q_p - \delta \cdot \sigma) \cdot E^7 \cdot \eta_\sigma^{1/4}\right]^{1/4}}\right\} \cdot l \cdot \gamma.$$

The optimal reduced skin width is determined:

$$b_{re} = 1.9 \cdot \delta \cdot \left(\frac{E}{\sigma}\right)^{1/2}.$$

The optimal pitch of stringer installation is determined:
for shapes forming with the sheet an open configuration $b_s = 2 \cdot b_{re}$, for those forming with the sheet a close configuration $b_s = b_{re}$.

The force per a stringer is calculated:

$$P_s = b_s \cdot (q_p - \delta \cdot \sigma).$$

The optimal pitch of rib installation is determined:

$$l_r = \left[\frac{\pi^4 \cdot E \cdot c^2 \cdot P_s^2 \cdot \left(\sqrt{\eta_\sigma} \cdot A\right)^5}{\sigma^5}\right]^{1/4}.$$

The optimal stringer shape dimensions are determined:

$$a = \left(\frac{P_s \cdot l_r}{\pi \cdot \sigma \cdot c^{1/2}}\right)^{1/3} \cdot \frac{A_1}{\eta_\sigma^{1/12}};$$

$$\delta_a = \left(\frac{\pi \cdot P_s^2 \cdot c^{1/2}}{\sigma \cdot l_r}\right)^{1/3} \cdot A_2 \cdot \eta_\sigma^{1/12};$$

$$b = a \cdot a_2,$$

$$c = b \cdot a_1,$$

$$\delta_b = \delta_a \cdot a_4,$$

$$\delta_c = \delta_b \cdot a_3.$$

The stringer moment of inertia is calculated:
$$J_s = a^3 \cdot \delta_a \cdot A_4.$$

The required rib shape moment of inertia is determined:
$$J_{r.p} = \frac{c \cdot \pi^2 \cdot J_s \cdot B^3 \cdot \eta_\sigma}{48 \cdot \beta \cdot l_r^3}.$$

The factor of rib shape change is calculated:
$$\psi_r = \left(\frac{J_{r.p.}}{J_r'}\right)^{1/4}.$$

Optimal dimensions of the rib shape are determined:
$b_r = \psi_r \cdot b_r'$; $\delta_{b,r} = \psi_r \cdot \delta_{b,r}'$; $c_r = \psi_r \cdot c_r'$; $\delta_{c,r} = \psi_r \cdot \delta_{c,r}'$.

Presented below is the refined algorithm for the rib-reinforced stringer panel optimization accounting for the influence of the skin onto the bending rigidity of the longitudinal and transversal sets, as well as for the inclination angle of the U-shaped profile lateral webs α.

Steps (1), (2), (3) remain the same as in the above algorithm.

The reduced skin width is determined:
$$b_{re} = 1,9 \cdot \delta \cdot \left(\frac{E}{\sigma}\right)^{1/2}.$$

The pitch of stringer installation is determined:
for shapes forming with the sheet an open configuration $b_s = 2 \cdot b_{re}$,
for those forming with the sheet a close configuration $b_s = b_{re}$.

The force per one stringer is determined:
$$P_s = b_s \cdot (q_p - \delta \cdot \sigma).$$

The pitch of rib installation is determined:
$$l_r = \left[\frac{\pi^4 \cdot E^3 \cdot c^2 \cdot P_s^2 \cdot (\sqrt{\eta_\sigma} \cdot A)^5}{\sigma^5}\right]^{1/4}.$$

Stringer shape dimensions are determined:
$$a = \left(\frac{P_s \cdot l_r}{\pi \cdot \sigma \cdot c^{1/2}}\right)^{1/3} \cdot \frac{A_1}{\eta_\sigma^{1/12}};$$

$$\delta_a = \left(\frac{\pi \cdot P_s^2 \cdot c^{1/2}}{\sigma^2 \cdot l_r}\right)^{1/3} \cdot A_2 \cdot \eta_\sigma^{1/12};$$

$b = a \cdot a_2,$ $c = b \cdot a_1,$ $\delta_b = \delta_a \cdot a_4,$ $\delta_c = \delta_b \cdot a_3.$ For the U-shaped profile, the web inclination angle is determined:
$$\alpha = \arcsin\frac{b_{re} - a - c}{2 \cdot b}.$$

If $\alpha \geq 60°$, then it is assumed that $\alpha = 60°$; if $\alpha < 0°$, then it is assumed that $\alpha = 0°$. Then the value of $b_s$ is calculated:
$$b_s = c + a + b_{re} + 2 \cdot b \cdot \sin\alpha.$$

If $0 < \alpha \leq 60°$, then steps 6 to 8 are reiterated; then branching to step 12 is carried out.

The stringer shape moment of inertia is determined:
$$J_s = a^3 \cdot \delta_a \cdot A_4 \cdot \cos^2\alpha.$$

The coordinate of the stringer shape neutral axis is determined:
For U-shaped profile
$$Y_s = \frac{a \cdot (1 + a_2 \cdot a_4)}{1 + 2 \cdot (a_2 \cdot a_4 + a_1 \cdot a_2 \cdot a_3 \cdot a_4)},$$

For Z-shaped profile:
$$Y_s = \frac{a}{2},$$

For L-shaped profile:
$$Y_s = \frac{a}{2 \cdot (1 + a_1 \cdot a_2)}.$$

The stringer shape area is determined:
for shapes forming with the sheet a closed configuration (U-shaped profile):
$$F_s = a \cdot \delta_a \cdot (1 + 2 \cdot a_2 \cdot a_4 + 2 \cdot a_1 \cdot a_2 \cdot a_3 \cdot a_4),$$

for shapes forming with the sheet an open configuration:

$F_s = a \cdot \delta_a \cdot (1 + 2 \cdot a_1 \cdot a_2),$ (Z-shaped profile)

$F_s = a \cdot \delta_a \cdot (1 + a_1 \cdot a_2).$ (L-shaped profile)

The coordinate of the stringer shape neutral axis with scaled (reduced) skin is determined:
$$Y_{s,re} = \frac{F_s \cdot Y_s}{F_s + b_s \cdot \delta}.$$

The scaled (reduced) moment of inertia of the stringer shape is determined:
$$J_{s,re} = J_s + F_s \cdot (Y_s - Y_{s,re})^2 + b_s \cdot \delta \cdot Y_{s,re}^2.$$

The required rib shape moment of inertia is determined:
$$J_{r,rq} = \frac{c \cdot \pi^2 \cdot J_{s,re} \cdot B^3 \cdot \eta_\sigma}{48 \cdot K_{ex} \cdot \beta \cdot l_r^3}.$$

The coordinate of the rib shape neutral axis with reduced skin is determined (for Z-shaped profile):
$$Y_{r,re} = \frac{F_r' \cdot b_r'}{2 \cdot (F_r' + b_{re} \cdot \delta)}.$$

Rib shape moment of inertia is determined:
$$J_r = J_{r,rq} - b_{re} \cdot \delta \cdot Y_{r,re}.$$

The rib shape area is determined:

$$F_r = \left(\frac{J_r}{f_r}\right)^{1/2}.$$

The minimum panel weight $G_{p.r}$ is determined through selection of optimal combinations of the variable parameters σ and δ:

$$G_{r.p.} = \gamma \cdot l \cdot B \cdot \left(\frac{q_p}{\sigma} + \frac{F_r}{l_r}\right).$$

The factor of rib shape change is calculated $$\psi_r = \left(\frac{J_r}{J_r'}\right)^{1/4}.$$

The optimal rib shape dimensions are determined:

$$b_r = \psi_r \cdot b_r'; \; \delta_{b.r} = \psi_r \cdot \delta_{b.r}'; \; c_r = \psi_r \cdot c_r'; \; \delta_{c.r} = \psi_r \cdot \delta_{c.r}'.$$

The panel parameters corresponding to the minimum weight are output. The calculation results are presented as plots of two types: weight versus optimal parameters (FIGS. 61-65); optimal parameters versus linear compressive force (FIGS. 66-72). The plots are presented for three stringer shapes, materials D16-T and B95.

From the plot in FIG. 61 one can see the influence of the rib weight $G_r$ onto the panel optimal weight $G_{p.r}$. With the increase of the stress σ, the weight of the longitudinal set $G_{p.s}$ falls smoothly, while the weight of ribs increases, first slowly and then sharply. The optimal skin thickness can be seen to constitute δ=3 mm. The total ribs weight $G_r$ being rather small compared to that of the longitudinal set $G_{p.s}$, it is this value that determines the optimal panel weight $G_{p.r}$. Deviations from the optimal value of the panel weight entail the sharp increase of the latter's weight.

From the plot in FIG. 62 one can see dependence of the optimal panel weight from the skin thickness. For the selected step of its incrementing δ=1 mm, the optimal skin thickness is δ=3 mm. With the skin thickness more than δ=3 mm or less than this value, the panel weight increases. It can also be seen from the plot in FIG. 62 that deviation from the optimal value of the skin thickness entails insignificant increase of the panel weight. Therefore, varying the skin thickness δ, one can arrange iteration cycles in δ from an array of sheet thickness values, selecting those according to the existing standards, similarly to the way employed in the suggested algorithm.

Shown in the plot in FIG. 63 is the influence of the pitch of rib installation onto the panel weight. It follows from this plot that deviation from the optimal pitch of rib installation increases the panel weight relatively insignificantly; a twofold deviation from the optimal pitch of rib installation (for skin thickness δ=1, 2, 3 mm) increases the panel weight in the average by 10%.

Shown in the plot in FIG. 63 is the influence of the rib rigidity onto the minimum panel weight. In the case of twofold increase of the adjustment factor of the rib rigidity $K_{ex}$ (3.1.14), the minimum panel weight is reduced by 4.7%; increasing of $K_{ex}$ by the factor of four entails reduction of the minimum panel weight by 6.2%. An error in the accuracy in determining the rib rigidity would entail a relatively small increase in the panel weight. This by no means cancels the requirement of obtaining as precise value of the rib rigidity factor $K_{ex}$ as possible.

The influence of the rib shape factor onto the minimum panel weight is shown in FIG. 65. It can be seen from the plot that with the rib shape factor two fold increase, the minimum panel weight is reduced by 4.7%. It is advisable, other conditions being equal, to have the maximum possible value of the rib shape factor; that is, the rib shape should be selected with its area as spaced as possible.

One can see from the plot in FIG. 72 that the dependence of the panel weight versus the linear force could be approximated fairly by a straight line. The panel manufactured out of a material with higher mechanical properties possesses a smaller weight.

Given the value of the weight $\overline{G}_{p.r}$ at a certain value of linear compressive force $q_p$, it is possible to get an analytical expression for $G_{p.r}$ as a function of $q_p$ through the formula $$G_{p.r} = l \cdot \gamma \cdot q \cdot tg\alpha,$$

where $tg\alpha = \dfrac{\overline{G}_{p.r}}{q_p}.$ 4.0 Designing of Wing Torsion Box Compressed Members Discussed in this section is method of design and calculation of optimal in weight cross-section dimensions of wing torsion box load-carrying members.

The method is divided into several stages. At the first stage (section 4.1), the problem is formulated and the calculation scheme is selected. At the second stage (section 4.2), the basic equation for wing torsion box weight is obtained at several simplifying assumptions; it is shown here that the variable parameters of the basic equation of the torsion box weight possess optimums. At the third stage (section 4.3), the problem are solved with account for normal and tangential stresses acting on the torsion box members; the formulae for numerical solution of the problem are presented. At the fourth stage (section 4.4) the algorithm for wing optimal parameters selection is presented. The problem is solved without assumptions adopted in section 4.2: joint action of normal and tangential stresses onto wing torsion box members is accounted for; also accounted for is the effect of the skin onto the bending rigidity of longitudinal and transversal sets and optimal angle of inclination of U-shaped stringer lateral webs is determined. It should be emphasized that each of the stages employs the results of the previous ones.

FIG. 73 plots aerodynamic profile of the wing with the specified position of the torsion box.

FIG. 74 shows a wing design scheme.

FIG. 75 is a table showing coefficients $K_{\sigma.w}$, $K_{\tau.w}$ in the formulae for web cell critical stresses.

FIG. 76 is a table showing factor θ versus web cell overall dimensions.

FIG. 77 is a table showing feasible coefficients for a stringer shape.

FIG. 78 is a table showing dimensions and geometrical characteristics of rib shape.

FIG. 79 is a table showing dimensions and geometrical characteristics of pillar shape.

4.1 Problem Formulation and Selection of the Calculation Scheme

The problem of design of load-carrying members of the torsion box is formulated as follows: the cross-section dimensions of load-carrying members of the torsion box are sought for basing on the criterion of the minimum weight.

The parameters to be determined:

stringer shape dimensions a, $\delta_a$, b, $\delta_b$, c, $\delta_c$ (U-shaped stringer);

rib shape dimensions $b_r$, $\delta_{b.r}$, $c_r$, $\delta_{c.r}$ (Z-shaped rib);

distance (pitch) between stringers $b_s$, distance (pitch) between ribs $l_r$, skin thickness $\delta$ (FIG. 74);

maximum thickness of the aerodynamic profile $c_{max}$ (effective torsion box height $h_{ef}$), thickness of vertical webs t (FIGS. 73, 74);

shape dimensions for pillars reinforcing the web $b_{pi}$, $\delta_{b.pi}$, $c_{pi}$, $\delta_{c.pi}$ (L-shaped profile), distance between pillars r.

Prescribed values are:

loads in the wing design sections: bending torque M, transversal force Q, torsion torque $M_{ts}$;

distance between torsion box design sections l;

wing aerodynamic profile with the given torsion box dimensions $h_{w1}$, $h_{w2}$, B (FIG. 73).

Given the wing aerodynamic profile, the optimal position of the torsion box (dimensions $h_{w1}$, $h_{w2}$, B) is found by known method basing on the criterion of obtaining the maximum building height of the torsion box.

To determine the weight and optimal dimensions of the member cross-sections, the calculation scheme shown in FIG. 74 is employed. As follows from this calculation scheme, the top and bottom panels possess equal cross-section areas.

The maximum thickness of the wing aerodynamic profile $c_{max}$ is related to the effective height $h_{ef}$ through the coefficient $$c_{max} = \frac{h_{ef}}{K_{ef}}, \quad (4.1.1)$$

where $K_{ef}=0.85$-$0.7$.

Lower values of $K_{ef}$ correspond to "thicker" torsion box panels; the value $K_{ef}=0.85$ corresponds to zero thickness; it is assumed that $K_{ef}=0.75$.

In the course of the iterative calculations the adopted value of $K_{ef}$ can be always refined according to the equation $$K_{ef} = K_{ef.tot.} - 0,985 \frac{\delta_p}{c_{max}}, \quad (4.1.2)$$

$\delta_p$ being the effective plate thickness constant along the panel width;

$$\delta_p = \delta + \frac{F_s}{b_s}, \quad (4.1.3)$$

$$K_{ef.tot.} = \frac{1}{N \cdot c \cdot Z_{max}} \cdot \sum (Z_{top.p}^2 + Z_{bot.p}),$$

Z being the ordinate of the profile measured from the torsion box neutral axis, N the number of elementary area sites.

Heights of the torsion box webs are related to the maximum thickness of the wing aerodynamic profile $c_{max}$ with the equation $$h_w = K_w \cdot c_{max} \quad (4.1.4)$$

$K_w$ being the factor, which is defined in the first approximation through the given torsion box web heights:

$$K_{w1} = \frac{h_{w1}}{c_{max}}, \quad K_{w2} = \frac{h_{w2}}{c_{max}}.$$

The value of $K_w$ can be always refined according to the found optimal value of $c_{max}$.

The expression (4.1.4) taking into account (4.1.1) takes on the form:

$$h_w = K_{ef.w} \cdot h_{ef} \quad (4.1.5),$$

$K_{ef.w}$ being the given value, $$K_{ef.w.} = \frac{K_w}{K_{ef}}.$$

The torsion torque is reacted by the torsion box as a whole. The design value of the torsion box cross-section area is $$\Omega_d = K_{ts} \cdot \Omega \quad (4.1.6),$$

$K_{ts}$ being the factor determined by the ratio of the design area of the torsion box cross-section $\Omega_d$ to the given one Q; in the first approximation, $K_{ts}=1$.

The value of $K_{ts}$ can be always refined according to the found optimal value of $c_{max}$.

Vertical webs of the torsion box are assumed to be of the same thickness, or the ratio of thickness values for these should be specified. Otherwise, each additional web thickness adds another variable parameter.

The torsion box members are selected basing on the stability condition; then the ribs are checked for strength.

For the selected wing calculation scheme, the bending torque is reacted by the wing panels at height $h_{ef}$ and by webs at the height $h_w$; the transversal force is distributed proportionally to the bending rigidity of the webs and is reacted by the latter ones at the height $h_w$; the torsion torque is reacted by the torsion box cross-section as a whole.

4.2 Derivation of the Basic Equation for Wing Torsion Box Weight

In deriving the analytical expression for the basic equation for wing torsion box weight it is assumed that the tangential force brought about by the transversal force and by the torsion torque affect the panel dimensions only slightly, and the normal force brought about by the bending torque affect the dimensions of the web and its reinforcing pillars slightly as well; therefore, the above effects shall be neglected.

The wing torsion box weight is equal to the total of the weight of rib-reinforced stringer panels and pillar-reinforced vertical webs.

$$G = 2 \cdot (G_{p.r} + G_w) \quad (4.2.1),$$

where it is assumed that $h_{w1} = h_{w2} = h_w$.

The expression for the rib-reinforced stringer panel weight compressed by the linear force $q_p$ has the form (3.1.14).

The first member in (3.1.14) determines the weight of stringers, while the second the weight of ribs. It follows from (3.1.14) that the weight of the compressed panel is the function of two variable parameters, normal stress in panel $\sigma$ and skin thickness $\delta$. Let us emphasize that all panel cross-section dimensions are expressed through parameters $\sigma$ and $\delta$.

The linear compressive force $q_p$ is expressed through the given bending torque and the sought-for effective height of the torsion box as follows:

$$q_p = \frac{M}{B \cdot h_{ef}}. \qquad (4.2.2)$$

Taking into account (4.2.2), the weight of the rib-reinforced stringer panel (3.1.14) shall take on the form $$G_{r.p} = \left\{ \frac{\frac{M}{h_{ef} \cdot B} + \lambda \cdot \frac{B^{5/2} \cdot \sigma^2}{\left[ \delta \cdot \left( \frac{M}{h_{ef} \cdot B} - \delta \cdot \sigma \right) \cdot E^7 \cdot \eta_\sigma^{1/4} \right]^{1/4}}}{} \right\} \cdot l \cdot \gamma. \qquad (4.2.3)$$

The weight of the rib-reinforced stringer panel (4.2.3) depends on three variable parameters $\sigma$, $\delta$ and $h_{ef}$.

The weight of pillar-reinforced web appearing in (4.2.1) can be written as follows:

$$G_w = \left( t + \frac{F_{pi}}{r} \right) \cdot K_{ef.w.} \cdot h_{ef} \cdot l \cdot \gamma. \qquad (4.2.4)$$

It follows from (4.2.4) that the weight of pillar-reinforced web is the function of four variables: t, r, $F_{pi}$, $h_{ef}$. In its turn, the pillar area $F_{pi}$ depends on pillar shape dimensions. For the L-shaped profile, $F_{pi}$ is the function of four parameters $b_{pi}$, $\delta_{b.pi}$, $c_{pi}$ and $\delta_{c.pi}$.

Determining of the optimal dimension for the cross-section of the pillar-reinforced web loaded by the flow of tangential forces is a distinct problem. In known studies of P.Kun and G.Hertel, this problem had been considered for a web buckling due to shear. We shall not admit the web buckling, as "it would be inexpedient to admit buckling due to operation of stripes (longerons) for longitudinal-transversal bending".

The optimal web cross-section dimensions shall be determined basing on condition of its minimum weight. This approach enables to express the parameters t and r explicitly as a function of the given load, of the mechanical properties of material and of the pillar shape area $F_{pi}$. The pillar shape area shall be selected in the first approximation basing on the analysis of the existing structures or basing on constructive considerations. Therefore, the wing weight shall be a function of three variable parameters, $\sigma$, $\delta$ and $h_{ef}$.

The procedure to determine the optimal parameters of the web basing on condition of the torsion box minimum weight along with selection of the optimal parameters of the pillar is stipulated in section 4.4. The wing torsion box weight shall be a function of four variable parameters $\sigma$, $\delta$, $h_{ef}$, and t.

The web strength condition has the form $$\tau_{cr.w} = \tau_w \qquad (4.2.5)$$

The critical tangential stress of web cell $\tau_{cr.w}$ is determined from the equation $$\tau_{cr.w} = \frac{K_{\tau.w} \cdot E \cdot t^2}{r^2} \cdot \sqrt{\eta_{\tau.w.}}. \qquad (4.2.6)$$

The factor $K_{\tau.w}$ is assumed the same as for the pivoted infinitely long plate; it is assumed that $r < h_w$; $K_{\tau.w} = 4.8$.

The ductility factor for shear $\eta_\tau$ can be obtained similarly to the ductility factor for compression $\eta_\sigma$.

Replacing $\sigma$ with $\tau$ in (1.2.5), we get $$\eta_\tau = \left\{ \frac{\left[ \sqrt{\tau_{pr} \cdot (\tau_0 - \tau_{pr})^2 + 4 \cdot \tau_{cr(\eta_\tau=1)}^2 \cdot \tau_0} - \tau_{pr}^{1/2} \cdot (\tau_0 - \tau_{pr}) \right]^2}{4 \cdot \tau_{cr(\eta_\tau=1)}^3} \right\}. \qquad (4.2.7)$$

The web ductility factor $\eta_\tau$ in (4.2.6) is determined as follows. The value $\eta_\tau = 1$ is set, and the critical tangential stress $\tau_{cr.w(\eta_\tau=1)}$ is calculated through (4.2.6). Should the value $\tau_{cr.w(\eta_\tau=1)} \leq \tau_{pr}$, then the ductility factor $\eta_{\tau.w} = 1$; otherwise ($\tau_{cr.w(\eta_{\tau 1})} > \tau_{pr}$), the calculated value $\tau_{cr.w(\eta_\tau=1)}$ is substituted into (4.2.7), whereby $\eta_{\tau.w}$ is found. Finally, the critical stress $\tau_{cr.w}$ is determined from the equation $$\tau_{cr.w} = \tau_{cr.w(\eta_\tau=1)} \sqrt{\eta_{\tau.w}} \qquad (4.2.8).$$

The tangential stress in the web, taking into account (4.1.5) and (4.1.6) takes on the form $$\tau_w = \frac{M_{ts}}{2 \cdot K_{ts} \cdot \Omega \cdot t} + \frac{Q_{tr.d}}{K_{ef.w} \cdot h_{ef} \cdot t}, \qquad (4.2.9)$$

$Q_{tr.d}$ being the transversal force in the design section of the web taking into account its obliquity.

$$Q_{tr.d} = \frac{1}{2} \left( Q - \frac{M}{K_{ef.w} \cdot h_{ef}} \cdot \alpha_w \right), \qquad (4.2.10)$$

$\alpha_w$ being the obliquity angle of webs, the factor ½ before the parentheses taking into account consideration of two webs of the same height.

For various values of thickness and height of torsion box web, or in case of number of webs exceeding 2, the tangential forces acting onto each of the webs can be obtained from the known equations as functions of parameters $h_w$ and t.

Solving equation (4.2.5) taking into account (4.2.6) and (4.2.9) for the web thickness t, we get $$t = \left[ \frac{r^2}{K_{\tau.w} \cdot E \cdot \sqrt{\eta_{\tau.w}}} \cdot \left( \frac{M_{ts}}{2 \cdot K_{ts} \cdot \Omega} + \frac{Q_{tr.d}}{K_{ef.w} \cdot h_{ef}} \right) \right]^{1/3}. \qquad (4.2.11)$$

Taking into account (4.2.1), the equation for the web weight takes on the form $$G_w = K_{ef.w} \cdot h_{ef} \cdot l \cdot \gamma \cdot \left\{ \left[ \frac{r^2 \left( \frac{M_{ts}}{2 \cdot K_{ts} \cdot \Omega} + \frac{Q_{tr.d}}{K_{ef.w} \cdot h_{ef}} \right)}{K_{\tau.w} \cdot E \cdot \sqrt{\eta_{\tau.w}}} \right]^{1/3} + \frac{F_{pi}}{r} \right\}. \qquad (4.2.12)$$

The distance between pillars is determined from the equation $$\frac{\partial G_w}{\partial r} = 0. \tag{4.2.13}$$

Solving (4.2.13) for r taking into account (4.2.12), we get $$r = \left[ \frac{\left(\frac{3}{2}F_{pi}\right)^3 \cdot K_{\tau \cdot w} \cdot E \cdot \sqrt{\eta_{\tau \cdot w}}}{\frac{M_{ts}}{2 \cdot K_{ts} \cdot \Omega} + \frac{Q_{tr \cdot d}}{K_{ef \cdot w} \cdot h_{ef}}} \right]^{1/5}. \tag{4.2.14}$$

Substituting (4.2.14) into (4.2.11), we get the web thickness t expressed through the selected pillar shape area $F_{pi}$ as $$t = \left[ \frac{\frac{9}{4}F_{pi}^2 \cdot \left( \frac{M_{ts}}{2 \cdot K_{ts} \cdot \Omega} + \frac{Q_{tr \cdot d}}{K_{ef \cdot w} \cdot h_{ef}} \right)}{K_{\tau \cdot w} \cdot E \cdot \sqrt{\eta_{\tau \cdot w}}} \right]^{1/5}. \tag{4.2.15}$$

The ductility factor $\eta_{\tau \cdot w}$ appearing in the equations for determining the distance between pillars (4.2.14) and of web thickness (4.2.15) is determined as follows. $\eta_{\tau \cdot w}=1$ is assumed, after which calculated are the distance between pillars $r_{(\eta_\tau=1)}$ through (4.2.14), the web thickness $t_{(\eta_\tau=1)}$ through (4.2.15) and the critical tangential stress in the web $\tau_{ck.w(\eta_\tau=1)}$ through (4.2.6). Should it turn out that $\tau_{ck.w(\eta_\tau=1)} \leq \sigma_{pr}$, then $\eta_{\tau \cdot w}=1$, otherwise $\eta_{\tau \cdot w}$ is calculated according to equation (4.2.7). The final values for r, t and $\tau_{cr.w}$ are determined accounting for the obtained value $\eta_{\tau \cdot w}$.

Substituting into (4.2.4) the expressions for the web thickness (4.2.15) and the distance between pillars (4.2.14), we get the web weight as $$G_w = \gamma \cdot l \cdot h_{ef} \tag{4.2.16}$$

$$K_{ef \cdot w} \cdot \left( K_{\tau \cdot w} \cdot E \cdot \sqrt{\eta_{\tau \cdot w}} \right)^{-1/5} \left[ \frac{2}{3} F_{pi}^2 \left( \frac{M_{ts}}{2K_{ts} \cdot \Omega} + \frac{Q_{tr \cdot d}}{K_{ef \cdot w} \cdot h_{ef}} \right) \right]^{1/5}$$

The final expression for the wing torsion box weight (4.2.1) taking into account (4.2.3) and (4.2.16) takes on the form:

$$G_w = 2 \cdot \gamma \cdot l \cdot \left\{ \frac{M}{h_{ef} \cdot \sigma} + \lambda \cdot \frac{B^{5/2} \cdot \sigma^2}{\left[ \frac{\delta \cdot \left( \frac{M}{h_{ef} \cdot B} - \delta \cdot \sigma \right)}{\eta_\delta^{1/4} \cdot E^7} \right]^{1/4}} + h_{ef} \cdot K_{ef \cdot w} \cdot \right. \tag{4.2.17}$$

$$\left. \left( K_{\tau \cdot w} \cdot E \cdot \sqrt{\eta_{\tau \cdot w}} \right)^{-1/5} \left[ \frac{2}{3} \cdot F_{pi}^2 \cdot \left( \frac{\frac{M_{ts}}{2K_{ts} \cdot \Omega} + }{\frac{Q_{tr \cdot d}}{K_{ef \cdot w} \cdot h_{ef}}} \right) \right]^{1/5} \right\}.$$

Analysis of (4.2.17) shows the wing torsion box weight to depend on three variable parameters, the panel stress σ, the skin thickness δ and the effective wing height $h_{ef}$ possessing an optimum in each of these. The pillar area $F_{pi}$ is selected by analogy with the existing structures.

Combination of the three variable parameters σ, δ and $h_{ef}$ corresponding to the torsion box minimum weight calculated through (4.2.17) are the sought-for optimal parameters. To determine these, one can employ the scanning method.

The optimal in weight values of the torsion box member cross-sections, viz. the dimensions of stringer and rib shapes, distances between stringers and ribs, skin thickness, web thickness, distance between pillars, can be easily calculated, as these are functions of the found optimal parameters σ, δ and $h_{ef}$.

4.3 Formulae for Calculation of Optimal Parameters in Case of Joint Action of Normal and Transversal Loads in the Wing Torsion Box Members In this section, the formulae are derived necessary for numerical solution of the formulated problem.

The weight of the wing torsion box is equal to the sum of weight of its load-bearing members:

$$G = 2 \cdot \gamma \cdot (F_s \cdot n_s \cdot l + \delta \cdot B \cdot l + F_r \cdot n_r \cdot B + F_{pi} \cdot n_{pi} \cdot h_w) \tag{4.3.1},$$

$n_s$, $n_r$ and $n_{pi}$ being, respectively, number of stringers, ribs and pillars in the torsion box:

$$n_s = B/b_s, \quad n_r = l/l_r, \quad n_{pi} = l/r.$$

It is obvious from (4.3.1) that the weight of the torsion box depends on eight parameters, namely $F_s$, $b_s$, δ, $F_r$, $l_r$, $F_{pi}$, r, $h_w$. In their turn, areas of the shapes $F_s$, $F_r$, $F_{pi}$ are functions of load-carrying members shape dimensions.

The geometrical characteristics of the stringer shape could be determined analytically given the force acting onto the stringer.

The force acting onto the stringer can be written as $$P_s = b_s \cdot \left( \frac{F_p \cdot \sigma}{B} - \delta \cdot \sigma \right). \tag{4.3.2}$$

To obtain the panel cross-section area $F_p$ in (4.3.2), let us employ the equation for the wing bending strength.

$$\frac{M}{W} \leq \sigma. \tag{4.3.3}$$

The resistance torque of the wing torsion box equals to $$W = F_p \cdot h_{ef} + 2 \cdot \frac{t \cdot h_w^2}{6}. \tag{4.3.4}$$

Hence, the required wing torsion box panel area providing for the given bending torque is $$F_p = \frac{W}{h_{ef}} - \frac{t \cdot h_w^2}{3 \cdot h_{ef}}. \tag{4.3.5}$$

Taking into account (4.3.3), the required panel area is $$F_p = \frac{M}{\sigma \cdot h_{ef}} - \frac{t \cdot h_w^2}{3 \cdot h_{ef}}. \tag{4.3.6}$$

It follows from (4.3.6) that taking into account operation of webs in the course of the wing bending enables reduction of panel areas.

The expression (4.3.2), taking into account (4.3.6), takes on the form:

$$P_c = b_c \cdot \left( \frac{M}{h_{ef} \cdot B} - \frac{\sigma \cdot t \cdot h_w^2}{3 \cdot h_{ef} \cdot B} - \delta \cdot \sigma \right). \quad (4.3.7)$$

The first term in parentheses of (4.3.7) is the linear force acting onto the panel, the second one accounts for reducing of the linear force acting onto the panel due to operation of webs at bending, and the third one accounts for reduction of the linear force due to operation of skin at bending.

The distance between stringers $b_s$ in the expression (4.3.7) is determined by the known formulae, see (2.2.2) and (2.5.2).

Width of the skin cell $b_{sk}$ (the distance between riveted joints of stringer fastening to the skin) in expressions (2.2.2) and (2.5.2) is derived from the condition of the skin cell strength at joint operation of normal and tangential stresses.

The condition of the skin cell strength has the form $$\frac{\sigma}{\sigma_{cr.sk}} + \left( \frac{\tau}{\tau_{cr.sk}} \right)^2 = 1, \quad (4.3.8)$$

$\sigma_{cr.sk}$ being the normal critical strength in the skin cell, $$\sigma_{cr.sk} = \frac{K_{\sigma.sk} \cdot E}{(b_{sk}/\delta)^2} \cdot \sqrt{\eta_{\sigma.sk}}, \quad (4.3.9)$$

$\tau_{cr.sk}$ being the tangential critical strength in the skin cell, $$\tau_{cr.sk} = \frac{K_{\tau.sk} \cdot E}{(b_{sk}/\delta)^2} \cdot \sqrt{\eta_{\tau.sk}}, \quad (4.3.10)$$

$\tau_{sk}$ being the tangential stress in the skin.

$$\tau_{sk} = \frac{M_{ts}}{2 \cdot K_{ts} \cdot \Omega \cdot t}. \quad (4.3.11)$$

The tangential stresses in the skin brought about by the transversal forces are relatively small and are therefore neglected in (4.3.11).

The factors $K_{\sigma.sk}$ and $K_{\tau.sk}$ are determined for the pivoted infinitely long plate: $K_{\sigma.sk}$=3.6, $K_{\tau.sk}$=4.8.

Ductility factors for compression $\eta_{\sigma.sk}$ and for shear $\eta_{\tau.sk}$ are derived, respectively, from equations (1.2.5) and (4.2.7).

Solving the equation (4.3.8) for $b_{sk}$ taking into account (4.3.9) and (4.3.10), we get the biquadratic equation $$x \cdot b_{sk}^4 + y \cdot b_{sk}^2 - 1 = 0, \quad (4.3.12)$$

where $$x = \frac{\tau_{sk}^2}{K_\tau^2 \cdot E^2 \cdot \delta^4 \cdot \eta_{\tau.sk}}, \quad (4.3.13)$$

$$y = \frac{\sigma}{K_{\sigma.sk} \cdot E \cdot \delta^2 \cdot \sqrt{\eta_{\sigma.sk}}}, \quad (4.3.14)$$

The solution of the equation (4.3.12) is $$b_{sk} = \left[ \sqrt{\left(\frac{y}{2 \cdot x}\right)^2 + \frac{1}{x}} - \frac{y}{2x} \right]^{\frac{1}{2}}. \quad (4.3.15)$$

The distance r between web-reinforcing pillars in (4.3.1) is determined from the condition of web cell strength at joint operation of normal and tangential stresses.

The web cell strength condition has the form $$\left( \frac{\sigma_w}{\sigma_{cr.w}} \right)^2 + \left( \frac{\tau_w}{\tau_{cr.w}} \right)^2 = 1, \quad (4.3.16)$$

$\sigma_{cr.w}$ being the normal critical stress in the web cell, $$\sigma_{cr.w} = \frac{K_{\sigma.w} \cdot E}{(r/t)^2} \cdot \sqrt{\eta_{\sigma.w}}, \quad (4.3.17)$$

$\tau_{cr.w}$ the tangential critical stress in the web cell, $$\tau_{cr.w} = \frac{K_{\tau.w} \cdot E}{(r/t)^2} \cdot \sqrt{\eta_{\tau.w}}, \quad (4.3.18)$$

$\sigma_w$ the normal stress in the web, $$\sigma_w = \sigma \cdot \frac{h_{ef}}{h_w}, \quad (4.3.19)$$

$\tau_w$ the tangential stress in the web determined from equation (4.2.9).

The factors $K_{\sigma.w}$ and $K_{\tau.w}$ are determined for the pivoted plate and are depending on the web cell overall dimensions in compliance the Table 4.1.

Ductility factors at compression $\eta_{\sigma.w}$ and at shear $\eta_{\tau.w}$ are determined, respectively, according to equations (1.2.5) and (4.2.7).

The equation (4.3.16) is solved numerically, as the factors $K_{\tau.w}$ and $K_{\tau.w}$ depend on the sought-for r (Table 4.1, FIG. 75).

The pillar area $F_{pi}$ in (4.3.1) is derived by the method outlined in section 3.2 from the expression $$F_{pi} = \Psi_{pi}^2 \cdot F'_{pi} \quad (4.3.20)$$

$$= \left( \frac{J_{pi}}{J'_{pi}} \right)^{1/2} \cdot F'_{pi},$$

$J_{pi}'$ and $F_{pi}'$ being, respectively, the moment of inertia and the area of the pillar shape selected basing on the analysis of the existing designs or on constructive considerations.

The pillar moment of inertia $J_{pi}$ appearing in (4.3.20) shall be selected so that the critical stress of the pillar-reinforced web (at the length l) and the web cell critical stress (at the length r) be equal. Increasing the moment of inertia in excess of this value is senseless, as no increase in the critical stress would be thereby reached.

The pillar moment of inertia in this case shall be:

$$J_{pi} = \theta \cdot \frac{t^3}{12 \cdot (1 - \mu^2)} \cdot l \qquad (4.3.21)$$
$$= \frac{\theta \cdot t_3 \cdot l}{10,7},$$

θ being the factor depending on ratios of the web overall dimensions and the number of pillars;
μ is the Poisson factor, μ=0.31.
With increasing the number of pillar, the factor θ increases. Assuming, that in all practical cases the required pillar moment of inertia shall differ from that for the plate with one rib in the middle not more than by factor of two, we come to results summarized in the Table 4.2, FIG. 76.
Taking into account that $$\frac{l}{h_w} > 2,$$

we assume, providing for the strength margin θ=1.66. For the selected value of θ, the equation (4.3.21) holds with the strength margin for any pitch of the equidistant pillars.

The equation for θ provided a high number of pillars has the form $$\theta = \frac{2 \sum B_i \cdot \sin \frac{\pi \cdot c_i}{r}}{D \cdot h_w}, \qquad (4.3.22)$$

where $B_i$ is the bending rigidity of the pillar located from the web edge at the distance $c_i$;

$$D = \frac{E \cdot t^3}{12 \cdot (1 - \mu^2)}$$

is the web cylindrical rigidity.

In the case $r=h_w$, it follows from (4.3.22) that θ=0; that is, the pillar shape moment of inertia, hence its area (4.3.20) are equal to zero. Provided r≠h, the equation (4.3.20) can be employed to refine the value of the factor θ assumed providing the strength margin.

Analysis of the parameters appearing in the equation for the torsion box weight has shown that the following four parameters shall be assigned the variables: $h_{ef}$, δ, σ, and t.

4.4 Algorithm for Determining the Optimal Parameters for Wing Torsion Box Members This algorithm takes into account the joint loading of the panel and the webs with normal and tangential stresses (section 4.3), joint operation of the skin with stringers and ribs at bending (section 3.3), the optimal inclination angle of the web for the U-shaped stringer (section 2.5), and the shape dimensions of the web-reinforcing pillar are determined (section 4.3).

(1) The benchmark data:
loads in the wing design section: bending torque M, torsion torque $M_{ts}$, transversal force Q;
distance between design wing sections l;
aerodynamic profile of the wing with the given torsion box dimensions; it is assumed that $h_{w1}=h_{w2}=h_{ef}$, $\Omega=h_{ef}B$;

$K_{ef}$, the factor relating the effective height of the wing torsion box with the maximum height of the aerodynamic profile; it is assumed that $K_{ef}=1$;
$K_w$, the factor relating vertical web height with the maximum height of aerodynamic profile; it is assumed that $K_w=1$;
$K_{ts}$, the factor relating the given torsion box outline area with the design one; it is assumed that $K_{ts}=1$;
the optimal stringer shape coefficients accounting for technological and design requirements $a_1$, $a_2$, $a_3$, $a_4$, A, $A_1$, $A_2$, $A_3$, $K_s$ (Table 4.3, FIG. 77);
the benchmark dimensions and geometrical characteristics of the rib shape $b'_r$, $\delta'_{b.r}$, $c'_r$, $\delta'_{c.r}$, $F'_r$, $W'_r$, $J'_r$, $f_r$ (Table 4.4, FIG. 78);
the rib rigidity factor $K_{ex}$; it is assumed that $K_{ex}=1$ (section 3.3);
the factor accounting for the condition of the stringer leaning on the rib c; it is assumed that c=2 (section 3.3);
the coefficients in the equations for critical stresses of skin and web accounting for cell dimensions, leaning conditions and type of loading $K_{\sigma.sk}=3.6$, $K_{\tau.sk}=4.8$, $K_{\sigma.w}$, $K_{\tau.w}$ (Table 4.1, FIG. 75);
the benchmark dimensions and geometrical characteristics of pillar shape $b'_{pi}$, $\delta'_{b.pi}$, $c'_{pi}$, $\delta'_{c.pi}$, $F'_{pi}$, $J'_{pi}$, $W'_r$ (Table 4.5, FIG. 79);
the coefficient in the equation for determining of the pillar shape moment of inertia θ=1.66;
the factor depending on the number of spans in the equation for rib rigidity β=0.255 (section 3.1);
angle of web obliquity; it is assumed that $\alpha_w=0$.

(2) The iteration cycles are specified in the following variable parameters:
the effective wing profile height $h_{ef}$; e.g., the range of its variation is assumed to be $h_{ef}=(50-200)$ cm;
skin thickness δ; the series of values in compliance with the existing standards is adopted, for example, δ=0.1; 0.12; 0.15; 0.2; 0.25; 0.3; 0.35; 0.4; 0.45; 0.5; 0.6; 0.8; 1.0 [cm];
web thickness t; the series of values in compliance with the existing standards is adopted, for example, t=0.1; 0.12; 0.15; 0.2; 0.25; 0.3; 0.35; 0.4; 0.45; 0.5; 0.6; 0.8; 1.0 [cm];
panel normal stress σ; the range of variation is adopted $\sigma=(500-\sigma_{0.2})$ [daN/cm²].
In specifying cycles in $h_{ef}$ and σ, increments of the varied parameters, $\Delta h_{ef}$ and Δσ, are reduced until the subsequent value for the weight function would differ from the previous one by no more than 2%.

The height of vertical webs is calculated $$h_w = \frac{K_w}{K_{ef}} \cdot h_{ef}.$$

The area of the torsion box reacting the torsion torque:

$$\Omega_d = K_{ts} \cdot \Omega.$$

The tangential stress in the skin is determined $$\tau_{sk} = \frac{M}{2 \cdot \Omega_d \cdot t}.$$

The ductility factor for normal stresses in the panel is calculated $$\eta_\sigma = \begin{cases} 1, & \text{provided } \sigma \leq \sigma_{pr} \\ \dfrac{\sigma}{\sigma_{pr}}\left(\dfrac{\sigma_o - \sigma}{\sigma_o - \sigma_{pr}}\right)^2, & \text{provided } \sigma > \sigma_{pr} \end{cases}.$$

The value of y and the value of x at $\eta_{\tau.sk}=1$ is calculated $$y = \dfrac{\sigma}{K_{\sigma.sk} \cdot E \cdot \delta^2 \cdot \sqrt{\eta_\sigma}},$$

$$x_{(\eta_{\tau.sk}=1)} = \dfrac{\tau_{sk}^2}{K_{\tau.sk}^2 \cdot E^2 \cdot \delta^4}.$$

The width of the skin cell at $\eta_{\tau.sk}=1$ is calculated $$b_{sk(\eta_{\tau.sk}=1)} = \left[\sqrt{\left(\dfrac{y}{2 \cdot x_{(\eta_{\tau.sk}=1)}}\right)^2 + \dfrac{1}{x_{(\eta_{\tau.sk}=1)}}} - \dfrac{y}{2 \cdot x_{(\eta_{\sigma.sk}=1)}}\right]^{1/2}$$

The critical tangential stress in the skin cell at $\eta_{\tau.sk}=1$ is calculated $$\tau_{cr.sk(\eta_{\tau.sk}=1)} = \dfrac{K_{\tau.sk} \cdot E}{\left(\dfrac{b_{sk(\eta_{\tau.sk}=1)}}{\delta}\right)^2}.$$

The shear ductility factor for the skin is calculated. If $\tau_{cr.sk(\eta_{\tau.sk}=1)} \leq \tau_{pr}$, then $\eta_{\tau.sk}=1$, otherwise $$\eta_{\tau.sk} = \left\{\dfrac{\left[\sqrt{\tau_{pr} \cdot (\tau_0 - \tau_{pr})^2 + 4 \cdot \tau_{cr.sk(\eta_{\tau.sk}=1)}^2 \cdot \tau_0} - \tau_{pr}^{\frac{1}{2}} \cdot (\tau_0 - \tau_{pr})\right]^2}{4 \cdot \tau_{cr.sk(\eta_{\tau.sk}=1)}^3}\right\}^2$$

The critical tangential stress in the skin cell is calculated $$\tau_{cr.sk} = \tau_{cr.sk(\eta_{\tau.sk}=1)} \cdot \eta_{\tau.sk}^{\frac{1}{2}}.$$

The width of skin cell is calculated $$b_{sk} = \left[\sqrt{\left(\dfrac{y \cdot \eta_{\tau.sk}}{2 \cdot x_{(\eta_{\tau.sk}=1)}}\right)^2 + \dfrac{\eta_{\tau.sk}}{x_{(\eta_{\tau.sk}=1)}}} - \dfrac{y \cdot \eta_{\tau.sk}}{2 \cdot x_{(\eta_{\tau.sk}=1)}}\right]^{1/2}.$$

The pitch of stringer installation is determined:
for shapes forming with the sheet an open configuration $b_s=2 \cdot b_{re}$,
for those forming with the sheet a close configuration $b_s=b_{re}$.
The number of stringers is determined $$n_s = \dfrac{B}{b_s}.$$

The value of $n_s$ is rounded to the nearest higher integer.
The distance between stringers is refined $$b_s = \dfrac{B}{n_s}.$$

The force per one stringer is determined $$P_s = b_s \cdot \left(\dfrac{M}{h_{ef} \cdot B} - \dfrac{\sigma \cdot t \cdot h_w^2}{3 \cdot B \cdot h_{ef}} - \delta \cdot \sigma\right).$$

The distance between ribs is determined $$l_r = \left[\dfrac{\pi^4 \cdot E^3 \cdot c^2 \cdot P_s^2 \cdot \left(\sqrt{\eta_\sigma} \cdot A\right)^5}{\sigma^5}\right]^{\frac{1}{4}}.$$

The number of ribs is calculated $$n_r = \dfrac{l}{l_r}.$$

The value of $n_r$ is rounded to the nearest higher integer.
The distance between ribs is refined $$l_r = \dfrac{l}{n_r}.$$

The characteristic stringer shape dimensions are determined $$a = \left(\dfrac{P_s \cdot l_r}{\pi \cdot \sigma \cdot c^{1/2}}\right)^{1/3} \cdot \dfrac{A_1}{\eta_\sigma^{1/12}},$$

$$\delta_a = \left(\dfrac{\pi \cdot P_s^2 \cdot c^{\frac{1}{2}}}{\sigma^2 \cdot l_r}\right)^{1/3} \cdot A_2 \eta_\sigma^{1/12}.$$

The other dimensions of the stringer shape are calculated $b = a \cdot a_2$, $\delta_b = \delta_a \cdot a_4$, $c = b \cdot a_1$, $\delta_c = \delta_b \cdot a_3$.

For the U-shaped stringer, the lateral web inclination angle is determined $$\alpha = \arcsin\left(\dfrac{b_{sk} - a - c}{2 \cdot b}\right).$$

If $\alpha \geq 60°$, then it is assumed that $\alpha=60°$; if $\alpha<0°$, then it is assumed that $\alpha=0°$.
The distance between stringers for $0<\alpha \leq 60°$ is calculated:
$b_s = c + 2 \cdot b \cdot \sin \alpha + a + b_{sk}$.
The stringer shape area is determined:
for shapes forming with the sheet a closed configuration (U-shaped profile):

$F_s = a \cdot \delta_a \cdot (1 + 2 \cdot a_2 \cdot a_4 + 2 \cdot a_1 \cdot a_2 \cdot a_3 \cdot a_4)$, for shapes forming with the sheet an open configuration:

$$F_s = a \cdot \delta_a \cdot (1 + 2 \cdot a_1 \cdot a_2),$$ (Z-shaped profile)

$$F_s = a \cdot \delta_a \cdot (1 + a_1 \cdot a_2).$$ (L-shaped profile)

The reduced stringer shape area is determined:

$$F_{re.s} = F_s + b_c \cdot \delta.$$

The stringer shape moment of inertia is determined:

$$J_s = a^3 \cdot \delta_a \cdot A_4 \cdot \cos^2 \alpha.$$

The coordinate of the stringer shape neutral axis is determined:

For U-shaped profile:

$$y_s = \frac{a \cdot (1 + a_2 \cdot a_4)}{1 + 2 \cdot (a_2 \cdot a_4 + a_1 \cdot a_2 \cdot a_3 \cdot a_4)},$$

For Z-shaped profile:

$$y_s = \frac{a}{2},$$

For L-shaped profile:

$$y_s = \frac{a}{2 \cdot (1 + a_1 \cdot a_2)}.$$

The coordinate of the stringer shape neutral axis is determined for the stringer with the reduced skin:

$$y_{re.s} = \frac{F_s}{F_{re.s}} \cdot y_s.$$

The reduced stringer shape moment of inertia is determined $$J_{re.s} = J_s + F_s (y_s - y_{re.s})^2 + b_s \cdot \delta \cdot y_{re.s}.$$

The required rib shape moment of inertia is determined:

$$J_{r.p} = \frac{c \cdot \pi^2 \cdot J_{r.rq} \cdot B^3 \cdot \eta_\sigma}{48 \cdot K_{ex} \cdot \beta \cdot l_r^3}.$$

The coordinate of the rib shape neutral axis with reduced skin is determined:

$$Y_{r.re} = \frac{F'_r \cdot b'_r}{2 \cdot (F'_r + b_{re} \cdot \delta)}.$$

Rib shape moment of inertia is determined:

$$J_r = J_{r.rq} - b_{sk} \cdot \delta \cdot Y_{r.re}^2.$$

The rib shape area is determined $$F_r = \left(\frac{J_r}{f_r}\right)^{1/2}.$$

The pillar moment of inertia is determined $$J_{pi} = \frac{\theta \cdot r^3 \cdot l}{10,7}.$$

The pillar shape area is determined $$F_{pi} = F'_{pi} \cdot \left(\frac{J_{pi}}{J'_{pi}}\right)^{1/2}.$$

r is assigned a number of values, for example: $r = h_{ef}$; $0.8\, h_{ef}$; $0.6\, h_{ef}$; $0.4\, h_{ef}$; $0.2\, h_{ef}$.

The critical normal stress in the web cell is determined at $\eta_{\sigma.w} = 1$, $$\sigma_{cr.w(\eta_{\sigma.w}=1)} = \frac{K_{\sigma.w} \cdot E}{(r/t)^2}.$$

The compression ductility factor for the web is calculated. If $\sigma_{cr.w(\eta_{\sigma.w}=1)} \leq \sigma_{pr}$, then $\eta_{\sigma.w} = 1$, otherwise $$\eta_{\sigma.w} = \left\{ \frac{\left[\sqrt{\sigma_{pr} \cdot (\sigma_0 - \sigma_{pr})^2 + 4 \cdot \sigma_{cr.w(\eta_{\sigma.w}=1)}^2 \cdot \sigma_0} - \sigma_{pr}^{1/2} \cdot (\sigma_0 - \sigma_{pr})\right]^2}{4 \cdot \sigma_{cr.w(\eta_{\sigma.w}=1)}^3} \right\}^2.$$

The critical normal stress in the web cell is determined $$\sigma_{cr.w} = \sigma_{cr.w(\eta_{\sigma.w}=1)} \cdot \eta_{\sigma.w}^{1/2}.$$

The transversal force in the web is determined $$Q_{tr.d} = \frac{1}{2} \cdot \left(Q - \frac{M_{ts}}{h_w} \cdot \alpha_w\right).$$

The tangential stress in the web is determined $$\tau_w = \frac{M_{ts}}{2\Omega_d \cdot t} + \frac{Q_{tr.d}}{h_w \cdot t}.$$

The critical tangential stress in the web is determined at $\eta_{\tau.w} = 1$ $$\tau_{cr.w(\eta_{\tau.w}=1)} = \frac{K_{\tau.w} \cdot E}{(r/t)^2}.$$

The shear ductility factor of the web is determined. If $\tau_{cr.w(\eta_{\tau.w}=1)} \leq \tau_{pr}$, then $\eta_{\tau.w} = 1$, otherwise $$\eta_{\tau.w} = \left\{ \frac{\left[\sqrt{\tau_{pr} \cdot (\tau_0 - \tau_{pr})^2 + 4 \cdot \tau_{cr.w(\eta_{\tau.w}=1)}^2 \tau_0} - \tau_{pr}^{1/2} \cdot (\tau_0 - \tau_{pr})\right]^2}{4 \cdot \tau_{cr.w(\eta_{\tau.w}=1)}^3} \right\}^2.$$

The critical tangential stress in the web is determined $$\tau_{cr.w} = \tau_{cr.w(\eta_{\tau.w}=1)} \cdot \eta_{\tau.w}^{1/2}$$

The normal stress in the web is determined $$\sigma_w = \sigma \cdot \frac{h_w}{h_{ef}}.$$

The distance between pillars is selected basing on the web strength condition. If $$\left(\frac{\sigma_w}{\sigma_{crw}}\right)^2 + \left(\frac{\tau_w}{\tau_{crw}}\right)^2 > 1$$

then branch to determining the pillar shape area.
The number of pillars is determined $$n_{pi} = \frac{l}{r}.$$

The value of $n_{pi}$ is rounded to the nearest higher integer.
The distance between pillars is refined $$r = \frac{l}{n_{pi}}.$$

The variable parameters $h_{ef}$, t, $\delta$ and $\sigma$ are determined basing on condition of the torsion box minimum weight $$G = 2 \cdot \gamma \cdot (F_s \cdot n_s \cdot l + \delta \cdot B \cdot l + F_r \cdot n_r \cdot B + h_w \cdot t \cdot l + F_{pi} \cdot n_{pi} \cdot h_w)$$

The factor of the rib profile dimension change is calculated $$\Psi_r = \left(\frac{J_r}{J'_r}\right)^{1/4}.$$

The optimal rib shape dimensions are calculated $$b_r = \Psi_r \cdot b'_r, \quad c_r = \Psi_r \cdot c'_r,$$

$$\delta_{b.r} = \Psi_r \cdot \delta'_{b.r}, \quad \delta_{c.r} = \Psi_r \cdot \delta'_{c.r}.$$

The factor of the pillar shape dimension change is calculated $$\Psi_{pi} = \left(\frac{J_{pi}}{J'_{pi}}\right)^{1/4}.$$

The optimal pillar shape dimensions are calculated $$b_{pi} = \Psi_{pi} \cdot b'_{pi}, \quad c_{pi} = \Psi_{pi} \cdot c'_{pi},$$

$$\delta_{c.pi} = \Psi_{pi} \cdot \delta'_{c.pi}, \quad \delta_{c.pi} = \Psi_{pi} \cdot \delta'_{c.pi}.$$

The radius of inertia of the stringer shape with reduced skin is calculated $$i_{res} = \left(\frac{J_{res}}{F_{res}}\right)^{1/2}.$$

The stringer overall stability critical stress for $\eta_{\sigma.tot}=1$ is calculated.

$$\sigma_{Kp.tot(\eta_{\sigma.tot}=1)} = \frac{c \cdot \pi^2 \cdot E}{(l/i_{res})^2}$$

The ductility factor of the stringer overall stability critical stress is calculated. If $\sigma_{cr.tot(\eta_{\sigma.tot}=1)} \leq \sigma_{pr}$ then $\eta_{\sigma.tot}=1$, otherwise $$\eta_{\sigma.tot} = \frac{\sigma_0}{\sigma_{cr.tot(\eta_{\sigma.tot}=1)}} - \frac{\sigma_0 - \sigma_{pr}}{\sigma_{cr.tot(\eta_{\sigma.tot}=1)}} \cdot \left(\frac{\sigma_{pr}}{\sigma_{cr.tot(\eta_{\sigma.tot}=1)}}\right)^{1/2}.$$

The stringer overall stability critical stress is calculated $$\sigma_{cr.tot} = \sigma_{cr.tot(\eta_{\sigma.tot}=1)} \cdot \eta_{\sigma.tot}$$

The stringer local stability normal critical stress for $\eta_{\sigma.l}=1$ is calculated.

$$\sigma_{cr.l(\eta_{\sigma.l}=1)} = \frac{K_s \cdot E}{(a/\delta_a)^2}.$$

The ductility factor of the stringer local stability critical stress is calculated. If $\sigma_{cr.l(\eta_{\sigma.l}=1)} \leq \sigma_{pr}$ then $\eta_{\sigma.l}=1$, otherwise $$\eta_{\sigma.l} = \left\{\frac{\left[\sqrt{\sigma_{pr} \cdot (\sigma_0 - \sigma_{pr})^2 + 4 \cdot \sigma_{cr.l(\eta_{\sigma.l}=1)}^2 \cdot \sigma_0} - \sigma_{pr}^{1/2} \cdot (\sigma_0 - \sigma_{pr})\right]^2}{4 \cdot \sigma_{cr.l(\eta_{\sigma.l}=1)}^3}\right\}^2$$

The stringer local stability critical stress is calculated.

$$\sigma_{cr.l} = \sigma_{cr.l(\eta_{\sigma.l}=1)} \cdot \eta_{\sigma.l}^{1/2}.$$

The skin normal critical stress is calculated.

$$\sigma_{cr.l} = \frac{K_{\sigma.sk} \cdot E}{(b_{sk}/\delta)^2}$$

Output are the following wing torsion box optimal parameters:
shape dimensions of stringer, rib, pillar: a, $\delta_a$, b, $\delta_b$, c, $\delta_c$, $b_r$, $\delta_{b.r}$, $c_r$, $\delta_{c.r}$, $b_{pi}$, $\delta_{b.pi}$, $c_{pi}$, $\delta_{c.pi}$;
distances between stringers, ribs and pillars $b_s$, $l_r$, r;
values of thickness for web and skin t and $\delta$;
effective wing height $h_{ef}$;
normal and tangential stresses of stringer, skin and web $\sigma$, $\tau_{sk}$, $\tau_w$;
critical normal and tangential stresses for stringer, skin cell and web cell $\sigma_{cr.l}$, $\sigma_{cr.tot}$, $\sigma_{cr.sk}$, $\sigma_{cr.w}$, $\tau_{cr.sk}$, $\tau_{cr.w}$;
inclination angle $\alpha$ for the U-shaped stringer lateral web.

INDUSTRIAL APPLICABILITY

TPM and TPM-panels as contemplated herein may be of any known grade of structural metallic alloys and/or non-metal material so long as suitable to satisfy desired constructive restrictions. The proposed techniques for improved efficiency in designing TPM and TPM-panel configurations for industrial applications, with the intent of their being fitted into a further manufactured profile or system design and taking any feasible to design shape, including fully monolithic TPM-panels, and sandwich TPM-panels with longitudinal load-bearing filler, corrugated components and other shapes depending on specific conditions.

It is believed that TPM and TPM-panels which utilize the proposed modeling and analysis tool will often result in a reduction of structure weight improvement of between 5 and 35 percent or more, as might otherwise be feasible using conventional tools.

It will be understood that each of the elements described above, or two or more together, may also find a useful application in other types of methods differing from the type described above.

While the invention has been illustrated and described as embodied in a method of producing thin wall profile members, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A thin wall profile member (TPM) with a cross-sectional shape and dimensions constant along its length, the TPM being pre-constructed for use as a load-carrying, weight optimized structural element under constructive restrictions, the TPM comprising;
   at least one main strip having longitudinal reinforcing ribs; and
   at least one additional strip having longitudinal reinforcing ribs, the at least one additional strip having a width that does not exceed a width of the at least one main strip and having a thickness that equals or exceeds a thickness of the at least one main strip;
   wherein a ratio of the width of the at least one additional strip to the width of the at least one main strip satisfies the range from 0.1 to 1.0;
   wherein a ratio of the thickness of the at least one additional strip to the thickness of the at least one main strip satisfies the range from 1.0 to 10.0; and wherein for each value in the width ratio range from 0.1 to 1.0, there is a corresponding maximum value in the thickness ratio range from 1.0 to 10.0 corresponding to a maximum shape efficiency factor value.

2. The TPM according to claim 1,
wherein the longitudinal reinforcing ribs of the at least one additional strip comprise a free reinforcing rib and a common reinforcing rib, and
wherein $\delta_c/c \geq \delta_b/b$
where;
b is the width of the at least one main strip,
c is the width of the at least one additional strip,
$\delta_b$ is the thickness of the at least one main strip, and
$\delta_c$ is the thickness of the at least one additional strip.

3. The TPM according to claim 1,
wherein the at least one additional strip comprises an additional strip having a common reinforcing rib and a free reinforcing rib as the longitudinal reinforcing ribs,
wherein the at least one additional strip comprises another additional strip having common reinforcing ribs as the longitudinal reinforcing ribs, a ratio of the width of the another additional strip to the width of the at least one main strip satisfying the range from 0.1 to 1.0, and a ratio of the thickness of the another additional strip to the thickness of the at least one main strip satisfying the range from 1.0 to 10.0, and
wherein $\delta_a/a \geq \delta_b/b$ and $\delta_c/c \geq \delta_b/b$
where:
a is the width of the additional strip with the common reinforcing ribs,
b is the width of the at least one main strip,
c is the width of the additional strip with the free reinforcing rib and the common reinforcing rib,
$\delta_a$ is the thickness of the additional strip with the common reinforcing ribs,
$\delta_b$ is the thickness of the at least one main strip, and
$\delta_c$ is the thickness of the additional strip with the free reinforcing rib and the common reinforcing rib.

4. The TPM according to claim 1, wherein the longitudinal reinforcing ribs of the at least one additional strip comprise two common reinforcing ribs and no free reinforcing ribs.

5. The TPM according to claim 1, wherein the longitudinal reinforcing ribs comprise a common reinforcing rib and a free reinforcing rib.

6. The TPM according to claim 5, wherein the TPM is Z-shaped in cross-section.

7. The TPM according to claim 5, wherein the TPM is U-shaped in cross-section.

8. The TPM according to claim 5, wherein the TPM is L-shaped in cross-section.

9. The TPM according to claim 5, wherein the TPM is I-shaped in cross-section.

10. The TPM according to claim 9, wherein the TPM is made of steel.

11. The TPM according to claim 5 wherein the TPM is one of I-shaped, Z-shaped, U-shaped and L-shaped in cross-section and is made of an aluminum alloy.

12. The TPM according to claim 1, wherein the at least one additional strip comprises an additional strip having two common reinforcing ribs as the longitudinal reinforcing ribs and an additional strip having a free reinforcing rib and a common reinforcing rib as the longitudinal reinforcing ribs.

13. The TPM according to claim 12, wherein $c/b \leq a/b \leq 1$ where a is the width of the additional strip with the two common reinforcing ribs, b is the width of the at least one main strip, and c is the width of the additional strip with the free reinforcing rib and the common reinforcing rib.

14. The TPM according to claim 13, wherein $1 \leq \delta_a/\delta_b \leq \delta_c/\delta_b$, where $\delta_a$ is the thickness of the additional strip with the two common reinforcing ribs, $\delta_b$ is the thickness of the at least one main strip, and $\delta_c$ is the thickness of the additional strip with the free reinforcing rib and the common reinforcing rib.

15. The TPM according to claim 12, wherein the TPM is U-shaped in cross-section and is made of an aluminum alloy.

16. The TPM according to claim 1, wherein the longitudinal reinforcing ribs of the at least one additional strip comprise common reinforcing ribs; and wherein $\delta_a/a \geq \delta_b/b$ where:
a is the width of the at least one additional strip,
b is the width of the at least one main strip,
$\delta_a$ the thickness of the at least one additional strip, and
$\delta_b$ is the thickness of the at least one main strip.

17. The TPM according to claim 1, wherein the constructive restrictions comprise structural requirements, material requirements and fabrication requirements.

18. The TPM according to claim 17, wherein the structural requirements comprise compression, tensile, shear and bending loads.

19. The TPM according to claim 1, wherein the corresponding maximum shape efficiency factor value is obtained from a set of shape efficiency factor values each determined as $\Sigma = K_f K_m$, where $K_f = (i^2/F)^{2/5}$ is an overall stability factor,
$K_m = K^{1/5}/(b/\delta_b)^{2/5}$ is a local stability factor,
b is the width of the at least one main strip,
$\delta_b$ is the thickness of the at least one main strip,
i is the radius of gyration of the cross-section of the TPM,
F is the area of the IPM cross-section, and
K is the coefficient in the known formula for local stability critical stress.

20. The TPM according to claim 1, wherein the TPM is made of a material in which the actual stress value is greater than the proportion limit stress value thereof.

21. A thin wall profile member (TPM) and panel sheet combination comprising:
a panel sheet; and
a plurality of TPMs installed longitudinally across a width of the panel sheet with even pitch:
wherein each of the TPMs comprises at least one main strip, and at least one additional strip having a width that does not exceed a width of the at least one main strip and having a thickness that equals or exceeds a thickness of the at least one main strip;
wherein for each of the TPMs, a ratio of the width of the at least one additional strip to the width of the at least one main strip satisfies the range from 0.1 to 1.0;
wherein for each of the TPMs, a ratio of the thickness of the at least one additional strip to the thickness of the at least one main strip satisfies the range from 1.0 to 10.0; and
wherein for each value in the width ratio range from 0.1 to 1.0, there is a corresponding maximum value in the thickness ratio range from 1.0 to 10.0 corresponding to it maximum shape efficiency factor value.

22. The TPM and panel sheet combination according to claim 21, wherein the TPMs are installed longitudinally across a width of the panel sheet with even pitch such that for each of the plurality of longitudinally installed TPMs, the corresponding at least one main strip and at least one additional strip form, with the panel sheet, an open cross-section configuration; and wherein a thickness of the panel sheet satisfies the expression $\delta=(0.0006$ to $0.0035)$ $l_s$ and a pitch of the longitudinally installed TPMs satisfies the expression $b_s=(20$ to $65)$ $\delta$, where:
- $\delta$ is the thickness of the panel sheet,
- $l_s$ is the length of each of the longitudinally installed TPMs; and
- $b_s$ is the pitch of the longitudinally installed TPMs forming with the panel sheet the open cross-section configuration.

23. The TPM and panel sheet combination according to claim 22, further comprising a plurality of TPMs installed transversally to the longitudinally installed TPMs.

24. The TPM and panel sheet combination according to claim 23, wherein each of the transversally installed TPMs comprises at least one main strip, an additional strip having common reinforcing ribs, and an additional strip having a free reinforcing rib and a common reinforcing rib, the ratio of the width of the additional strip having the common reinforcing ribs to the width of the at least one main strip of each of the transversally installed TPMs satisfying the range:

$$a/b=0.1 \text{ to } 1.0,$$

the ratio of the thickness of the additional strip with the common reinforcing ribs to the thickness of the at least one main strip of each of the transversally installed TPMS satisfying the range:

$$\delta_a/\delta_b=1.0 \text{ to } 3.0,$$

the ratio of width of the additional strip with the free reinforcing rib and the common reinforcing rib to the width of the at least one main strip of each of the transversally installed TPMs satisfying the range:

$$c/b=0.1 \text{ to } 1.0, \text{ and}$$

the ratio of the thickness of the of the additional strip with the free reinforcing rib and the common reinforcing rib to the thickness of the at least one main strip of each of the transversally installed TPMs satisfying the range:

$$\delta_c/\delta_b=1.0 \text{ to } 10.0,$$

where:
- a is the width of the additional strip with the common reinforcing ribs of each of the transversally installed TPMs,
- b is the width of the at least one main strip of each of the transversally installed TPMs,
- c is the width of the additional strip with the tine reinforcing rib and the common reinforcing rib of each of the transversally installed TPMs,
- $\delta_a$ is the thickness of the additional strip with the common reinforcing ribs of each of the transversally installed TPMs,
- $\delta_b$ is the thickness of the at least one main strip of each of the transversally installed TPMs, and
- $\delta_c$ is the thickness of the additional strip with the free reinforcing rib and the common reinforcing rib of each of the transversally installed TPMs; and
wherein $\delta_a/a \geq \delta_b/b$ and $\delta_c/c \geq \delta_b/b$.

25. The TPM and panel sheet combination according to claim 22, wherein a width B of the TPM and panel sheet combination is determined from the expression:

$$B=n_s \cdot b_s,$$

where $n_s$ the number of longitudinally installed TPMs forming with the panel sheet the open cross-section configuration.

26. The TPM and panel sheet combination according to claim 23, wherein a pitch $l^1_r$ transversally installed TPMs satisfies the expression:

$$l^1_r=(1.5 \text{ to } 10)b^1_s,$$

where $b^1_s$ is the pitch of the longitudinally installed TPMs forming with the panel sheet a closed cross-section configuration.

27. The TPM and panel sheet combination according to claim 26, wherein a width B of the TPM and panel sheet combination is determined from the expression;

$$B=n^1_s \cdot b^1_s,$$

where $n^1_s$ is the number of longitudinally installed TPMs forming with the panel sheet the closed cross-section configuration.

28. The TPM and panel sheet combination according to claim 23, wherein a length L of the TPM and panel sheet combination is determined from the expression:

$$L=n_r \cdot l_r,$$

where $n_r$ is the number of TPMs installed transversally to the longitudinally installed TPMs that form with the panel sheet the open cross-section configuration, and where $l_r$ is the pitch of the transversally installed TPMs and satisfies the expression:

$$l_r=(10 \text{ to } 60)b_s.$$

29. The TPM and panel sheet combination according to claim 21, wherein the at least one additional strip has a common reinforcing rib and a free reinforcing rib; and wherein $\delta_c/c \geq \delta_b/b$,
where:
- b is the width of the at least one main strip,
- c is the width of the at least one additional strip,
- $\delta_b$ is the thickness of the at least one main strip, and
- $\delta_c$ is the thickness of the at least one additional strip.

30. The TPM and panel sheet combination according to claim 21, wherein the at least one additional strip has two common reinforcing ribs and no free reinforcing ribs.

31. The TPM and panel sheet combination according to claim 21, wherein the at least one additional strip has a common reinforcing rib and a free reinforcing rib.

32. The TPM and panel sheet combination according to claim 21, wherein the TPMs are installed longitudinally across a width of the panel sheet with even pitch such that .for each of the plurality of longitudinally installed TPMs, the corresponding at least one main strip and at least one additional strip form, with the panel sheet, a closed cross-section configuration; and wherein a thickness of the panel sheet satisfies the expression $\delta=(0.0006$ to $0.0035)$ $l^1_s$, and a pitch of the longitudinally installed TPMs satisfies the expression $b^1_s=(40$ to $130)\delta$, where:
- $\delta$ is the thickness of the panel sheet,
- $l^1_s$ is the length of each of the longitudinally installed TPMs; and
- $b^1_s$ is the pitch of the longitudinally installed TPMs forming with the panel sheet the closed cross-section configuration.

33. The TPM and panel sheet combination according to claim 32, farther comprising a plurality of TPMs installed transversally to the longitudinally installed TPMs; and wherein a length L of the TPM and panel sheet combination is determined from the expression:

$$L = n^1_r l^1_r$$

where $n^1_r$ is the number of TPMs installed transversally to the longitudinally installed TPMs that form with the panel sheet the closed cross-section configuration.

34. The TPM and panel sheet combination according to claim 21, wherein the constructive restrictions comprise structural requirements, material requirements and fabrication requirements.

35. The TPM and panel sheet combination according to claim 34, wherein the structural requirements comprise compression, tensile, shear and bending loads.

36. The TPM and panel sheet combination according to claim 21, wherein the corresponding maximum shape efficiency factor value is obtained from a set of shape efficiency factor values each determined as $$\Sigma K_f \cdot K_m, \text{ where}$$

$K_f = (i^2/F)^{2/5}$ is an overall stability factor,
$K_m = K^{1/5}/(b/\delta_b)^{2/5}$ is a local stability factor,
b is the width of the at least one main strip,
$\delta_b$ is the thickness of the at least one main strip,
i is the radius of gyration of the cross-section of the TPM,
F is the area of the TPM cross-section, and
K is the coefficient in the known formula for local stability critical stress.

37. The TPM according to claim 21, wherein each of the TPMs is made of a material in which the actual stress value is greater than the proportion limit stress value thereof.

38. A thin wall profile member (TPM) with a cross-sectional shape and dimensions constant along its length, the TPM being pre-constructed for use as a load-carrying, weight optimized structural element, the TPM comprising:
at least one main strip having longitudinal reinforcing ribs; and
at least one additional strip having longitudinal reinforcing ribs, the at least one additional strip having a width that does not exceed a width of the at least one main strip and having a thickness that equals or exceeds a thickness of the at least one main strip;
wherein a ratio of the width of the at least one additional strip to the width of the at least one main strip satisfies the range from 0.1 to 1.0;
wherein a ratio of the thickness of the at least one additional strip to the thickness of the at least one main strip satisfies the range from 1.0 to 10.0; and
wherein the TPM is made of a material in which the actual stress value is greater than the proportion limit stress value thereof.

39. The TPM according to claim 38,
wherein the longitudinal reinforcing ribs of the at least one additional strip comprise a free reinforcing rib and a common reinforcing rib, and
wherein $\delta_c/c \geq \delta_b/b$
where:
b is the width of the at least one main strip,
c is the width of the at least one additional strip,
$\delta_b$ is the thickness of the at least one main strip, and
$\delta_c$ is the thickness of the at least one additional strip.

40. The TPM according to claim 38,
wherein the at least one additional strip comprises an additional strip having, a common reinforcing rib and a free reinforcing rib as the longitudinal reinforcing ribs,
wherein the at least one additional strip comprises another additional strip having common reinforcing ribs as the longitudinal reinforcing ribs, a ratio of the width of the another additional strip to the width of the at least one main strip satisfying the range from 0.1 to 1.0, and a ratio of the thickness of the another additional strip to the thickness of the at least one main strip satisfying the range from 1.0 to 10.0, and
wherein $\delta_a/a \geq \delta_b/b$ and $\delta_c/c \geq \delta_b/b$
where:
a is the width of the additional strip with the common reinforcing ribs,
b is the width of the at least one main strip,
c is the width of the additional strip with the free reinforcing rib and the common reinforcing rib,
$\delta_a$ is the thickness of the additional strip with the common reinforcing ribs,
$\delta_b$ is the thickness of the at least one main strip, and
$\delta_c$ is the thickness of the additional strip with the free reinforcing rib and the common rein rib.

41. The TPM according to claim 38 wherein the longitudinal reinforcing ribs of the at least one additional strip comprise two common reinforcing ribs and no free reinforcing ribs.

42. The TPM according to claim 38, wherein the longitudinal reinforcing ribs comprise a common reinforcing rib and a free reinforcing rib.

43. The TPM according to claim 42, wherein the TPM is Z-shaped in cross-section.

44. The TPM according to claim 42, wherein the TPM is U-shaped in cross-section.

45. The TPM according to claim 42, wherein the TPM is L-shaped in cross-section.

46. The TPM according to claim 42, wherein the TPM is I-shaped in cross-section.

47. The TPM according to claim 46, wherein the TPM is made of steel.

48. The TPM according to claim 42, wherein the TPM is one of I-shaped, Z-shaped, U-shaped and L-shaped in cross-section and is made of an aluminum alloy.

49. The TPM according to claim 38 wherein the at least one additional strip comprises an additional strip having two common reinforcing ribs as the longitudinal reinforcing ribs and an additional strip having a free reinforcing rib and a common reinforcing rib as the longitudinal reinforcing ribs.

50. The TPM according to claim 49, wherein $c/b \leq a/b \leq 1$, where a is the width of the additional strip with the two common reinforcing ribs, b is the width of the at least one main strip, and c is the width of the additional strip with the free reinforcing rib and the common reinforcing rib.

51. The TPM according to claim 50, wherein $1 \leq \delta_a/\delta_b \leq \delta_c/\delta_b$, where $\delta_a$ is the thickness of the additional strip with the two common reinforcing ribs, $\delta_b$ is the thickness of the at least one main strip, and $\delta_c$ is the thickness of the additional strip with the free reinforcing rib and the common reinforcing rib.

52. The TPM according to claim 49, wherein the TPM is U-shaped in cross-section and is made of an aluminum alloy.

53. The TPM according to claim 38, wherein the longitudinal reinforcing ribs of the at least one additional strip comprise common reinforcing ribs; and wherein $$\delta_a/a \geq \delta_b/b$$

where:
a is the width of the at least one additional strip,
b is the width of the at least one main strip,
$\delta_a$ is the thickness of the at least one additional strip, and
$\delta_b$ is the thickness of the at least one main strip.

54. A thin wall profile member (TPM) and panel sheet combination comprising:
a panel sheet; and
a plurality of TPMs installed longitudinally across a width of the panel sheet with even pitch;
wherein each of the TPMs comprises at least one main strip, and at least one additional strip having a width that does not exceed a width of the at least one main strip and having a thickness that equals or exceeds a thickness of the at least one main strip;
wherein for each of the TPMs, a ratio of the width of the at least one additional strip to the width of the at least one main strip satisfies the range from 0.1 to 1.0;
wherein for each of the TPMs, a ratio of the thickness of the at least one additional strip to the thickness of the at least one main strip satisfies the range from 1.0 to 10.0; and
wherein each of the TPMs is made of a material in which the actual stress value is greater than the proportion limit stress value thereof.

55. The TPM and panel sheet combination according to claim 54, wherein the TPMs are installed longitudinally across a width of the panel sheet with even pitch such that for each of the plurality of longitudinally installed TPMs, the corresponding at least one main strip and at least one additional strip form, with the panel sheet, an open cross-section configuration; and wherein a thickness of the panel sheet satisfies the expression $\delta = (0.0006 \text{ to } 0.0035) \, l_s$ and a pitch of the longitudinally installed TPMs satisfies the expression $b_{s=}(20 \text{ to } 65)\delta$, where:
$\delta$ is the thickness of the panel sheet,
$l_s$ is the length of each of the longitudinally installed TPMs; and
$b_s$ is the pitch of the longitudinally installed TPMs forming with the panel sheet the open cross-section configuration.

56. The TPM and panel sheet combination according to claim 55, further comprising a plurality of TPMs installed transversely to the longitudinally installed TPMs.

57. The TPM and panel sheet combination according to claim 56, wherein each of the transversally installed TPMs comprises at least one main strip, an additional strip having common reinforcing ribs, and an additional strip having a free reinforcing rib and a common reinforcing rib, the ratio of the width of the additional strip having the common reinforcing ribs to the width of the at least one main strip of each of the transversally installed TPMs satisfying the range:

$a/b = 0.1$ to $1.0$, the ratio of the thickness of the additional strip with the common reinforcing ribs to the thickness of the at least one main strip of each of the transversally installed TPMs satisfying the range:

$\delta_a/\delta_b = 1.0$ to $10.0$, the ratio of width of the additional strip with the free reinforcing rib and the common reinforcing rib to the width of the at least one main strip of each of the transversally installed TPMs satisfying the range:

$c/b = 0.1$ to $1.0$, and the ratio of the thickness of the of the additional strip with the free reinforcing rib and the common reinforcing rib to the thickness of the at least one main strip of each of the transversally installed TPMs satisfying the range:
$\delta_c/\delta_b = 1.0$ to $10.0$, where:
a is the width of the additional strip with the common reinforcing ribs of each of the transversally installed TPMs,
b is the width of the at least one main strip of each of the transversally installed TPMs,
c is the width of the additional strip with the free reinforcing rib and the common reinforcing rib of each of the transversally installed TPMs,
$\delta_a$ is the thickness of the additional strip with the common reinforcing ribs of each of the transversally installed TPMs,
$\delta_b$ is the thickness of the at least one main strip of each of the transversally installed TPMs, and
$\delta_c$ is the thickness of the additional strip with the free reinforcing rib and the common reinforcing rib of each of the transversally installed TPMs; and
wherein $\delta_a/a \geq \delta_b/b$ and $\delta_c c \geq \delta_b/b$.

58. The TPM and panel sheet combination according to claim 56, wherein a pitch $l^1_r$ of the transversally installed TPMs satisfies the expression:

$$l^1_r = (1.510) b^1_s,$$

where $b^1_s$ is the pitch of the longitudinally installed TPMs forming with the panel sheet a closed cross-section configuration.

59. The TPM and panel sheet combination according to claim 58, wherein a width B of the TPM and panel sheet combination is determined from the expression:

$$B = n^1_s \cdot b^1_s,$$

where $n^1_s$, is the number of longitudinally installed TPMs limning with the panel sheet the closed cross-section configuration.

60. The TPM and panel sheet combination according to claim 56, wherein a length L of the TPM and panel sheet combination is determined from, the expression:

$$L = n_r \cdot l_r,$$

where $n_r$ is the number of TPMs installed transversely to the longitudinally installed TPMs that form with the panel sheet in the open cross-section configuration, and where $l_r$ is the pitch of the transversally installed TPMs and satisfies the expression:

$$l_r = (10 \text{ to } 60) b_s.$$

61. The TPM and panel sheet combination according to claim 54, wherein the at least one additional strip has a common reinforcing rib and a free reinforcing rib; and wherein $\delta_c/c \geq \delta_b/b$
where:
b is the width of the at least one main strip,
c is the width of the at least one additional strip,
$\delta_b$ is the thickness of the at least one main strip, and
$\delta_c$ is the thickness of the at least one additional strip.

62. The TPM and panel sheet combination according to claim 54, wherein the at least one additional strip has two common reinforcing ribs and no free reinforcing ribs.

63. The TPM and panel sheet combination according to claim 54, wherein the at least one additional strip has a common reinforcing rib and a free reinforcing rib.

64. The TPM and panel sheet combination according to claim 54, wherein the TPMs are installed longitudinally across a width of the panel sheet with even pitch such that for each of the plurality of longitudinally installed TPMs, the corresponding at least one main strip and at least one additional strip form, with the panel sheet, an open cross-section configuration; and Wherein a thickness of the panel sheet satisfies the expression $\delta=(0.0006 \text{ to } 0.0035) l_s$, and a pitch of the longitudinally installed TPMs satisfies the expression $b_s=(20 \text{ to } 65) \delta$, where:

$\delta$ is the thickness of the panel shod, $l_s$ is the length of each of the longitudinally installed TPMs; and $b_s$ is the pitch of the longitudinally installed TPMs forming with the panel sheet the open cross-section configuration.

65. The TPM and panel sheet combination according to claim 64, wherein a width B of the TPM and panel sheet combination is determined from the expression:

$$B = n_s \cdot b_s,$$

where $n_s$ is the number of longitudinally installed TPMs forming with the panel sheet the open cross-section configuration.

66. The TPM and panel sheet combination according to claim 54, wherein the TPMs are installed longitudinally across a width of the panel sheet with even pitch such that for each of the plurality of longitudinally installed TPMs, the corresponding at least one main strip and at least one additional strip form, with the panel sheet, a closed cross-section configuration; and wherein a thickness of the panel sheet satisfies the expression $\delta=(0.0006 \text{ to } 0.0035) l^1_s$ and a pitch of the longitudinally installed TPMs satisfies the expression $b^1_s=(40 \text{ to } 130)\delta$, where:

$\delta$ is the thickness of the panel sheet, $l^1_s$ is the length of each of the longitudinally installed TPMs; and $b^1_s$ is the pitch of the longitudinally installed TPMs forming with the panel sheet the closed cross-section configuration.

67. The TPM and panel sheet combination according to claim 66, further comprising a plurality of TPMs installed transversally to the longitudinally installed TPMs; and wherein a length L of the TPM and panel sheet combination is determined from the expression:

$$L = n^1_r \cdot l^1_r,$$

where $n^1_r$ is the number of TPMs installed transversally to the longitudinally installed TPMs that form with the panel sheet the closed cross-section configuration.

* * * * *